United States Patent
Tada et al.

(10) Patent No.: US 12,534,459 B2
(45) Date of Patent: Jan. 27, 2026

(54) LIGHT-EMITTING DEVICE, DISPLAY DEVICE, ELECTRONIC DEVICE, ORGANIC COMPOUND, AND LIGHTING DEVICE

(71) Applicant: SEMICONDUCTOR ENERGY LABORATORY CO., LTD., Atsugi (JP)

(72) Inventors: Anna Tada, Kanagawa (JP); Nobuharu Ohsawa, Kanagawa (JP); Satoshi Seo, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 961 days.

(21) Appl. No.: 17/634,635

(22) PCT Filed: Aug. 27, 2020

(86) PCT No.: PCT/IB2020/057999
§ 371 (c)(1),
(2) Date: Feb. 11, 2022

(87) PCT Pub. No.: WO2021/044262
PCT Pub. Date: Mar. 11, 2021

(65) Prior Publication Data
US 2022/0396574 A1     Dec. 15, 2022

(30) Foreign Application Priority Data

Sep. 6, 2019 (JP) ................................ 2019-162847

(51) Int. Cl.
*C07D 471/04* (2006.01)
*H10K 50/11* (2023.01)
(Continued)

(52) U.S. Cl.
CPC ....... *C07D 471/04* (2013.01); *H10K 85/6572* (2023.02); *H10K 50/11* (2023.02); *H10K 2101/10* (2023.02)

(58) Field of Classification Search
CPC .......................... C07D 471/04; H10K 85/6572
See application file for complete search history.

(56) References Cited

U.S. PATENT DOCUMENTS 5,759,444 A    6/1998  Enokida et al.
6,376,107 B1   4/2002  Heuer et al.
(Continued)

FOREIGN PATENT DOCUMENTS

CN    1482127 A  *  3/2004
CN    1673311 A  *  9/2005
(Continued)

OTHER PUBLICATIONS

Xia et al., Chem. Eur. J. 2020, 26, 160-164.*
(Continued)

*Primary Examiner* — Vu A Nguyen
(74) *Attorney, Agent, or Firm* — Fish & Richardson P.C.

(57) ABSTRACT

An organic compound that enables provision of a light-emitting device with high emission efficiency and high reliability is provided. An organic compound represented by General Formula (G1-1) below is provided. Note that in General Formula (G1-1) below, R1 to R10 each independently represent any one of hydrogen, an alkyl group having 3 to 10, inclusive, carbon atoms, and a substituted or unsubstituted cycloalkyl group having 3 to 10, inclusive, carbon atoms, and Ar1 and Ar2 each independently represent an aromatic hydrocarbon group having 6 to 13, inclusive, carbon atoms with a substituent. The Ar1 and the Ar2 each include, as the substituent, one or more of a cycloalkyl (Continued)

group having 3 to 12, inclusive, carbon atoms and a cycloalkyl group having a bridge structure and having 7 to 10, inclusive, carbon atoms.

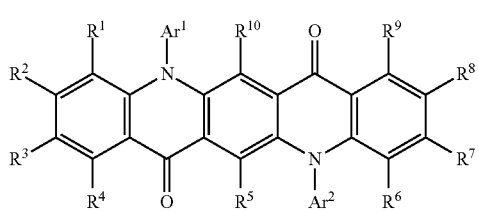

(G1-1)

20 Claims, 30 Drawing Sheets

(51) Int. Cl.
*H10K 85/60* (2023.01)
*H10K 101/10* (2023.01)

(56) References Cited

U.S. PATENT DOCUMENTS

| | | | |
|---|---|---|---|
| 6,664,396 B1 * | 12/2003 | Cosimbescu | C07D 471/04 546/49 |
| 6,863,997 B2 | 3/2005 | Thompson et al. | |
| 7,175,922 B2 | 2/2007 | Jarikov et al. | |
| 7,183,010 B2 | 2/2007 | Jarikov | |
| 7,332,857 B2 | 2/2008 | Seo et al. | |
| 7,572,522 B2 | 8/2009 | Seo et al. | |
| 7,597,967 B2 | 10/2009 | Kondakova et al. | |
| 7,943,925 B2 | 5/2011 | Yamazaki | |
| 7,993,760 B2 | 8/2011 | Komori et al. | |
| 8,034,465 B2 | 10/2011 | Liao et al. | |
| 8,247,086 B2 | 8/2012 | Inoue et al. | |
| 8,274,214 B2 | 9/2012 | Ikeda et al. | |
| 8,476,823 B2 | 7/2013 | Kuma et al. | |
| 8,729,310 B2 | 5/2014 | Osaka et al. | |
| 8,766,249 B2 | 7/2014 | Sawada et al. | |
| 8,803,134 B2 | 8/2014 | Inoue et al. | |
| 8,853,680 B2 | 10/2014 | Yamazaki et al. | |
| 8,945,722 B2 | 2/2015 | Thompson et al. | |
| 8,963,127 B2 | 2/2015 | Pieh et al. | |
| 8,981,355 B2 | 3/2015 | Seo | |
| 8,993,129 B2 | 3/2015 | Endo et al. | |
| 8,994,263 B2 | 3/2015 | Shitagaki et al. | |
| 9,054,317 B2 | 6/2015 | Monkman et al. | |
| 9,159,942 B2 | 10/2015 | Seo et al. | |
| 9,175,213 B2 | 11/2015 | Seo et al. | |
| 9,356,250 B2 | 5/2016 | Ohsawa et al. | |
| 9,362,517 B2 | 6/2016 | Ohsawa et al. | |
| 9,515,279 B2 | 12/2016 | Ishisone et al. | |
| 9,604,928 B2 | 3/2017 | Shitagaki et al. | |
| 9,634,279 B2 | 4/2017 | Seo et al. | |
| 10,367,160 B2 | 7/2019 | Seo et al. | |
| 10,439,005 B2 | 10/2019 | Ishisone et al. | |
| 10,892,301 B2 | 1/2021 | Ito et al. | |
| 11,690,238 B2 | 6/2023 | Ohsawa et al. | |
| 12,048,176 B2 | 7/2024 | Ohsawa et al. | |
| 2003/0175553 A1 | 9/2003 | Thompson. et al. | |
| 2004/0124421 A1 | 7/2004 | Yamazaki et al. | |
| 2004/0253478 A1 | 12/2004 | Thompson et al. | |
| 2005/0048310 A1 | 3/2005 | Cocchi et al. | |
| 2005/0214575 A1 | 9/2005 | Igarashi et al. | |
| 2005/0221116 A1 | 10/2005 | Cocchi et al. | |
| 2006/0134464 A1 | 6/2006 | Nariyuki | |
| 2006/0152143 A1 | 7/2006 | Nakaya et al. | |
| 2006/0186376 A1 | 8/2006 | Yamamoto et al. | |
| 2006/0202190 A1 | 9/2006 | Funahashi | |
| 2006/0228577 A1 | 10/2006 | Nagara | |
| 2007/0007884 A1 | 1/2007 | Iwanaga et al. | |
| 2007/0090756 A1 | 4/2007 | Okada et al. | |
| 2007/0244320 A1 | 10/2007 | Inoue et al. | |
| 2007/0252511 A1 | 11/2007 | Funahashi | |
| 2008/0160345 A1 | 7/2008 | Inoue et al. | |
| 2008/0286604 A1 | 11/2008 | Inoue et al. | |
| 2009/0053559 A1 | 2/2009 | Spindler et al. | |
| 2009/0057613 A1 | 3/2009 | Yamamoto et al. | |
| 2009/0166563 A1 | 7/2009 | Yokoyama et al. | |
| 2010/0052527 A1 | 3/2010 | Ikeda et al. | |
| 2010/0145044 A1 | 6/2010 | Inoue et al. | |
| 2010/0301318 A1 | 12/2010 | Kuma et al. | |
| 2011/0001146 A1 | 1/2011 | Yamazaki et al. | |
| 2011/0210316 A1 | 9/2011 | Kadoma et al. | |
| 2011/0215714 A1 | 9/2011 | Seo et al. | |
| 2012/0098417 A1 | 4/2012 | Inoue et al. | |
| 2012/0205632 A1 | 8/2012 | Shitagaki et al. | |
| 2012/0205687 A1 | 8/2012 | Yamazaki et al. | |
| 2012/0206035 A1 | 8/2012 | Shitagaki et al. | |
| 2012/0217486 A1 | 8/2012 | Takemura et al. | |
| 2012/0217487 A1 | 8/2012 | Yamazaki et al. | |
| 2012/0235127 A1 | 9/2012 | Takasu et al. | |
| 2012/0242219 A1 | 9/2012 | Seo et al. | |
| 2012/0248421 A1 | 10/2012 | Yamazaki et al. | |
| 2012/0248968 A1 | 10/2012 | Ogiwara et al. | |
| 2012/0256535 A1 | 10/2012 | Seo et al. | |
| 2012/0263648 A1 | 10/2012 | Shapiro et al. | |
| 2013/0048964 A1 | 2/2013 | Takeda et al. | |
| 2013/0056720 A1 | 3/2013 | Kim et al. | |
| 2013/0207088 A1 | 8/2013 | Seo | |
| 2013/0270531 A1 | 10/2013 | Seo et al. | |
| 2013/0277653 A1 | 10/2013 | Osaka et al. | |
| 2013/0277655 A1 | 10/2013 | Seo et al. | |
| 2013/0277656 A1 | 10/2013 | Seo et al. | |
| 2013/0292656 A1 | 11/2013 | Seo et al. | |
| 2013/0306945 A1 | 11/2013 | Seo | |
| 2014/0014930 A1 | 1/2014 | Hirose et al. | |
| 2014/0034925 A1 | 2/2014 | Osaka et al. | |
| 2014/0034926 A1 | 2/2014 | Matsubara et al. | |
| 2014/0034927 A1 | 2/2014 | Seo et al. | |
| 2014/0034930 A1 | 2/2014 | Seo et al. | |
| 2014/0034931 A1 | 2/2014 | Inoue et al. | |
| 2014/0034932 A1 | 2/2014 | Seo et al. | |
| 2014/0048784 A1 | 2/2014 | Inoue et al. | |
| 2014/0061604 A1 | 3/2014 | Seo et al. | |
| 2014/0103329 A1 | 4/2014 | Ogiwara et al. | |
| 2014/0336379 A1 | 11/2014 | Adachi et al. | |
| 2015/0069352 A1 | 3/2015 | Kim et al. | |
| 2016/0028022 A1 | 1/2016 | Seo et al. | |
| 2016/0056401 A1 | 2/2016 | Lee et al. | |
| 2016/0064684 A1 | 3/2016 | Seo et al. | |
| 2016/0093823 A1 | 3/2016 | Seo et al. | |
| 2016/0104855 A1 | 4/2016 | Ohsawa et al. | |
| 2016/0172605 A1 | 6/2016 | Seo et al. | |
| 2016/0190500 A1 | 6/2016 | Watabe et al. | |
| 2016/0248031 A1 | 8/2016 | Seo | |
| 2016/0248032 A1 | 8/2016 | Seo et al. | |
| 2016/0268513 A1 | 9/2016 | Ishisone et al. | |
| 2016/0268534 A1 | 9/2016 | Hosoumi et al. | |
| 2016/0343949 A1 | 11/2016 | Seo et al. | |
| 2016/0343954 A1 | 11/2016 | Seo et al. | |
| 2016/0351833 A1 | 12/2016 | Hosoumi et al. | |
| 2017/0012207 A1 | 1/2017 | Seo et al. | |
| 2017/0133617 A1 | 5/2017 | Seo et al. | |
| 2017/0271610 A1 | 9/2017 | Takahashi | |
| 2017/0324054 A1 | 11/2017 | Ishisone et al. | |
| 2017/0324055 A1 | 11/2017 | Ishisone et al. | |
| 2019/0140027 A1 | 5/2019 | Ishisone et al. | |
| 2019/0173038 A1 | 6/2019 | Seo et al. | |
| 2019/0319072 A1 | 10/2019 | Ito et al. | |
| 2019/0319210 A1 | 10/2019 | Nakamura et al. | |
| 2020/0321533 A1 | 10/2020 | Aspuru-guzik et al. | |
| 2021/0057667 A1 | 2/2021 | Ohsawa et al. | |

(56) References Cited

U.S. PATENT DOCUMENTS

| | | | |
|---|---|---|---|
| 2021/0118955 A1 | 4/2021 | Ito et al. | |
| 2025/0017035 A1 | 1/2025 | Ohsawa et al. | |

FOREIGN PATENT DOCUMENTS

| | | | |
|---|---|---|---|
| CN | 001802374 A | | 7/2006 |
| CN | 001977029 A | | 6/2007 |
| EP | 1202608 A | | 5/2002 |
| EP | 1359790 A | | 11/2003 |
| EP | 1650208 A | | 4/2006 |
| EP | 1769048 A | | 4/2007 |
| JP | 02-255788 A | | 10/1990 |
| JP | 2686418 | | 12/1997 |
| JP | 2002256168 A | * | 9/2002 |
| JP | 2003-347058 A | | 12/2003 |
| JP | 2004-026835 A | | 1/2004 |
| JP | 2005-035965 A | | 2/2005 |
| JP | 2005-310766 A | | 11/2005 |
| JP | 2008-505240 | | 2/2008 |
| JP | 4188369 | | 11/2008 |
| JP | 4188401 | | 11/2008 |
| JP | 2010-507922 | | 3/2010 |
| JP | 2013-012535 A | | 1/2013 |
| JP | 2014-045179 A | | 3/2014 |
| JP | 2018-082022 A | | 5/2018 |
| JP | 2019-083314 A | | 5/2019 |
| KR | 2006-0024445 A | | 3/2006 |
| KR | 2007-0043810 A | | 4/2007 |
| KR | 2009-0078283 A | | 7/2009 |
| TW | 201947012 | | 12/2019 |
| WO | WO-2000/070655 | | 11/2000 |
| WO | WO-2005/000847 | | 1/2005 |
| WO | WO-2006/003090 | | 1/2006 |
| WO | WO-2008/054578 | | 5/2008 |
| WO | WO-2017/205425 | | 11/2017 |
| WO | WO-2018/092523 | | 5/2018 |
| WO | WO-2018/097156 | | 5/2018 |
| WO | WO-2019/082024 | | 5/2019 |
| WO | WO-2019/215535 | | 11/2019 |

OTHER PUBLICATIONS

Uoyama.H et al., "Highly efficient organic light-emitting diodes from delayed fluorescence", Nature, Dec. 13, 2012, vol. 492, No. 7428, pp. 234-238.

Nakanotani.H et al., "High-efficiency organic light-emitting diodes with fluorescent emitters", Nature Communications, May 30, 2014, vol. 5, pp. 4016-1-4016-7.

Itano.K et al., "Exciplex formation at the organic solid-state interface: Yellow emission in organic light-emitting diodes using green-fluorescent tris(8-quinolinolato)aluminum and hole-transporting molecular materials with low ionization potentials", Appl. Phys. Lett. (Applied Physics Letters), Feb. 9, 1998, vol. 72, No. 6, pp. 636-638.

Endo.A et al., "Efficient Up-Conversion of Triplet Excitons Into a Singlet State and Its Application for Organic Light Emitting Diodes", Appl. Phys. Lett. (Applied Physics Letters), Feb. 24, 2011, vol. 98, No. 8, pp. 083302-1-083302-3.

Kondakova.M et al., "High-efficiency, low-voltage phosphorescent organic light-emitting diode devices with mixed host", J. Appl. Phys. (Journal of Applied Physics), Nov. 4, 2008, vol. 104, pp. 094501-1-094501-17.

Hino.Y et al., "Red Phosphorescent Organic Light-Emitting Diodes Using Mixture System of Small-Molecule and Polymer Host", Jpn. J. Appl. Phys. (Japanese Journal of Applied Physics), Apr. 21, 2005, vol. 44, No. 4B, pp. 2790-2794.

Su.S et al., "RGB Phosphorescent Organic Light-Emitting Diodes by Using Host Materials with Heterocyclic Cores:Effect of Nitrogen Atom Orientations", Chem. Mater. (Chemistry of Materials), 2011, vol. 23, No. 2, pp. 274-284.

Fujita.M et al., "Reduction of operating voltage in organic light-emitting diode by corrugated photonic crystal structure", Appl. Phys. Lett. (Applied Physics Letters), Dec. 6, 2004, vol. 85, No. 23, pp. 5769-5771.

Tsuboyama.A et al., "Homoleptic Cyclometalated Iridium Complexes with Highly Efficient Red Phosphorescence and Application to Organic Light-Emitting Diode", J. Am. Chem. Soc. (Journal of the American Chemical Society), 2003, vol. 125, No. 42, pp. 12971-12979.

Yoshida.K et al., "High efficiency reverse intersystem crossing of exciplex states", The 71st Autumn Meeting of the Japan Society of Applied Physics and Related Societies, 2010, p. 319, The Japan Society of Applied Physics.

Goushi.K et al., "Delayed fluorescence organic light-emitting diodes based on exciplex", The 59th Spring Meeting of the Japan Society of Applied Physics and Related Societies Preliminary Drafts, 2012, p. 251.

Nakagawa.T et al., "Electroluminescence based on thermally activated delayed fluorescence generated by a spirobifluorene donor-acceptor structure", Chemical Communications, Apr. 17, 2012, vol. 48, No. 77, pp. 9580-9582, RSC Publishing.

Yokoyama.D et al., "Dual efficiency enhancement by delayed fluorescence and dipole orientation in high-efficiency fluorescent organic light-emitting diodes", Appl. Phys. Lett. (Applied Physics Letters), Sep. 22, 2011, vol. 99, No. 12, pp. 123303-1-123303-4, AIP Publishing.

Mehes.G et al., "Thermally Activated Delayed Fluorescence and its Application for OLED", The 2nd Phoenics International Symposium, Mar. 5, 2012.

Sajoto.T et al., "Temperature Dependence of Blue Phosphorescent Cyclometalated Ir(III) Complexes", J. Am. Chem. Soc. (Journal of the American Chemical Society), Jun. 18, 2009, vol. 131, No. 28, pp. 9813-9822.

Gong.X et al., "Phosphorescence from iridium complexes doped into polymer blends", J. Appl. Phys. (Journal of Applied Physics), Feb. 1, 2004, vol. 95, No. 3, pp. 948-953.

Lee.J et al., "Stabilizing the efficiency of phosphorescent organic light-emitting diodes", SPIE Newsroom, Apr. 21, 2008, pp. 1-3.

D'Andrade.B et al., "High-efficiency yellow double-doped organic light-emitting devices based on phosphor-sensitized fluorescence", Appl. Phys. Lett. (Applied Physics Letters), Aug. 13, 2001, vol. 79, No. 7, pp. 1045-1047.

Cheng.G et al., "Improved efficiency for white organic light-emitting devices based on phosphor sensitized fluorescence", Appl. Phys. Lett. (Applied Physics Letters), Feb. 20, 2006, vol. 88, No. 8, pp. 083512-1-083512-3.

Kanno.H et al., "White organic light-emitting device based on a compound fluorescent phosphor-sensitized-fluorescent emission layer", Appl. Phys. Lett. (Applied Physics Letters), Oct. 2, 2006, vol. 89, No. 14, pp. 143516-1-143516-3.

Matsumoto.N et al., "Exciplex Formations between Tris(8-hydoxyquinolate)aluminum and Hole Transport Materials and Their Photoluminescence and Electroluminescence Characteristics", J. Phys. Chem. C (The Journal of Physical Chemistry C), May 22, 2008, vol. 112, No. 20, pp. 7735-7741.

Yersin.H et al., Highly Efficient OLEDs with Phosphorescent Materials, 2008, pp. 1-97,283-309, Wiley-VCH Verlag Gmbh & Co.

Tokito.S et al., "Improvement in performance by doping", Organic EL Display, Aug. 20, 2004, pp. 67-99, Ohmsha.

Jeon.W et al., "Ideal host and guest system in phosphorescent OLEDs", Organic Electronics, 2009, vol. 10, pp. 240-246, Elsevier.

Rausch.A et al., "Matrix Effects on the Triplet State of the OLED Emitter Ir(4,6-dFppy)2(pic)(FIrpic):Investigations by High-Resolution Optical Spectroscopy", Inorg. Chem. (Inorganic Chemistry), 2009, vol. 48, No. 5, pp. 1928-1937.

Zhao.Q et al., "Synthesis and Photophysical, Electrochemical, and Electrophosphorescent Properties of a Series of Iridium(III) Complexes Based on Quinoline Derivatives and Different β-Diketonate Ligands", Organometallics, Jun. 14, 2006, vol. 25, No. 15, pp. 3631-3638.

Park.Y et al., "Efficient triplet harvesting by fluorescent molecules through exciplexes for high efficiency organic light-emitting diodes", Appl. Phys. Lett. (Applied Physics Letters), Apr. 18, 2013, vol. 102, No. 15, pp. 153306-1-153306-5.

Noda.H et al., "Excited state engineering for efficient reverse intersystem crossing", Science Advances, Jul. 22, 2018, vol. 4, No. 6, p. 6910.

(56) References Cited

OTHER PUBLICATIONS

Baldo.M et al., "High-Efficiency Fluorescent Organic Light-Emitting Devices Using a Phosphorescent Sensitizer", Nature, Feb. 17, 2000, vol. 403, No. 6771, pp. 750-753.
International Search Report (Application No. PCT/IB2020/057999) Dated Oct. 27, 2020.
Written Opinion (Application No. PCT/IB2020/057999) Dated Oct. 27, 2020.

* cited by examiner

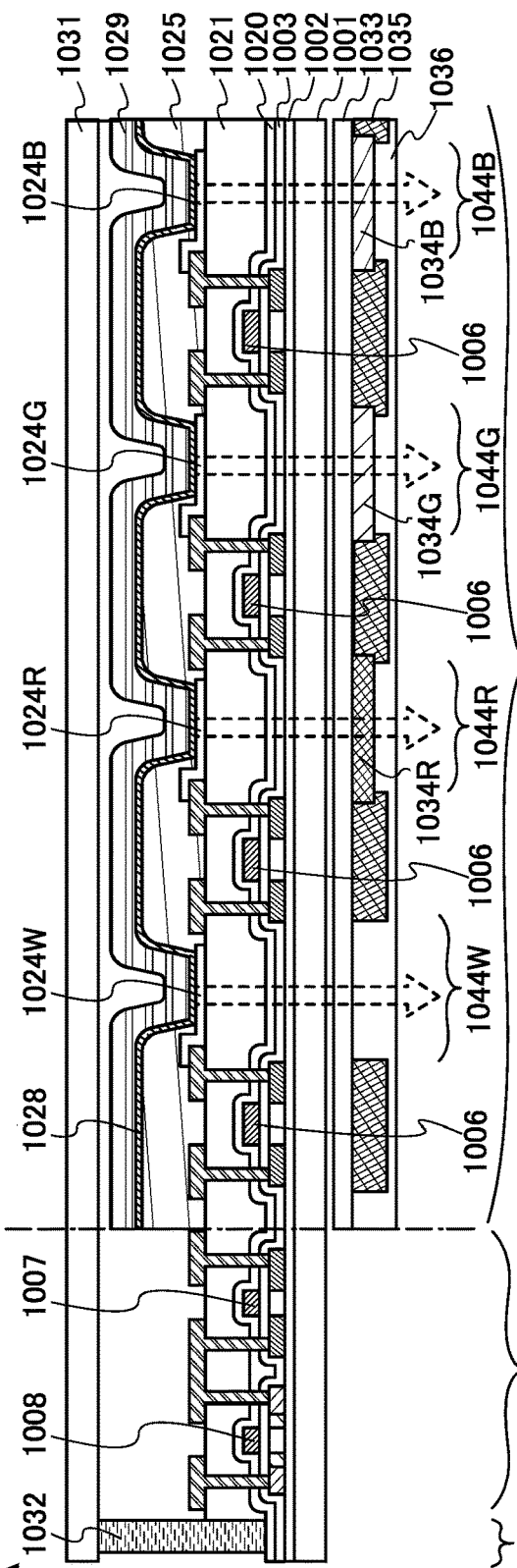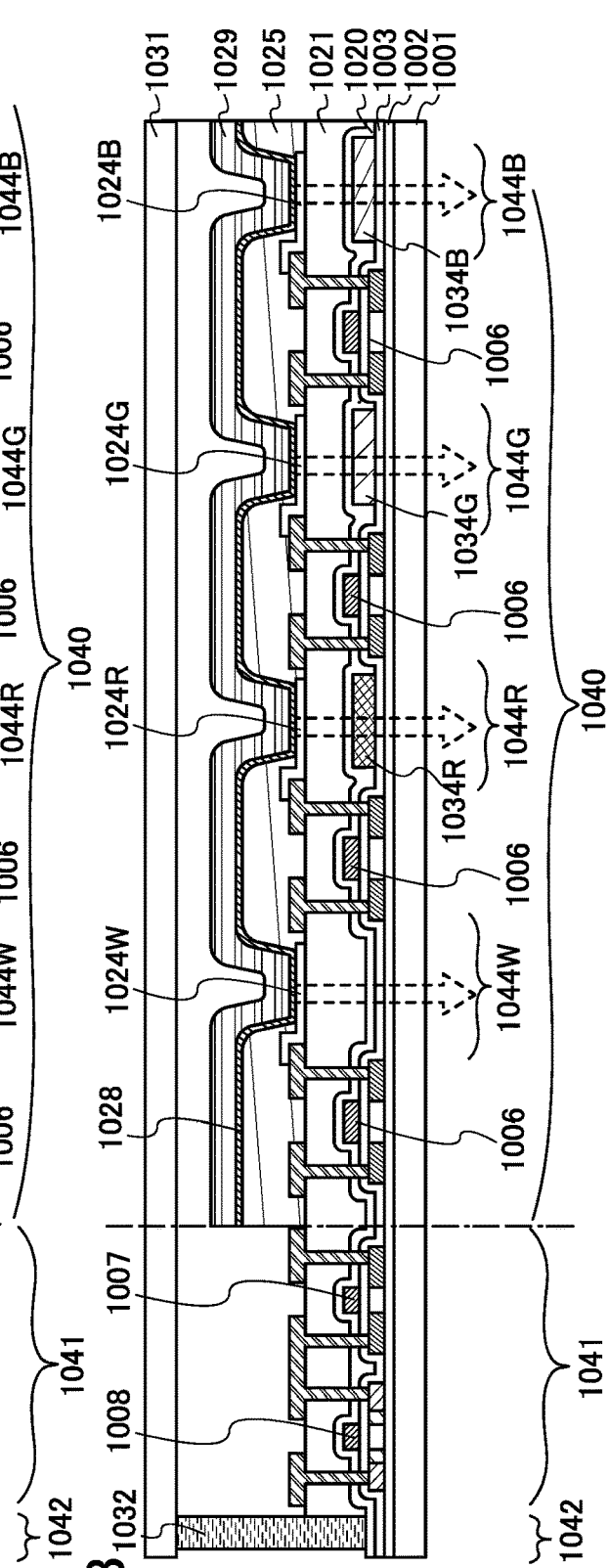

FIG. 11A
FIG. 11B
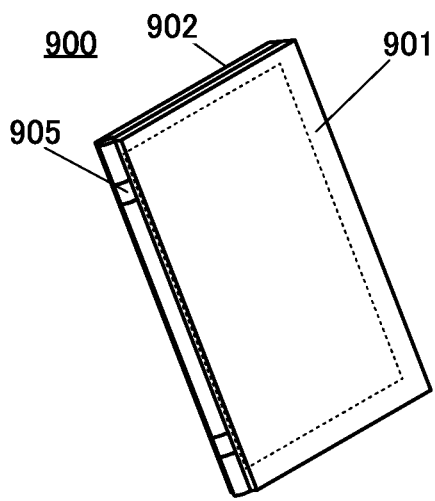
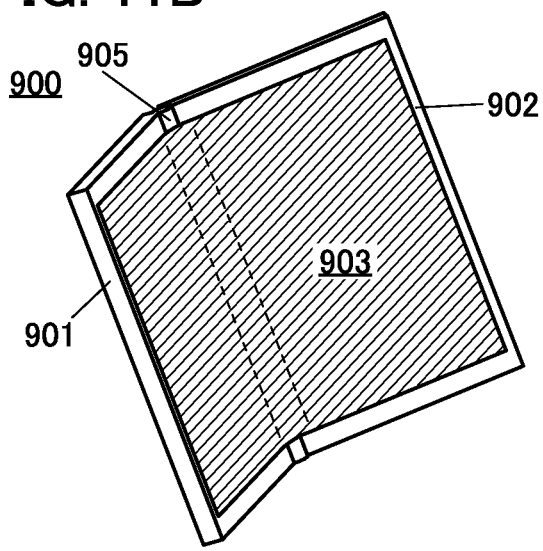
FIG. 11C
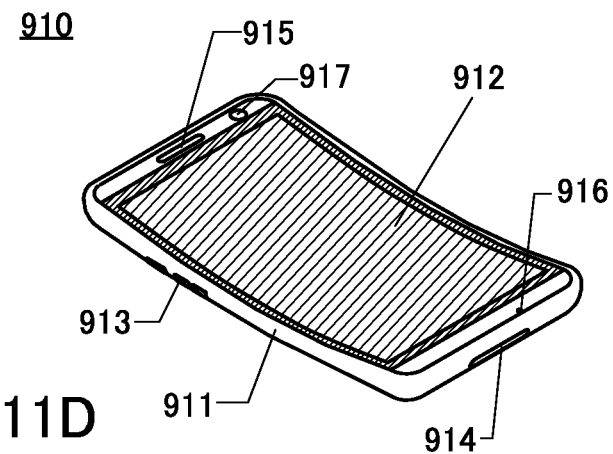
FIG. 11D
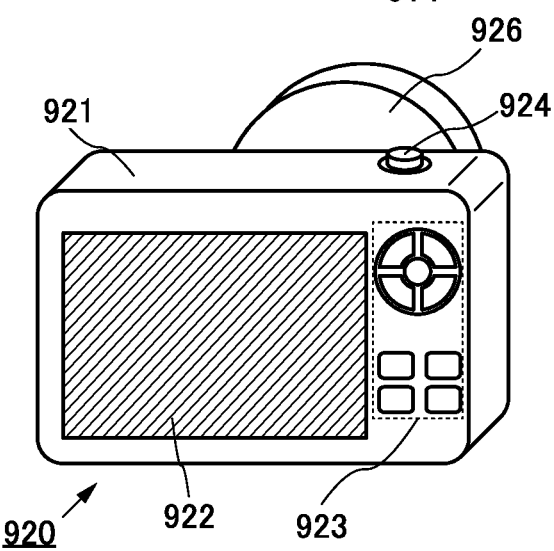

LIGHT-EMITTING DEVICE, DISPLAY DEVICE, ELECTRONIC DEVICE, ORGANIC COMPOUND, AND LIGHTING DEVICE

CROSS REFERENCE TO RELATED APPLICATIONS

This application is a U.S. National Phase Application under 35 U.S.C. § 371 of International Application PCT/IB2020/057999, filed on Aug. 27, 2020, which is incorporated by reference and claims the benefit of a foreign priority application filed in Japan on Sep. 6, 2019, as Application No. 2019-162847.

TECHNICAL FIELD

One embodiment of the present invention relates to a light-emitting device, an organic compound, or a display device, an electronic device, and a lighting device each including the light-emitting device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Accordingly, specific examples of the technical field of one embodiment of the present invention disclosed in this specification include a semiconductor device, a display device, a liquid crystal display device, a light-emitting apparatus, a lighting device, a power storage device, a memory device, a driving method thereof, and a manufacturing method thereof.

BACKGROUND ART

In recent years, research and development have been extensively conducted on light-emitting devices utilizing electroluminescence (EL). The basic structure of these light-emitting devices is a structure in which a layer containing a light-emitting substance (an EL layer) is interposed between a pair of electrodes. By application of a voltage between the electrodes, light emission from the light-emitting substance can be obtained.

Since the above light-emitting device is a self-luminous type, a display device using this has features such as high visibility, no necessity of a backlight, and low power consumption. The display device also has advantages in that it can be manufactured to be thin and lightweight and has high response speed, for example.

In the case of such a light-emitting device, application of a voltage between the pair of electrodes causes injection of electrons from a cathode and holes from an anode into the EL layer and thus a current flows. By recombination of the injected electrons and holes, the light-emitting substance is brought into an excited state, and light emission can be obtained.

In the case where the light-emitting substance is an organic compound, the two types of excited states formed by the organic compound are a singlet excited state (S*) and a triplet excited state (T*); light emission from the singlet excited state is referred to as fluorescent light, and light emission from the triplet excited state is referred to as phosphorescent light. The statistical formation ratio of the excited states formed by current excitation in the light-emitting device is $S^*:T^*=1:3$. Thus, a light-emitting device using, as a light-emitting substance, a phosphorescent material that converts triplet excitation energy into light emission is likely to exhibit high emission efficiency compared to the case of using a fluorescent material that converts singlet excitation energy into light emission. Therefore, light-emitting devices using phosphorescent materials have been actively developed in recent years.

However, among light-emitting devices using phosphorescent materials, a light-emitting device that emits blue light in particular has not yet been put into practical use because it is extremely difficult to develop a stable compound having a high triplet excitation energy level. Therefore, light-emitting devices using a stable fluorescent material and exhibiting high emission efficiency have been actively developed mainly for application to blue light-emitting devices.

As a material capable of converting energy of the triplet excited state into light emission, a thermally activated delayed fluorescent (TADF) material is known in addition to a phosphorescent material. In a TADF material, a singlet excited state is generated from a triplet excited state by reverse intersystem crossing, and the singlet excited state causes light emission.

In order to improve the emission efficiency of a light-emitting device using a TADF material as a light-emitting material, not only efficient generation of a singlet excited state from a triplet excited state of a TADF material but also efficient light emission from a generated singlet excited state, that is, a high fluorescence quantum yield of a TADF material itself, is important. It is, however, not easy to design a light-emitting material that simultaneously meets these two.

In view of the above problem, Patent Document 1 proposes a light-emitting device containing a TADF material as a host material and a fluorescent material as a guest material (light-emitting material), in which singlet excitation energy converted from triplet excitation energy by the TADF material is transferred to the fluorescent material and light emission is obtained from the fluorescent material. In such a light-emitting device, triplet excitation energy also contributes to light emission, and thus high emission efficiency can be achieved even when a light-emitting material is a fluorescent material. Moreover, since the fluorescent material that is a light-emitting material is stable, a long lifetime can be achieved compared to that of a phosphorescent light-emitting device.

REFERENCE

Patent Document

[Patent Document 1] Japanese Published Patent Application No. 2014-45179

Non-Patent Document

[Non-Patent Document 1] Hiroki Uoyama et al., "Nature", 2012, vol. 492, 234

SUMMARY OF THE INVENTION

Problems to be Solved by the Invention

As one of methods for improving the efficiency of a fluorescent light-emitting device, Patent Document 1 discloses the following method: a light-emitting layer containing a host material capable of converting triplet excitation energy into singlet excitation energy, such as a TADF material, and a guest material, which is a fluorescent material, is used; triplet excitons of the host material are converted into singlet excitons; and then singlet excitation energy is transferred to the fluorescent material, which is the guest material.

However, in this method, the process where the triplet excitation energy of the host material is converted into the singlet excitation energy is in competition with a process where the triplet excitation energy is deactivated. Therefore, the triplet excitation energy of the host material is not sufficiently converted into the singlet excitation energy and an expected effect of efficiency improvement is not obtained in some cases.

Examples of processes where the triplet excitation energy is deactivated include a pathway where the triplet excitation energy of a host material is transferred to the lowest triplet excitation energy level ($T_1$ level) of a guest material, which is a fluorescent material.

This deactivation pathway can be inhibited by reducing the guest material concentration; however, in this case, energy transfer from the host material to a singlet excited state of the guest material is also inhibited, so that quenching due to a degraded material and an impurity is likely to occur, leading to a decrease in emission efficiency and reliability.

Therefore, an object of one embodiment of the present invention is to provide an organic compound capable of achieving a fluorescent light-emitting device with high emission efficiency and a long lifetime. Another object of one embodiment of the present invention is to provide an organic compound that can be used as a guest material capable of, in a host material and a guest material of a light-emitting layer of a light-emitting device, inhibiting transfer of the triplet excitation energy of the host material to the $T_1$ level of the guest material, which is a fluorescent material, and converting the triplet excitation energy of the host material into the singlet excitation energy of the guest material efficiently, so as to improve the emission efficiency of the fluorescent light-emitting device. Another object of one embodiment of the present invention is to provide an organic compound capable of achieving a light-emitting device with high emission efficiency and high reliability.

Another object of one embodiment of the present invention is to provide a light-emitting device capable of, in a host material and a guest material of a light-emitting layer of the light-emitting device, inhibiting transfer of the triplet excitation energy of the host material to the $T_1$ level of the guest material, which is a fluorescent material, and converting the triplet excitation energy of the host material into the singlet excitation energy of the guest material efficiently, so as to improve the fluorescent emission efficiency of the light-emitting device. Another object of one embodiment of the present invention is to provide a light-emitting device with high emission efficiency and high reliability. Another object of one embodiment of the present invention is to provide a light-emitting device with high color purity. Another object of one embodiment of the present invention is to provide a light-emitting device with high color purity and high emission efficiency.

Another object of one embodiment of the present invention is to provide a light-emitting device with reduced power consumption. Another object of one embodiment of the present invention is to provide a novel light-emitting device. Another object of one embodiment of the present invention is to provide a novel light-emitting apparatus. Another object of one embodiment of the present invention is to provide a novel display device. Another object of one embodiment of the present invention is to provide a novel organic compound.

Note that the description of the above objects does not disturb the existence of other objects. In one embodiment of the present invention, there is no need to achieve all of these objects. Objects other than those described above are apparent from the description of the specification and the like and objects other than those described above can be derived from the description of the specification and the like.

Means for Solving the Problems

One embodiment of the present invention is an organic compound represented by General Formula (G1-1) below.

[Chemical Formula 1]

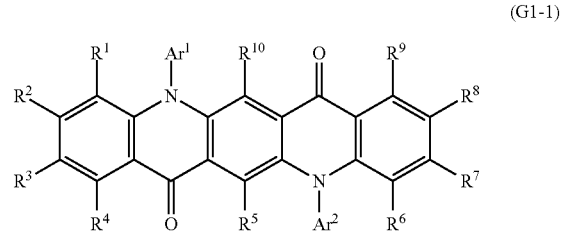

(G1-1)

Note that in General Formula (G1-1) above, $R^1$ to $R^{10}$ each independently represent any one of hydrogen, an alkyl group having 3 to 10, inclusive, carbon atoms, and a substituted or unsubstituted cycloalkyl group having 3 to 10, inclusive, carbon atoms, and $Ar^1$ and $Ar^2$ each independently represent an aromatic hydrocarbon group having 6 to 13, inclusive, carbon atoms with a substituent. The $Ar^1$ and the $Ar^2$ each include, as the substituent, one or more of a cycloalkyl group having 3 to 12, inclusive, carbon atoms and a cycloalkyl group having a bridge structure and having 7 to 10, inclusive, carbon atoms.

Another embodiment of the present invention is the organic compound with the above structure, in which the $Ar^1$ and the $Ar^2$ each represent a phenyl group with a substituent.

Another embodiment of the present invention is an organic compound represented by General Formula (G1-2) below.

[Chemical Formula 2]

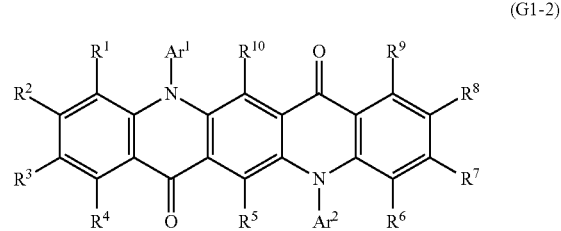

(G1-2)

Note that in General Formula (G1-2) above, $R^1$ to $R^{10}$ each independently represent any one of hydrogen, an alkyl group having 3 to 10, inclusive, carbon atoms, and a substituted or unsubstituted cycloalkyl group having 3 to 10, inclusive, carbon atoms, and $Ar^1$ and $Ar^2$ each independently represent an aromatic hydrocarbon group having 6 to 13, inclusive, carbon atoms with three or more substituents. The $Ar^1$ and the $Ar^2$ each include, as the substituents, two or more selected from an alkyl group having 1 to 10, inclusive, carbon atoms, a cycloalkyl group having 3 to 12, inclusive, carbon atoms, and a cycloalkyl group having a bridge structure and having 7 to 10, inclusive, carbon atoms.

Another embodiment of the present invention is the organic compound with the above structure, in which the $Ar^1$ and the $Ar^2$ each include three to five substituents.

Another embodiment of the present invention is the organic compound with the above structure, in which the $Ar^1$ and the $Ar^2$ each represent a phenyl group with a substituent.

Another embodiment of the present invention is the organic compound with the above structure, in which the substituents of the $Ar^1$ and the $Ar^2$ are bonded to both ortho positions and para positions of the $Ar^1$ and the $Ar^2$.

Another embodiment of the present invention is the organic compound with the above structure, in which the $Ar^1$ and the $Ar^2$ each include three substituents.

Another embodiment of the present invention is the organic compound with the above structure, in which the substituents of the $Ar^1$ and the $Ar^2$ are each a cyclohexyl group.

Another embodiment of the present invention is an organic compound represented by General Formula (G2) below.

[Chemical Formula 3]

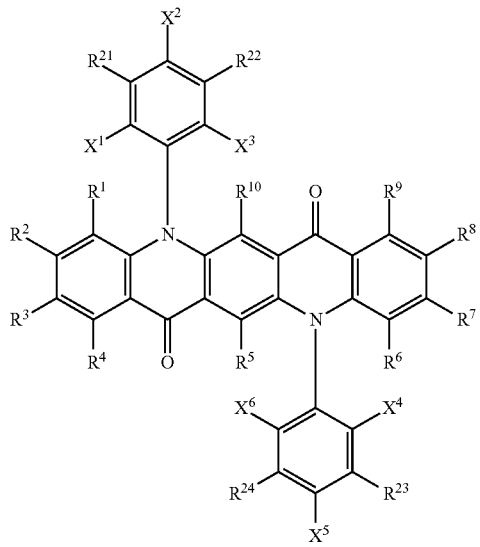

(G2)

Note that in General Formula (G2) above, $R^1$ to $R^{10}$ and $R^{21}$ to $R^{24}$ each independently represent any one of hydrogen, an alkyl group having 3 to 10, inclusive, carbon atoms, and a substituted or unsubstituted cycloalkyl group having 3 to 10, inclusive, carbon atoms, and $X^1$ to $X^6$ each independently represent any one of an alkyl group having 1 to 10, inclusive, carbon atoms, a cycloalkyl group having 3 to 12, inclusive, carbon atoms, and a cycloalkyl group having a bridge structure and having 7 to 10, inclusive, carbon atoms.

Another embodiment of the present invention is the organic compound with any of the above structures, in which the $R^{21}$ to the $R^{24}$ each represent hydrogen.

Another embodiment of the present invention is the organic compound with any of the above structures, in which the $X^1$ to the $X^6$ each represent a cycloalkyl group having 3 to 12, inclusive, carbon atoms.

Another embodiment of the present invention is the organic compound with any of the above structures, in which the $X^1$ to the $X^6$ each represent a cyclohexyl group.

Another embodiment of the present invention is the organic compound with any of the above structures, in which the $R^1$ to the $R^{10}$ each represent hydrogen.

Another embodiment of the present invention is a light-emitting material containing the organic compound described in any of the above.

Another embodiment of the present invention is a light-emitting device material containing the organic compound described in any of the above.

Another embodiment of the present invention is a light-emitting material for a light-emitting element, containing the organic compound described in any of the above, for receiving excitation energy from a material having a function of converting triplet excitation energy into light emission, and converting the excitation energy into light emission from a singlet excited state in a light-emitting layer.

Another embodiment of the present invention is a light-emitting device containing the organic compound described in any of the above.

Another embodiment of the present invention is a light-emitting device containing, in a light-emitting layer, a material having a function of converting triplet excitation energy into light emission and the organic compound described in any of the above.

Another embodiment of the present invention is an electronic device including the above light-emitting device, and a sensor, an operation button, a speaker, or a microphone.

Another embodiment of the present invention is a light-emitting apparatus including the above light-emitting device, and a transistor or a substrate.

Another embodiment of the present invention is a lighting device including the above light-emitting device and a housing.

The category of one embodiment of the present invention includes not only a light-emitting apparatus including a light-emitting device but also an electronic device including a light-emitting apparatus. Accordingly, a light-emitting apparatus in this specification refers to an image display device or a light source (including a lighting device). In some cases, the light-emitting (display) apparatus is included in a display module in which a connector, for example, an FPC (Flexible Printed Circuit) or a TCP (Tape Carrier Package), is connected to a light-emitting apparatus, a display module in which a printed wiring board is provided on the tip of a TCP, or a display module in which an IC (integrated circuit) is directly mounted on a light-emitting device by a COG (Chip On Glass) method.

Effect of the Invention

According to the present invention, an organic compound capable of achieving a light-emitting device with high emission efficiency can be provided. According to one embodiment of the present invention, an organic compound capable of achieving a light-emitting device with high reliability can be provided. According to another embodiment of the present invention, an organic compound capable of achieving a light-emitting device with reduced power consumption can be provided. According to another embodiment of the present invention, a light-emitting device with high color purity can be provided. According to another embodiment of the present invention, a light-emitting device with high color purity and high emission efficiency can be provided.

According to one embodiment of the present invention, a light-emitting device with high emission efficiency can be provided. According to another embodiment of the present invention, a light-emitting device with high reliability can be provided. According to another embodiment of the present invention, a light-emitting device with reduced power consumption can be provided. According to another embodiment of the present invention, a novel light-emitting device can be provided. According to another embodiment of the present invention, a novel light-emitting apparatus can be provided. According to another embodiment of the present invention, a novel display device can be provided. A novel organic compound can be provided.

Note that the description of these effects does not disturb the existence of other effects. In one embodiment of the present invention, there is no need to achieve all of these effects. Effects other than those are apparent from the description of the specification, drawings, claims, and the like and effects other than those can be derived from the description of the specification, drawings, claims, and the like.

BRIEF DESCRIPTION OF THE DRAWINGS

FIG. 9A and FIG. 9B are schematic cross-sectional views illustrating display devices of embodiments of the present invention.

FIG. 11A to FIG. 11D are perspective views illustrating display modules of embodiments of the present invention.

MODE FOR CARRYING OUT THE INVENTION

Figure 1A:
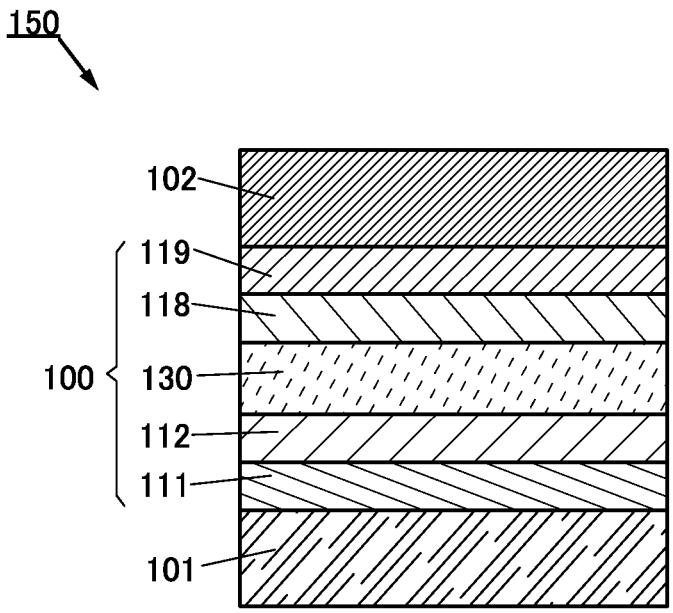
FIG. 1A and FIG. 1B are schematic cross-sectional views of a light-emitting layer of a light-emitting device of one embodiment of the present invention.

Embodiments of the present invention are described in detail below with reference to drawings. Note that the present invention is not limited to the following description, and the modes and details of the present invention can be modified in various ways without departing from the spirit and scope of the present invention. Accordingly, the present invention should not be interpreted as being limited to the description of the embodiments below.

In this specification and the like, a singlet excited state (S*) refers to a singlet state having excitation energy. An S1 level means the excitation energy level of the lowest singlet excited state (S1 state). A triplet excited state (T*) refers to a triplet state having excitation energy. A T1 level means the excitation energy level of the lowest triplet excited state (T1 state). Note that in this specification and the like, simple expressions singlet excited state and singlet excitation energy level mean the S1 state and the S1 level, respectively, in some cases. In addition, simple expressions triplet excited state and triplet excitation energy level mean the T1 state and the T1 level, respectively, in some cases.

In this specification and the like, a fluorescent material refers to a compound that supplies light emission in the visible light region when the relaxation from the singlet excited state to the ground state occurs. A phosphorescent material refers to a compound that supplies light emission in the visible light region at room temperature when the relaxation from the triplet excited state to the ground state occurs. In other words, a phosphorescent material refers to one of compounds that can convert triplet excitation energy into visible light. Note that in this specification and the like, room temperature refers to a temperature in the range of higher than or equal to 0° C. and lower than or equal to 40° C.

In this specification and the like, a wavelength range of blue is greater than or equal to 400 nm and less than 490 nm, and blue light has at least one emission spectrum peak in that wavelength range. A wavelength range of green is greater than or equal to 490 nm and less than 580 nm, and green light has at least one emission spectrum peak in that wavelength range. A wavelength range of red is greater than or equal to 580 nm and less than or equal to 680 nm, and red light has at least one emission spectrum peak in that wavelength range.

Embodiment 1

This embodiment will describe an organic compound that can be used as a guest material capable of efficiently converting the triplet excitation energy of a host material into light emission in a light-emitting device containing in a light-emitting layer the host material capable of converting triplet excitation energy into light emission and the guest material (fluorescent material) capable of converting singlet excitation energy into light emission.

In the case where excitation energy needs to be transferred from a host material capable of converting triplet excitation energy into light emission to a guest material capable of converting singlet excitation energy into light emission, when triplet excitation energy is transferred from the triplet excitation energy level of the host material to the triplet excitation energy level of the guest material, non-radiative deactivation of the triplet excitation energy of the guest material becomes dominant, and thus energy not contributing to light emission is generated. This undesirable energy transfer is energy transfer based on the Dexter mechanism; thus, as a countermeasure, the doping concentration of the guest material is sometimes reduced to inhibit this undesirable energy transfer. However, in this case, not only energy transfer based on the Dexter mechanism but also energy transfer based on the Förster mechanism is inhibited at the same time, which has affected efficiency and a lifetime in some cases.

It is known that, in general, the Dexter mechanism is dominant when the distance between a host material and a guest material is shorter than or equal to 1 nm, and the Förster mechanism is dominant when the distance therebetween is longer than or equal to 1 nm and shorter than or equal to 10 nm. Note that the distance in this case intrinsically means the distance between the host material and a skeleton generating light emission of the guest material (a luminophore).

The above-described countermeasure, reducing the doping concentration of the guest material, inhibits both energy transfer based on the Dexter mechanism and energy transfer based on the Förster mechanism.

In other words, in the case of a light-emitting device containing in a light-emitting layer a host material capable of converting triplet excitation energy into light emission and a guest material (fluorescent material) capable of converting singlet excitation energy into light emission, a light-emitting device with high emission efficiency and a long lifetime in which energy is transferred mainly on the basis of the Förster mechanism can be obtained by keeping appropriate distance between the host material and the luminophore of the guest material in order to block an energy deactivation pathway due to energy transfer based on the Dexter mechanism from the triplet excitation energy level of the host material to the triplet excitation energy level of the guest material and subsequent non-radiative deactivation. Here, the distance between the host material and the luminophore of the guest material is preferably longer than or equal to 1 nm and shorter than or equal to 10 nm. Therefore, the guest material preferably has a bulky substituent having a function of keeping appropriate distance between the luminophore and the host material.

In view of the above, one embodiment of the present invention provides an organic compound having protecting groups that enables such a light-emitting device. Note that the protecting group means a substituent having a function of keeping appropriate distance between a host material and a luminophore.

That is, the organic compound of one embodiment of the present invention is an organic compound represented by General Formula (G1-1) below.

[Chemical Formula 4]

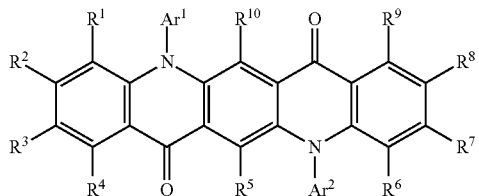

(G1-1)

In General Formula (G1-1) above, $R^1$ to $R^{10}$ each independently represent any one of hydrogen, an alkyl group having 3 to 10, inclusive, carbon atoms, and a cycloalkyl group having 3 to 10, inclusive, carbon atoms, and $Ar^1$ and $Ar^2$ each independently represent an aromatic hydrocarbon group having 6 to 13, inclusive, carbon atoms with a substituent. Note that $Ar^1$ and $Ar^2$ each include, as the substituent, one or more of a cycloalkyl group having 3 to 12, inclusive, carbon atoms and a cycloalkyl group having a bridge structure and having 7 to 10, inclusive, carbon atoms.

In the organic compound represented by General Formula (G1-1) above, a quinacridone skeleton is a luminophore and the substituents bonded to $Ar^1$ and $Ar^2$ function as protecting groups. Since the protecting groups are each a cycloalkyl group having 3 to 12, inclusive, carbon atoms or a cycloalkyl group having a bridge structure and having 7 to 10, inclusive, carbon atoms, appropriate distance can be kept between the organic compound represented by General Formula (G1-1) above and a host material, and energy transfer based on the Dexter mechanism can be effectively inhibited. Accordingly, by using the organic compound represented by General Formula (G1-1) above as a guest material of a light-emitting device containing in a light-emitting layer a host material capable of converting triplet excitation energy into light emission and the guest material capable of converting singlet excitation energy into light emission, the guest material can efficiently receive energy from the host material owing to energy transfer based on the Förster mechanism while energy transfer based on the Dexter mechanism is inhibited.

The organic compound represented by General Formula (G1-1) above has a quinacridone skeleton as a luminophore and has a high fluorescence quantum yield, which enables a light-emitting device that exhibits extremely high emission efficiency.

The organic compound represented by General Formula (G1-1) above in which $Ar^1$ and $Ar^2$ each represent a phenyl group is preferable in terms of easy synthesis and high sublimability.

Another embodiment of the present invention is an organic compound represented by General Formula (G1-2) below.

[Chemical Formula 5]

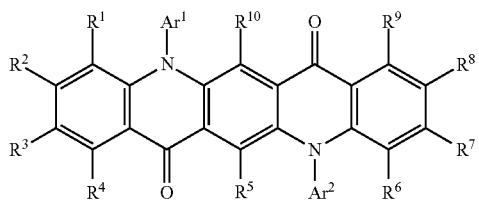

(G1-2)

In General Formula (G1-2) above, $R^1$ to $R^{10}$ each independently represent any one of hydrogen, an alkyl group having 3 to 10, inclusive, carbon atoms, and a cycloalkyl group having 3 to 10, inclusive, carbon atoms, and $Ar^1$ and $Ar^2$ each independently represent an aromatic hydrocarbon group having 6 to 13, inclusive, carbon atoms with three or more substituents. Note that $Ar^1$ and $Ar^2$ each include, as the substituents, two or more selected from an alkyl group having 1 to 10, inclusive, carbon atoms, a cycloalkyl group having 3 to 12, inclusive, carbon atoms, and a cycloalkyl group having a bridge structure and having 7 to 10, inclusive, carbon atoms.

In the organic compound represented by General Formula (G1-2) above, a quinacridone skeleton is a luminophore and the substituents of $Ar^1$ and $Ar^2$ function as protecting groups. Since three or more, preferably three to five protecting groups are bonded to $Ar^1$ and $Ar^2$, appropriate distance can be kept between the organic compound represented by General Formula (G1-2) above and a host material, and energy transfer based on the Dexter mechanism can be effectively inhibited. Accordingly, by using the organic compound represented by General Formula (G1-2) above as a guest material of a light-emitting device containing in a light-emitting layer a host material capable of converting triplet excitation energy into light emission and the guest material capable of converting singlet excitation energy into light emission, the guest material can efficiently receive energy from the host material owing to energy transfer based on the Förster mechanism.

The organic compound represented by General Formula (G1-2) above in which $Ar^1$ and $Ar^2$ each represent a phenyl group is preferable in terms of easy synthesis and high sublimability.

The substituents of $Ar^1$ and $Ar^2$ are preferably bonded to both the ortho positions and the para positions of $Ar^1$ and $Ar^2$ in terms of high sublimability. In addition, $Ar^1$ and $Ar^2$ each preferably include three substituents in terms of easy synthesis, higher sublimability, and more effective inhibition of energy transfer by the Dexter mechanism.

The substituents of $Ar^1$ and $Ar^2$ are each preferably a cycloalkyl group, further preferably a cyclohexyl group in terms of more effective inhibition of energy transfer by the Dexter mechanism.

As described above, in the organic compound of one embodiment of the present invention, $Ar^1$ and $Ar^2$ preferably represent phenyl groups, and protecting groups bonded to the phenyl groups are preferably bonded to both the ortho positions and the para positions. That is, the organic compound of one embodiment of the present invention is preferably an organic compound represented by General Formula (G2) below.

[Chemical Formula 6]

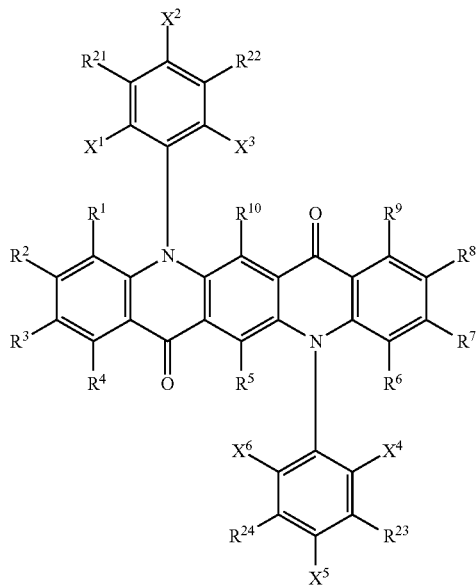

(G2)

In General Formula (G2) above, $R^1$ to $R^{10}$ and $R^{21}$ to $R^{24}$ each independently represent any one of hydrogen, an alkyl group having 3 to 10, inclusive, carbon atoms, and a cycloalkyl group having 3 to 10, inclusive, carbon atoms, and $X^1$ to $X^6$ each independently represent any one of an alkyl group having 1 to 10, inclusive, carbon atoms, a cycloalkyl group having 3 to 12, inclusive, carbon atoms, and a cycloalkyl group having a bridge structure and having 7 to 10, inclusive, carbon atoms.

In the organic compound represented by General Formula (G2) above, a quinacridone skeleton is a luminophore and $X^1$ to $X^6$ function as protecting groups. Thus, appropriate distance can be kept between the organic compound represented by General Formula (G2) above and a host material, and energy transfer based on the Dexter mechanism can be effectively inhibited. Accordingly, by using the organic compound represented by General Formula (G2) above as a guest material of a light-emitting device containing in a light-emitting layer a host material capable of converting triplet excitation energy into light emission and the guest material capable of converting singlet excitation energy into light emission, the guest material can efficiently receive energy from the host material owing to energy transfer based on the Förster mechanism.

Note that in General Formula (G2) above, $R^{21}$ to $R^{24}$ each preferably represent hydrogen in terms of easy synthesis. Moreover, $X^1$ to $X^6$ each preferably represent any of cycloalkyl groups having 3 to 12, inclusive, carbon atoms in terms of easy synthesis, and a cyclohexyl group is further preferable.

In General Formulae (G1-1), (G1-2), and (G2) above, $R^1$ to $R^{10}$ are each preferably hydrogen in terms of easy synthesis.

Since the organic compound of the present invention with such a structure can keep appropriate distance between a luminophore included in the organic compound and a host material, undesirable energy transfer can be effectively inhibited, and the use of the organic compound of the present invention makes it possible to provide a light-emitting element with high emission efficiency. Moreover, a light-emitting element with a long lifetime can be provided.

Furthermore, the organic compounds represented by General Formulae (G1-1), (G1-2), and (G2) above each have a high fluorescence quantum yield, and thus enable a light-emitting device that exhibits extremely high emission efficiency.

In this embodiment, specific examples of the alkyl group having 3 to 10, inclusive, carbon atoms include an n-propyl group, an isopropyl group, an n-butyl group, an isobutyl group, a tert-butyl group, a sec-butyl group, a neopentyl group, an n-hexyl group, an n-octyl group, and an n-decyl group, and examples of the cycloalkyl group having 3 to 10, inclusive, carbon atoms include a cyclopropyl group, a cyclobutyl group, a cyclopentyl group, a cyclohexyl group, a cycloheptyl group, a cyclooctyl group, a cyclononanyl group, and a cyclodecyl group.

Similarly, in this embodiment, examples of the alkyl group having 1 to 10, inclusive, carbon atoms include a methyl group, an ethyl group, an n-propyl group, an isopropyl group, an n-butyl group, an isobutyl group, a tert-butyl group, a sec-butyl group, a neopentyl group, an n-hexyl group, an n-octyl group, and an n-decyl group; examples of the cycloalkyl group having 3 to 12, inclusive, carbon atoms include a cyclopropyl group, a cyclobutyl group, a cyclopentyl group, a cyclohexyl group, a cycloheptyl group, a cyclooctyl group, a cyclononanyl group, a cyclodecyl group, and a cyclododecyl group; and examples of the cycloalkyl group having a bridge structure and having 7 to 10, inclusive, carbon atoms include an adamantyl group, a norbornanyl group, and a tetrahydrodicyclopentadienyl group.

Specific examples of the organic compounds include organic compounds represented by Structural Formulae (100) to (140) below.

[Chemical Formulae 7]

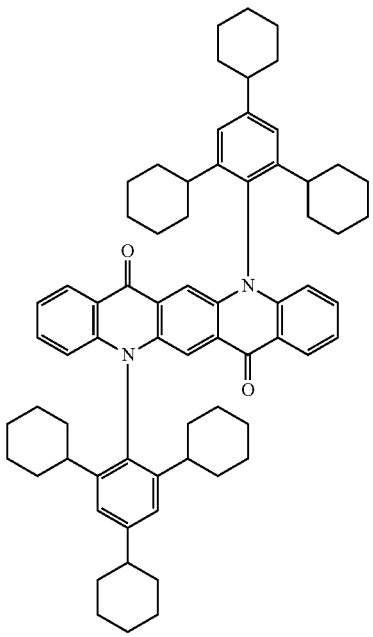

(100)

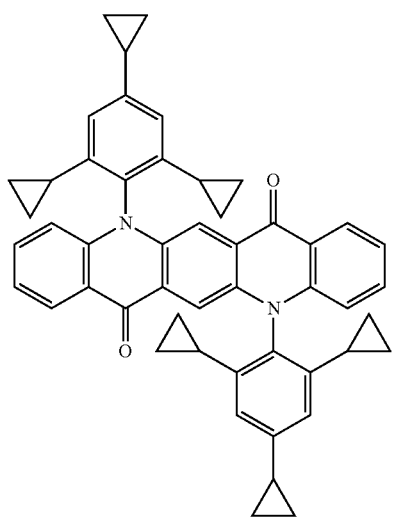
(101)
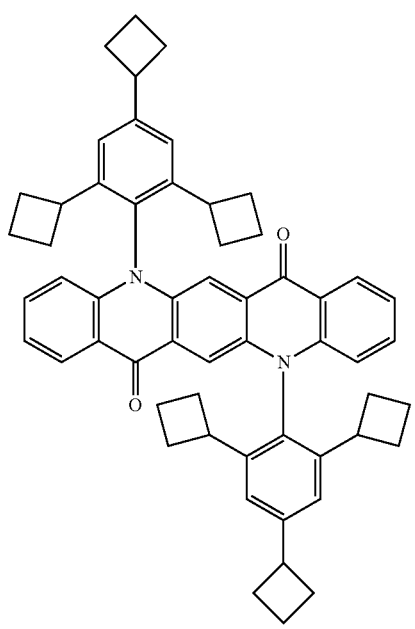
(102)
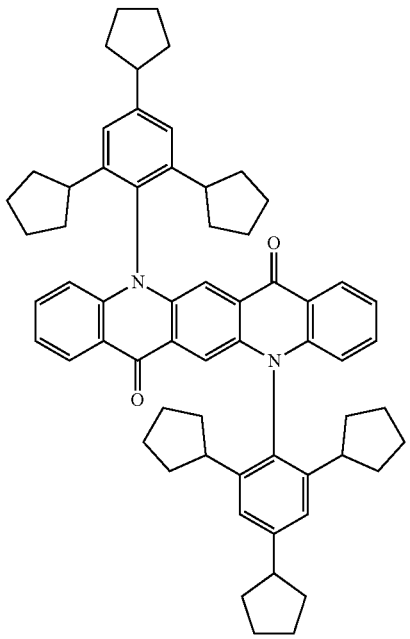
(103)
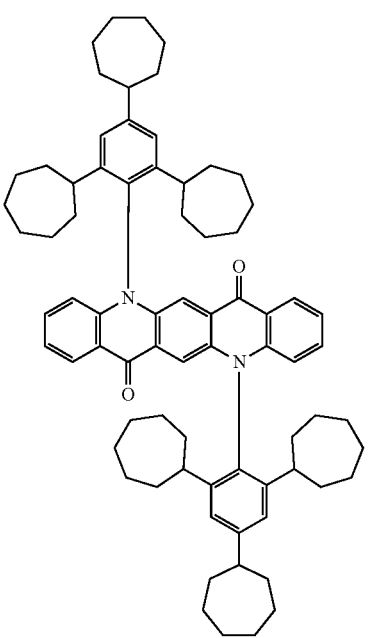
(104)

(105)
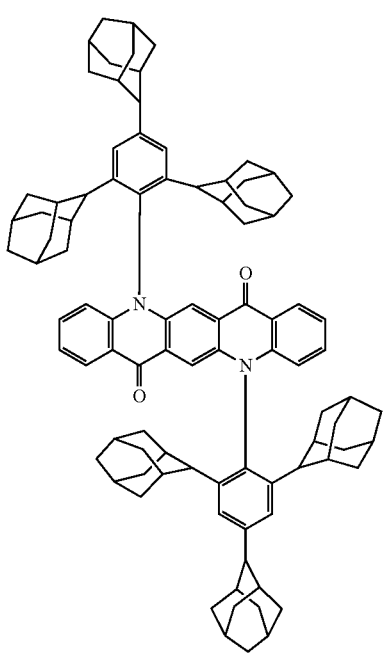
(107)
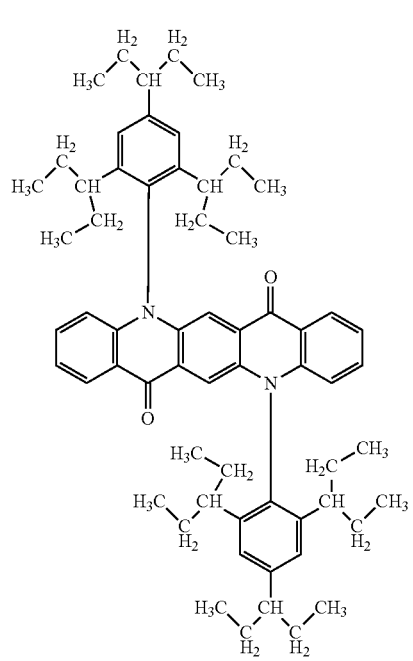
[Chemical Formulae 8]
(106)
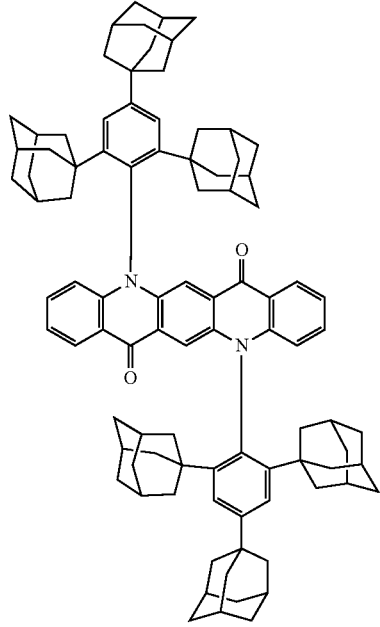
(108)
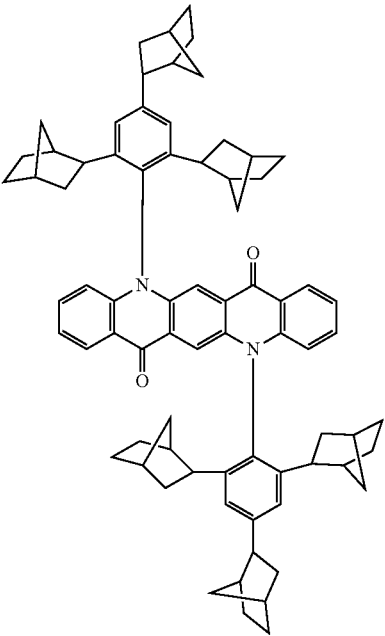

[Chemical Formulae 9]
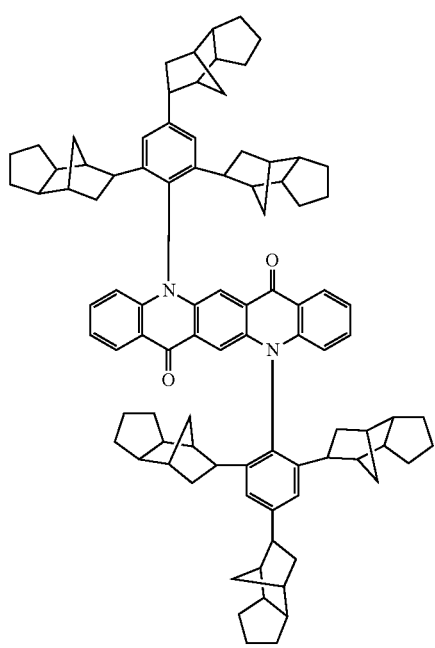
(109)
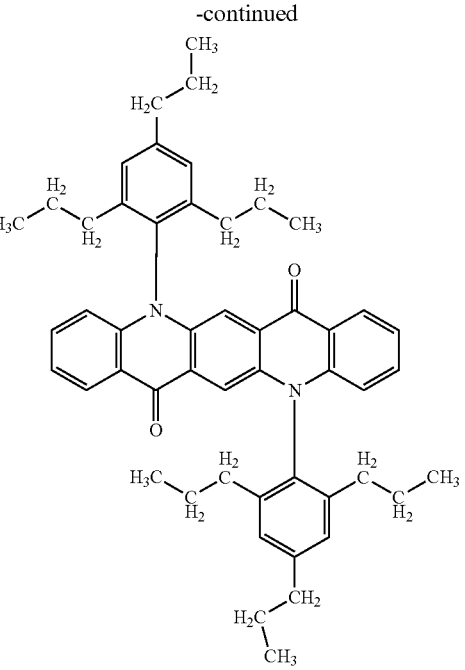
(111)
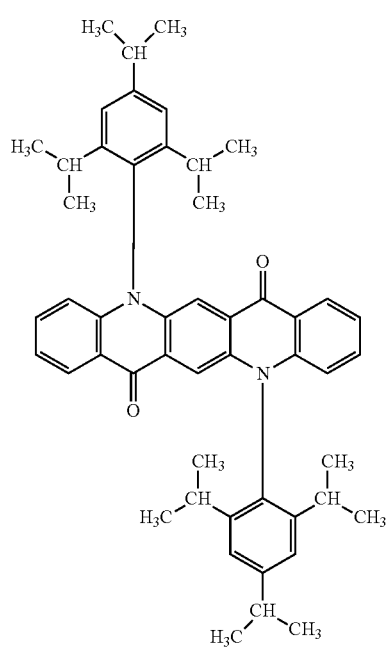
(110)
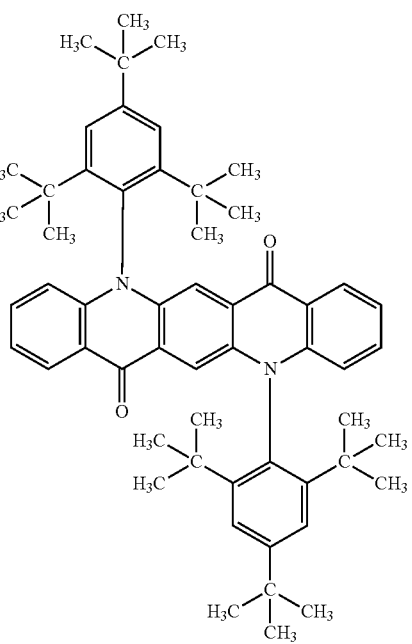
(112)

-continued
(113)
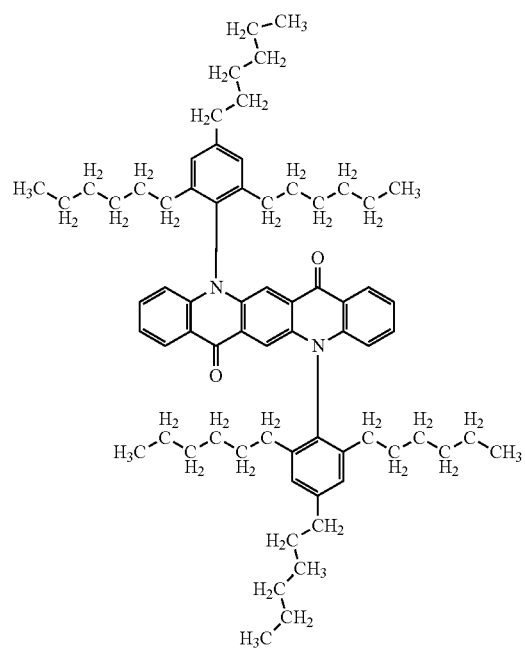
[Chemical Formulae 10]
(114)
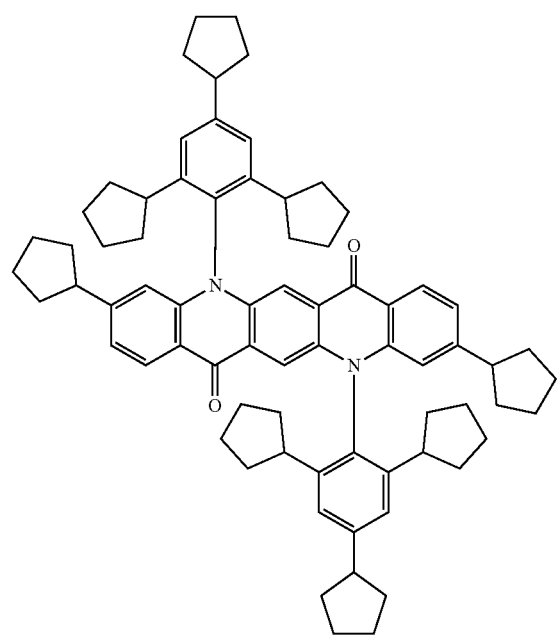
-continued
(115)
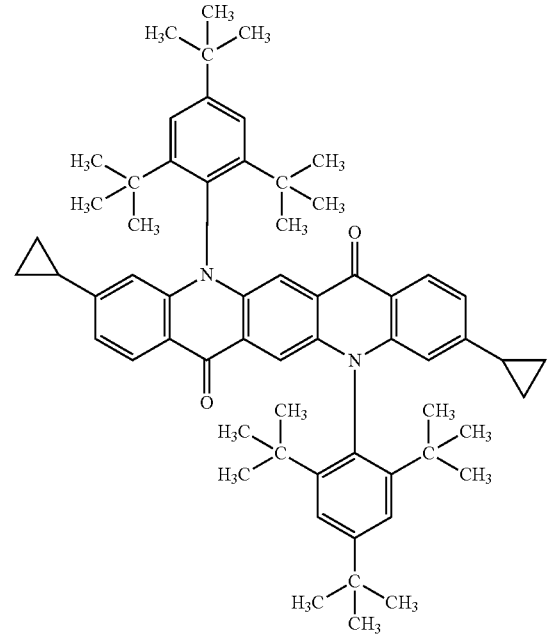
(116)
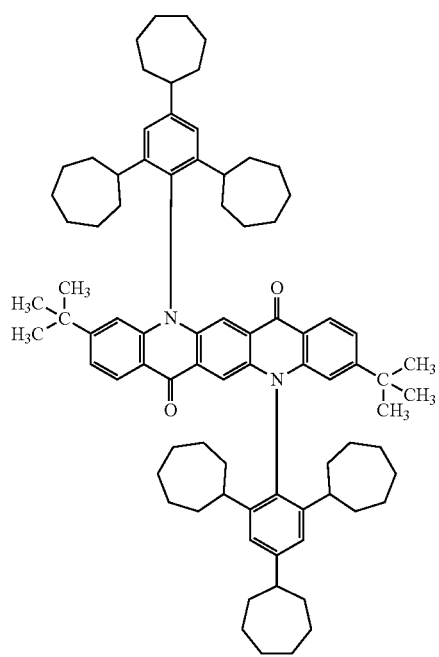

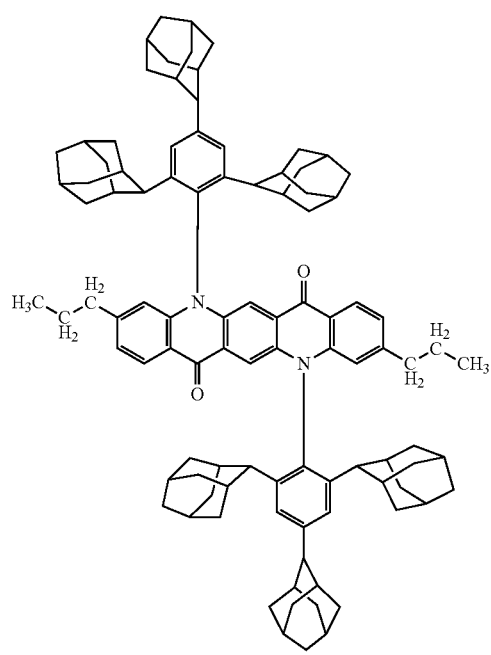
(117)
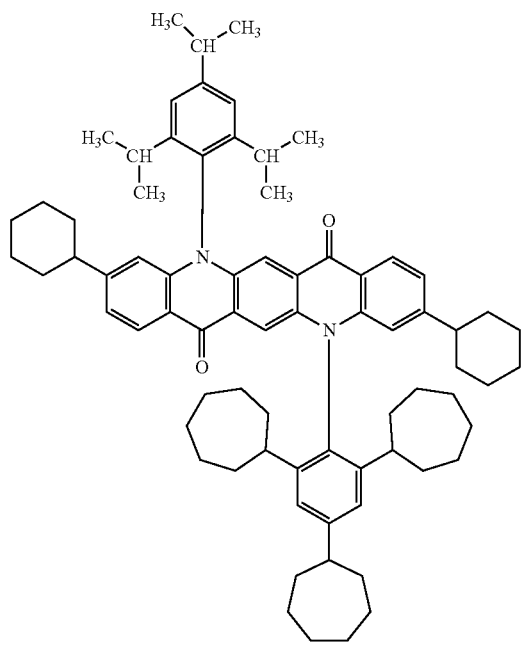
(119)
[Chemical Formulae 11]
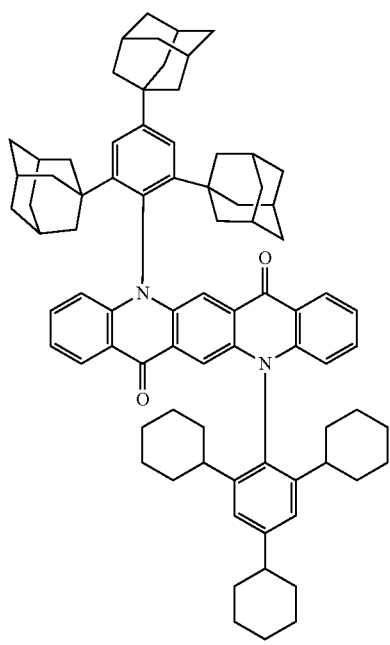
(118)
[Chemical Formulae 12]
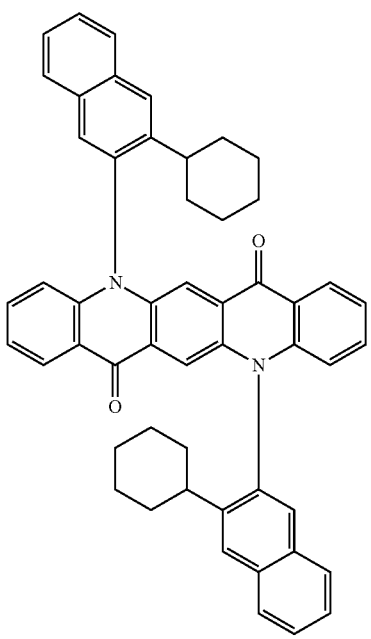
(120)

(121)
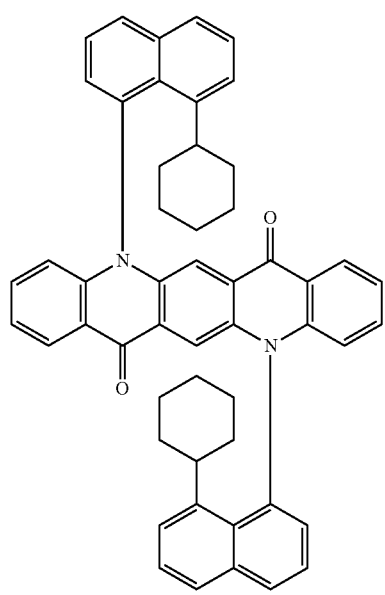
(122)
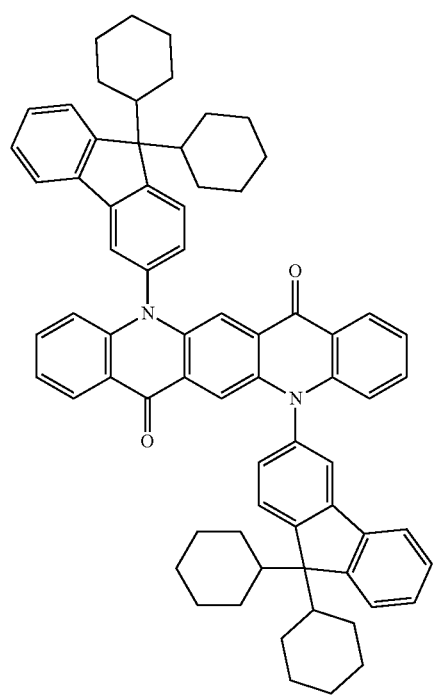
(123)
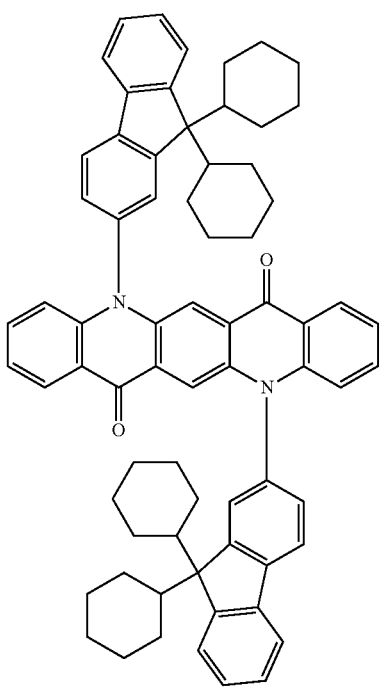
(124)
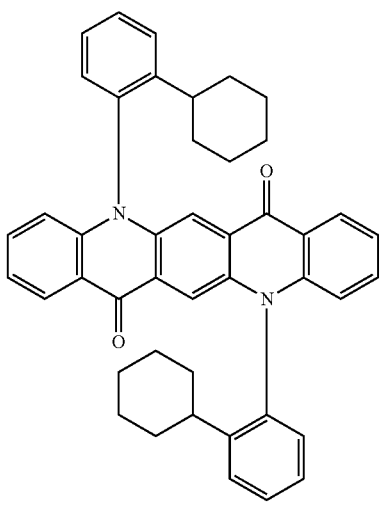
(125)
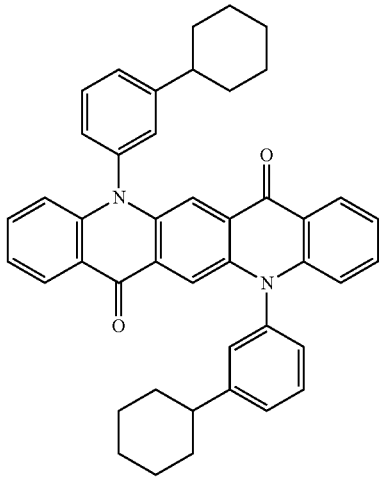

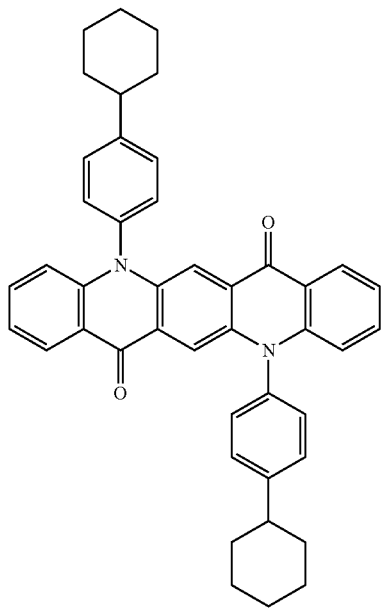
(126)
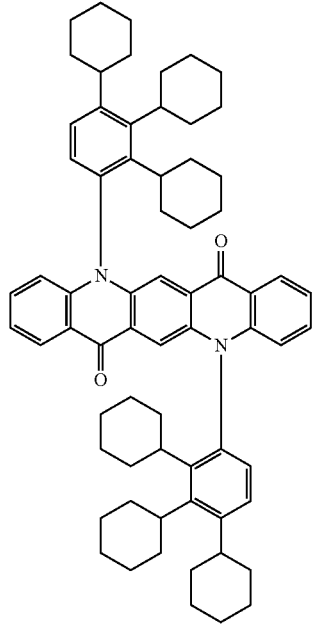
(128)
[Chemical Formulae 13]
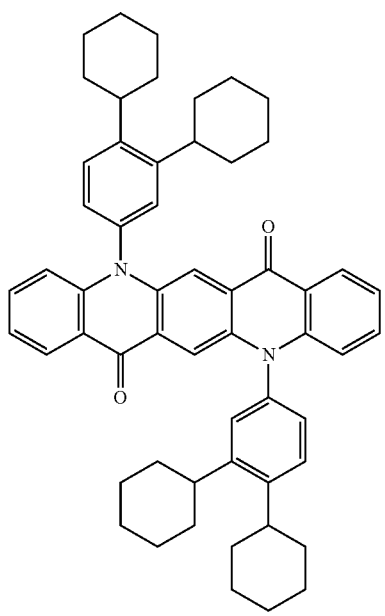
(127)
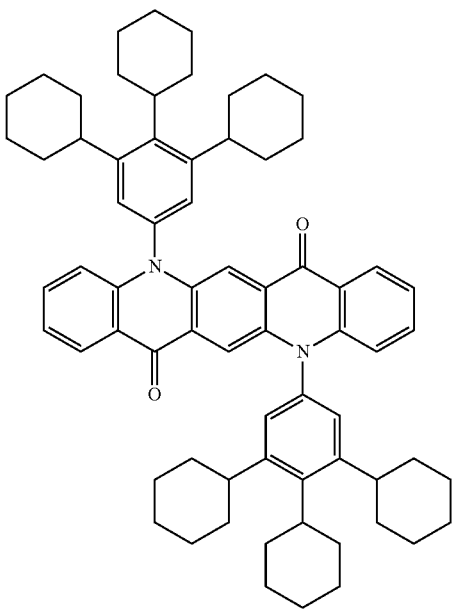
(129)

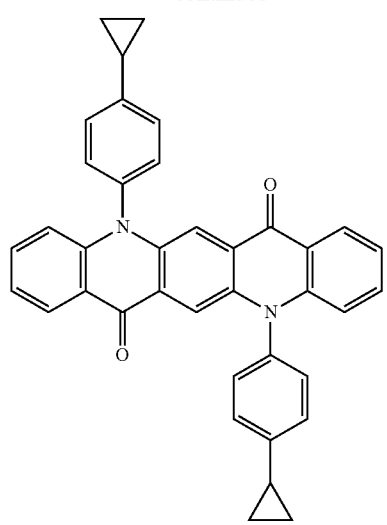
(130)
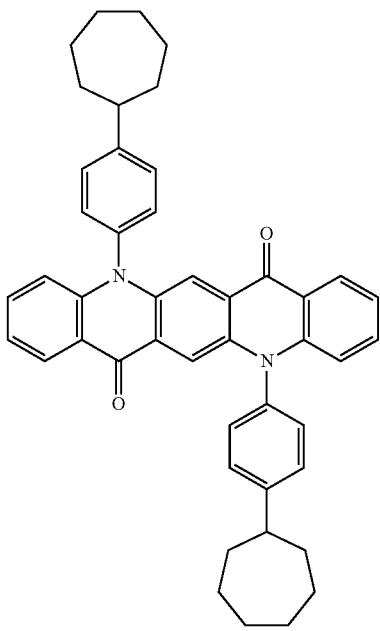
(132)
[Chemical Formulae 14]
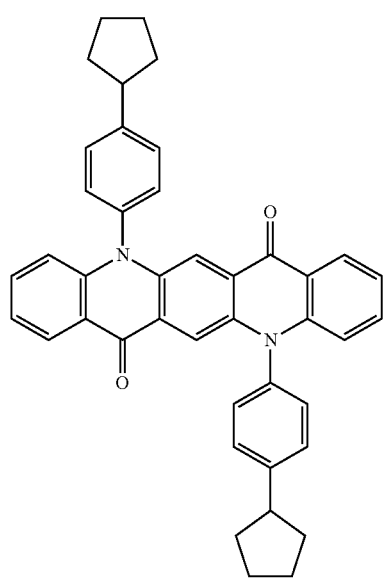
(131)
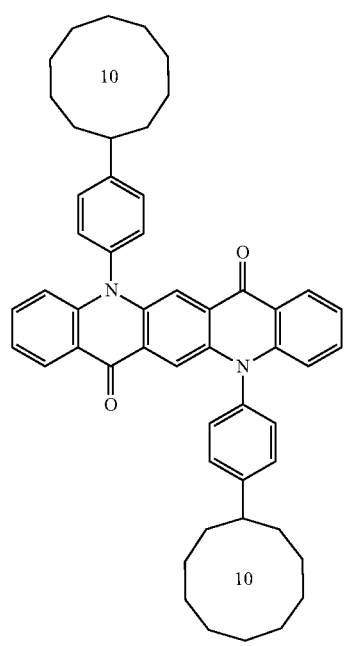
(133)

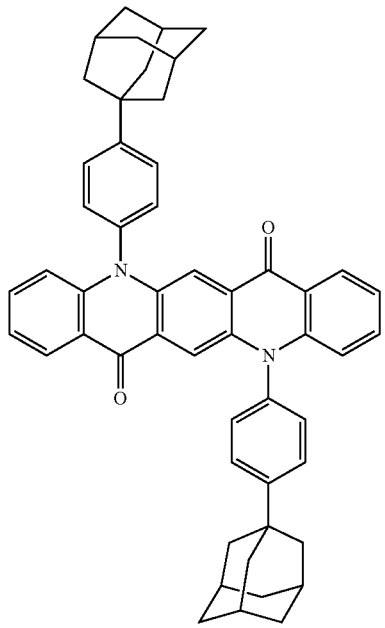
(134)
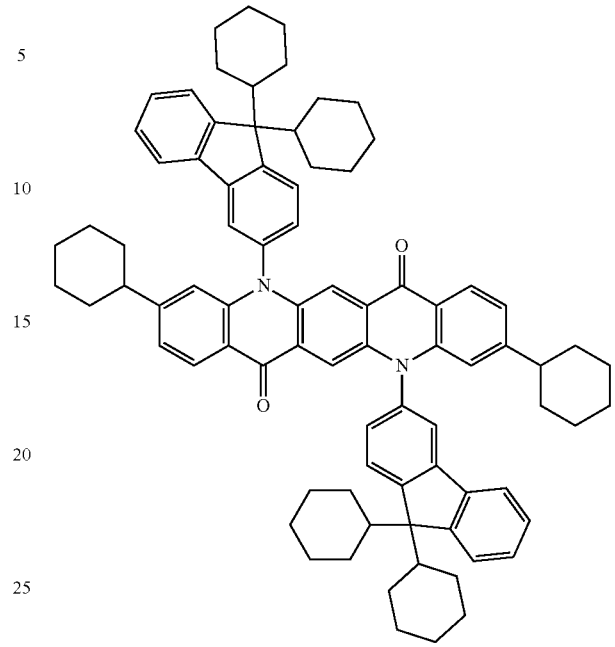
(136)
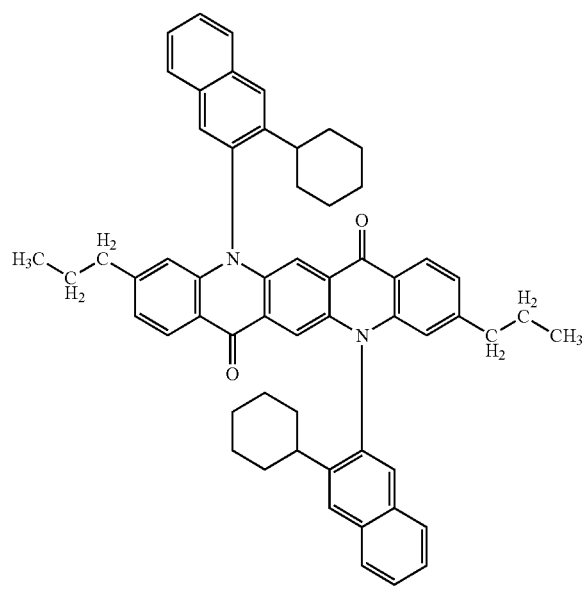
(135)
[Chemical Formulae 15]
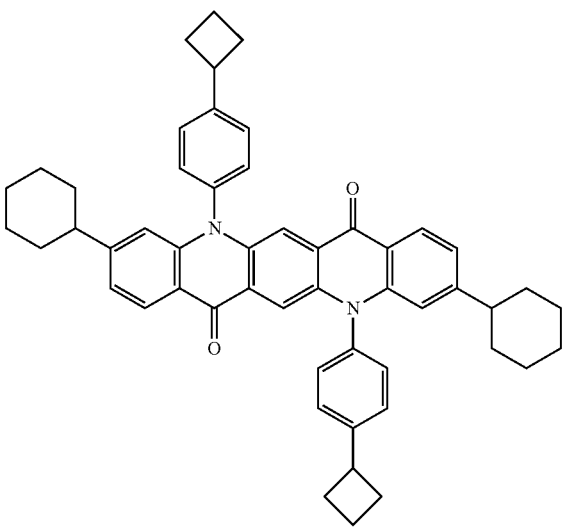
(137)

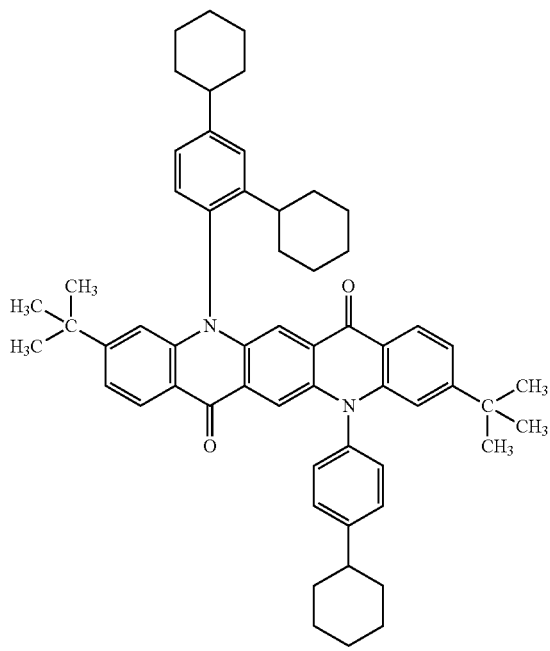

(138)

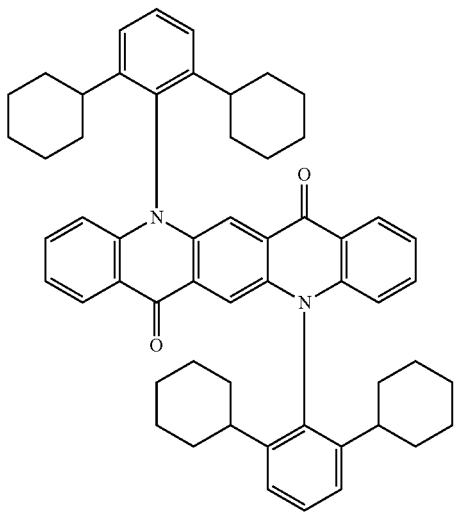

(139)

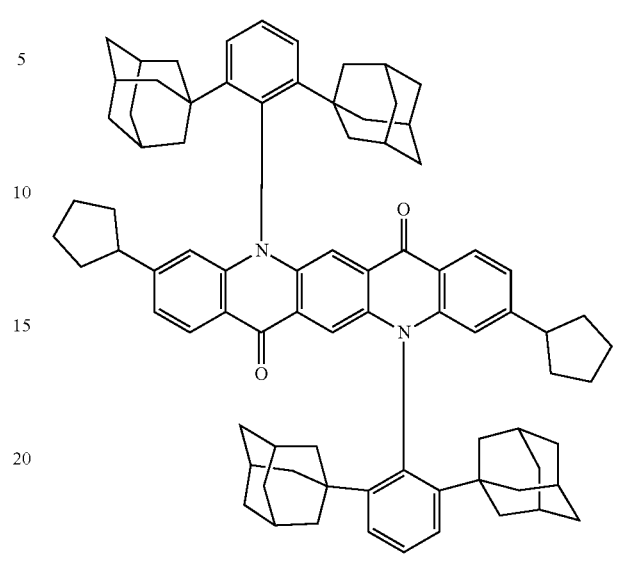

(140)

Next, an example of a method for synthesizing the above-described organic compound will be described giving the organic compounds represented by General Formulae (G1-1) and (G2) as examples.

<Method for Synthesizing Organic Compound Represented by General Formula (G1-1)>

The organic compound of one embodiment of the present invention represented by General Formula (G1-1) below can be synthesized by utilizing a variety of organic reactions, and two kinds of methods are shown below as examples.

[Chemical Formula 16]

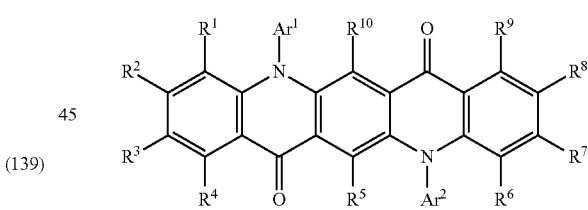

(G1-1)

In General Formula (G1-1) above, $R^1$ to $R^{10}$ each independently represent any one of hydrogen, an alkyl group having 3 to 10, inclusive, carbon atoms, and a cycloalkyl group having 3 to 10, inclusive, carbon atoms, and $Ar^1$ and $Ar^2$ each independently represent an aromatic hydrocarbon group having 6 to 13, inclusive, carbon atoms with a substituent. Note that $Ar^1$ and $Ar^2$ each include, as the substituent, one or more of a cycloalkyl group having 3 to 12, inclusive, carbon atoms and a cycloalkyl group having a bridge structure and having 7 to 10, inclusive, carbon atoms.

The first method is a method consists of Synthesis Schemes (S-1) to (S-6) below. In the first step, a dehydration condensation reaction of an aniline compound (compound 1) and a 1,4-cyclohexadiene-2,5-dicarboxylic acid compound (compound 2) gives an amine compound (compound 3). The step is shown in Scheme (S-1)

[Chemical Formulae 17]

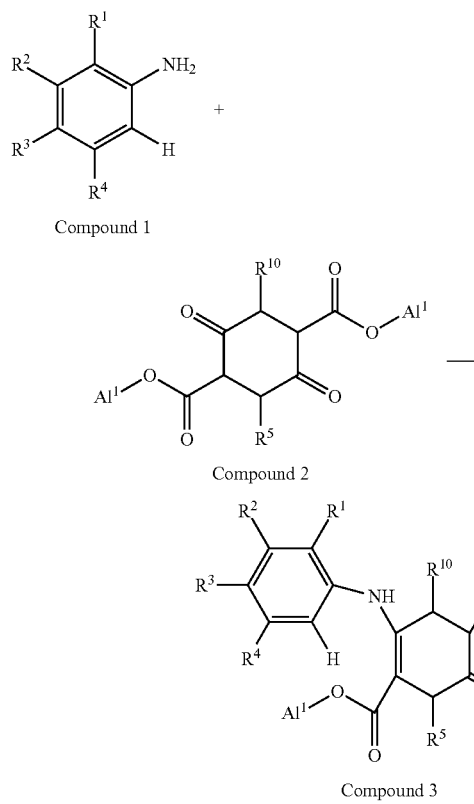

Compound 1

Compound 2

Compound 3

Next, a condensation reaction of an amine compound (compound 3) and an aniline derivative (compound 4) gives a 1,4-cyclohexadiene compound (compound 5). The step for obtaining the compound 5 is shown in Scheme (S-2).

[Chemical Formulae 18]

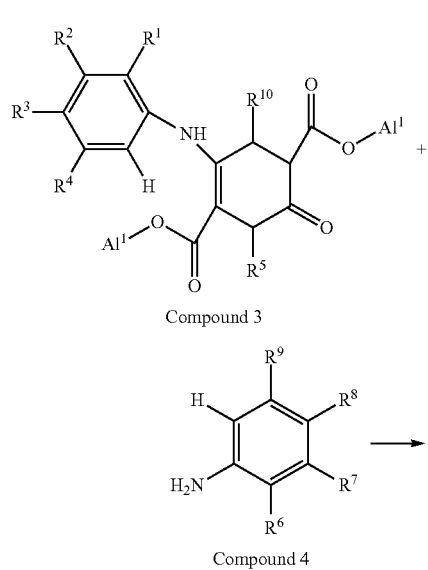

Compound 3

Compound 4

(S-1)

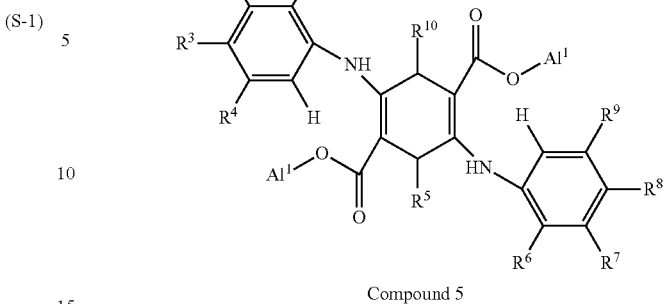

Compound 5

Note that in the case where an amino group having the same structure is introduced in the 1,4-cyclohexadiene compound (compound 5), the reaction is preferably performed with two equivalents of the aniline compound (compound 1) in Synthesis Scheme (S-1). In that case, one object can be obtained even when a carbonyl group of the compound 2 does not have reaction selectivity.

Then, the 1,4-cyclohexadiene compound (compound 5) is oxidized in the air, whereby a terephthalic acid compound (compound 6) can be obtained. The step for obtaining the compound 6 is shown in Scheme (S-3).

[Chemical Formulae 19]

(S-3)

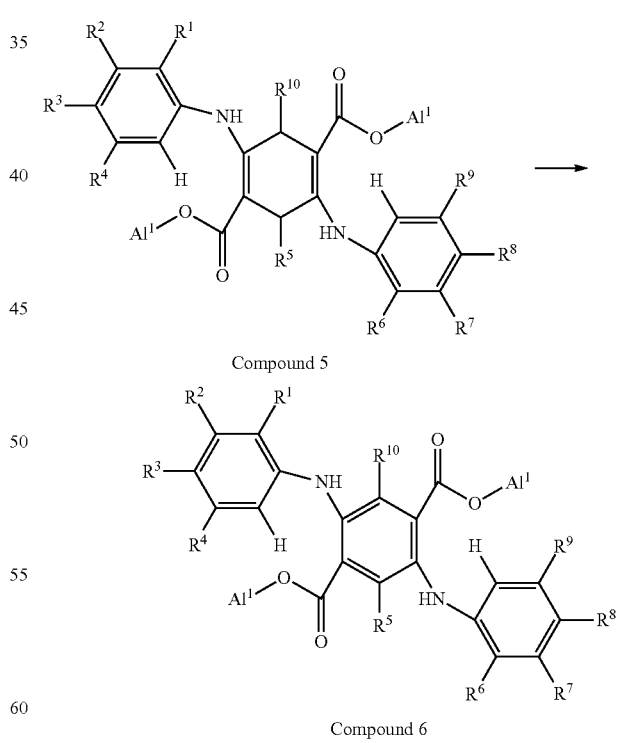

Compound 5

Compound 6

Next, the terephthalic acid compound (compound 6) is intramolecularly cyclized using acid, whereby a quinacridone compound (compound 7) can be obtained. The step for obtaining the compound 7 is shown in Scheme (S-4).

[Chemical Formulae 20]

(S-4)

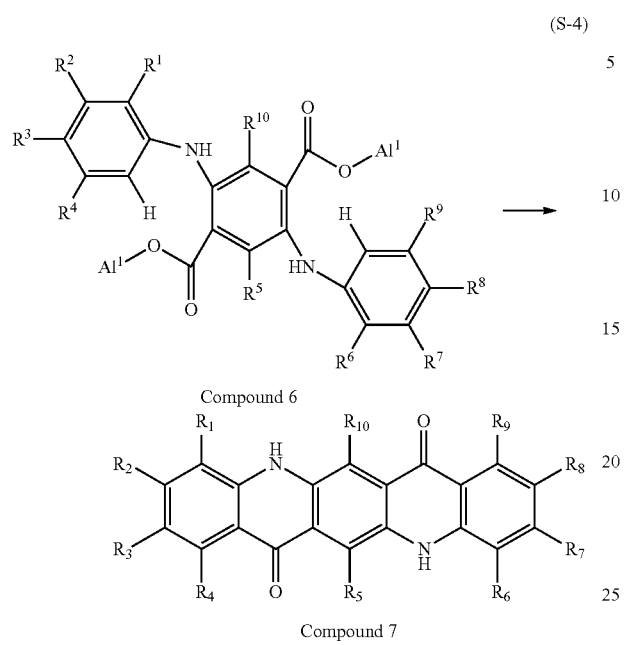

Compound 6

Compound 7

After that, the quinacridone compound (compound 7) and a halogenated aryl compound (compound 8) are coupled, whereby a quinacridone compound (compound 9) can be obtained. The step for obtaining the compound 9 is shown in Scheme (S-5).

[Chemical Formulae 21]

(S-5)

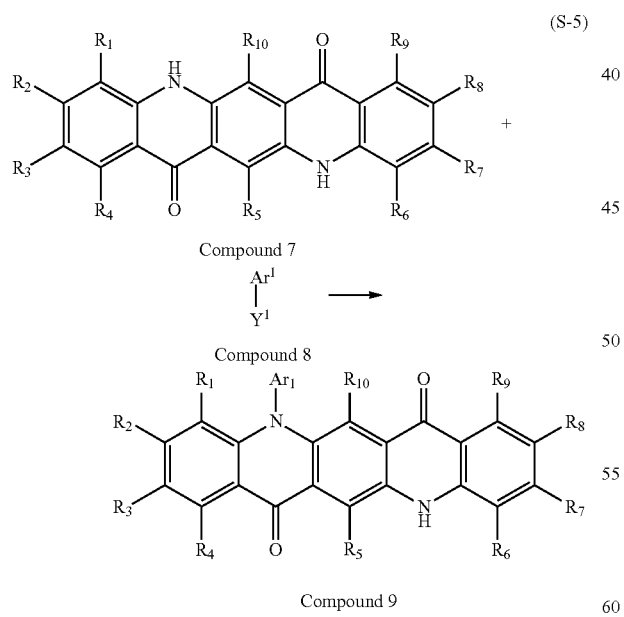

Compound 7

Compound 8

Compound 9

After that, the quinacridone compound (compound 9) and a halogenated aryl compound (compound 10) are coupled, whereby the organic compound represented by General Formula (G1-1) above can be obtained. The step is shown in Scheme (S-6).

[Chemical Formulae 22]

(S-6)

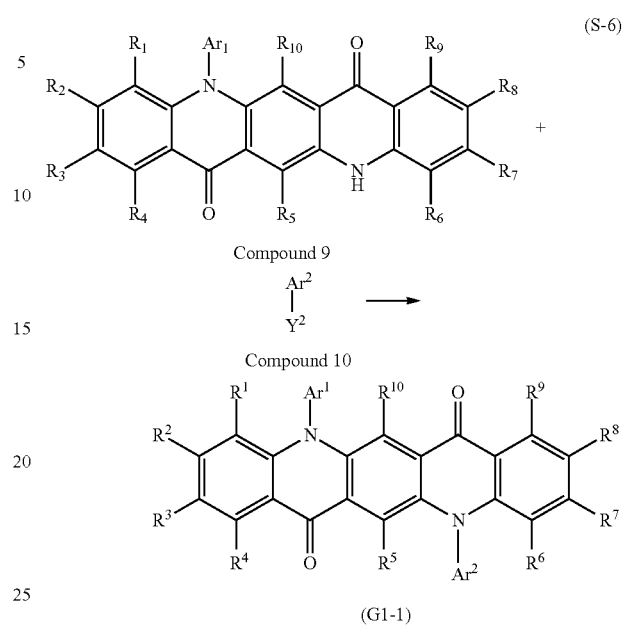

Compound 9

Compound 10

(G1-1)

In the case where $Ar^1$ and $Ar^2$ in General Formula (G1-1) have the same structure, the two same halogenated aryl compounds (compounds 8) can be coupled in Scheme (S-5), so that the reaction is preferably performed with two equivalents of the halogenated aryl compound (compound 8). In that case, one object can be obtained even when an amino group of the compound 7 does not have reaction selectivity.

The second method consists of Synthesis Schemes (S-1) to (S-3) and (S-7) to (S-9) below. The description of (S-1) to (S-3) is as described above.

The terephthalic acid compound (compound 6) obtained by Scheme (S-3) and the halogenated aryl compound (compound 8) are coupled, whereby a diamine compound (compound 11) can be obtained. The step for obtaining the compound 11 is shown in Scheme (S-7).

[Chemical Formulae 23]

(S-7)

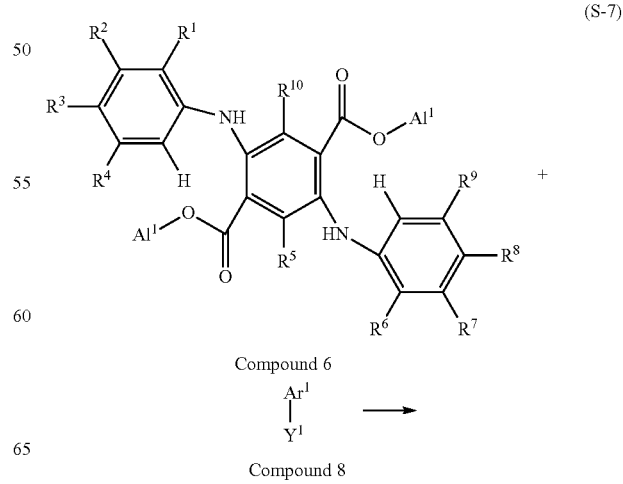

Compound 6

Compound 8

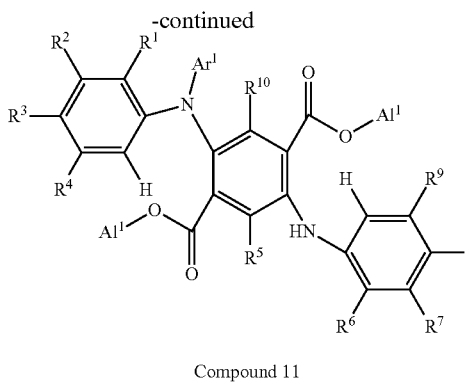

Compound 11

Next, the diamine compound (compound 11) and the halogenated aryl compound (compound 10) are coupled, whereby a diamine compound (compound 12) can be obtained. The step for obtaining the compound 12 is shown in Scheme (S-8).

[Chemical Formulae 24]

(S-8)

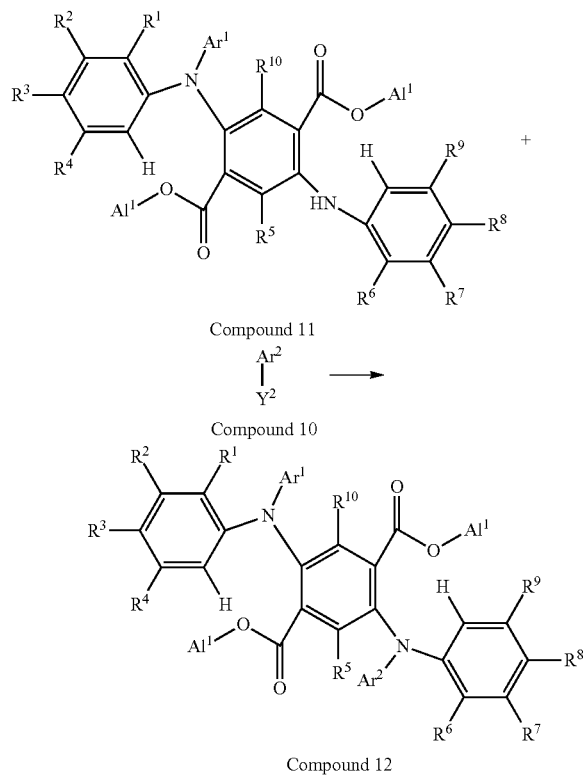

Compound 12

In the case where $Ar^1$ and $Ar^2$ in the diamine compound (compound 12) have the same structure, the two same halogenated aryl compound molecules can be coupled with the terephthalic acid compound (compound 6) in one step, so that the reaction is preferably performed with two equivalents of the halogenated aryl compound (compound 8). In that case, one object can be obtained even when an amino group of the compound 6 does not have reaction selectivity.

Finally, a ring of the diamine compound (compound 12) is fused using acid, whereby the organic compound represented by General Formula (G1-1) above can be obtained. The step is shown in Scheme (S-9).

[Chemical Formulae 25]

(S-9)

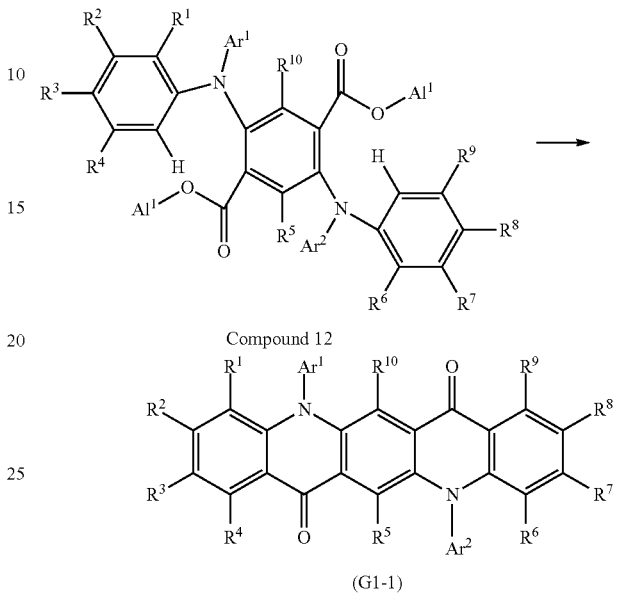

Compound 12

(G1-1)

The diamine compound (compound 12) having a symmetrical structure is used in Scheme (S-9), whereby the organic compound represented by General Formula (G1-1) above can be synthesized.

In Synthesis Schemes (S-1) to (S-4) and (S-7) to (S-9), $Al^1$ represents an alkyl group having 1 to 4, inclusive, carbon atoms.

In Synthesis Schemes (S-5) to (S-8), $Y^1$ and $Y^2$ each represent chlorine, bromine, iodine, or a triflate group.

Although the oxidation in Synthesis Scheme (S-3) can be performed with oxygen in the air, iodine or the like is preferably used as an oxidizer.

In Synthesis Schemes (S-5) to (S-8), the Ullmann reaction is preferably performed because the reaction can proceed at high temperatures and a target compound can be obtained in a relatively high yield. In the reaction, copper or a copper compound can be used as a reagent, and an inorganic base such as potassium carbonate or sodium hydride can be used as a base. Examples of the solvent that can be used in the reaction include 2,2,6,6-tetramethyl-3,5-heptanedione, 1,3-dimethyl-3,4,5,6-tetrahydro-2(1H)pyrimidinone (DMPU), toluene, xylene, benzene, and diphenyl ether. In the Ullmann reaction, a target substance can be obtained in a shorter time and in a higher yield when the reaction temperature is 100° C. or higher; therefore, it is preferable to use 2,2,6,6-tetramethyl-3,5-heptanedione, DMPU, xylene, or diphenyl ether, which has high boiling temperatures. A reaction temperature of 150° C. or higher is further preferred, and accordingly, DMPU or diphenyl ether is further preferably used. Reagents that can be used in the reaction are not limited to the above-described reagents.

In Synthesis Schemes (S-5) to (S-8), the Buchwald-Hartwig reaction using a palladium catalyst can be performed. In the reaction, a palladium compound such as bis(dibenzylideneacetone)palladium(0), palladium(II) acetate, [1,1-bis(diphenylphosphino)ferrocene]palladium (II) dichloride, tetrakis(triphenylphosphine)palladium(0), or allylpalladium(II) chloride (dimer) and a ligand such as tri(tert-butyl)phosphine, tri(n-hexyl)phosphine, tricyclohexylphosphine, di(1-adamantyl)-n-butylphosphine, 2-dicyclohexylphosphino-2',6'-dimethoxybiphenyl, tri(ortho-tolyl)phosphine, or (S)-(6,6'-dimethoxybiphenyl-2,2'-diyl)bis(diisopropylphosphine) (abbreviation: cBRIDP (registered trademark)) can be used. In the reaction, an organic base such as sodium tert-butoxide, an inorganic base such as potassium carbonate, cesium carbonate, or sodium carbonate, or the like can be used. In the reaction, toluene, xylene, benzene, tetrahydrofuran, dioxane, or the like can be used as a solvent. Reagents that can be used in the reaction are not limited to the above-described reagents.

The method for synthesizing the organic compound represented by General Formula (G1-1) of the present invention is not limited to Synthesis Schemes (S-1) to (S-9).

In General Formula (G1-1), $R^1$ to $R^{10}$ each independently represent any one of hydrogen, an alkyl group having 3 to 10, inclusive, carbon atoms, and a substituted or unsubstituted cycloalkyl group having 3 to 10, inclusive, carbon atoms. Specific examples include hydrogen, an n-propyl group, an isopropyl group, an n-butyl group, an isobutyl group, a tert-butyl group, a cyclopropyl group, an n-hexyl group, a cyclobutyl group, a cyclopentyl group, a cyclohexyl group, a cycloheptyl group, a cyclooctyl group, a cyclononanyl group, and a cyclodecyl group.

In General Formula (G1-1), $Ar^1$ and $Ar^2$ each independently represent an aromatic hydrocarbon group having 6 to 13, inclusive, carbon atoms with a substituent. Note that $Ar^1$ and $Ar^2$ each include, as the substituent, one or more of a cycloalkyl group having 3 to 12, inclusive, carbon atoms and a cycloalkyl group having a bridge structure and having 7 to 10, inclusive, carbon atoms. Specific examples include a 2-cyclopropylphenyl group, a 2-cyclobutylphenyl group, a 2-cyclopentylphenyl group, a 2-cyclohexyphenyl group, a 2-cycloheptylphenyl group, a 2-cyclooctylphenyl group, a 2-adamantylphenyl group, a 2-norbornanylphenyl group, a 2-tetrahydrodicyclopentadienylphenyl group, a 3-cyclopropylphenyl group, a 3-cyclobutylphenyl group, a 3-cyclopentylphenyl group, a 3-cyclohexylphenyl group, a 3-cycloheptylphenyl group, a 3-cyclooctylphenyl group, a 3-adamantylphenyl group, a 3-norbornanylphenyl group, a 3-tetrahydrodicyclopentadienylphenyl group, a 4-cyclopropylphenyl group, a 4-cyclobutylphenyl group, a 4-cyclopentylphenyl group, a 4-cyclohexylphenyl group, a 4-cycloheptylphenyl group, a 4-cyclooctylphenyl group, a 4-adamantylphenyl group, a 4-norbornanylphenyl group, a 4-tetrahydrodicyclopentadienylphenyl group, a 1,3-dicyclopropylphenyl group, a 1,3-dicyclobutylphenyl group, a 1,3-dicyclopentylphenyl group, a 1,3-dicyclohexylphenyl group, a 1,3-dicycloheptylphenyl group, a 1,3-dicyclooctylphenyl group, a 1,3-diadamantylphenyl group, a 1,3-dinorbornanylphenyl group, a 1,3-ditetrahydrodicyclopentadienylphenyl group, a 1,5-dicyclopropylphenyl group, a 1,5-dicyclobutylphenyl group, a 1,5-dicyclopentylphenyl group, a 1,5-dicyclohexylphenyl group, a 1,5-dicycloheptylphenyl group, a 1,5-dicyclooctylphenyl group, a 1,5-diadamantylphenyl group, a 1,5-dinorbomanylphenyl group, a 1,5-ditetrahydrodicyclopentadienylphenyl group, a 3,4-dicyclopropylphenyl group, a 3,4-dicyclobutylphenyl group, a 3,4-dicyclopentylphenyl group, a 3,4-dicyclohexylphenyl group, a 3,4-dicycloheptylphenyl group, a 3,4-dicyclooctylphenyl group, a 3,4-diadamantylphenyl group, a 3,4-dinorbomanylphenyl group, a 3,4-ditetrahydrodicyclopentadienylphenyl group, a 4-tricyclopentylphenyl group, a 2,3,4-tricyclohexylphenyl group, a 2,3,4-tricycloheptylphenyl group, a 2,3,4-tricyclooctylphenyl group, a 2,3,4-triadamantylphenyl group, a 2,3,4-trinorbomanylphenyl group, a 2,3,4-tritetrahydrodicyclopentadienylphenyl group, a 3,4,5-tricyclopropylphenyl group, a 3,4,5-tricyclobutylphenyl group, a 3,4,5-tricyclopentylphenyl group, a 3,4,5-tricyclohexylphenyl group, a 3,4,5-tricycloheptylphenyl group, a 3,4,5-tricyclooctylphenyl group, a 3,4,5-triadamantylphenyl group, a 3,4,5-trinorbomanylphenyl group, a 3,4,5-tritetrahydrodicyclopentadienylphenyl group, a 3-cyclohexyl-2-naphthyl group, an 8-cyclohexyl-1-naphthyl group, a 9,9-dicyclohexyl-9H-fluoren-3-yl group, and 9,9-dicyclohexyl-9H-fluoren-2-yl group.

The method for synthesizing the organic compound represented by General Formula (G1-1) of the present invention is not limited to Synthesis Schemes (S-1) to (S-9).

<Method for Synthesizing Organic Compound Represented by General Formula (G2)>

The organic compound of one embodiment of the present invention represented by General Formula (G2) below can be synthesized by utilizing a variety of organic reactions. Two kinds of methods are shown below as examples.

[Chemical Formula 26]

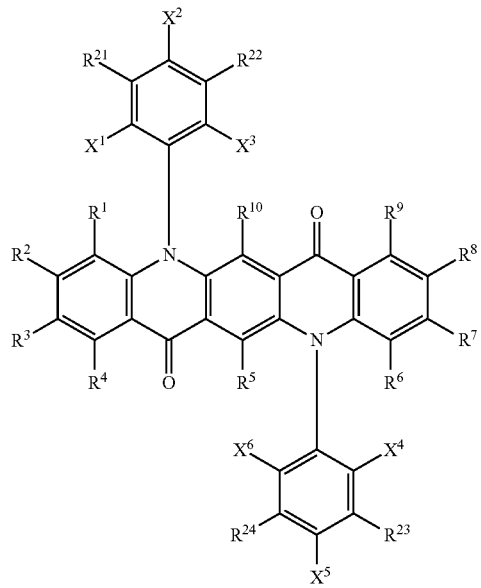

(G2)

The first method consists of Synthesis Schemes (S-1) to (S-4), (S-10), and (S-11) below. The description of (S-1) to (S-4) is as described above. After Synthesis Scheme (S-4), the quinacridone compound (compound 7) and a halogenated aryl compound (compound 13) are coupled, whereby a quinacridone compound (compound 14) can be obtained. The step for obtaining the compound 14 is shown in Scheme (S-10). Note that in the case where the two same halogenated aryl compounds (compounds 13) can be coupled and an amino group having the same structure is introduced in one step, the reaction is preferably performed with two equivalents of the halogenated aryl compound (compound 13). In that case, one object can be obtained even when an amino group of the compound 7 does not have reaction selectivity.

[Chemical Formulae 27]

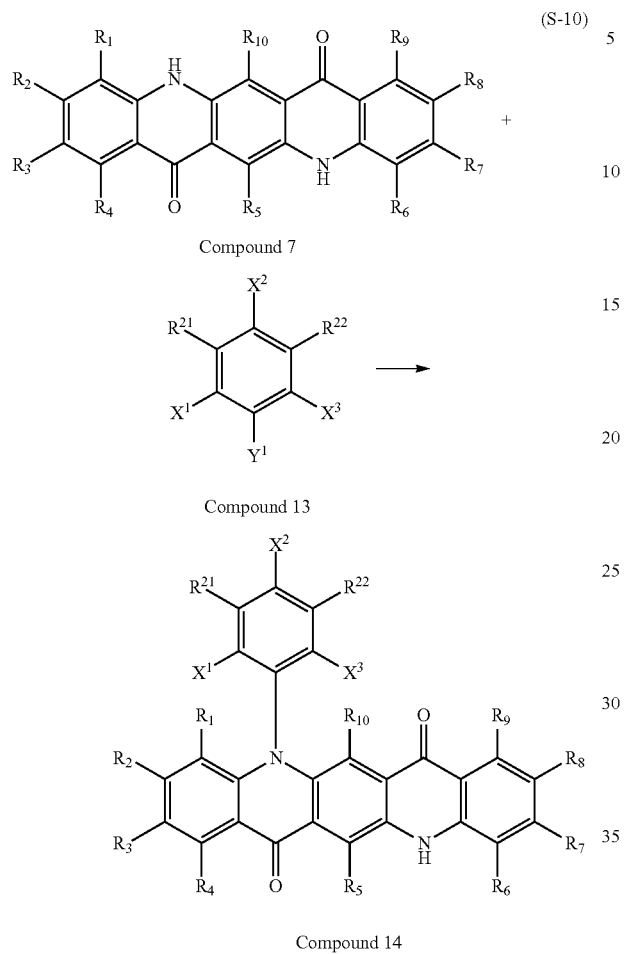

Next, the quinacridone compound (compound 14) and a halogenated aryl compound (compound 15) are coupled, whereby the organic compound represented by General Formula (G2) above can be obtained. The step is shown in Scheme (S-11).

[Chemical Formulae 28]

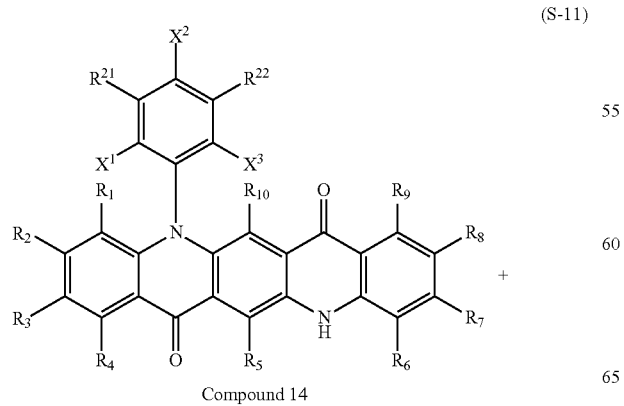

In the case where the substituents on the phenyl groups in the compound (G2) have the same structure, the two same halogenated aryl compounds (compounds 13) can be coupled in Scheme (S-10), so that the reaction is preferably performed with two equivalents of the halogenated aryl compound (compound 13). In that case, one object can be obtained even when an amino group of the compound 7 does not have reaction selectivity.

The second method consists of Synthesis Schemes (S-1) to (S-3) and (S-12) to (S-14) below. The description of (S-1) to (S-3) is as described above. After (S-3), the terephthalic acid compound (compound 6) and the halogenated aryl compound (compound 13) are coupled, whereby a diamine compound (compound 16) can be obtained. The step for obtaining the compound 16 is shown in Scheme (S-12).

[Chemical Formulae 29]

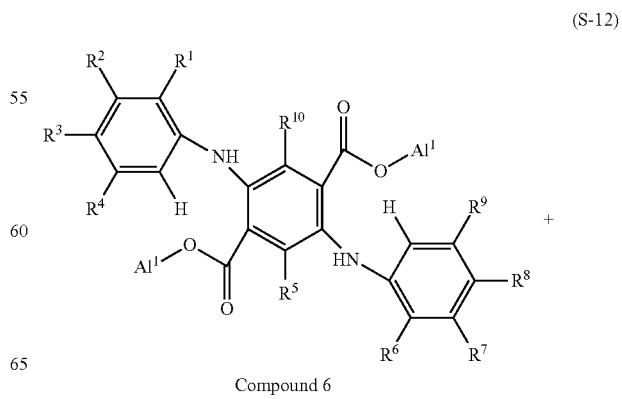

-continued

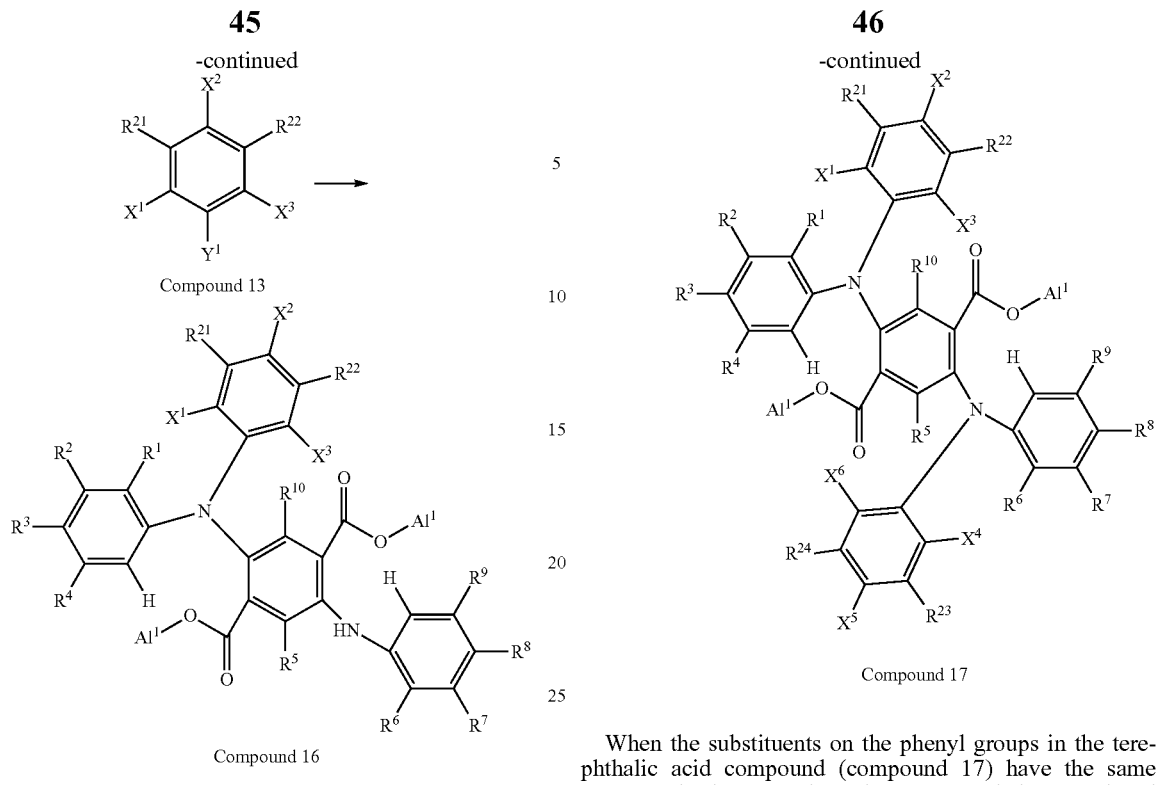

Compound 13

Compound 16

Next, the diamine compound (compound 16) and the halogenated aryl compound (compound 15) are coupled, whereby a diamine compound (compound 17) can be obtained. The step for obtaining the compound 17 is shown in Scheme (S-13).

[Chemical Formulae 30]

(S-13)

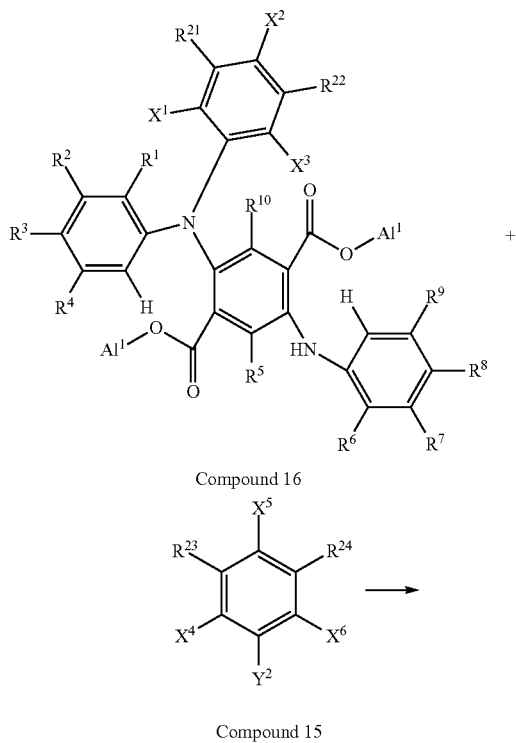

Compound 16

Compound 15

Compound 17

When the substituents on the phenyl groups in the terephthalic acid compound (compound 17) have the same structure, in the case where the two same halogenated aryl compound molecules can be coupled and an amino group having the same structure is introduced in one step, the reaction is preferably performed with two equivalents of the halogenated aryl compound (compound 13). In that case, one object can be obtained even when an amino group of the compound 6 does not have reaction selectivity.

Finally, a ring of the terephthalic acid compound (compound 17) is fused using acid, whereby the organic compound represented by General Formula (G2) above can be obtained. The step is shown in Scheme (S-14).

[Chemical Formulae 31]

(S-14)

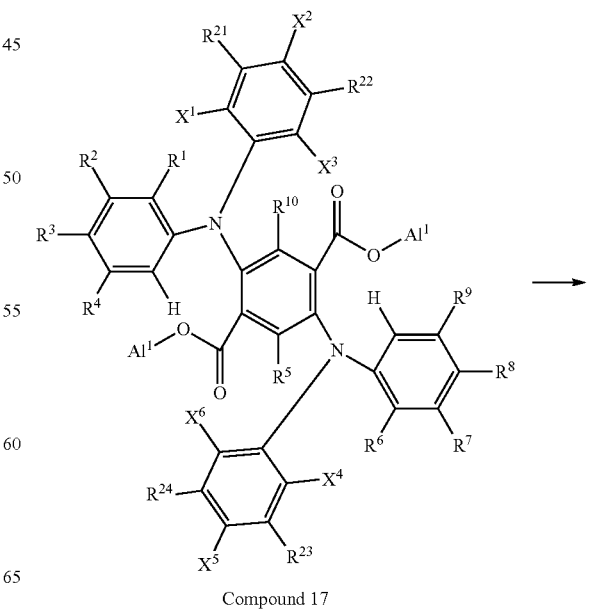

Compound 17

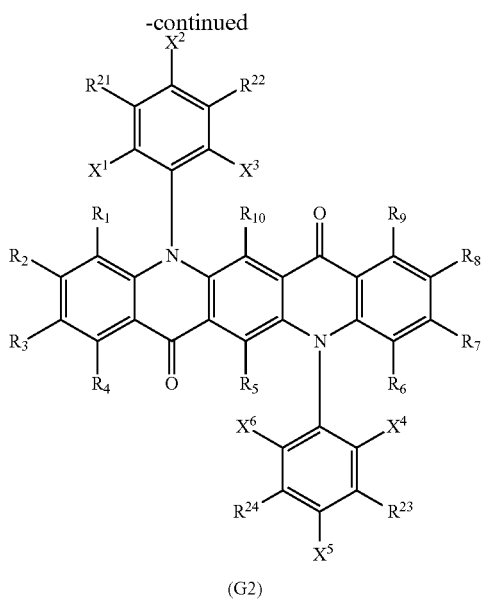

(G2)

In Synthesis Schemes (S-1) to (S-4) and (S-12) to (S-14), $Al^1$ represents an alkyl group having 1 to 4, inclusive, carbon atoms.

In Synthesis Schemes (S-10) to (S-13), $Y^1$ and $Y^2$ each represent fluorine, chlorine, bromine, iodine, or a triflate group.

In Synthesis Schemes (S-10) to (S-13), the Ullmann reaction is preferably performed because the reaction can proceed at high temperatures and a target compound can be obtained in a relatively high yield. In the reaction, copper or a copper compound can be used as a reagent, and an inorganic base such as potassium carbonate or sodium hydride can be used as a base. Examples of the solvent that can be used in the reaction include 2,2,6,6-tetramethyl-3,5-heptanedione, 1,3-dimethyl-3,4,5,6-tetrahydro-2(1H)pyrimidinone (DMPU), toluene, xylene, benzene, and diphenyl ether. In the Ullmann reaction, a target substance can be obtained in a shorter time and in a higher yield when the reaction temperature is 100° C. or higher; therefore, it is preferable to use 2,2,6,6-tetramethyl-3,5-heptanedione, DMPU, xylene, or diphenyl ether, which has high boiling temperatures. A reaction temperature of 150° C. or higher is further preferred, and accordingly, DMPU or diphenyl ether is further preferably used. Reagents that can be used in the reaction are not limited to the above-described reagents.

In Synthesis Schemes (S-10) to (S-13), the Buchwald-Hartwig reaction using a palladium catalyst can be performed. In the reaction, a palladium compound such as bis(dibenzylideneacetone)palladium(0), palladium(II) acetate, [1,1-bis(diphenylphosphino)ferrocene] palladium (II) dichloride, tetrakis(triphenylphosphine)palladium(0), or allylpalladium(II) chloride (dimer) and a ligand such as tri(tert-butyl)phosphine, tri(n-hexyl)phosphine, tricyclohexylphosphine, di(1-adamantyl)-n-butylphosphine, 2-dicyclohexylphosphino-2',6'-dimethoxybiphenyl, tri(ortho-tolyl) phosphine, or (S)-(6,6'-dimethoxybiphenyl-2,2'-diyl)bis (diisopropylphosphine) (abbreviation: cBRIDP (registered trademark)) can be used. In the reaction, an organic base such as sodium tert-butoxide, an inorganic base such as potassium carbonate, cesium carbonate, or sodium carbonate, or the like can be used. In the reaction, toluene, xylene, benzene, tetrahydrofuran, dioxane, or the like can be used as a solvent. Reagents that can be used in the reaction are not limited to the above-described reagents.

The method for synthesizing the organic compound represented by General Formula (G2) of the present invention is not limited to Synthesis Schemes (S-1) to (S-4) and (S-10) to (S-14).

In General Formula (G2) above, $R^1$ to $R^{10}$ and $R^{21}$ to $R^{24}$ each independently represent any one of hydrogen, an alkyl group having 3 to 10, inclusive, carbon atoms, and a substituted or unsubstituted cycloalkyl group having 3 to 10, inclusive, carbon atoms. Specific examples include hydrogen, an n-propyl group, an isopropyl group, an n-butyl group, an isobutyl group, a tert-butyl group, an n-hexyl group, a cyclopropyl group, a cyclobutyl group, a cyclopentyl group, a cyclohexyl group, a cycloheptyl group, a cyclooctyl group, a cyclononanyl group, and a cyclodecyl group.

In General Formula (G2) above, $X^1$ to $X^3$ and $X^4$ to $X^6$ each independently represent any one of an alkyl group having 1 to 10, inclusive, carbon atoms, a cycloalkyl group having 3 to 12, inclusive, carbon atoms, and a cycloalkyl group having a bridge structure and having 7 to 10, inclusive, carbon atoms. Specific examples include an n-propyl group, an isopropyl group, an n-butyl group, an isobutyl group, a tert-butyl group, an n-hexyl group, a cyclopropyl group, a cyclobutyl group, a cyclopentyl group, a cyclohexyl group, a cycloheptyl group, a cyclooctyl group, a cyclononanyl group, a cyclodecyl group, an adamantyl group, a norbornanyl group, and a tetrahydrodicyclopentadienyl group.

The above is the description of the methods for synthesizing the organic compounds which are embodiments of the present invention and are represented by General Formula (G1-1) and General Formula (G2); however, the present invention is not limited thereto and the synthesis may be performed by another synthesis method.

Embodiment 2

A light-emitting device of one embodiment of the present invention will be described below with reference to FIG. 1 to FIG. 6.

<Structure Example of Light-Emitting Device>

First, the structure of the light-emitting device of one embodiment of the present invention will be described below with reference to FIG. 1.

FIG. 1A is a schematic cross-sectional view of a light-emitting device 150 of one embodiment of the present invention.

The light-emitting device 150 includes a pair of electrodes (an electrode 101 and an electrode 102) and an EL layer 100 provided between the pair of electrodes. The EL layer 100 includes at least a light-emitting layer 130.

The EL layer 100 illustrated in FIG. 1A includes functional layers such as a hole-injection layer 111, a hole-transport layer 112, an electron-transport layer 118, and an electron-injection layer 119, in addition to the light-emitting layer 130.

Note that in this embodiment, although description is given assuming that the electrode 101 and the electrode 102 of the pair of electrodes serve as an anode and a cathode, respectively, the structure of the light-emitting device 150 is not limited thereto. That is, the electrode 101 may serve as a cathode, the electrode 102 may serve as an anode, and the stacking order of layers between the electrodes may be reversed. In other words, the hole-injection layer 111, the hole-transport layer 112, the light-emitting layer 130, the electron-transport layer 118, and the electron-injection layer 119 may be stacked in this order from the anode side.

The structure of the EL layer 100 is not limited to the structure illustrated in FIG. 1A, as long as at least one selected from the hole-injection layer 111, the hole-transport layer 112, the electron-transport layer 118, and the electron-injection layer 119 is included. Alternatively, the EL layer 100 may have a structure including a functional layer such as a layer that lowers a hole- or electron-injection barrier, a layer that improves a hole- or electron-transport property, a layer that inhibits a hole- or electron-transport property, or a layer that inhibits a quenching phenomenon by an electrode. Note that the functional layers may each be a single layer or have a structure in which a plurality of layers are stacked.

<Light Emission Mechanism of Light-Emitting Device>

Next, a light emission mechanism of the light-emitting layer 130 will be described below. The light-emitting device 150 of one embodiment of the present invention is a light-emitting device containing in a light-emitting layer a host material capable of converting triplet excitation energy into light emission and a guest material (fluorescent material) capable of converting singlet excitation energy into light emission. By using the host material capable of converting triplet excitation energy into light emission, triplet excitons can be made to contribute to light emission and the emission efficiency of the light-emitting device can be improved. In addition, since the guest material is a stable fluorescent material, a light-emitting device with a long lifetime can be achieved.

As one of the materials that have a function of converting triplet excitation energy into light emission, a compound that can emit phosphorescent light (hereinafter, also referred to as a phosphorescent material) can be given. A phosphorescent material in this specification and the like is a compound that exhibits phosphorescent light and exhibits no fluorescent light at a temperature in the temperature range lower than or equal to room temperature. The phosphorescent material is preferably a compound containing a metal element with large spin-orbit interaction, specifically a compound containing a transition metal element. In particular, a compound containing a platinum group element (ruthenium (Ru), rhodium (Rh), palladium (Pd), osmium (Os), iridium (Ir), or platinum (Pt)) is preferable. Especially, iridium is preferable because the transition probability relating to direct transition between a singlet ground state and a triplet excited state of the phosphorescent material can be increased.

As the material that has a function of converting triplet excitation energy into light emission, a TADF material is can also be given. The TADF material is a material having a small difference between the S1 level and the T1 level and capable of converting triplet excitation energy into singlet excitation energy by reverse intersystem crossing. Thus, with use of the TADF material, a singlet excited state can be efficiently generated from a triplet excited state. An exciplex whose excited state is formed by two kinds of substances also has an extremely small difference between the S1 level and the T1 level and has a function equivalent to that of a TADF material.

Note that although it is difficult to calculate the T1 level directly, an index of the T1 level can be calculated from a phosphorescent spectrum observed at a low temperature (e.g., 10 K). That is, the level of energy with a wavelength of the line obtained by extrapolating a tangent to the spectrum at a tail on the short wavelength side can be regarded as the T1 level.

In a similar manner, an index of the S1 level can be calculated from a fluorescent spectrum at room temperature or a low temperature. That is, the level of energy with a wavelength of the line obtained by extrapolating a tangent to the fluorescent spectrum at a tail on the short wavelength side can be regarded as the S1 level.

To obtain the function of a TADF material, the difference between the S1 level and the T1 level is preferably less than or equal to 0.2 eV.

As an example of a material having a function of converting triplet excitation energy into light emission, a nano-structure of a transition metal compound having a perovskite structure can also be given. In particular, a nano-structure of a metal-halide perovskite is preferable. The nano-structure is preferably a nanoparticle or a nanorod.

Figure 1B:
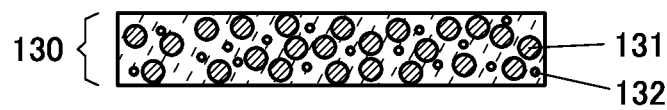

FIG. 1B is a schematic cross-sectional view illustrating the light-emitting layer 130 of the light-emitting device of one embodiment of the present invention. In one embodiment of the present invention, the light-emitting layer 130 contains a compound 131 and a compound 132. The compound 131 is a material having a function of converting triplet excitation energy into light emission and the compound 132 is a material having a function of converting singlet excitation energy into light emission, that is, a fluorescent material. A fluorescent material has high stability, so that the use of a fluorescent material as the compound 132 enables a light-emitting device with high reliability. Here, the compound 131 functions as an energy donor, and the compound 132 functions as an energy acceptor.

<Structure Example 1 of Light-Emitting Layer>

Figure 1C:
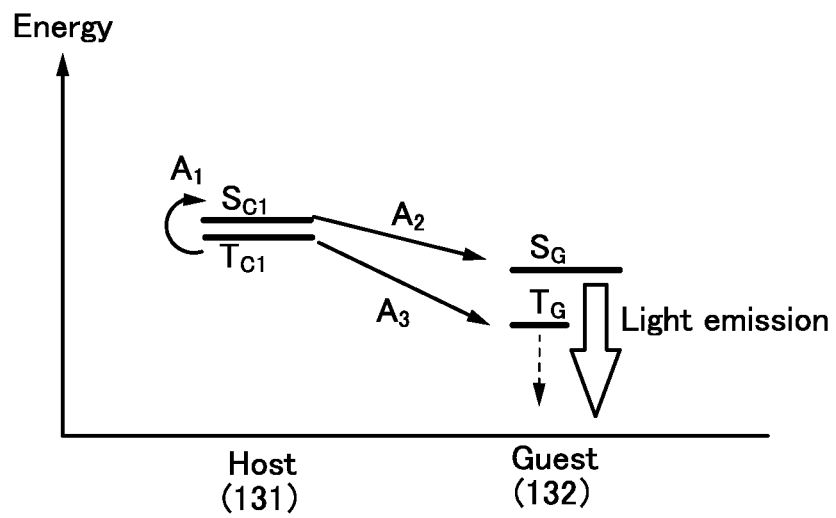
FIG. 1C is a diagram illustrating the correlation between energy levels.

FIG. 1C is a diagram showing the correlation between the energy levels in the light-emitting layer of the light-emitting device of one embodiment of the present invention, which uses a TADF material as the compound 131. The following explains what terms and numerals in FIG. 1C represent.

Host (131): the compound 131
Guest (132): the compound 132
$T_{C1}$: the T1 level of the compound 131
$S_{C1}$: the S1 level of the compound 131
$S_G$: the S1 level of the compound 132
$T_G$: the T1 level of the compound 132

Here, the triplet excitation energy of the compound 131 generated by current excitation is focused on. In this structure example, the compound 131 has a TADF property. Therefore, the compound 131 can convert triplet excitation energy into singlet excitation energy by upconversion (Route $A_1$ in FIG. 1C). The singlet excitation energy of the compound 131 can be transferred to the compound 132 (Route $A_2$ in FIG. 1C). At this time, $S_{C1} \geq S_G$ is preferably satisfied.

The triplet excitation energy generated in the compound 131 is transferred to the S1 level of the compound 132, which is a guest material, through Route $A_1$ and Route $A_2$ described above and the compound 132 emits light, whereby the emission efficiency of the fluorescent light-emitting device can be improved.

Here, in the case where the compound 132 is a normal fluorescent material, a process where the triplet excitation energy of the compound 131 is converted into the triplet excitation energy of the compound 132 (Route $A_3$ in FIG. 1C) can be caused simultaneously with and conflicting with Route $A_1$ and Route $A_2$ described above. Since the triplet excitation energy of the compound 132, which is a fluorescent material, does not contribute to light emission, when the energy transfer through Route $A_3$ occurs, the emission efficiency of the light-emitting device decreases. (Note that in practice, the energy is not directly transferred from $T_{C1}$ to $T_G$ (Route $A_3$), but can pass through a pathway where $T_{C1}$ is once transferred to the triplet excited state at a level higher than $T_G$ of the compound 132 and then the triplet excited state is converted into $T_G$ by internal conversion; the process is omitted in the drawing. Hereinafter, the same applies to all the following deactivation processes to $T_G$ in this specification.)

As mechanisms of the intermolecular energy transfer, the Förster mechanism (dipole-dipole interaction) and the Dexter mechanism (electron exchange interaction) are known. When the compound 132, which is an energy acceptor, is a fluorescent material, the Dexter mechanism is dominant as the mechanism of energy transfer through Route $A_3$. In general, the Dexter mechanism occurs significantly when the distance between the compound 131, which is an energy donor, and the compound 132, which is an energy acceptor, is shorter than or equal to 1 nm. Therefore, to inhibit Route $A_3$, it is important that the host material and the guest material, that is, the energy donor and the energy acceptor be made away from each other.

The light-emitting layer 130 is a mixed film of the compound 132 and the compound 131; thus, as a method for making an energy acceptor (the compound 132) and an energy donor (the compound 131) away from each other, a method in which the concentration of the compound 132 in the mixed film is reduced is employed in some cases.

However, reducing the concentration of the energy acceptor in the mixed film inhibits not only energy transfer based on the Dexter mechanism from the energy donor to the energy acceptor but also energy transfer based on the Forster mechanism from the energy donor to the energy acceptor. As a result, a problem such as a decrease in the emission efficiency and reliability of the light-emitting device is caused because energy transfer through Route $A_2$ is based on the Förster mechanism.

In general, the Dexter mechanism is dominant when the distance between the luminophore included in the energy acceptor and the energy donor is shorter than or equal to 1 nm, and the Förster mechanism is dominant when the distance is longer than or equal to 1 nm and shorter than or equal to 10 nm. In general, energy transfer is less likely to occur when the distance between the energy acceptor and the energy donor is longer than or equal to 10 nm. In other words, in order to inhibit energy transfer by the Dexter mechanism and not to inhibit energy transfer by the Forster mechanism, the distance between the energy acceptor and the energy donor needs to be strictly kept longer than or equal to 1 nm and shorter than or equal to 10 nm. In view of the above, the present inventors have found that the use of a fluorescent material having protecting groups, as an energy acceptor, for keeping a distance from the energy donor can inhibit the above-described decrease in the emission efficiency.

Here, the T1 level of a fluorescent material is the energy level derived from a luminophore in the material in many cases. Thus, in order to more strictly maintain the pathway through Route $A_2$ and inhibit Route $A_3$, it is important to control the distance between the luminophore included in the compound 132, which is an energy acceptor, and the compound 131, which is an energy donor. The luminophore refers to an atomic group (skeleton) that causes light emission in a fluorescent material. The luminophore generally has a π bond and preferably has an aromatic ring, further preferably a condensed aromatic ring or a condensed heteroaromatic ring. As another embodiment, the luminophore can be regarded as an atomic group (skeleton) having an aromatic ring having a transition dipole vector on a ring plane. In the case where one fluorescent material has a plurality of condensed aromatic rings or condensed heteroaromatic rings, a skeleton having the lowest S1 level among the plurality of condensed aromatic rings or condensed heteroaromatic rings may be considered as a luminophore of the fluorescent material. In other cases, a skeleton having an absorption edge on the longest wavelength side among the plurality of condensed aromatic rings or condensed heteroaromatic rings may be considered as the luminophore of the fluorescent material. The luminophore of the fluorescent material can be presumed from the shapes of the emission spectra of the plurality of condensed aromatic rings or condensed heteroaromatic rings in some cases.

Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent material having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

Figure 2A:
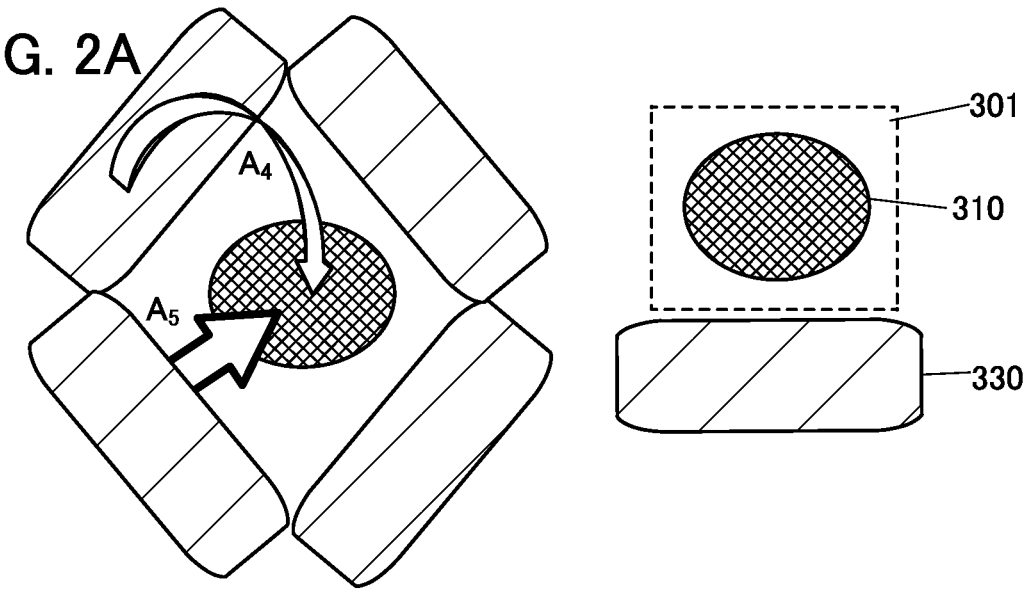
FIG. 2A and FIG. 2B are conceptual diagrams of a conventional guest material and a guest material used for a light-emitting device of one embodiment of the present invention.
Figure 2B:
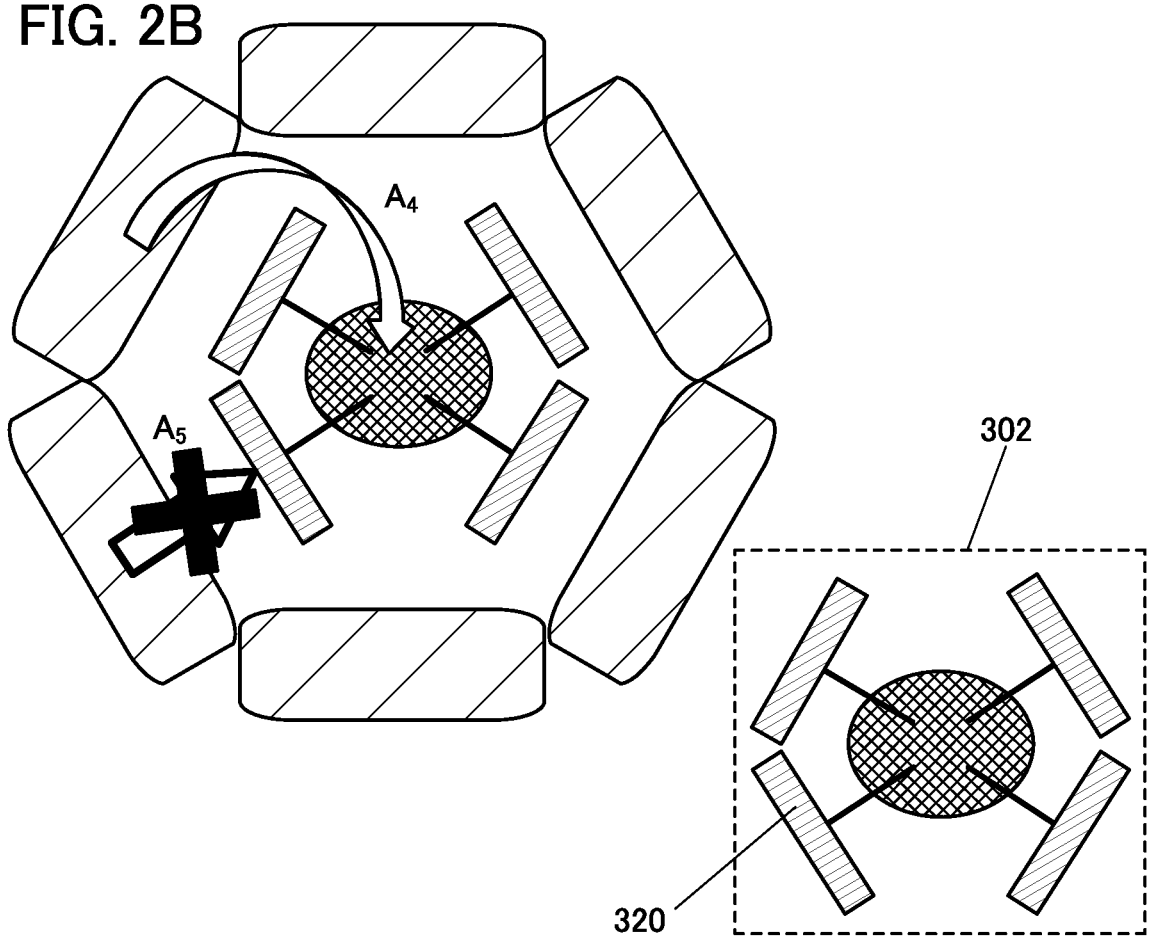

FIG. 2A is a conceptual diagram illustrating the case where a typical fluorescent material having no protecting group is dispersed as a guest material to a host material. FIG. 2B is a conceptual diagram illustrating the case where the fluorescent material having protecting groups, which is used for the light-emitting device of one embodiment of the present invention, is dispersed as a guest material to a host material. The host material and the guest material may be replaced with an energy donor and an energy acceptor, respectively. The energy donor and the energy acceptor correspond to the compound 131 and the compound 132 in FIG. 1, respectively.

Here, the protecting groups have a function of making a luminophore and the host material away from each other. In FIG. 2A, the guest material 301 is a normal fluorescent material having no protecting group, and includes a luminophore 310. The guest material 301 has a function of an energy acceptor. In FIG. 2B, a guest material 302 includes the luminophore 310 and protecting groups 320. In FIG. 2A and FIG. 2B, the guest material 301 and the guest material 302 are surrounded by host materials 330. Since the luminophore is close to the host materials in FIG. 2A, both energy transfer by the Förster mechanism (Route $A_4$) and energy transfer by the Dexter mechanism (Route $A_5$) can occur as the energy transfer from the host materials 330 to the guest material 301. When the guest material is a fluorescent material and energy is transferred from the triplet excitation energy level of the host material to the triplet excitation energy level of the guest material by the Dexter mechanism, non-radiative decay of the triplet excitation energy is caused, contributing to a reduction in the emission efficiency.

In contrast, the guest material 302 in FIG. 2B has the protecting groups 320. Thus, the luminophore 310 and each of the host materials 330 can be kept away from each other as appropriate, which inhibits energy transfer by the Dexter mechanism (Route $A_5$).

Here, in order that the guest material 302 emits light while energy transfer by the Dexter mechanism is inhibited as illustrated in FIG. 2B, the guest material 302 needs to receive energy from the host materials 330 by energy transfer by the Förster mechanism. In other words, it is preferred that energy transfer by the Forster mechanism can be efficiently utilized while energy transfer by the Dexter mechanism is inhibited.

Thus, the protecting groups 320 preferably extend within a range from 1 nm to 10 nm from the luminophore 310. A range from 1 nm to 5 nm is more preferable. With such a structure, appropriate distance can be kept between the host material 330 and the guest material, and energy transfer by the Förster mechanism from the host material 330 to the guest material 302 can be efficiently utilized while energy transfer by the Dexter mechanism is inhibited. Thus, the light-emitting device with high emission efficiency can be fabricated.

A substituent used as the protecting group needs to have a triplet excitation energy level higher than the T1 levels of the luminophore and the host material so as to prevent energy transfer to the protecting group. Since a substituent having no π bond has a high triplet excitation energy level, a saturated hydrocarbon group is preferably used as the protecting group.

In addition, since a substituent having no π bond has a poor function of transporting carriers (electrons or holes), a saturated hydrocarbon group can keep appropriate distance between the luminophore and the host material with little influence on the excited state or the carrier-transport property of the host material.

In an organic compound including a substituent having no π bond and a substituent having a π-conjugated system, frontier orbitals {HOMO (Highest Occupied Molecular Orbital) and LUMO (Lowest Unoccupied Molecular Orbital)} are present on the side of the substituent having a π-conjugated system in many cases; in particular, the luminophore tends to have frontier orbitals. Here, the overlap of the HOMOs of the energy donor and the energy acceptor and the overlap of the LUMOs of the energy donor and the energy acceptor are important for energy transfer by the Dexter mechanism. Therefore, the use of saturated hydrocarbon groups as the protecting groups can make the frontier orbitals of the host material, which is an energy donor, and the frontier orbitals of the guest material, which is an energy acceptor, away from each other, and thus, energy transfer by the Dexter mechanism can be effectively inhibited.

Specific examples of the protecting group include an alkyl group having 1 to 10, inclusive, carbon atoms, a cycloalkyl group having 3 to 12, inclusive, carbon atoms, and a cycloalkyl group having a bridge structure and having 7 to 10, inclusive, carbon atoms. The protecting group is preferably a bulky substituent because the luminophore and the host material need to be away from each other. Thus, an alkyl group having 3 to 10, inclusive, carbon atoms or a substituted or unsubstituted cycloalkyl group having 3 to 10, inclusive, carbon atoms can be favorably used. In particular, the alkyl group is preferably a bulky branched-chain alkyl group or a bulky branched-chain cycloalkyl group. In addition, it is more preferable that the substituent have a ring-like structure because the substituent can be a bulky substituent having an excellent effect of inhibiting energy transfer by the Dexter mechanism, and a cyclohexyl group is particularly preferable because of its stability.

Furthermore, the substituent with a valence of 2 or more that bonds the luminophore and each of the protecting groups is preferably a substituent having a π-conjugated system. With such a structure, the physical properties of the guest material, such as the emission color, the HOMO level, and the glass transition point, can be adjusted. Note that the protecting groups are preferably positioned on the outermost side when the molecular structure is seen around the luminophore.

As such a guest material, the light-emitting device of one embodiment of the present invention contains the organic compound described in Embodiment 1.

Note that in order to improve the efficiency of energy transfer (increase the energy transfer rate) by the Förster mechanism, the ratio of the concentration of the guest material 301 or the guest material 302 to the host material 330 is preferably increased.

As the concentration of the guest material is increased, the rate of energy transfer by the Dexter mechanism is usually increased, resulting in a decrease in emission efficiency; thus, it has been difficult to increase the concentration of the guest material. In contrast, in the light-emitting device of one embodiment of the present invention, the guest material in which a luminophore has protecting groups is used for the light-emitting layer, and thus energy transfer by the Dexter mechanism can be inhibited; therefore, even when the concentration of the guest material, which is an energy acceptor, is increased, a reduction in the emission efficiency due to the Dexter mechanism is less likely to occur. As a result, increasing the rate of energy transfer by the Förster mechanism and inhibiting energy transfer by the Dexter mechanism, which are originally conflicting phenomena, can be concurrently caused.

By increasing the rate of energy transfer by the Förster mechanism with the above-described structure, the excitation lifetime of the energy donor in the light-emitting layer is shortened, thereby inhibiting degradation and improving the reliability of the light-emitting device.

Note that energy transfer in a light-emitting device always conflicts with a quenching process due to the influence of a degraded material and an impurity. However, as described above, the rate of energy transfer by the Förster mechanism can be increased compared with a conventional light-emitting device while the energy transfer by the Dexter mechanism is inhibited in one embodiment of the present invention; thus, the influence of conflict with the quenching process can be reduced, so that the lifetime of the light-emitting device can be increased.

The concentration of the guest material with respect to the host material is preferably higher than or equal to 2 wt % and lower than or equal to 30 wt %, further preferably higher than or equal to 5 wt % and lower than or equal to 20 wt %, still further preferably higher than or equal to 5 wt % and lower than or equal to 15 wt %. With such a structure, the rate of energy transfer by the Förster mechanism can be increased; thus, a light-emitting device with high emission efficiency can be obtained. Moreover, the excitation lifetime of the energy donor is shortened; thus, a light-emitting device with high reliability can be obtained. Note that the above-described concentration is concentration when a light-emitting material is mainly used as the guest material and a material other than the guest material is used as the host material of the light-emitting layer.

<Structure Example 2 of Light-Emitting Layer>

Figure 4A:
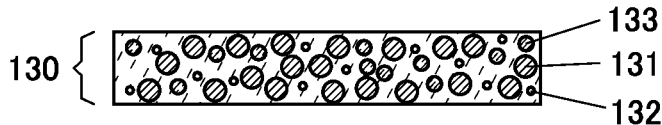
FIG. 4A is a schematic cross-sectional view of a light-emitting layer of a light-emitting device of one embodiment of the present invention.
Figure 4B:
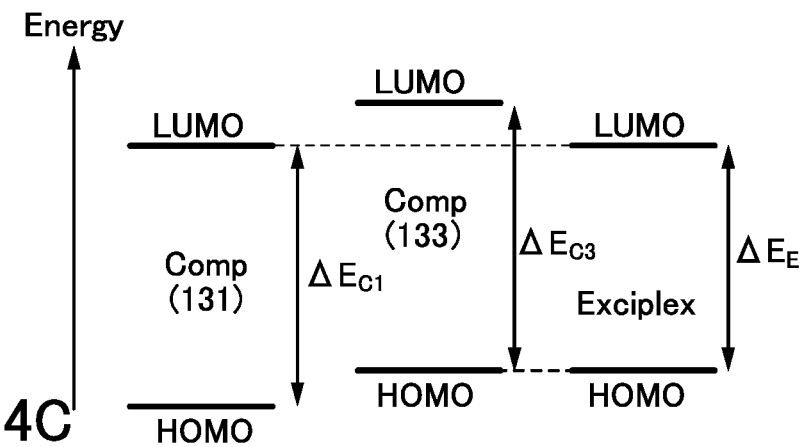
FIG. 4B to FIG. 4D are diagrams illustrating the correlation between energy levels of the light-emitting device of one embodiment of the present invention.
Figure 4C:
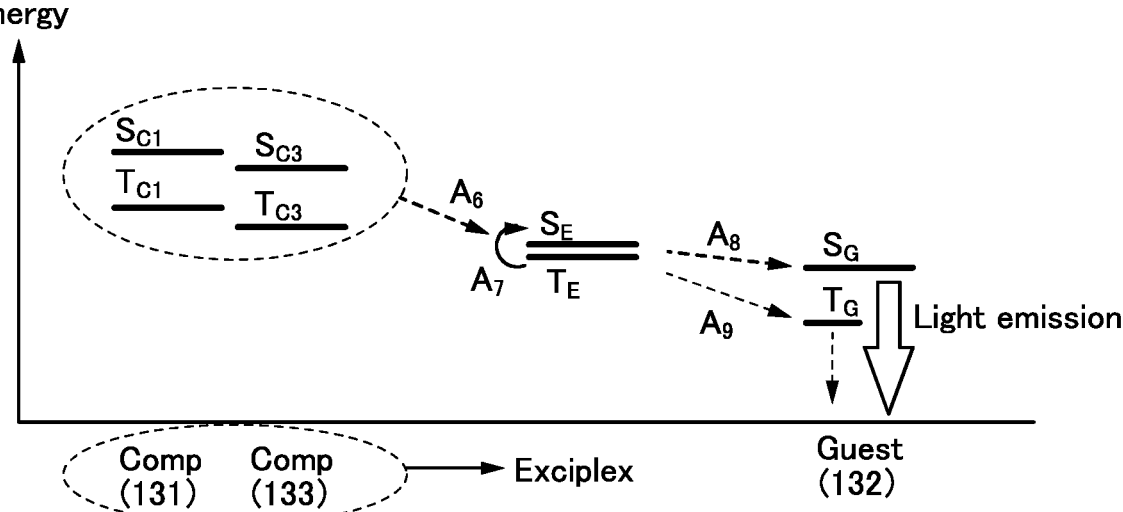

FIG. 4C shows an example of the correlation between energy levels in the light-emitting layer 130 of the light-emitting device 150 of one embodiment of the present invention. The light-emitting layer 130 illustrated in FIG. 4A contains the compound 131, the compound 132, and also a compound 133. In this structure example, the compound 132 is the fluorescent material having protecting groups, which is described in Embodiment 1, and the compound 131 and the compound 133 form an exciplex in combination.

Although it is acceptable as long as the compound 131 and the compound 133, in combination, can form an exciplex, it is further preferable that one of them be a compound having a function of transporting holes (a hole-transport property) and the other be a compound having a function of transporting electrons (an electron-transport property). In that case, a donor-acceptor exciplex is easily formed; thus, efficient formation of an exciplex is possible. In the case where the combination of the compound 131 and the compound 133 is a combination of a compound having a hole-transport property and a compound having an electron-transport property, the carrier balance can be easily controlled by the mixture ratio. The ratio of the compound having a hole-transport property to the compound having an electron-transport property is preferably within a range of 1:9 to 9:1 (weight ratio). Since the carrier balance is easily controlled with the structure, a carrier recombination region can also be controlled easily.

For the combination of host materials for forming an exciplex efficiently, it is preferred that the HOMO level of one of the compound 131 and the compound 133 be higher than the HOMO level of the other and the LUMO level of the one of the compounds be higher than the LUMO level of the other. Note that the HOMO level of the compound 131 may be equivalent to the HOMO level of the compound 133, or the LUMO level of the compound 131 may be equivalent to the LUMO level of the compound 133.

Note that the LUMO levels and the HOMO levels of the compounds can be derived from the electrochemical characteristics (reduction potentials and oxidation potentials) of the compounds that are measured by cyclic voltammetry (CV) measurement.

When the compound 131 has a hole-transport property and the compound 133 has an electron-transport property, for example, it is preferable that the HOMO level of the compound 131 {Comp(131)} be higher than the HOMO level of the compound 133 {Comp(133)} and that the LUMO level of the compound 131 be higher than the LUMO level of the compound 133, as in an energy band diagram in FIG. 4B. Such a correlation between energy levels is suitable because holes and electrons, which are carriers injected from the pair of electrodes (the electrode 101 and the electrode 102), are easily injected into the compound 131 and the compound 133, respectively.

As for expressions and reference numerals in FIG. 4B, $\Delta E_{C1}$ represents the energy difference between the LUMO level and the HOMO level of the compound 131, $\Delta E_{C3}$ represents the energy difference between the LUMO level and the HOMO level of the compound 132, and $\Delta E_E$ represents the energy difference between the LUMO level of the compound 133 and the HOMO level of the compound 131.

The exciplex formed by the compound 131 and the compound 133 is an exciplex that has HOMO of the molecular orbital in the compound 131 and LUMO of the molecular orbital in the compound 133. The excitation energy of the exciplex substantially corresponds to the energy difference ($\Delta E_E$) between the LUMO level of the compound 133 and the HOMO level of the compound 131, which is smaller than the energy difference ($\Delta E_{C1}$) between the LUMO level and the HOMO level of the compound 131 and the energy difference ($\Delta E_{C3}$) between the LUMO level and the HOMO level of the compound 133. Thus, when the compound 131 and the compound 133 form an exciplex, an excited state can be formed with lower excitation energy. Having lower excitation energy, the exciplex can form a stable excited state.

FIG. 4C shows the correlation between the energy levels of the compound 131, the compound 132, and the compound 133 in the light-emitting layer 130. The following explains what terms and numerals in FIG. 4C represent.

Comp (131): the compound 131
Comp (133): the compound 133
Guest (132): the compound 132
$S_{C1}$: the S1 level of the compound 131
$T_{C1}$: the T1 level of the compound 131
$S_{C3}$: the S1 level of the compound 133
$T_{C3}$: the T1 level of the compound 133
$T_G$: the T1 level of the compound 132
$S_E$: the S1 level of the exciplex
$T_E$: the T1 level of the exciplex In the light-emitting device of one embodiment of the present invention, the compound 131 and the compound 133 contained in the light-emitting layer 130 form the exciplex. The S1 level ($S_E$) of the exciplex and the T1 level ($T_E$) of the exciplex are energy levels adjacent to each other (see Route $A_6$ in FIG. 4C).

Because the excitation energy levels ($S_E$ and $T_E$) of the exciplex are lower than the S1 levels ($S_{C1}$ and $S_{C3}$) of the substances (the compound 131 and the compound 133) that form an exciplex, an excited state can be formed with lower excitation energy. Accordingly, the driving voltage of the light-emitting device 150 can be reduced.

Since the S1 level ($S_E$) and the T1 level ($T_E$) of the exciplex are energy levels adjacent to each other, reverse intersystem crossing occurs easily; the exciplex has a TADF property. Thus, the exciplex has a function of converting triplet excitation energy into singlet excitation energy by upconversion (Route $A_7$ in FIG. 4C). The singlet excitation energy of the exciplex is rapidly transferred to the compound 132 (Route $A_8$ in FIG. 4C). At this time, $S_E \geq S_G$ is preferably satisfied. In Route $A_8$, the exciplex serves as an energy donor, and the compound 132 serves as an energy acceptor. In addition, $S_E \geq S_G$ is preferably satisfied.

Note that in order to maintain the efficiency of upconversion by the exciplex, it is preferred that the T1 levels of both of the compound 131 and the compound 133, that is, To and $T_{C3}$ be higher than or equal to $T_E$. Alternatively, $S_E - T_{C1} \leq 0.2$ eV and $S_E - T_{C3} \leq 0.2$ eV are preferably satisfied.

Triplet excitation energy generated in the light-emitting layer 130 is transferred through Route $A_6$ described above and from the S1 level of the exciplex to the S1 level of the guest material (Route $A_8$), which allows light emission of the guest material.

In the light-emitting device of one embodiment of the present invention, a guest material in which a luminophore has protecting groups is used as the compound 132 described above. Such a structure can inhibit energy transfer by the Dexter mechanism that is represented by Route $A_9$ as described above, leading to inhibition of deactivation of triplet excitation energy. Thus, a fluorescent light-emitting device with high emission efficiency can be obtained.

Routes $A_6$ to $A_8$ described above, which are processes through which excitation energy is supplied from an exciplex to a fluorescent material, are sometimes referred to as ExSET (Exciplex-Singlet Energy Transfer) or ExEF (Exciplex-Enhanced Fluorescence) in this specification and the like.

<Structure Example 3 of Light-Emitting Layer>

In this structure example, the case where a phosphorescent material is used as one of compounds that form an exciplex in Structure example 2 will be described.

In this structure example, a phosphorescent material containing a heavy atom is used as one of compounds that form an exciplex. In this case, even in an exciplex using the phosphorescent material as the one compound, intersystem crossing between a singlet state and a triplet state is likely to occur due to a heavy atom effect; thus, transition from the triplet excited state to the singlet ground state is possible (i.e., phosphorescent light can be exhibited).

Note that examples of the heavy atom contained in the phosphorescent material used in the above-described structure include Ir, Pt, Os, Ru, and Pd.

In such an exciplex, the triplet excitation energy level ($T_E$) is a donor level of energy transfer based on the Förster mechanism; thus, $T_E$ is preferably higher than or equal to the singlet excitation energy level ($S_G$) of the compound 132, which is a light-emitting material. Specifically, $T_E \geq S_G$ is preferably satisfied.

In a light-emitting layer with such a structure, the triplet excitation energy of the formed exciplex can be transferred from the triplet excitation energy level ($T_E$) of the exciplex to the singlet excitation energy level ($S_G$) of the compound 132.

Note that it is difficult to clearly distinguish fluorescent light and phosphorescent light from each other in an emission spectrum in some cases because the $S_1$ level ($S_E$) and the $T_1$ level ($T_E$) of the exciplex are energy levels adjacent to each other. In that case, fluorescent light and phosphorescent light can be sometimes distinguished from each other by the emission lifetime.

Since a phosphorescent material serves as an energy donor in this structure example, the quantum yield of the phosphorescent material can be either high or low as long as energy transfer from the triplet excitation energy level of the exciplex to the singlet excitation energy level of the guest material is allowable transition.

The energy transfer from the phosphorescent material or the exciplex formed using a phosphorescent material to the guest material is preferred, in which case energy transfer from the triplet excitation energy level of the energy donor to the singlet excitation energy level of the guest material (energy acceptor) is allowable transition; thus, without through the process of Route $A_7$ in FIG. 4C, the triplet excitation energy of the exciplex can be transferred to the $S_1$ level ($S_G$) of the guest material through the process of Route $A_8$, so that the energy transfer process until light is emitted is short and the degradation of the material and energy loss can be inhibited.

In the light-emitting device of one embodiment of the present invention, a guest material in which a luminophore has protecting groups is used as the compound 132 described above. Such a structure can inhibit energy transfer by the Dexter mechanism that is represented by Route $A_9$ as described above, leading to inhibition of deactivation of triplet excitation energy. Thus, a fluorescent light-emitting device with high emission efficiency can be obtained.

<Structure Example 4 of Light-Emitting Layer>

In this structure example, the case where a material having a TADF property is used as the compound 133 of the light-emitting device in Structure example 2 will be described with reference to FIG. 4D.

Figure 4D:
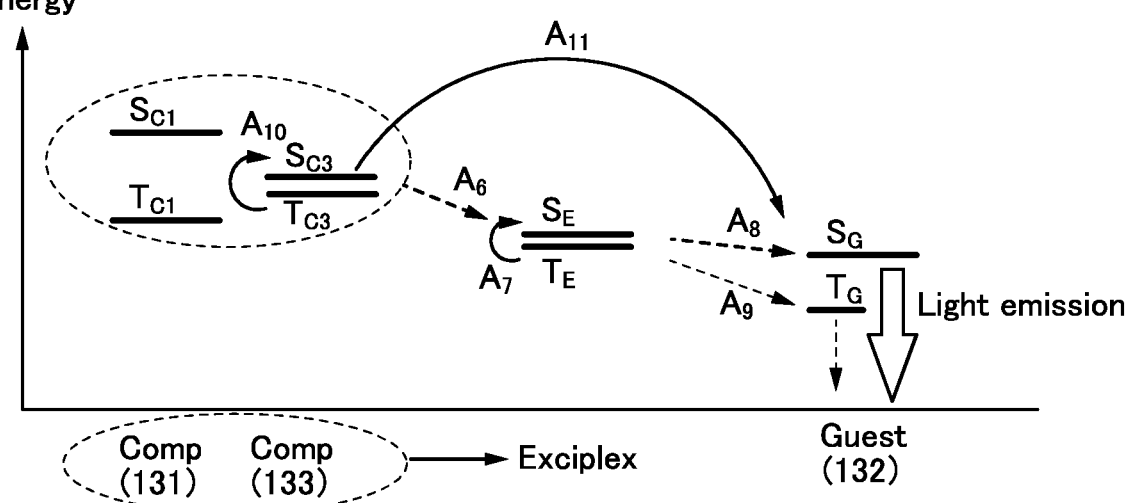

Since the compound 133 is the TADF material, the compound 133 has a function of converting triplet excitation energy into singlet excitation energy by upconversion (Route $A_{10}$ in FIG. 4D). The singlet excitation energy of the compound 133 can be rapidly transferred to the compound 132 (Route $A_{11}$ in FIG. 4D). At this time, $S_{C3} \geq S_G$ is preferably satisfied.

The light-emitting device in this structure example has a pathway where the triplet excitation energy is transferred to the compound 132, which is a guest material, through Route $A_6$ to Route As in FIG. 4D and a pathway where the triplet excitation energy is transferred to the compound 132 through Route $A_{10}$ and Route $A_{11}$ in FIG. 4D. Since a plurality of pathways through each of which the triplet excitation energy is transferred to the fluorescent material exist, the light-emitting device in this structure example can have higher emission efficiency.

In the light-emitting device of one embodiment of the present invention, a guest material in which a luminophore has protecting groups is used as the compound 132 described above. Such a structure can inhibit energy transfer by the Dexter mechanism that is represented by Route $A_9$ as described above, leading to inhibition of deactivation of triplet excitation energy. Thus, a fluorescent light-emitting device with high emission efficiency can be obtained.

In this structure example, the exciplex and the compound 133 serve as energy donors, and the compound 132 serves as an energy acceptor.

<Structure Example 5 of Light-Emitting Layer>

Figure 5A:
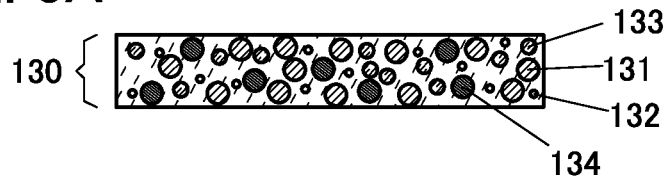
FIG. 5A is a schematic cross-sectional view of a light-emitting layer of a light-emitting device of one embodiment of the present invention.

FIG. 5A shows the case where the light-emitting layer 130 contains four kinds of materials. The light-emitting layer 130 in FIG. 5A contains the compound 131, the compound 132, the compound 133, and a compound 134. In this structure example, the case where the compound 133 is a phosphorescent material is described. The compound 132 is the guest material having protecting groups and exhibiting fluorescent light emission, which is described in Embodiment 1. The compound 131 is an organic compound that forms an exciplex together with the compound 134.

Figure 5B:
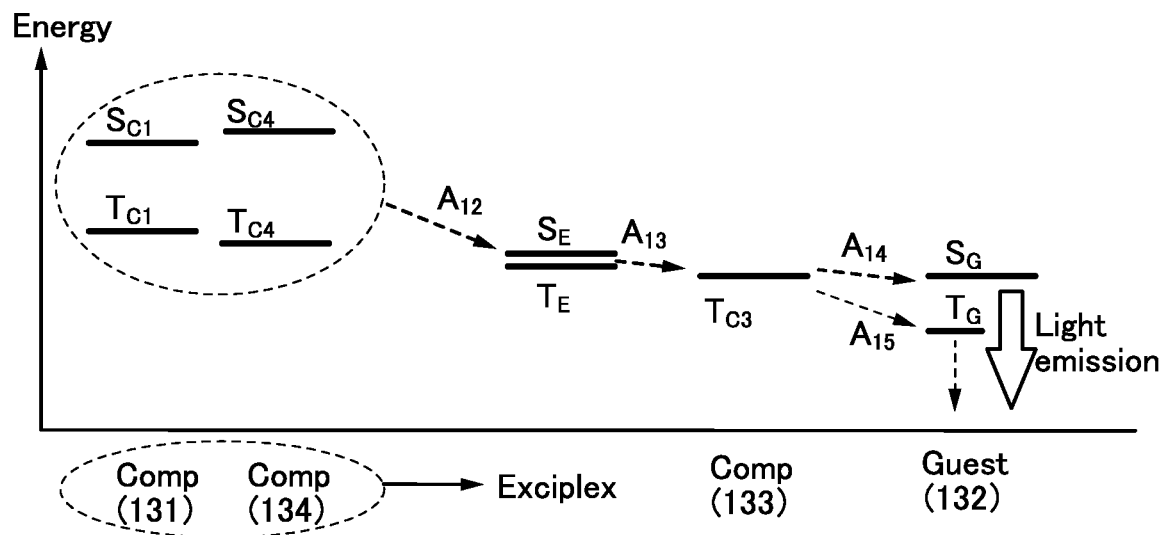
FIG. 5B and FIG. 5C are diagrams illustrating the correlation between energy levels.

FIG. 5B is a diagram showing the correlation between the energy levels of the compound 131, the compound 132, the compound 133, and the compound 134 in the light-emitting layer 130. The following explains what terms and signs in FIG. 5B represent, and the other terms and signs are the same as the terms and the signs in FIG. 4B.

$S_{C4}$: the S1 level of the compound 134

$T_{C4}$: the T1 level of the compound 134

In the light-emitting device of one embodiment of the present invention described in this structure example, the compound 131 and the compound 134 form the exciplex. The S1 level ($S_E$) of the exciplex and the T1 level ($T_E$) of the exciplex are adjacent energy levels (see Route Au in FIG. 5B).

When the exciplex formed through the above process loses excitation energy, the exciplex behaves as the two separate substances forming the exciplex.

Because the excitation energy levels ($S_E$ and $T_E$) of the exciplex are lower than the S1 levels ($S_{C1}$ and $S_{C4}$) of the substances (the compound 131 and the compound 134) that form an exciplex, an excited state can be formed with lower excitation energy. Accordingly, the driving voltage of the light-emitting device 150 can be reduced.

Here, the compound 133 is a phosphorescent material, and intersystem crossing between a singlet state and a triplet state is allowed. Hence, both the singlet excitation energy and the triplet excitation energy of the exciplex are rapidly transferred to the compound 133 (Route $A_{13}$). At this time, $T_E \geq T_{C3}$ is preferably satisfied.

Here, $T_E \geq T_{C3} \geq S_G$ as shown in FIG. 5B is preferably satisfied, in which case the excitation energy of the compound 133 is efficiently transferred as the singlet excitation energy to the compound 132, which is the guest material (Route $A_{14}$).

At this time, although it is acceptable as long as the compound 131 and the compound 134, in combination, can form an exciplex, it is further preferable that one of them be a compound having a hole-transport property and the other be a compound having an electron-transport property.

For the combination of materials for forming an exciplex efficiently, it is preferred that the HOMO level of one of the compound 131 and the compound 134 be higher than the HOMO level of the other and the LUMO level of the one of the compounds be higher than the LUMO level of the other.

Note that the correlation between the energy levels of the compound 131 and the compound 134 is not limited to that shown in FIG. 5B. That is, the singlet excitation energy level ($S_{C1}$) of the compound 131 may be higher or lower than the singlet excitation energy level ($S_{C4}$) of the compound 134. The triplet excitation energy level ($T_{C1}$) of the compound 131 may be higher or lower than the triplet excitation energy level ($T_{C4}$) of the compound 134.

In the light-emitting device of one embodiment of the present invention, the compound 131 preferably has a π-electron deficient skeleton. Such a structure lowers the LUMO level of the compound 131, which is suitable for forming an exciplex.

In the light-emitting device of one embodiment of the present invention, the compound 131 preferably has a π-electron rich skeleton. Such a structure increases the HOMO level of the compound 131, which is suitable for forming an exciplex.

In the light-emitting device of one embodiment of the present invention, a guest material in which a luminophore has protecting groups is used as the compound 132 described above. Such a structure can inhibit energy transfer by the Dexter mechanism that is represented by Route $A_{15}$ as described above, leading to inhibition of deactivation of triplet excitation energy. Thus, a fluorescent light-emitting device with high emission efficiency can be obtained.

Note that the above-described processes through Routes $A_{12}$ and $A_{13}$ through which excitation energy is supplied from the exciplex to the compound 133 may be referred to as ExTET (Exciplex-Triplet Energy Transfer) in this specification and the like. Thus, this structure example can be referred to as a structure in which a fluorescent material having protecting groups is mixed to a light-emitting layer capable of utilizing ExTET.

<Structure Example 6 of Light-Emitting Layer>

In this structure example, the case where a material having a TADF property is used as the compound 134 described in Structure example 5 of light-emitting layer described above will be described.

Figure 5C:
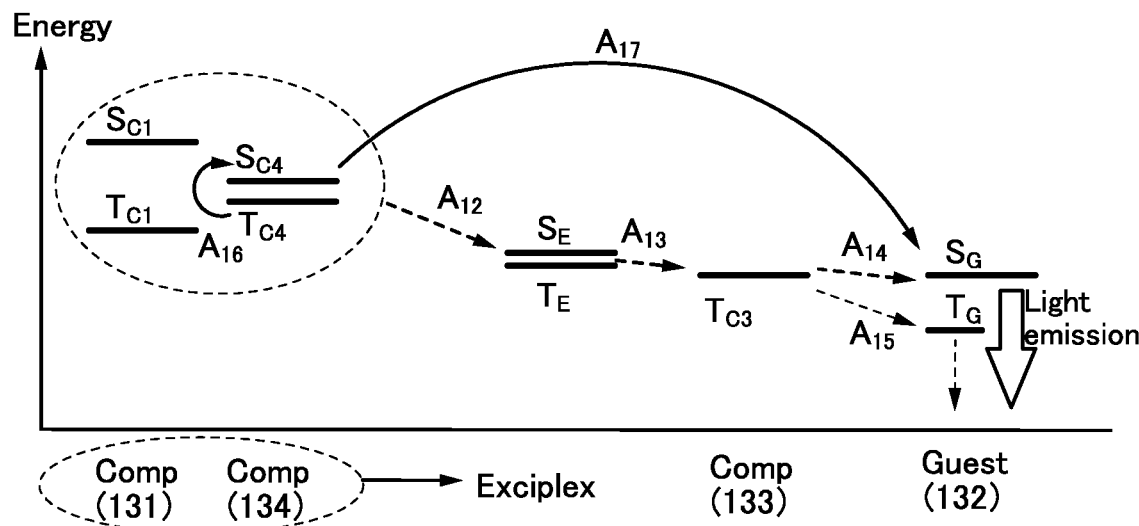

The light-emitting layer 130 in FIG. 5C contains the compound 131, the compound 132, the compound 133, and a compound 134. In one embodiment of the present invention, the compound 133 has a function of being capable of converting triplet excitation energy into light emission. The compound 132 is the guest material having protecting groups and exhibiting fluorescent light emission, which is described in Embodiment 1. The compound 131 is an organic compound that forms an exciplex together with the compound 134.

Here, since the compound 134 is the TADF material, the compound 134 that does not form an exciplex has a function of converting triplet excitation energy into singlet excitation energy by upconversion (Route $A_{16}$ in FIG. 5C). The singlet excitation energy of the compound 134 is rapidly transferred to the compound 132 (Route $A_{17}$ in FIG. 5C). At this time, $S_{C4} \geq S_G$ is preferably satisfied.

In the light-emitting device of one embodiment of the present invention including the light-emitting layer of this structure example has a pathway where the triplet excitation energy is transferred to the compound 132, which is a guest material, through Route $A_{12}$ to Route $A_{14}$ and a pathway where the triplet excitation energy is transferred to the compound 132 through Route $A_{16}$ and Route $A_{17}$. Since a plurality of pathways through each of which the triplet excitation energy is transferred to the fluorescent material exist, higher emission efficiency can be obtained. In Route $A_{14}$, the compound 133 serves as an energy donor, and the compound 132 serves as an energy acceptor. In Route $A_{17}$, the compound 134 serves as an energy donor and the compound 132 serves as an energy acceptor.

In the light-emitting device of one embodiment of the present invention, a guest material in which a luminophore has protecting groups is used as the compound 132 described above. Such a structure can inhibit energy transfer by the Dexter mechanism that is represented by Route $A_{15}$ as described above, leading to inhibition of deactivation of triplet excitation energy. Thus, a fluorescent light-emitting device with high emission efficiency can be obtained.

<Structure Example 7 of Light-Emitting Layer>

Figure 6A:
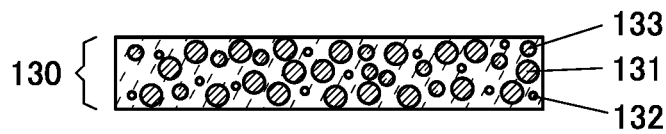
FIG. 6A is a schematic cross-sectional view of a light-emitting layer of a light-emitting device of one embodiment of the present invention.

The light-emitting layer 130 illustrated in FIG. 6A contains the compound 131, the compound 132, and also the compound 133. In one embodiment of the present invention, the compound 132 is the fluorescent material having protecting groups, which is described in Embodiment 1. The compound 133 has a function of converting triplet excitation energy into light emission. In this structure example, the case where the compound 133 is a phosphorescent material is described.

Figure 6B:
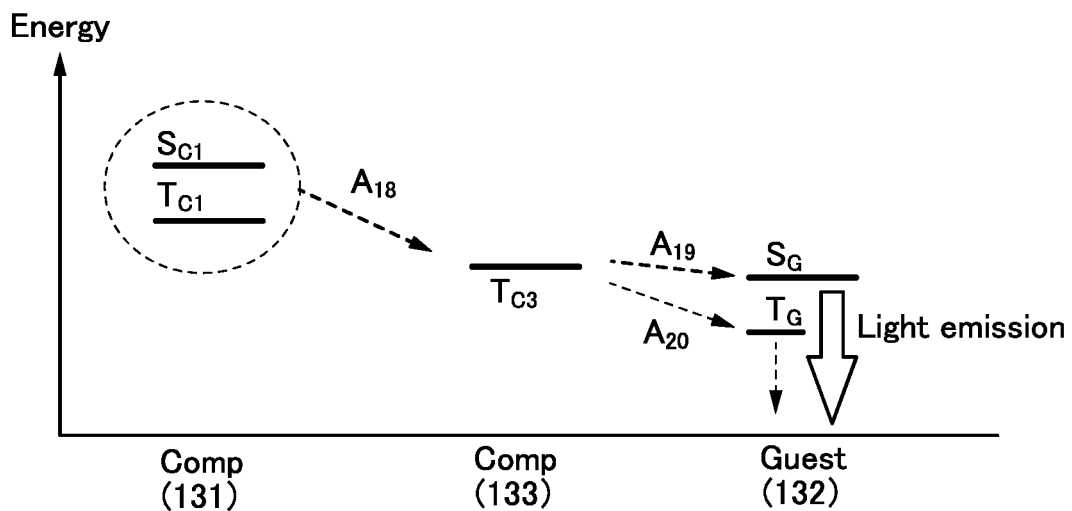
FIG. 6B and FIG. 6C are diagrams illustrating the correlation between energy levels.

FIG. 6B shows an example of the correlation between energy levels in the light-emitting layer 130 of the light-emitting device 150 of one embodiment of the present invention. The following explains what terms and numerals in FIG. 6B described later represent.

Comp (131): the compound 131
Comp (133): the compound 133
Guest (132): the compound 132
$S_{C1}$: the S1 level of the compound 131
$T_{C1}$: the T1 level of the compound 131
$T_{C3}$: the T1 level of the compound 133
$T_G$: the T1 level of the compound 132
$S_G$: the S1 level of the compound 132

In the light-emitting device of one embodiment of the present invention, when carrier recombination mainly occurs in the compound 131 contained in the light-emitting layer 130, singlet excitons and triplet excitons are generated. Since the compound 133 is a phosphorescent material, selecting materials that have a relation of $T_{C3} \leq T_{C1}$ allows both the singlet excitation energy and triplet excitation energy generated in the compound 131 to be transferred to the $T_{C3}$ level of the compound 133 (Route $A_{18}$ in FIG. 6B).

A phosphorescent material is preferably an energy donor, in which case energy transfer from the triplet excitation energy level of the energy donor to the singlet excitation energy level of the guest material (energy acceptor) is allowable transition. Thus, the triplet excitation energy of the compound 133 can be transferred to the S1 level ($S_G$) of the guest material through the process of Route $A_{19}$. In Route $A_{19}$, the compound 133 serves as an energy donor and the compound 132 serves as an energy acceptor. In that case, $T_{C3} \geq S_G$ is preferably satisfied because the excitation energy of the compound 133 is efficiently transferred to the singlet excited state of the compound 132, which is a guest material.

In the light-emitting device of one embodiment of the present invention, a guest material in which a luminophore has protecting groups is used as the compound 132. Such a structure can inhibit energy transfer by the Dexter mechanism that is represented by Route $A_{20}$ as described above, leading to inhibition of deactivation of triplet excitation energy. Thus, a fluorescent light-emitting device with high emission efficiency can be obtained.

<Structure Example 8 of Light-Emitting Layer>

Figure 6C:
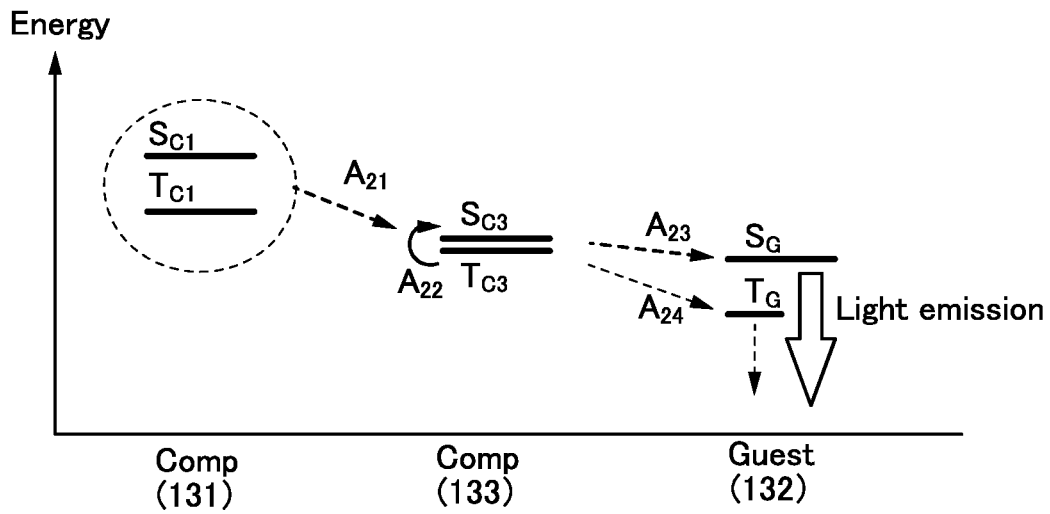

FIG. 6C shows an example of the correlation between energy levels in the light-emitting layer 130 of the light-emitting device 150 of one embodiment of the present invention. The light-emitting layer 130 illustrated in FIG. 6C contains the compound 131, the compound 132, and also the compound 133. In one embodiment of the present invention, the compound 132 is the fluorescent material having protecting groups, which is described in Embodiment 1. The compound 133 has a function of being capable of converting triplet excitation energy into light emission. In this structure example, the case where the compound 133 is a compound having a TADF property is described.

The following explains what terms and signs in FIG. 6C represent, and the other terms and signs are the same as the terms and the signs in FIG. 6B.

$S_{C3}$: the S1 level of the compound 133

In the light-emitting device of one embodiment of the present invention, when carrier recombination mainly occurs in the compound 131 contained in the light-emitting layer 130, singlet excitons and triplet excitons are generated. Selecting materials that have a relation of $S_{C3} \leq S_{C1}$ and $T_{C3} \leq T_{C1}$ allows both the singlet excitation energy and triplet excitation energy generated in the compound 131 to be transferred to the $S_{C3}$ and $T_{C3}$ levels of the compound 133 (Route $A_{21}$ in FIG. 6C). Some of the carriers can be recombined in the compound 133.

The compound 134 is a TADF material and thus has a function of converting triplet excitation energy into singlet excitation energy by upconversion (Route $A_{22}$ in FIG. 6C). The singlet excitation energy of the compound 133 can be rapidly transferred to the compound 132 (Route $A_{23}$ in FIG. 6C). At this time, $S_{C3} \geq S_G$ is preferably satisfied. Specifically, when the level of energy with a wavelength of the line obtained by extrapolating a tangent to the fluorescent spectrum of the compound 133 at a tail on the short wavelength side is $S_{C3}$ and the level of energy with a wavelength of the absorption edge of the absorption spectrum of the compound 132 is $S_G$, $S_{C3} \geq S_G$ is preferably satisfied. Through the processes through Route $A_{21}$ to Route $A_{23}$, triplet excitation energy in the light-emitting layer 130 can be converted into fluorescent light emission of the compound 132. In Route $A_{23}$, the compound 133 serves as an energy donor and the compound 132 serves as an energy acceptor.

In the light-emitting device of one embodiment of the present invention, a guest material in which a luminophore has protecting groups is used as the compound 132. Such a structure can inhibit energy transfer by the Dexter mechanism that is represented by Route $A_{24}$ as described above, leading to inhibition of deactivation of triplet excitation energy. Thus, a fluorescent light-emitting device with high emission efficiency can be obtained.

<Material>

Next, components of a light-emitting device of one embodiment of the present invention will be described in detail below.

<<Light-Emitting Layer>>

Materials that can be used for the light-emitting layer 130 will be described below. In the light-emitting layer of the light-emitting device of one embodiment of the present invention, an energy donor having a function of converting triplet excitation energy into light emission and an energy acceptor including a luminophore and protecting groups are used. Examples of the material having a function of converting triplet excitation energy into light emission include a TADF material, an exciplex, and a phosphorescent material.

Examples of the luminophore included in the compound 132 serving as an energy acceptor include a phenanthrene skeleton, a stilbene skeleton, an acridone skeleton, a phenoxazine skeleton, and a phenothiazine skeleton. Specifically, a fluorescent material having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

The protecting group is preferably an alkyl group having 1 to 10, inclusive, carbon atoms, a cycloalkyl group having 3 to 10, inclusive, carbon atoms, a branched-chain alkyl group having 3 to 10, inclusive, carbon atoms, or a trialkylsilyl group having 3 to 12, inclusive, carbon atoms.

Examples of an alkyl group having 1 to 10, inclusive, carbon atoms include a methyl group, an ethyl group, a propyl group, a pentyl group, and a hexyl group, and a branched-chain alkyl group having 3 to 10, inclusive, carbon atoms, which is described later, is particularly preferred. Note that the alkyl group is not limited thereto.

Examples of a cycloalkyl group having 3 to 10, inclusive, carbon atoms include a cyclopropyl group, a cyclobutyl group, a cyclohexyl group, a norbornyl group, and an adamantyl group. The cycloalkyl group is not limited thereto. In the case where the cycloalkyl group has a substituent, examples of the substituent include an alkyl group having 1 to 7, inclusive, carbon atoms, such as a methyl group, an ethyl group, a propyl group, an isopropyl group, a butyl group, an isobutyl group, a sec-butyl group, a tert-butyl group, a pentyl group, or a hexyl group, a cycloalkyl group having 5 to 7, inclusive, carbon atoms, such as a cyclopentyl group, a cyclohexyl group, a cycloheptyl group, or an 8,9,10-trinorbornanyl group, and an aryl group having 6 to 12, inclusive, carbon atoms, such as a phenyl group, a naphthyl group, or a biphenyl group.

Examples of a branched-chain alkyl group having 3 to 10, inclusive, carbon atoms include an isopropyl group, a sec-butyl group, an isobutyl group, a tert-butyl group, an isopentyl group, a sec-pentyl group, a tert-pentyl group, a neopentyl group, an isohexyl group, a 3-methylpentyl group, a 2-methylpentyl group, a 2-ethylbutyl group, a 1,2-dimethylbutyl group, and a 2,3-dimethylbutyl group. The branched-chain alkyl group is not limited thereto.

Examples of a trialkylsilyl group having 3 to 12, inclusive, carbon atoms include a trimethylsilyl group, a triethylsilyl group, and a tert-butyl dimethylsilyl group. The trialkylsilyl group is not limited thereto.

In the molecular structure of the energy acceptor, it is preferred that two or more aryl groups be bonded to a luminophore and the aryl groups each have at least one protecting group. It is further preferred that at least two protecting groups be bonded to each of the aryl groups. This is because a larger number of protecting groups more effectively inhibit energy transfer by the Dexter mechanism in the case where the guest material is used for the light-emitting layer. To inhibit an increase in molecular weight and keep the sublimability, the aryl groups are preferably phenyl groups. Note that a structure in which the luminophore and the aryl group are bonded to each other through a nitrogen atom of the luminophore is preferable.

Furthermore, when two or more aryl groups are bonded to a luminophore, a fluorescent material whose emission color can be adjusted and which has a high quantum yield can be obtained. The aryl groups are preferably bonded to the luminophore at symmetric positions. With such a structure, the fluorescent material can have a high quantum yield.

The protecting groups may be introduced to the luminophore via the aryl groups, not directly introduced to the luminophore. Such a structure is preferred because the protecting groups can be arranged to cover the luminophore, allowing the host material and the luminophore to be away from each other from any direction. In the case where the protecting groups are not directly bonded to the luminophore, four or more protecting groups are preferably introduced to one luminophore.

Figure 3A:
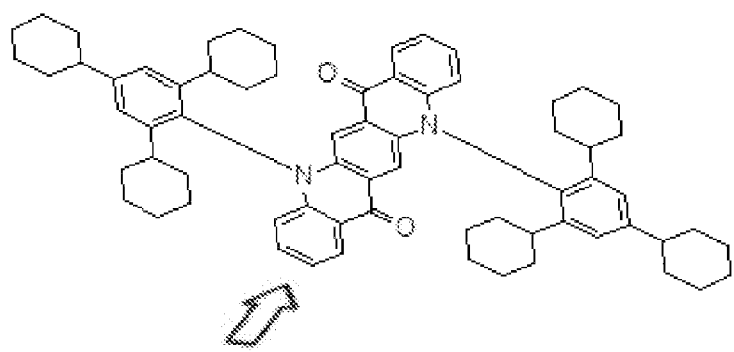
FIG. 3A and FIG. 3B are a structural formula and a ball-and-stick diagram of a guest material used for a light-emitting device of one embodiment of the present invention.
Figure 3B:
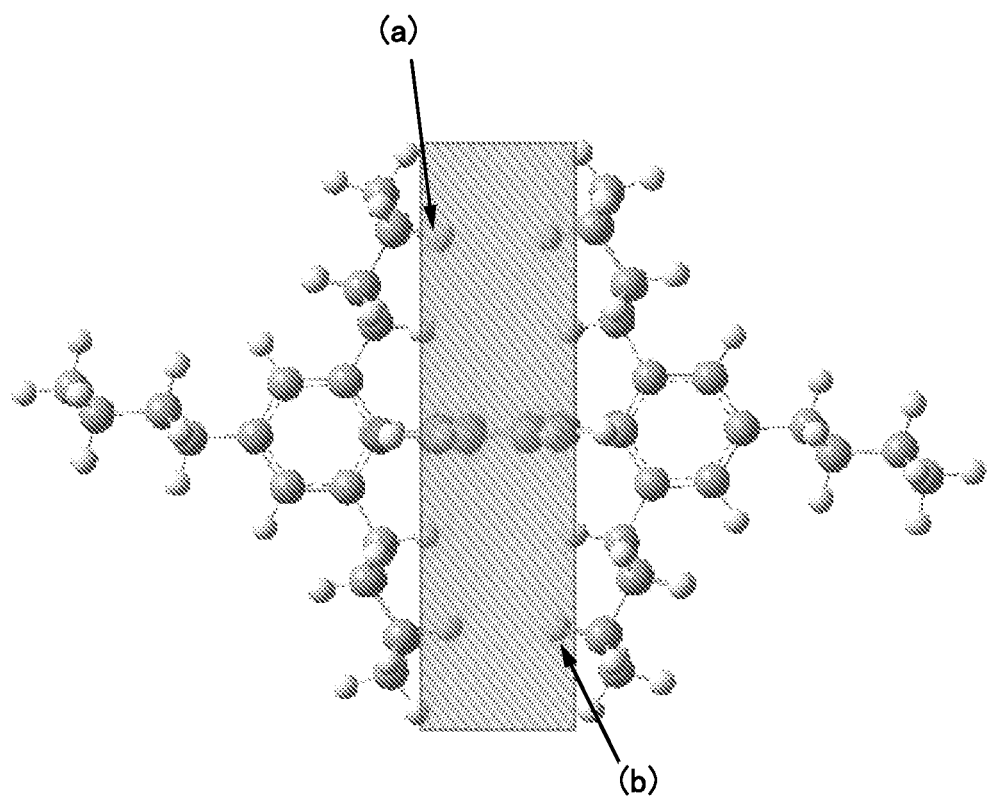

Furthermore, it is preferred that at least one of atoms of the plurality of protecting groups be positioned over one plane of the luminophore, that is, the condensed aromatic ring or the condensed heteroaromatic ring, and at least one of atoms of the plurality of protecting groups be positioned over the other plane of the condensed aromatic ring or the condensed heteroaromatic ring, as illustrated in FIG. 3. As a specific method, the following structure is given. That is, the condensed aromatic ring or the condensed heteroaromatic ring, which is a luminophore, is bonded to two or more phenyl groups, and the two or more phenyl groups each independently have protecting groups at the ortho positions.

Such a structure enables a steric configuration in which the protecting groups at the ortho positions of the phenyl groups are positioned over the condensed aromatic ring or the condensed heteroaromatic ring, which is a luminophore, as shown in FIG. 3. As a result, the upper and lower planes of the condensed aromatic ring or the condensed heteroaromatic ring can be efficiently covered, inhibiting energy transfer by the Dexter mechanism.

As the energy acceptor material described above, the organic compound described in Embodiment 1 is particularly preferable.

A TADF material that can be used as any of the compound 131, the compound 133, and the compound 134 preferably has a skeleton having a hole-transport property and a skeleton having an electron-transport property. Alternatively, the TADF material preferably has a π-electron rich skeleton or an aromatic amine skeleton, and a π-electron deficient skeleton. In that case, a donor-acceptor excited state is easily formed in a molecule. Furthermore, to increase both the donor property and the acceptor property in the molecule, the skeleton having an electron-transport property and the skeleton having a hole-transport property are preferably directly bonded to each other. Alternatively, the π-electron deficient skeleton is preferably directly bonded to the π-electron rich skeleton or the aromatic amine skeleton. By improving both the donor property and the acceptor property in the molecule, an overlap between a region where the HOMO is distributed and a region where the LUMO is distributed can be small, and the energy difference between the singlet excitation energy level and the triplet excitation energy level can be small. Moreover, the triplet excitation energy level can be kept high. The energy difference between the S1 level and the T1 level of the TADF material is preferably small, specifically, greater than 0 eV and less than or equal to 0.2 eV.

As a TADF material, the following materials can be used, for example.

First, a fullerene, a derivative thereof, an acridine derivative such as proflavine, eosin, and the like can be given. Furthermore, a metal-containing porphyrin containing magnesium (Mg), zinc (Zn), cadmium (Cd), tin (Sn), platinum (Pt), indium (In), palladium (Pd), or the like can be given.

Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$OEP).

[Chemical Formulae 32]

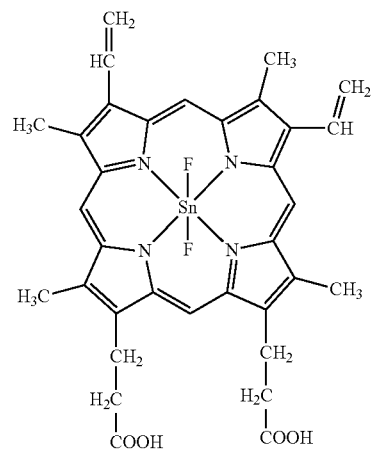

$SnF_2$(Proto IX)

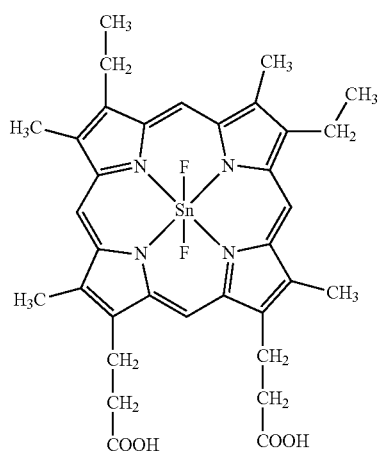

$SnF_2$(Meso IX)

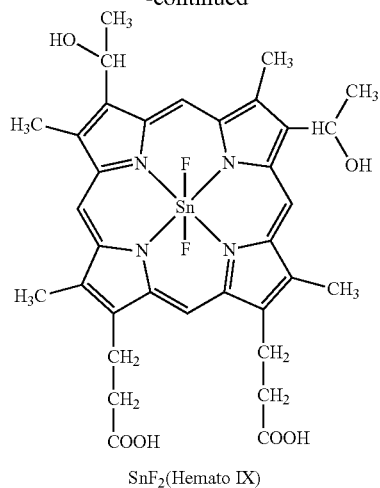

SnF$_2$(Hemato IX)

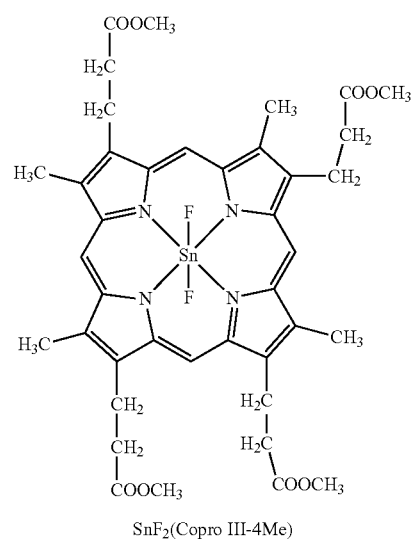

SnF$_2$(Copro III-4Me)

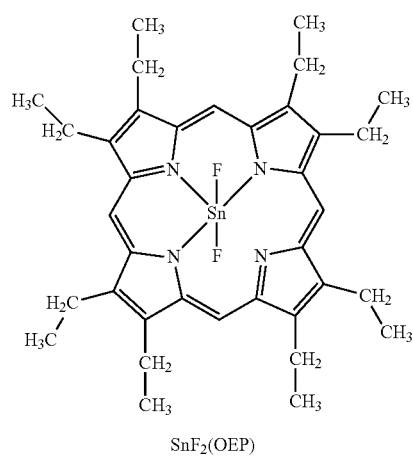

SnF$_2$(OEP)

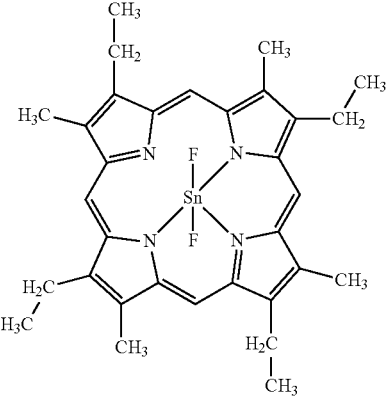

SnF$_2$(Etio I)

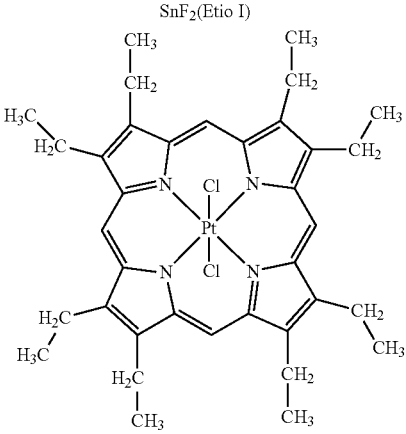

PtCl$_2$OEP

As the TADF material composed of one kind of material, a heterocyclic compound having one or both of a π-electron rich heteroaromatic skeleton and a π-electron deficient heteroaromatic skeleton can also be used. Specific examples include 2-(biphenyl-4-yl)-4,6-bis(12-phenylindolo[2,3-a] carbazol-11-yl)-1,3,5-triazine (abbreviation: PIC-TRZ), 2-{4-[3-(N-phenyl-9H-carbazol-3-yl)-9H-carbazol-9-yl] phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H, 10'H-spiro[acridin-9,9'-anthracen]-10'-one (abbreviation: ACRSA), 4-(9'-phenyl-3,3'-bi-9H-carbazol-9-yl)benzofuro[3,2-d]pyrimidine (abbreviation: 4PCCzBfpm), 4-[4-(9'-phenyl-3,3'-bi-9H-carbazol-9-yl)phenyl]benzofuro[3,2-d] pyrimidine (abbreviation: 4PCCzPBfpm), and 9-[3-(4,6-diphenyl-1,3,5-triazin-2-yl)phenyl]-9'-phenyl-2,3'-bi-9H-carbazole (abbreviation: mPCCzPTzn-02). The heterocyclic compound is preferable because of its high electron-transport property and hole-transport property due to the π-electron rich heteroaromatic ring and the π-electron deficient heteroaromatic ring contained therein. Among skeletons having the π-electron deficient heteroaromatic ring, a pyridine skeleton, a diazine skeleton (a pyrimidine skeleton, a pyrazine skeleton, or a pyridazine skeleton) and a triazine skeleton are particularly preferable because of their high stability and reliability. In particular, a benzofuropyrimidine skeleton, a benzothienopyrimidine skeleton, a benzofuropyrazine skeleton, and a benzothienopyrazine skeleton are preferable because of their high acceptor properties and reliability. Among skeletons having the π-electron rich type heteroaromatic ring, an acridine skeleton, a phenoxazine skeleton, a phenothiazine skeleton, a furan skeleton, a thiophene skeleton, and a pyrrole skeleton have stability and high reliability; therefore, at least one of these skeletons is preferably included. Note that as a furan skeleton, a dibenzofuran skeleton is preferable, and as a thiophene skeleton, a dibenzothiophene skeleton is preferable. Furthermore, as a pyrrole skeleton, an indole skeleton, a carbazole skeleton, a bicarbazole skeleton, or a 3-(9-phenyl-9H-carbazol-3-yl)-9H-carbazole skeleton is particularly preferable. Note that a substance in which the π-electron rich type heteroaromatic ring is directly bonded to the π-electron deficient type heteroaromatic ring is particularly preferred because the donor property of the π-electron rich type heteroaromatic ring and the acceptor property of the π-electron deficient type heteroaromatic ring are both intense and the difference between the level of the singlet excited state and the level of the triplet excited state becomes small. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a boron-containing skeleton such as phenylborane or boranthrene, an aromatic ring or a heteroaromatic ring having a nitrile group or a cyano group, such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical Formulae 33]

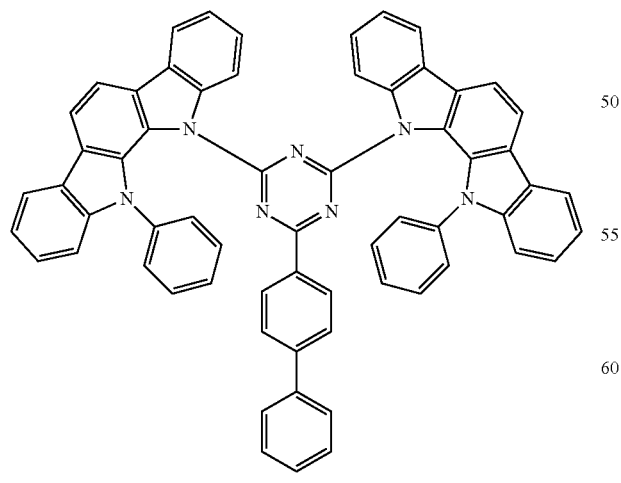

PIC-TRZ

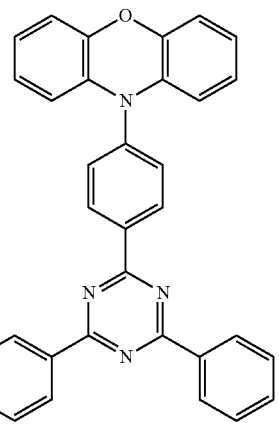

PXZ-TRZ

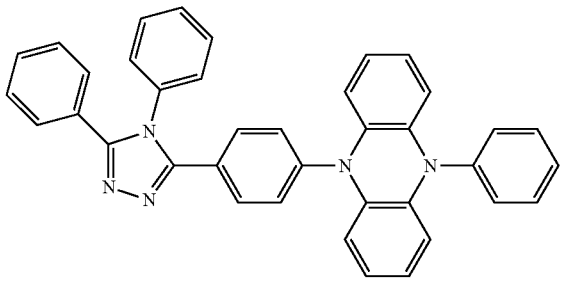

PPZ-3TPT

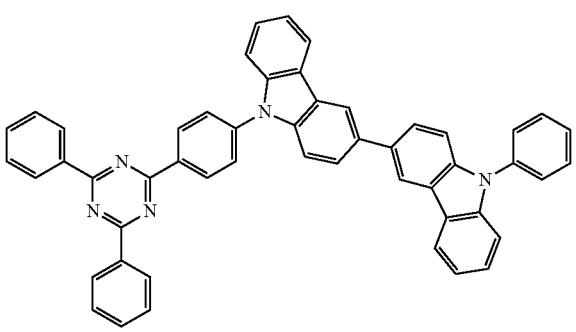

PCCzPTzn

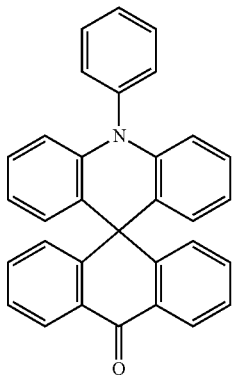

ACRSA

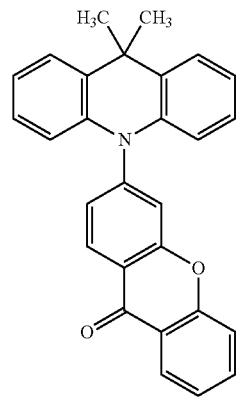

ACRXTN

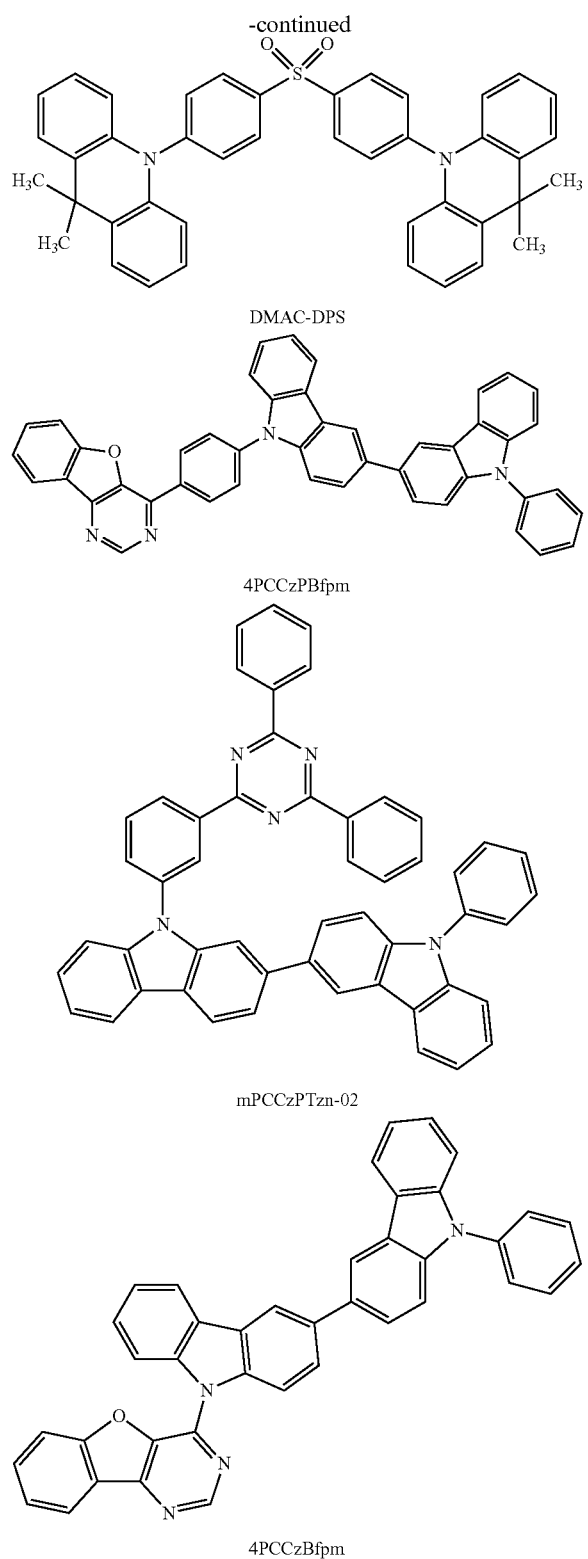

DMAC-DPS

4PCCzPBfpm mPCCzPTzn-02

4PCCzBfpm

As the phosphorescent material that can be used as any of the compound 131, the compound 133, and the compound 134, an iridium-, rhodium-, or platinum-based organometallic complex or a metal complex can be given. A platinum complex or organoiridium complex having a porphyrin ligand can be given; among them, for example, an organoiridium complex such as an iridium-based ortho-metalated complex is preferable. Examples of an ortho-metalated ligand include a 4H-triazole ligand, a 1H-triazole ligand, an imidazole ligand, a pyridine ligand, a pyrimidine ligand, a pyrazine ligand, and an isoquinoline ligand. In this case, the compound 133 (phosphorescent material) has an absorption band of triplet MLCT (Metal to Ligand Charge Transfer) transition. In the case where the phosphorescent material is used as an energy donor, it is preferred that the material be selected so that the emission peak of the phosphorescent material overlaps with an absorption band on the longest wavelength side (low energy side) of the compound 132 (fluorescent material). This makes it possible to provide a light-emitting device with drastically improved emission efficiency. Specifically, the following materials can be given as the phosphorescent material.

Examples of the substance that has an emission peak in blue or green include organometallic iridium complexes having a 4H-triazole skeleton, such as tris{2-[5-(2-methylphenyl)-4-(2,6-dimethylphenyl)-4H-1,2,4-triazol-3-yl-κN$^2$]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), tris[4-(3-biphenyl)-5-isopropyl-3-phenyl-4H-1,2,4-triazolato]iridium(III) (abbreviation: Ir(iPrptz-3b)$_3$), and tris[3-(5-biphenyl)-5-isopropyl-4-phenyl-4H-1,2,4-triazolato]iridium(III) (abbreviation: Ir(iPr5btz)$_3$); organometallic iridium complexes having a 1H-triazole skeleton, such as tris[3-methyl-1-(2-methylphenyl)-5-phenyl-1H-1,2,4-triazolato]iridium(III) (abbreviation: Ir(Mptz1-mp)$_3$) and tris(1-methyl-5-phenyl-3-propyl-1H-1,2,4-triazolato)iridium(III) (abbreviation: Ir(Prptz1-Me)$_3$); organometallic iridium complexes having an imidazole skeleton, such as fac-tris[1-(2,6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-f]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,C$^2$]iridium(III) tetrakis(1-pyrazolyl)borate (abbreviation: FIr6), bis[2-(4',6'-difluorophenyl)pyridinato-N,C$^2$]iridium(III) picolinate (abbreviation: FIrpic), bis {2-[3',5'-bis(trifluoromethyl)phenyl]pyridinato-N,C$^2$}iridium(III) picolinate (abbreviation: Ir(CF$_3$ppy)$_2$(pic)), and bis[2-(4',6'-difluorophenyl)pyridinato-N,C$^2$]iridium(III) acetylacetonate (abbreviation: FIr(acac)). Among the materials given above, the organometallic iridium complexes having a nitrogen-containing five-membered heterocyclic skeleton, such as a 4H-triazole skeleton, a 1H-triazole skeleton, or an imidazole skeleton have high triplet excitation energy, reliability, and emission efficiency and are thus especially preferable.

Examples of the substance that has an emission peak in green or yellow include organometallic iridium complexes having a pyrimidine skeleton, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[4-(2-norbornyl)-6-phenylpyrimidinato]iridium(III) (abbreviation: Ir(nbppm)$_2$(acac)), (acetylacetonato)bis[5-methyl-6-(2-methylphenyl)-4-phenylpyrimidinato]iridium (III) (abbreviation: Ir(mpmppm)$_2$(acac)), (acetylacetonato)bis{4,6-dimethyl-2-[6-(2,6-dimethylphenyl)-4-pyrimidinyl-κN$^3$]phenyl-κC}iridium(III) (abbreviation: Ir(dmppm-dmp)$_2$ (acac)), and (acetylacetonato)bis(4,6- diphenylpyrimidinato)iridium(III) (abbreviation: Ir(dppm)$_2$(acac)); organometallic iridium complexes having a pyrazine skeleton, such as (acetylacetonato)bis(3,5-dimethyl-2-phenylpyrazinato)iridium(III) (abbreviation: Ir(mppr-Me)$_2$(acac)) and (acetylacetonato)bis(5-isopropyl-3-methyl-2-phenylpyrazinato)iridium(III) (abbreviation: Ir(mppr-iPr)$_2$(acac)); organometallic iridium complexes having a pyridine skeleton, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$), and bis(2-phenylquinolinato-N,C$^{2'}$)iridium(III) acetylacetonate (abbreviation: Ir(pq)$_2$(acac)); organometallic iridium complexes such as bis(2,4-diphenyl-1,3-oxazolato-N,C$^{2'}$)iridium(III) acetylacetonate (abbreviation: Ir(dpo)$_2$(acac)), bis{2-[4'-(perfluorophenyl)phenyl]pyridinato-N,C$^{2'}$}iridium(III) acetylacetonate (abbreviation: Ir(p-PF-ph)$_2$(acac)), and bis(2-phenylbenzothiazolato-N,C$^{2'}$)iridium(III) acetylacetonate (abbreviation: Ir(bt)$_2$(acac)); and a rare earth metal complex such as tris(acetylacetonato) (monophenanthroline)terbium(III) (abbreviation: Tb(acac)$_3$(Phen)). Among the materials given above, the organometallic iridium complexes having a pyrimidine skeleton have distinctively high reliability and emission efficiency and are thus especially preferable.

Examples of the substance that has an emission peak in yellow or red include organometallic iridium complexes having a pyrimidine skeleton, such as (diisobutyrylmethanato)bis[4,6-bis(3-methylphenyl)pyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), and bis[4,6-di(naphthalen-1-yl)pyrimidinato](dipivaloylmethanato)iridium(III) (abbreviation: Ir(d1npm)$_2$(dpm)); organometallic iridium complexes having a pyrazine skeleton, such as (acetylacetonato)bis(2,3,5-triphenylpyrazinato)iridium(III) (abbreviation: Ir(tppr)$_2$(acac)), bis(2,3,5-triphenylpyrazinato)(dipivaloylmethanato)iridium(III) (abbreviation: Ir(tppr)$_2$(dpm)), and (acetylacetonato)bis[2,3-bis(4-fluorophenyl)quinoxalinato]iridium(III) (abbreviation: Ir(Fdpq)$_2$(acac)); organometallic iridium complexes having a pyridine skeleton, such as tris(1-phenylisoquinolinato-N,C$^{2'}$)iridium(III) (abbreviation: Ir(piq)$_3$) and bis(1-phenylisoquinolinato-N,C$^{2'}$)iridium(III) acetylacetonate (abbreviation: Ir(piq)$_2$(acac)); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato)(monophenanthroline)europium(III) (abbreviation: Eu(DBM)$_3$(Phen)) and tris[1-(2-thenoyl)-3,3,3-trifluoroacetonato](monophenanthroline)europium(III) (abbreviation: Eu(TTA)$_3$(Phen)). Among the materials given above, the organometallic iridium complexes having a pyrimidine skeleton have distinctively high reliability and emission efficiency and are thus especially preferable. Furthermore, the organometallic iridium complexes having a pyrazine skeleton can emit red light with favorable chromaticity.

In the case where any of the compound 131, the compound 133, and the compound 134 forms an exciplex, examples include, in addition to the above TADF material, the above phosphorescent material, and zinc- and aluminum-based metal complexes, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, and a phenanthroline derivative. Other examples include an aromatic amine and a carbazole derivative.

In addition, the following hole-transport materials and electron-transport materials can be used.

As the hole-transport material, a material having a property of transporting more holes than electrons can be used, and a material having a hole mobility of $1 \times 10^{-6}$ cm$^2$/Vs or higher is preferable. Specifically, an aromatic amine, a carbazole derivative, an aromatic hydrocarbon, a stilbene derivative, or the like can be used. Furthermore, the hole-transport material may be a high molecular compound.

Examples of the aromatic amine compound, which is a material having a high hole-transport property, include N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B).

Specific examples of the carbazole derivative include 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Other examples of the carbazole derivative include 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), and 1,4-bis[4-(N-carbazolyl)phenyl]-2,3,5,6-tetraphenylbenzene.

Moreover, examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Besides, pentacene, coronene, and the like can be used. Thus, the use of the aromatic hydrocarbon having a hole mobility of $1 \times 10^{-6}$ cm$^2$/Vs or higher and having 14 to 42, inclusive, carbon atoms is further preferable.

The aromatic hydrocarbon may have a vinyl skeleton. Examples of the aromatic hydrocarbon having a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA).

It is also possible to use high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD).

As the material having a high hole-transport property, the following aromatic amine compounds can be used for example: 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris[N-(1-naphthyl)-N-phenylamino]triphenylamine (abbreviation: 1'-TNATA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N'-phenyl-N''-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N'-diphenylbenzene-1,3-diamine (abbreviation: PCA2B), N,N',N''-triphenyl-N,N,N'-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]-spiro-9,9'-bifluorene (abbreviation: DPA2SF), N-[4-(9H-carbazol-9-yl)phenyl]-N-(4-phenyl) phenylaniline (abbreviation: YGA1BP), and N,N'-bis[4-(carbazol-9-yl)phenyl]-N,N'-diphenyl-9,9-dimethylfluorene-2,7-diamine (abbreviation: YGA2F). It is also possible to use an amine compound, a carbazole compound, a thiophene compound, a furan compound, a fluorene compound, a triphenylene compound, a phenanthrene compound, or the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 4-{3-[3-(9-phenyl-9H-fluoren-9-yl)phenyl]phenyl}dibenzofuran (abbreviation: mmDBFFLBi-II), 4,4',4''-(benzene-1,3,5-triyl)tri(dibenzofuran) (abbreviation: DBF3P-II), 1,3,5-tri(dibenzothiophen-4-yl)-benzene (abbreviation: DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), or 4-[3-(triphenylen-2-yl)phenyl]dibenzothiophene (abbreviation: mDBTPTp-II). The substances described here are mainly substances having a hole mobility of $1 \times 10^{-6}$ cm$^2$/Vs or higher. Note that other substances may also be used as long as they have a property of transporting more holes than electrons.

A material having a property of transporting more electrons than holes can be used as the electron-transport material, and a material having an electron mobility of $1 \times 10^{-6}$ cm$^2$/Vs or higher is preferable. A π-electron deficient type heteroaromatic compound such as a nitrogen-containing heteroaromatic compound, a metal complex, or the like can be used as the material that easily accepts electrons (the material having an electron-transport property). Specifically, metal complexes having a quinoline ligand, a benzoquinoline ligand, an oxazole ligand, and a thiazole ligand; an oxadiazole derivative; a triazole derivative; a phenanthroline derivative; a pyridine derivative; a bipyridine derivative; a pyrimidine derivative; and the like are given.

Examples include metal complexes having a quinoline skeleton or a benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato) (4-phenylphenolato) aluminum(III) (abbreviation: BAlq), and bis(8-quinolinolato)zinc(II) (abbreviation: Znq). Alternatively, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ), or the like can also be used. Furthermore, other than the metal complexes, it is possible to use a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), bathophenanthroline (abbreviation: BPhen), 2,9-bis(naphthalen-2-yl)-4,7-diphenyl-1,10-phenanthroline (abbreviation: NBPhen), or bathocuproine (abbreviation: BCP); a heterocyclic compound having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 4,6-bis[3-(phenanthren-9-yl)phenyl]pyrimidine (abbreviation: 4,6mPnP2Pm), 4,6-bis[3-(4-dibenzothienyl)phenyl] pyrimidine (abbreviation: 4,6mDBTP2Pm-II), or 4,6-bis[3-(9H-carbazol-9-yl)phenyl]pyrimidine (abbreviation: 4,6mCzP2Pm); a heterocyclic compound having a triazine skeleton, such as 2-{4-[3-(N-phenyl-9H-carbazol-3-yl)-9H-carbazol-9-yl]phenyl}-4,6-diphenyl-1,3,5-triazine (abbreviation: PCCzPTzn); a heterocyclic compound having a pyridine skeleton, such as 3,5-bis[3-(9H-carbazol-9-yl)phenyl]pyridine (abbreviation: 35DCzPPy), or 1,3,5-tri[3-(3-pyridyl)phenyl]benzene (abbreviation: TmPyPB); or a heteroaromatic compound such as 4,4'-bis(5-methylbenzoxazol-2-yl)stilbene (abbreviation: BzOs). Furthermore, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used. The substances described here are mainly substances having an electron mobility of $1 \times 10^{-6}$ cm$^2$/Vs or higher. Note that other substances may also be used as long as they have a property of transporting more electrons than holes.

In the case where compounds that form an exciplex do not include a TADF material or a phosphorescent material, it is preferred that one have a function of transporting electrons and the other have a function of transporting holes. Furthermore, it is preferred that one have a π-electron deficient heteroaromatic ring skeleton and the other have a π-electron rich heteroaromatic ring skeleton.

It is preferred that the compound 131 and the compound 133, the compound 131 and the compound 134, and the compound 132 (fluorescent material) be selected so that the emission peak of the exciplex formed by the compound 131 and the compound 133 or the compound 131 and the compound 134 overlaps with an absorption band on the longest wavelength side (low energy side) of the compound 132 (fluorescent material). This makes it possible to provide a light-emitting device with drastically improved emission efficiency.

When an exciplex is formed using a phosphorescent material as one of materials, the phosphorescent material does not need to emit light at room temperature and emits light at room temperature after an exciplex is formed. In that case, for example, Ir(ppz)$_3$ or the like can be used as the phosphorescent material.

The light-emitting layer 130 can be formed of two or more layers. For example, in the case where the light-emitting layer 130 is formed by stacking a first light-emitting layer and a second light-emitting layer in this order from the hole-transport layer side, a substance having a hole-transport property is used as the host material of the first light-emitting layer and a substance having an electron-transport property is used as the host material of the second light-emitting layer.

The light-emitting layer 130 may contain a material (a compound 135 (not illustrated)) other than the compound 131, the compound 132, the compound 133, and the compound 134. In that case, in order for the compound 131 and the compound 133 (or the compound 134) to efficiently form an exciplex, it is preferable that the HOMO level of one of the compound 131 and the compound 133 (or the compound 134) be the highest HOMO level of the materials in the light-emitting layer 130, and that the LUMO level of the other be the lowest LUMO level of the materials in the light-emitting layer 130. With such an energy level correlation, the reaction for forming an exciplex by the compound 131 and the compound 135 can be inhibited.

In the case where, for example, the compound 131 has a hole-transport property and the compound 133 (or the compound 134) has an electron-transport property, the HOMO level of the compound 131 is preferably higher than the HOMO level of the compound 133 and the HOMO level of the compound 135, and the LUMO level of the compound 133 is preferably lower than the LUMO level of the compound 131 and the LUMO level of the compound 135. In this case, the LUMO level of the compound 135 may be higher or lower than the LUMO level of the compound 131. Furthermore, the HOMO level of the compound 135 may be higher or lower than the HOMO level of the compound 133.

Although there is no particular limitation on the compound 135, for example, metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4,4'-bis[N-(spiro-9,9'-bifluoren-2-yl)-N-phenylamino]biphenyl (abbreviation: BSPB) can be given. Other examples include condensed polycyclic aromatic compounds such as anthracene derivatives, phenanthrene derivatives, pyrene derivatives, chrysene derivatives, and dibenzo[g,p]chrysene derivatives, and specific examples include 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N',N",N",N''',N'''-octaphenyldibenzo[g,p]chrysene-2,7,10,15-tetraamine (abbreviation: DBC1), 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), and 1,3,5-tri(1-pyrenyl)benzene (abbreviation: TPB3). One or more substances having a wider energy gap than the compound 131 and the compound 132 are selected from these and known substances.

<<Pair of Electrodes>>

The electrode 101 and the electrode 102 have functions of injecting holes and electrons into the light-emitting layer 130. The electrode 101 and the electrode 102 can be formed using a metal, an alloy, a conductive compound, a mixture or a stack thereof, or the like. As the metal, aluminum (Al) is a typical example; besides, a transition metal such as silver (Ag), tungsten, chromium, molybdenum, copper, or titanium, an alkali metal such as lithium (Li) or cesium, or a Group 2 metal such as calcium or magnesium (Mg) can be used. As the transition metal, a rare earth metal such as ytterbium (Yb) may be used. An alloy containing the above metal can be used as the alloy, and MgAg, AlLi, and the like can be given, for example. As the conductive compound, for example, metal oxides such as indium tin oxide (hereinafter ITO), indium tin oxide containing silicon or silicon oxide (abbreviation: ITSO), indium zinc oxide, and indium oxide containing tungsten and zinc can be given. It is also possible to use an inorganic carbon-based material such as graphene as the conductive compound. As described above, one or both of the electrode 101 and the electrode 102 may be formed by stacking two or more of these materials.

Light emission obtained from the light-emitting layer 130 is extracted through one or both of the electrode 101 and the electrode 102. Therefore, at least one of the electrode 101 and the electrode 102 has a function of transmitting visible light. As the conductive material having a function of transmitting light, a conductive material having a visible light transmittance of higher than or equal to 40% and lower than or equal to 100%, preferably higher than or equal to 60% and lower than or equal to 100%, and a resistivity of lower than or equal to $1\times10^{-2}$ Ω·cm can be given. The electrode through which light is extracted may be formed using a conductive material having a function of transmitting light and a function of reflecting light. An example of the conductive material is a conductive material having a visible light reflectivity higher than or equal to 20% and lower than or equal to 80%, preferably higher than or equal to 40% and lower than or equal to 70%, and a resistivity lower than or equal to $1\times10^{-2}$ Ω·cm. In the case where a material with low light transmittance, such as metal or alloy, is used for the electrode through which light is extracted, one or both of the electrode 101 and the electrode 102 are formed to a thickness that is thin enough to transmit visible light (e.g., a thickness of 1 nm to 10 nm).

Note that in this specification and the like, for the electrode having a function of transmitting light, a material that has a function of transmitting visible light and has conductivity is used, and examples include, in addition to the above-described oxide conductor layer typified by an ITO, an oxide semiconductor layer and an organic conductor layer containing an organic substance. As the organic conductor layer containing an organic substance, for example, a layer containing a composite material in which an organic compound and an electron donor (donor) are mixed, a layer containing a composite material in which an organic compound and an electron acceptor (acceptor) are mixed, and the like can be given. The resistivity of the transparent conductive layer is preferably lower than or equal to $1\times10^5$ Ω·cm, and further preferably lower than or equal to $1\times10^4$ Ω·cm.

As the method for forming the electrode 101 and the electrode 102, a sputtering method, an evaporation method, a printing method, a coating method, an MBE (Molecular Beam Epitaxy) method, a CVD method, a pulsed laser deposition method, an ALD (Atomic Layer Deposition) method, or the like can be used as appropriate.

<<Hole-Injection Layer>>

The hole-injection layer 111 has a function of reducing a barrier for hole injection from one of the pair of electrodes (the electrode 101 or the electrode 102) to promote hole injection and is formed using a transition metal oxide, a phthalocyanine derivative, an aromatic amine, or the like, for example. Examples of the transition metal oxide include molybdenum oxide, vanadium oxide, ruthenium oxide, tungsten oxide, and manganese oxide. Examples of the phthalocyanine derivative include phthalocyanine and metal phthalocyanine. Examples of the aromatic amine include a benzidine derivative and a phenylenediamine derivative. It is also possible to use a high molecular compound such as polythiophene or polyaniline; a typical example thereof is poly(ethylenedioxythiophene)/poly(styrenesulfonic acid), which is self-doped polythiophene.

As the hole-injection layer 111, a layer containing a composite material of a hole-transport material and a material having a property of accepting electrons from the hole-transport material can also be used. Alternatively, a stack of a layer containing a material having an electron-accepting property and a layer containing a hole-transport material may also be used. In a steady state or in the presence of an electric field, a charge can be transferred between these materials. Examples of the material having an electron-accepting property include organic acceptors such as a quinodimethane derivative, a chloranil derivative, and a hexaazatriphenylene derivative. A specific example is a compound having an electron-withdrawing group (in particular, a cyano group or a halogen group such as a fluoro group), such as 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), and 1,3,4,5,7,8-hexafluorotetracyanonaphthoquinodimethane (abbreviation: F6-TCNNQ). A compound in which electron-withdrawing groups are bonded to a condensed aromatic ring having a plurality of hetero atoms, such as HAT-CN, is particularly preferable because it is thermally stable. A [3]radialene derivative including an electron-withdrawing group (in particular, a cyano group or a halogen group such as a fluoro group) has a very high electron-accepting property and thus is preferred; specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile]. Alternatively, a transition metal oxide such as an oxide of metal from Group 4 to Group 8 can be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because of stability in the air, a low hygroscopic property, and easiness of handling.

As the hole-transport material, a material having a property of transporting more holes than electrons can be used, and a material having a hole mobility of $1\times10^{-6}$ cm$^2$/Vs or higher is preferable. Specifically, the aromatic amines and the carbazole derivatives given as the hole-transport material that can be used in the light-emitting layer 130 can be used. Alternatively, the aromatic hydrocarbons, the stilbene derivatives, and the like can be used. Furthermore, the hole-transport material may be a high molecular compound.

Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)

phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Besides, pentacene, coronene, and the like can be used. Thus, the use of the aromatic hydrocarbon having a hole mobility of $1 \times 10^{-6}$ cm$^2$/Vs or higher and having 14 to 42, inclusive, carbon atoms is further preferable.

The aromatic hydrocarbon may have a vinyl skeleton. Examples of the aromatic hydrocarbon having a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA).

It is also possible to use high molecular compounds such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD).

<<Hole-Transport Layer>>

The hole-transport layer 112 is a layer containing a hole-transport material and can be formed using any of the materials given as examples of the materials of the hole-injection layer 111. In order that the hole-transport layer 112 has a function of transporting holes injected into the hole-injection layer 111 to the light-emitting layer 130, the hole-transport layer 112 preferably has the HOMO level equal or close to the HOMO level of the hole-injection layer 111.

As the hole-transport material, the material given as an example of the material of the hole-injection layer 111 can be used. A substance having a hole mobility of $1 \times 10^{-6}$ cm$^2$/Vs or higher is preferred. Note that other substances may also be used as long as they have a property of transporting more holes than electrons. The layer containing a substance having a high hole-transport property is not limited to a single layer, and two or more layers containing the aforementioned substances may be stacked.

<<Electron-Transport Layer>>

The electron-transport layer 118 has a function of transporting, to the light-emitting layer 130, electrons injected from the other of the pair of electrodes (the electrode 101 or the electrode 102) through the electron-injection layer 119. A material having a property of transporting more electrons than holes can be used as the electron-transport material, and a material having an electron mobility of $1 \times 10^{-6}$ cm$^2$/Vs or higher is preferable. As a compound that easily accepts electrons (a material having an electron-transport property), a π-electron deficient heteroaromatic compound such as a nitrogen-containing heteroaromatic compound or a metal complex can be used, for example. Specifically, the metal complex having a quinoline ligand, a benzoquinoline ligand, an oxazole ligand, or a thiazole ligand, which is given as the electron-transport material that can be used in the light-emitting layer 130, can be given. Furthermore, an oxadiazole derivative, a triazole derivative, a phenanthroline derivative, a pyridine derivative, a bipyridine derivative, a pyrimidine derivative, and the like can be given. A substance having an electron mobility of $1 \times 10^{-6}$ cm$^2$/Vs or higher is preferable. Note that other substances may also be used for the electron-transport layer as long as they have a property of transporting more electrons than holes. The electron-transport layer 118 is not limited to a single layer, and two or more layers containing the aforementioned substances may be stacked.

A layer that controls transfer of electron carriers may be provided between the electron-transport layer 118 and the light-emitting layer 130. The layer that controls transfer of electron carriers is a layer in which a small amount of a substance having a high electron-trapping property is added to the above-described material having a high electron-transport property, and is capable of adjusting carrier balance by inhibiting transfer of electron carriers. Such a structure is very effective in preventing a problem (such as a reduction in element lifetime) caused when electrons pass through the light-emitting layer.

<<Electron-Injection Layer>>

The electron-injection layer 119 has a function of reducing a barrier for electron injection from the electrode 102 to promote electron injection, and a Group 1 metal, a Group 2 metal, or an oxide, a halide, a carbonate, or the like of them can be used, for example. Alternatively, a composite material of the electron-transport material described above and a material having a property of donating electrons thereto can be used. Examples of the material having an electron-donating property include a Group 1 metal, a Group 2 metal, and an oxide of them. Specifically, an alkali metal, an alkaline earth metal, or a compound thereof, such as lithium fluoride (LiF), sodium fluoride (NaF), cesium fluoride (CsF), calcium fluoride (CaF$_2$), or lithium oxide (LiO$_x$), can be used. Alternatively, a rare earth metal compound such as erbium fluoride (ErF$_3$) can be used. Electride may also be used for the electron-injection layer 119. Examples of the electride include a substance in which electrons are added at high concentration to a mixed oxide of calcium and aluminum. The substance that can be used for the electron-transport layer 118 can be used for the electron-injection layer 119.

A composite material in which an organic compound and an electron donor (donor) are mixed may also be used for the electron-injection layer 119. Such a composite material is excellent in an electron-injection property and an electron-transport property because electrons are generated in the organic compound by the electron donor. In this case, the organic compound is preferably a material that is excellent in transporting the generated electrons; specifically, the above-described substances contained in the electron-transport layer 118 (the metal complexes, heteroaromatic compounds, and the like) can be used, for example. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, ytterbium, and the like are given as examples. In addition, an alkali metal oxide or an alkaline earth metal oxide is preferable, and examples include lithium oxide, calcium oxide, and barium oxide. A Lewis base such as magnesium oxide can also be used. An organic compound such as tetrathiafulvalene (abbreviation: TTF) can also be used.

Note that the light-emitting layer, the hole-injection layer, the hole-transport layer, the electron-transport layer, and the electron-injection layer described above can each be formed by a method such as an evaporation method (including a vacuum evaporation method), an inkjet method, a coating method, a nozzle printing method, or gravure printing. Other than the above-described materials, an inorganic compound such as a quantum dot or a high molecular compound (an oligomer, a dendrimer, a polymer, or the like) may be used in the light-emitting layer, the hole-injection layer, the hole-transport layer, the electron-transport layer, and the electron-injection layer described above.

As the quantum dot, a colloidal quantum dot, an alloyed quantum dot, a core-shell quantum dot, a core quantum dot, or the like may be used. Moreover, a quantum dot containing an element group of Group 2 and Group 16, Group 13 and Group 15, Group 13 and Group 17, Group 11 and Group 17, or Group 14 and Group 15 may be used. Alternatively, a quantum dot containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

As the liquid medium used for the wet process, an organic solvent of ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; dimethylformamide (DMF); dimethyl sulfoxide (DMSO); or the like can be used.

Examples of the high molecular compound that can be used for the light-emitting layer include a polyphenylenevinylene (PPV) derivative such as poly[2-methoxy-5-(2-ethylhexyloxy)-1,4-phenylenevinylene] (abbreviation: MEH-PPV) or poly(2,5-dioctyl-1,4-phenylenevinylene); a polyfluorene derivative such as poly(9,9-di-n-octylfluorenyl-2,7-diyl) (abbreviation: PF8), poly[(9,9-di-n-octylfluorenyl-2,7-diyl)-alt-(benzo[2,1,3]thiadiazole-4,8-diyl)] (abbreviation: F8BT), poly[(9,9-di-n-octylfluorenyl-2,7-diyl)-alt-(2,2'-bithiophene-5,5'-diyl)] (abbreviation: F8T2), poly[(9,9-dioctyl-2,7-divinylenefluorenylene)-alt-(9,10-anthracene)], or poly[(9,9-dihexylfluorene-2,7-diyl)-alt-(2,5-dimethyl-1,4-phenylene)]; a polyalkylthiophene (PAT) derivative such as poly(3-hexylthiophene-2,5-diyl) (abbreviation: P3HT); and a polyphenylene derivative. These high molecular compounds and high molecular compounds such as PVK, poly(2-vinylnaphthalene), and poly[bis(4-phenyl)(2,4,6-trimethylphenyl)amine] (abbreviation: PTAA) may be doped with a light-emitting compound and used for the light-emitting layer. As the light-emitting compound, the above-described light-emitting compound can be used.

<<Substrate>>

A light-emitting device of one embodiment of the present invention is formed over a substrate of glass, plastic, or the like. As for the order of forming layers over the substrate, layers may be sequentially stacked from the electrode 101 side or sequentially stacked from the electrode 102 side.

For the substrate over which the light-emitting device of one embodiment of the present invention can be formed, glass, quartz, plastic, or the like can be used, for example. Furthermore, a flexible substrate can be used. The flexible substrate is a substrate that can be bent (is flexible), such as a plastic substrate made of polycarbonate or polyarylate, for example. Furthermore, a film, an inorganic vapor deposition film, or the like can be used. Another material may be used as long as the substrate functions as a support in a fabrication process of the light-emitting devices or the optical elements. Another material having a function of protecting the light-emitting devices or the optical elements may be used.

In one embodiment of the present invention, a light-emitting device can be formed using any of a variety of substrates, for example. The type of substrate is not limited particularly. Examples of the substrate include a semiconductor substrate (e.g., a single-crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, cellulose nanofiber (CNF) and paper which include a fibrous material, and a base material film. Examples of the glass substrate include barium borosilicate glass, aluminoborosilicate glass, and soda lime glass. Examples of the flexible substrate, the attachment film, the base material film, and the like are as follows. The examples include plastics typified by polyethylene terephthalate (PET), polyethylene naphthalate (PEN), polyether sulfone (PES), and polytetrafluoroethylene (PTFE). Another example is a resin such as acrylic. Furthermore, polypropylene, polyester, polyvinyl fluoride, and polyvinyl chloride can be given as examples. Other examples are polyamide, polyimide, aramid, epoxy, an inorganic vapor deposition film, and paper.

Furthermore, a flexible substrate may be used as the substrate and the light-emitting device may be formed directly on the flexible substrate. Alternatively, a separation layer may be provided between the substrate and the light-emitting device. The separation layer can be used when part or the whole of a light-emitting device formed thereover is separated from the substrate and transferred onto another substrate. In such a case, the light-emitting device can be transferred to a substrate having low heat resistance or a flexible substrate as well. For the above separation layer, a stacked structure of inorganic films, which are a tungsten film and a silicon oxide film, or a structure in which a resin film of polyimide or the like is formed over a substrate can be used, for example.

In other words, after the light-emitting device is formed using a substrate, the light-emitting device may be transferred to and arranged over another substrate. Examples of the substrate to which the light-emitting device is transferred include, in addition to the above substrates, a cellophane substrate, a stone substrate, a wood substrate, a cloth substrate (including a natural fiber (silk, cotton, or hemp), a synthetic fiber (nylon, polyurethane, or polyester), a regenerated fiber (acetate, cupro, rayon, or regenerated polyester), and the like), a leather substrate, and a rubber substrate. With the use of such a substrate, a light-emitting device with high durability, a light-emitting device with high heat resistance, a light-emitting device with reduced weight, or a light-emitting device with reduced thickness can be obtained.

A field-effect transistor (FET) may be formed over the above-described substrate and the light-emitting device 150 may be formed over an electrode electrically connected to the FET, for example. Accordingly, an active matrix display device in which the FET controls the driving of the light-emitting device can be fabricated.

The structure described in this embodiment can be used in appropriate combination with the other embodiments.

Embodiment 3

In this embodiment, a light-emitting device having a structure different from the structure of the light-emitting device described in Embodiment 1 will be described below with reference to FIG. 7. Note that in FIG. 7, a portion having a function similar to that of a portion denoted by a reference numeral shown in FIG. 1A is represented by the same hatch pattern and the reference numeral is omitted in some cases. In addition, common reference numerals are used for portions having similar functions, and a detailed description thereof is omitted in some cases.

<Structure Example 2 of Light-Emitting Device>

Figure 7:
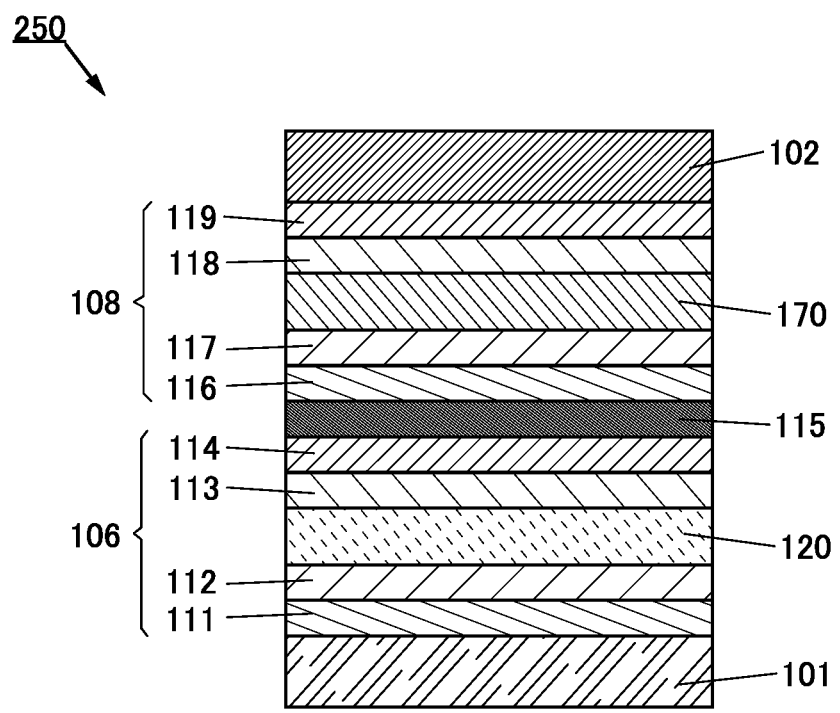
FIG. 7 is a schematic cross-sectional view of a light-emitting device of one embodiment of the present invention.

FIG. 7 is a schematic cross-sectional view of a light-emitting device 250.

The light-emitting device 250 illustrated in FIG. 7 includes a plurality of light-emitting units (a light-emitting unit 106 and a light-emitting unit 108) between a pair of electrodes (the electrode 101 and the electrode 102). Any one of the plurality of light-emitting units preferably has a structure similar to that of the EL layer 100 illustrated in FIG. 1A. That is, it is preferable that the light-emitting device 150 illustrated in FIG. 1A include one light-emitting unit, while the light-emitting device 250 include a plurality of light-emitting units. Note that the electrode 101 functions as an anode and the electrode 102 functions as a cathode in the light-emitting device 250 in the following description; however, the functions of the electrodes may be reversed as the structure of the light-emitting device 250.

Moreover, in the light-emitting device 250 illustrated in FIG. 7, the light-emitting unit 106 and the light-emitting unit 108 are stacked, and a charge-generation layer 115 is provided between the light-emitting unit 106 and the light-emitting unit 108. Note that the light-emitting unit 106 and the light-emitting unit 108 may have the same structure or different structures. For example, it is preferable to use a structure similar to that of the EL layer 100 for the light-emitting unit 108.

The light-emitting device 250 includes a light-emitting layer 120 and a light-emitting layer 170. The light-emitting unit 106 includes the hole-injection layer 111, the hole-transport layer 112, an electron-transport layer 113, and an electron-injection layer 114 in addition to the light-emitting layer 120. The light-emitting unit 108 includes a hole-injection layer 116, a hole-transport layer 117, the electron-transport layer 118, and the electron-injection layer 119 in addition to the light-emitting layer 170.

In the light-emitting device 250, any layer of each of the light-emitting unit 106 and the light-emitting unit 108 contains the compound of one embodiment of the present invention. Note that the layer containing the compound is preferably the light-emitting layer 120 or the light-emitting layer 170.

The charge-generation layer 115 may have either a structure in which a substance having an acceptor property, which is an electron acceptor, is added to a hole-transport material or a structure in which a substance having a donor property, which is an electron donor, is added to an electron-transport material. Alternatively, both of these structures may be stacked.

In the case where the charge-generation layer 115 contains a composite material of an organic compound and a substance having an acceptor property, the composite material that can be used for the hole-injection layer 111 described in Embodiment 1 is used as the composite material. As the organic compound, a variety of compounds such as an aromatic amine compound, a carbazole compound, an aromatic hydrocarbon, and a high molecular compound (an oligomer, a dendrimer, a polymer, or the like) can be used. Note that a substance having a hole mobility of $1 \times 10^{-6}$ cm$^2$/Vs or higher is preferably used as the organic compound. However, other substances may also be used as long as they have a property of transporting more holes than electrons. Since the composite material of an organic compound and a substance having an acceptor property has excellent carrier-injection and carrier-transport properties, low-voltage driving or low-current driving can be achieved. Note that in the case where a surface of a light-emitting unit on the anode side is in contact with the charge-generation layer 115, the charge-generation layer 115 can also serve as a hole-injection layer or a hole-transport layer of the light-emitting unit; thus, a structure in which a hole-injection layer or a hole-transport layer is not provided in the light-emitting unit may be employed. Alternatively, in the case where a surface of a light-emitting unit on the cathode side is in contact with the charge-generation layer 115, the charge-generation layer 115 can also serve as an electron-injection layer or an electron-transport layer of the light-emitting unit; thus, a structure in which an electron-injection layer or an electron-transport layer is not provided in the light-emitting unit may be employed.

Note that the charge-generation layer 115 may have a stacked-layer structure combining a layer containing the composite material of an organic compound and a substance having an acceptor property and a layer formed of another material. For example, a layer containing the composite material of an organic compound and a substance having an acceptor property and a layer containing one compound selected from electron-donating substances and a compound having a high electron-transport property may be combined. Moreover, a layer containing the composite material of an organic compound and a substance having an acceptor property and a layer containing a transparent conductive film may be combined.

Note that the charge-generation layer 115 sandwiched between the light-emitting unit 106 and the light-emitting unit 108 injects electrons into one of the light-emitting units and injects holes into the other of the light-emitting units when voltage is applied to the electrode 101 and the electrode 102. For example, in FIG. 7, the charge-generation layer 115 injects electrons into the light-emitting unit 106 and injects holes into the light-emitting unit 108 when voltage is applied such that the potential of the electrode 101 is higher than the potential of the electrode 102.

Note that in terms of outcoupling efficiency, the charge-generation layer 115 preferably has a property of transmitting visible light (specifically, the transmittance of visible light through the charge-generation layer 115 is preferably higher than or equal to 40%). Moreover, the charge-generation layer 115 functions even when it has lower conductivity than the pair of electrodes (the electrode 101 and the electrode 102).

Forming the charge-generation layer 115 using the above-described materials can inhibit an increase in driving voltage in the case where the light-emitting layers are stacked.

The light-emitting device having two light-emitting units has been described with reference to FIG. 7; however, a light-emitting device in which three or more light-emitting units are stacked can be similarly employed. When a plurality of light-emitting units partitioned by the charge-generation layer are arranged between a pair of electrodes as in the light-emitting device 250, it is possible to achieve a light-emitting device that can emit high-luminance light with the current density kept low and has a long lifetime. Moreover, a light-emitting device having low power consumption can be achieved.

Note that in each of the above-described structures, the emission colors of the guest materials used for the light-emitting unit 106 and the light-emitting unit 108 may be the same or different from each other. In the case where guest materials having a function of emitting light of the same color are used for the light-emitting unit 106 and the light-emitting unit 108, the light-emitting device 250 can exhibit high emission luminance at a small current value, which is preferable. In the case where guest materials having a function of emitting light of different colors are used for the light-emitting unit 106 and the light-emitting unit 108, the light-emitting device 250 can exhibit multi-color light emission, which is preferable. In this case, with the use of a plurality of light-emitting materials with different emission wavelengths in one or both of the light-emitting layer 120 and the light-emitting layer 170, the light-emitting device 250 emits light obtained by synthesizing light emission having different emission peaks; thus, its emission spectrum has at least two local maximum values.

The above structure is also suitable for obtaining white light emission. When the light-emitting layer 120 and the light-emitting layer 170 emit light of complementary colors, white light emission can be obtained. It is particularly favorable to select the guest materials so that white light emission with high color rendering properties or light emission of at least red, green, and blue can be obtained.

One or both of the light-emitting layer 120 and the light-emitting layer 170 preferably have the structure of the light-emitting layer 130 described in Embodiment 1. With such a structure, a light-emitting device with favorable emission efficiency and favorable reliability can be obtained. The guest material contained in the light-emitting layer 130 is a fluorescent material. Thus, when one or both of the light-emitting layer 120 and the light-emitting layer 170 have the structure of the light-emitting layer 130 described in Embodiment 1, a light-emitting device with high efficiency and high reliability can be obtained.

In the case of a light-emitting device in which three or more light-emitting units are stacked, the emission colors of guest materials used in the light-emitting units may be the same or different from each other. In the case where a plurality of light-emitting units that exhibit the same emission color are included, the emission color of the plurality of light-emitting units can have higher emission luminance at a small current value. Such a structure can be suitably used for adjustment of emission colors. The structure is particularly suitable when guest materials that exhibit different emission colors with different luminous efficiencies are used. For example, when three layers of light-emitting units are included, the intensity of fluorescent light emission and phosphorescent light emission can be adjusted with two layers of light-emitting units that contain a fluorescent material for the same color and one layer of a light-emitting unit that contains a phosphorescent material that exhibits a different emission color from that of the fluorescent material. That is, the intensity of emitted light of each color can be adjusted with the number of light-emitting units.

In the case of the light-emitting device including two layers of fluorescent units and one layer of a phosphorescent unit, it is preferable to use a light-emitting device including the two layers of the light-emitting units including a blue fluorescent material and the one layer of the light-emitting unit including a yellow phosphorescent material; a light-emitting device including the two layers of the light-emitting units including a blue fluorescent material and the one layer of the light-emitting unit including a red phosphorescent material and a green phosphorescent material; or a light-emitting device including the two layers of the light-emitting units including a blue fluorescent material and the one layer of the light-emitting unit including a red phosphorescent material, a yellow phosphorescent material, and a green phosphorescent material, in which case white light emission can be obtained efficiently. Thus, the light-emitting device of one embodiment of the present invention can be combined with a phosphorescent unit, as appropriate.

The above phosphorescent units exhibit an emission color other than blue. The structure of the light-emitting layer 130 described in Embodiment 1 can be used for the light-emitting units of a color other than blue. In this case, the light-emitting units of a color other than blue contains a fluorescent material. For example, it is possible to use a light-emitting device including two layers of the light-emitting units including a blue fluorescent material and one layer of the light-emitting unit including a yellow fluorescent material; a light-emitting device including two layers of the light-emitting units including a blue fluorescent material and one layer of the light-emitting unit including a red fluorescent material and a green fluorescent material; or a light-emitting device including two layers of the light-emitting units including a blue fluorescent material and one layer of the light-emitting unit including a red fluorescent material, a yellow fluorescent material, and a green fluorescent material. In that case, when a light-emitting unit that emits light of a color other than blue and the above-described light-emitting unit are combined as the light-emitting unit of the light-emitting device, a structure in which the structure of the light-emitting layer 130 described in Embodiment 1 is used for light-emitting units of red, green, and yellow can be employed. This structure is preferable because white light emission can be efficiently obtained. In that case, the following materials can be used for the light-emitting layer of the blue fluorescent unit. The relation between the T1 level of the host material and the T1 level of the guest material of the light-emitting layer of the blue fluorescent unit is, preferably, the T1 level of the host material<the T1 level of the guest material, in which case high efficiency owing to triplet-triplet annihilation (TTA) can be expected. Needless to say, the structure of the light-emitting layer 130 described in Embodiment 1 may be used for the blue fluorescent unit.

At least one of the light-emitting layer 120 and the light-emitting layer 170 may further be divided into layers and the divided layers may contain different light-emitting materials. That is, at least one of the light-emitting layer 120 and the light-emitting layer 170 can consist of two or more layers. For example, in the case where the light-emitting layer is formed by stacking a first light-emitting layer and a second light-emitting layer in this order from the hole-transport layer side, the first light-emitting layer is formed using a material having a hole-transport property as the host material and the second light-emitting layer is formed using a material having an electron-transport property as the host material. In this case, the light-emitting materials contained in the first light-emitting layer and the second light-emitting layer may be the same or different, and may have functions of exhibiting light emission of the same color or exhibiting light emission of different colors. White light emission with high color rendering properties that is formed of three primary colors or four or more emission colors can also be obtained by using a plurality of light-emitting materials having functions of exhibiting light emission of different colors.

Note that this embodiment can be combined as appropriate with any of the other embodiments.

Embodiment 4

In this embodiment, a light-emitting apparatus including the light-emitting device described in Embodiment 1 and Embodiment 3 will be described with reference to FIG. 8A and FIG. 8B.

Figure 8A:
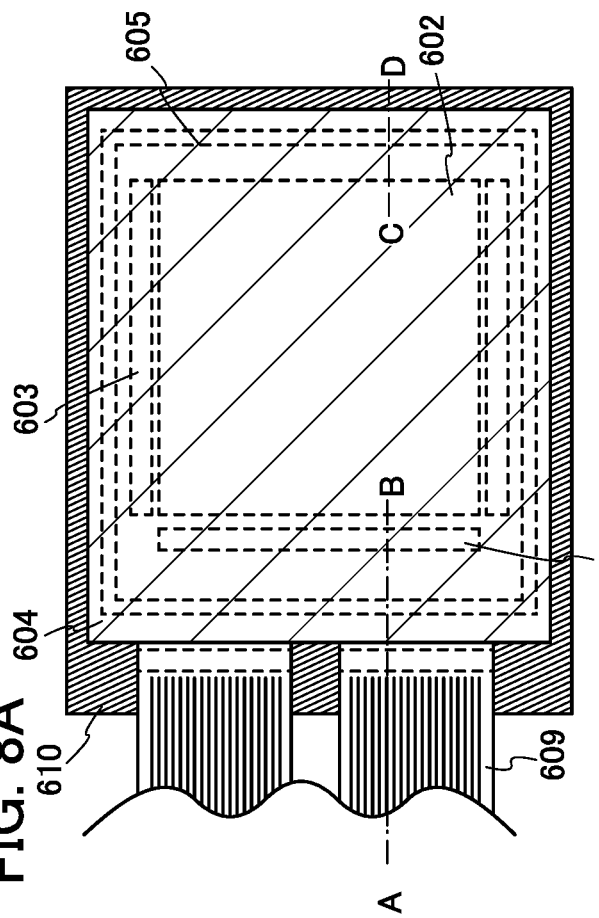
FIG. 8A is a top view illustrating a display device of one embodiment of the present invention.
Figure 8B:
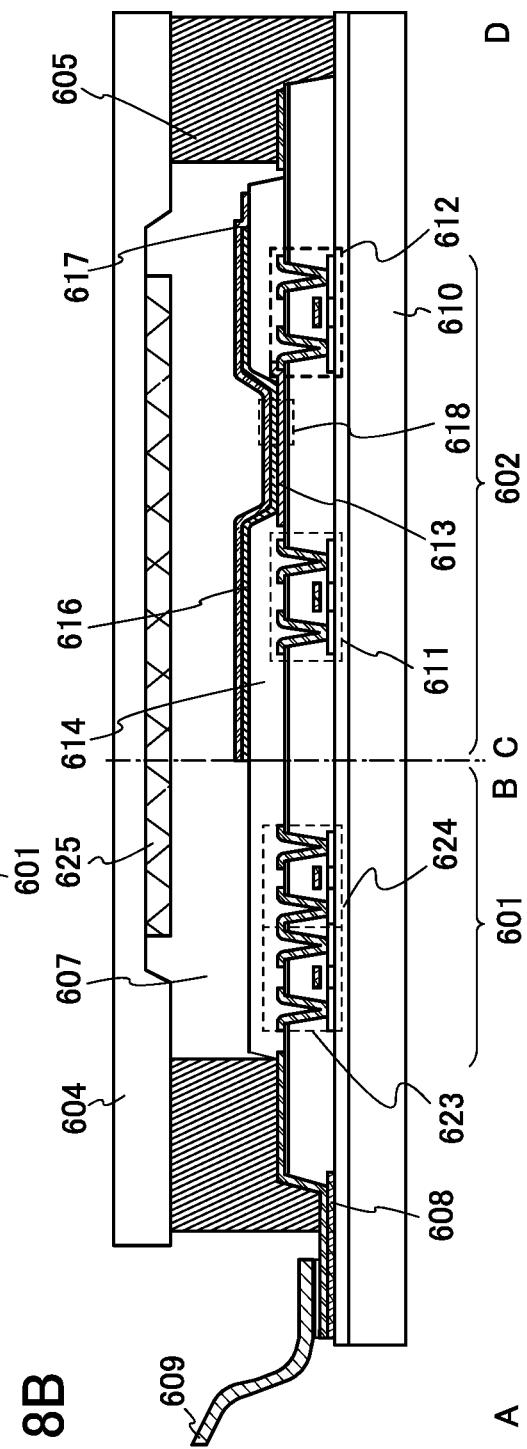
FIG. 8B is a cross-sectional schematic view thereof.

FIG. 8A is a top view of a light-emitting apparatus, and FIG. 8B is a cross-sectional view taken along A-B and C-D in FIG. 8A. This light-emitting apparatus includes a driver circuit portion (a source side driver circuit) 601, a pixel portion 602, and a driver circuit portion (a gate side driver circuit) 603, which are indicated by dotted lines, as components controlling light emission from a light-emitting device. Furthermore, 604 denotes a sealing substrate, 625 denotes a desiccant, 605 denotes a sealant, and a portion surrounded by the sealant 605 is a space 607.

Note that a lead wiring 608 is a wiring for transmitting signals to be input to the source side driver circuit 601 and the gate side driver circuit 603 and receives a video signal, a clock signal, a start signal, a reset signal, and the like from an FPC (flexible printed circuit) 609 serving as an external input terminal. Although only the FPC is illustrated here, a printed wiring board (PWB) may be attached to the FPC. The light-emitting apparatus in this specification includes not only the light-emitting apparatus itself but also the state where the FPC or the PWB is attached thereto.

Next, a cross-sectional structure of the above light-emitting apparatus is described with reference to FIG. 8B. The driver circuit portion and the pixel portion are formed over an element substrate 610; here, the source side driver circuit 601, which is the driver circuit portion, and one pixel in the pixel portion 602 are illustrated.

Note that in the source side driver circuit 601, a CMOS circuit in which an n-channel TFT 623 and a p-channel TFT 624 are combined is formed. The driver circuit may be formed of various CMOS circuits, PMOS circuits, or the like. Although a driver-integrated type where the driver circuit is formed over the substrate is described in this embodiment, the driver circuit is not necessarily integrated and can be formed not over the substrate but outside the substrate.

The pixel portion 602 is formed of pixels including a switching TFT 611, a current controlling TFT 612, and a first electrode 613 electrically connected to a drain thereof. Note that an insulator 614 is formed to cover an end portion of the first electrode 613. The insulator 614 can be formed using a positive photosensitive resin film.

In order to improve the coverage with a film formed over the insulator 614, the insulator 614 is formed to have a surface with curvature at its upper end portion or lower end portion. For example, in the case where a photosensitive acrylic is used as a material of the insulator 614, only the upper end portion of the insulator 614 preferably has a curved surface. The radius of curvature of the curved surface is preferably greater than or equal to 0.2 μm and less than or equal to 0.3 μm. Either a negative photosensitive material or a positive photosensitive material can be used as the insulator 614.

An EL layer 616 and a second electrode 617 are formed over the first electrode 613. Here, as a material used for the first electrode 613 functioning as an anode, a material with a high work function is desirably used. For example, a single-layer film of an ITO film, an indium tin oxide film containing silicon, an indium oxide film containing zinc oxide at 2 wt % or higher and 20 wt % or lower, a titanium nitride film, a chromium film, a tungsten film, a Zn film, a Pt film, or the like, a stacked layer of titanium nitride and a film containing aluminum as its main component, a three-layer structure of a titanium nitride film, a film containing aluminum as its main component, and a titanium nitride film, or the like can be used. Note that the stacked-layer structure achieves low wiring resistance, a favorable ohmic contact, and a function as an anode.

The EL layer 616 is formed by any of a variety of methods such as an evaporation method using an evaporation mask, an inkjet method, and a spin coating method. A material included in the EL layer 616 may be a low molecular compound or a high molecular compound (including an oligomer or a dendrimer).

As a material used for the second electrode 617, which is formed over the EL layer 616 and functions as a cathode, a material with a low work function (e.g., Al, Mg, Li, Ca, or an alloy or a compound thereof, MgAg, MgIn, or AlLi) is preferably used. Note that in the case where light generated in the EL layer 616 passes through the second electrode 617, a stacked layer of a thin metal film with a reduced film thickness and a transparent conductive film (e.g., ITO, indium oxide containing zinc oxide at 2 wt % or higher and 20 wt % or lower, indium tin oxide containing silicon, or zinc oxide (ZnO)) is preferably used for the second electrode 617.

Note that the first electrode 613, the EL layer 616, and the second electrode 617 constitute a light-emitting device 618. The light-emitting device 618 is preferably the light-emitting device having the structure described in Embodiment 1 and Embodiment 2. In the light-emitting apparatus of this embodiment, the pixel portion, which includes a plurality of light-emitting devices, may include both the light-emitting device with the structure described in Embodiment 2 and a light-emitting device with another structure.

The sealing substrate 604 and the element substrate 610 are attached to each other using the sealant 605, so that a structure in which a light-emitting device 618 is provided in the space 607 surrounded by the element substrate 610, the sealing substrate 604, and the sealant 605 is employed. Note that the space 607 is filled with a filler, and may be filled with an inert gas (nitrogen, argon, or the like) or a resin and/or a desiccant.

Note that an epoxy-based resin or glass frit is preferably used for the sealant 605. Furthermore, these materials are preferably materials that transmit moisture or oxygen as little as possible. As a material used for the sealing substrate 604, in addition to a glass substrate and a quartz substrate, a plastic substrate formed of FRP (Fiber Reinforced Plastics), PVF (polyvinyl fluoride), polyester, acrylic, or the like can be used.

As described above, the light-emitting apparatus using the light-emitting device described in Embodiment 2 can be obtained.

<Structure Example 1 of Light-Emitting Apparatus>

As an example of a light-emitting apparatus, FIG. 9 shows a light-emitting apparatus in which a light-emitting device exhibiting white light emission is formed and a coloring layer (color filter) is formed.

FIG. 9A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting devices, a partition wall 1026, an EL layer 1028, a second electrode 1029 of the light-emitting devices, a sealing substrate 1031, a sealant 1032, a red pixel 1044R, a green pixel 1044G, a blue pixel 1044B, a white pixel 1044W, and the like.

In FIG. 9A and FIG. 9B, coloring layers (a red coloring layer 1034R, a green coloring layer 1034G, and a blue coloring layer 1034B) are provided on a transparent base material 1033. A black layer (black matrix) 1035 may be additionally provided. The transparent base material 1033 provided with the coloring layers and the black layer is positioned and fixed to the substrate 1001. Note that the coloring layers and the black layer are covered with an overcoat layer 1036. In FIG. 9A, there is a light-emitting layer from which light is extracted to the outside without passing through the coloring layers and a light-emitting layer from which light is extracted to the outside after passing through the coloring layers of each color. The light that does not pass through the coloring layers is white, and the light that passes through the coloring layers is red, green, and blue, so that an image can be expressed with the pixels of four colors.

FIG. 9B shows an example in which the red coloring layer 1034R, the green coloring layer 1034G, and the blue coloring layer 1034B are formed between the gate insulating film 1003 and the first interlayer insulating film 1020. As shown in FIG. 9B, the coloring layers may be provided between the substrate 1001 and the sealing substrate 1031.

The above-described light-emitting apparatus is a light-emitting apparatus having a structure in which light is extracted from the substrate 1001 side where the TFTs are formed (a bottom emission type), but may be a light-emitting apparatus having a structure in which light is extracted from the sealing substrate 1031 side (a top emission type).

<Structure Example 2 of Light-Emitting Apparatus>

Figures 10A, 10B:
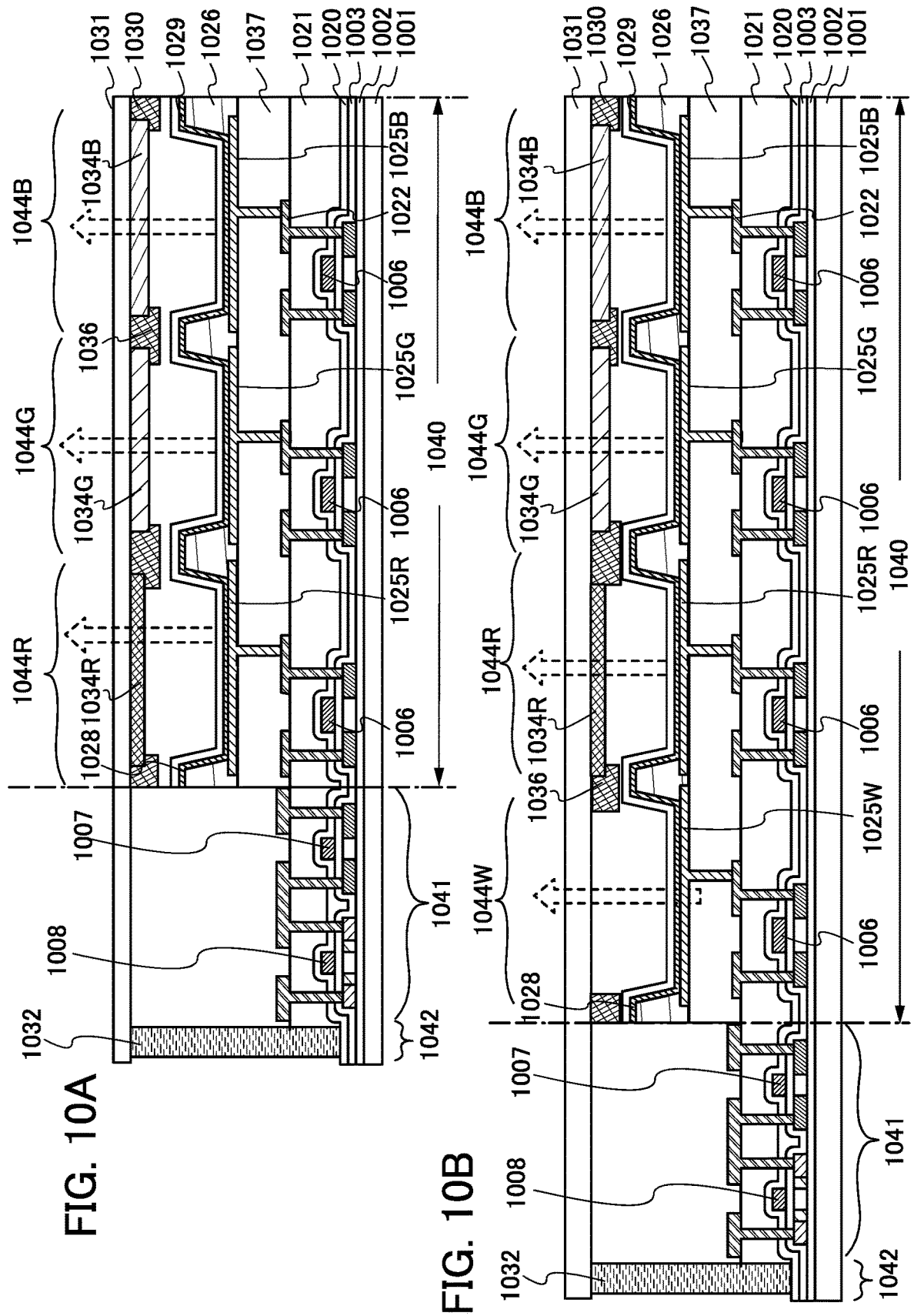
FIG. 10A and FIG. 10B are schematic cross-sectional views illustrating display devices of embodiments of the present invention.

FIG. 10A and FIG. 10B each show a cross-sectional view of a top-emission light-emitting apparatus. In this case, a substrate that does not transmit light can be used as the substrate 1001. The process up to the formation of a connection electrode that connects the TFT and the anode of the light-emitting device is performed in a manner similar to that of a bottom-emission-type light-emitting apparatus. Then, a third interlayer insulating film 1037 is formed to cover an electrode 1022. This insulating film may have a planarization function. The third interlayer insulating film 1037 can be formed using a material similar to that of the second interlayer insulating film 1021 or using other various materials.

A lower electrode 1025W, a lower electrode 1025R, a lower electrode 1025G, and a lower electrode 1025B of the light-emitting device are anodes here, but may be cathodes. Furthermore, in the case of the top-emission light-emitting apparatus as illustrated in FIG. 10A and FIG. 10B, the lower electrode 1025W, the lower electrode 1025R, the lower electrode 1025G, and the lower electrode 1025B are preferably reflective electrodes. Note that the second electrode 1029 preferably has a function of reflecting light and a function of transmitting light. It is preferable that a microcavity structure be used between the second electrode 1029, and the lower electrode 1025W, the lower electrode 1025R, the lower electrode 1025G, and the lower electrode 1025B, in which case a function of amplifying light with a specific wavelength is included. The structure of the EL layer 1028 is an element structure similar to the structures described in Embodiment 1 and Embodiment 3, with which white light emission can be obtained.

In FIG. 9A, FIG. 9B, FIG. 10A, and FIG. 10B, the structure of the EL layer for providing white light emission can be achieved by, for example, using a plurality of light-emitting layers or using a plurality of light-emitting units. Note that the structure for providing white light emission is not limited thereto.

In a top emission structure as shown in FIG. 10A and FIG. 10B, sealing can be performed with the sealing substrate 1031 on which the coloring layers (the red coloring layer 1034R, the green coloring layer 1034G, and the blue coloring layer 1034B) are provided. The sealing substrate 1031 may be provided with the black layer (black matrix) 1030 which is positioned between pixels. The coloring layers (the red coloring layer 1034R, the green coloring layer 1034G, and the blue coloring layer 1034B) may be covered with the overcoat layer. Note that a substrate having a light-transmitting property is used as the sealing substrate 1031.

FIG. 10A illustrates a structure in which full color display is performed using three colors of red, green, and blue; alternatively, full color display may be performed using four colors of red, green, blue, and white as illustrated in FIG. 10B. Note that the structure for performing full color display is not limited to them. For example, full color display using four colors of red, green, blue, and yellow may be performed.

In the light-emitting device of one embodiment of the present invention, a fluorescent material is used as a guest material. Since a fluorescent material has a sharper spectrum than a phosphorescent material, light emission with high color purity can be obtained. Accordingly, when the light-emitting device is used for the light-emitting apparatus described in this embodiment, a light-emitting apparatus with high color reproducibility can be obtained.

As described above, the light-emitting apparatus using the light-emitting device described in Embodiment 2 can be obtained.

Note that this embodiment can be combined as appropriate with any of the other embodiments.

Embodiment 5

In this embodiment, electronic devices and display devices of embodiments of the present invention will be described.

An electronic device and a display device that have a flat surface, high emission efficiency, and high reliability can be manufactured according to one embodiment of the present invention. In addition, an electronic device and a display device that have a curved surface, high emission efficiency, and high reliability can be manufactured according to one embodiment of the present invention. Moreover, a light-emitting device having high color reproducibility can be obtained as described above.

Examples of the electronic devices include a television device, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

A portable information terminal 900 illustrated in FIG. 11A and FIG. 11B includes a housing 901, a housing 902, a display portion 903, a hinge portion 905, and the like.

The housing 901 and the housing 902 are joined together by the hinge portion 905. The portable information terminal 900 can be opened as illustrated in FIG. 11B from a folded state (FIG. 11A). Thus, the portable information terminal 900 has high portability when carried and excellent visibility with its large display region when used.

In the portable information terminal 900, the flexible display portion 903 is provided across the housing 901 and the housing 902 which are joined together by the hinge portion 905.

The light-emitting apparatus manufactured using one embodiment of the present invention can be used for the display portion 903. Thus, a highly reliable portable information terminal can be manufactured.

The display portion 903 can display at least one of text information, a still image, a moving image, and the like.

When text information is displayed on the display portion, the portable information terminal 900 can be used as an e-book reader.

When the portable information terminal 900 is opened, the display portion 903 is held in a state with a large radius of curvature. For example, the display portion 903 is held while including a curved portion with a radius of curvature of greater than or equal to 1 mm and less than or equal to 50 mm, preferably greater than or equal to 5 mm and less than or equal to 30 mm. Part of the display portion 903 can display an image while being curved since pixels are continuously arranged from the housing 901 to the housing 902.

The display portion 903 functions as a touch panel and can be controlled with a finger, a stylus, or the like.

The display portion 903 is preferably formed using one flexible display. Thus, a seamless continuous image can be displayed between the housing 901 and the housing 902. Note that each of the housing 901 and the housing 902 may be provided with a display.

The hinge portion 905 preferably includes a locking mechanism so that an angle formed between the housing 901 and the housing 902 does not become larger than a predetermined angle when the portable information terminal 900 is opened. For example, an angle at which they become locked (they are not opened any further) is preferably greater than or equal to 90° and less than 180° and can be typically 90°, 120°, 135°, 150°, 175°, or the like. In this way, the convenience, safety, and reliability of the portable information terminal 900 can be improved.

When the hinge portion 905 includes a locking mechanism, excessive force is not applied to the display portion 903; thus, breakage of the display portion 903 can be prevented. Therefore, a highly reliable portable information terminal can be achieved.

The housing 901 and the housing 902 may be provided with a power button, an operation button, an external connection port, a speaker, a microphone, or the like.

One of the housing 901 and the housing 902 is provided with a wireless communication module, and data can be transmitted and received through a computer network such as the Internet, a LAN (Local Area Network), or Wi-Fi (registered trademark).

A portable information terminal 910 illustrated in FIG. 11C includes a housing 911, a display portion 912, an operation button 913, an external connection port 914, a speaker 915, a microphone 916, a camera 917, and the like.

The light-emitting apparatus fabricated using one embodiment of the present invention can be used for the display portion 912. Thus, the portable information terminal can be fabricated with a high yield.

The portable information terminal 910 includes a touch sensor in the display portion 912. A variety of operations such as making a call and inputting a character can be performed by touch on the display portion 912 with a finger, a stylus, or the like.

In addition, the operation of the operation button 913 can switch the power ON and OFF operations and types of images displayed on the display portion 912. For example, switching from a mail creation screen to a main menu screen can be performed.

When a sensing device such as a gyroscope sensor or an acceleration sensor is provided inside the portable information terminal 910, the direction of display on the screen of the display portion 912 can be automatically switched by determining the orientation (horizontal or vertical) of the portable information terminal 910. Furthermore, the direction of display on the screen can be switched by touch on the display portion 912, operation of the operation button 913, sound input using the microphone 916, or the like.

The portable information terminal 910 has, for example, one or more functions selected from a telephone set, a notebook, an information browsing system, and the like. Specifically, the portable information terminal can be used as a smartphone. The portable information terminal 910 is capable of executing a variety of applications such as mobile phone calls, e-mailing, text viewing and writing, music replay, video replay, Internet communication, and games, for example.

A camera 920 illustrated in FIG. 11D includes a housing 921, a display portion 922, operation buttons 923, a shutter button 924, and the like. Furthermore, a detachable lens 926 is attached to the camera 920.

The light-emitting apparatus fabricated using one embodiment of the present invention can be used for the display portion 922. Thus, a highly reliable camera can be fabricated.

Although the camera 920 here is configured such that the lens 926 is detachable from the housing 921 for replacement, the lens 926 may be integrated with the housing 921.

A still image or a moving image can be taken with the camera 920 at the press of the shutter button 924. In addition, the display portion 922 has a function of a touch panel, and images can also be taken by the touch on the display portion 922.

Note that a stroboscope, a viewfinder, or the like can be additionally attached to the camera 920. Alternatively, these may be incorporated into the housing 921.

Figure 12A:
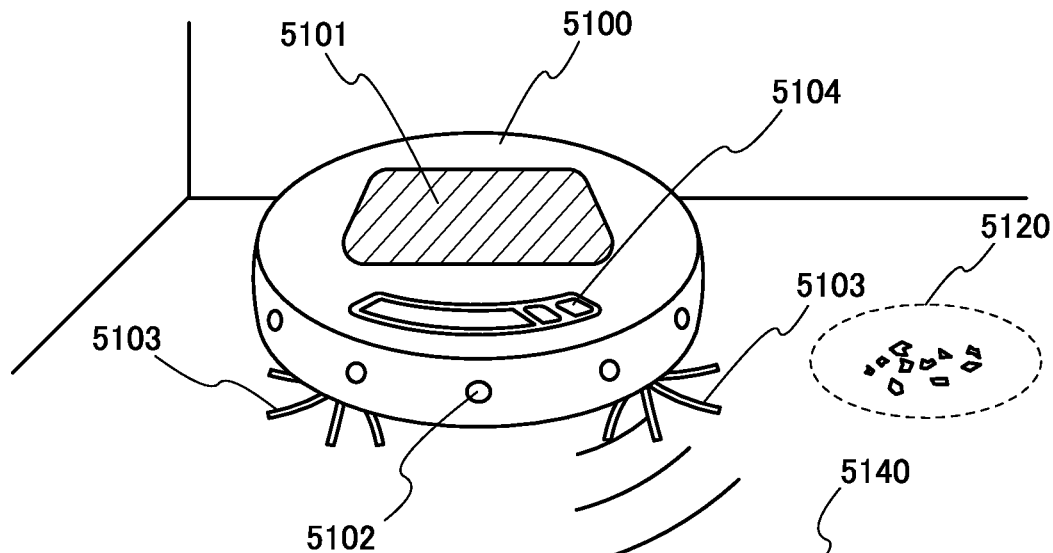
FIG. 12A to FIG. 12C are diagrams illustrating electronic devices of embodiments of the present invention.

FIG. 12A is a schematic view showing an example of a cleaning robot.

A cleaning robot 5100 includes a display 5101 placed on its top surface, a plurality of cameras 5102 placed on its side surface, a brush 5103, and an operation button 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. In addition, the cleaning robot 5100 has a wireless communication means.

The cleaning robot 5100 is self-propelled, detects dust 5120, and can suck up the dust through the inlet provided on the bottom surface.

The cleaning robot 5100 can determine whether there is an obstacle such as a wall, furniture, or a step by analyzing images taken by the cameras 5102. When an object that is likely to be caught in the brush 5103, such as a wire, is detected by image analysis, the rotation of the brush 5103 can be stopped.

The display 5101 can display the remaining capacity of a battery, the amount of vacuumed dust, and the like. The display 5101 may display the path on which the cleaning robot 5100 has run. The display 5101 may be a touch panel, and the operation button 5104 may be provided on the display 5101.

The cleaning robot 5100 can communicate with a portable electronic device 5140 such as a smartphone. The portable electronic device 5140 can display images taken by the cameras 5102. Accordingly, an owner of the cleaning robot 5100 can monitor the room even from the outside. The display on the display 5101 can be checked by the portable electronic device 5140 such as a smartphone.

The light-emitting apparatus of one embodiment of the present invention can be used for the display 5101.

Figure 12B:
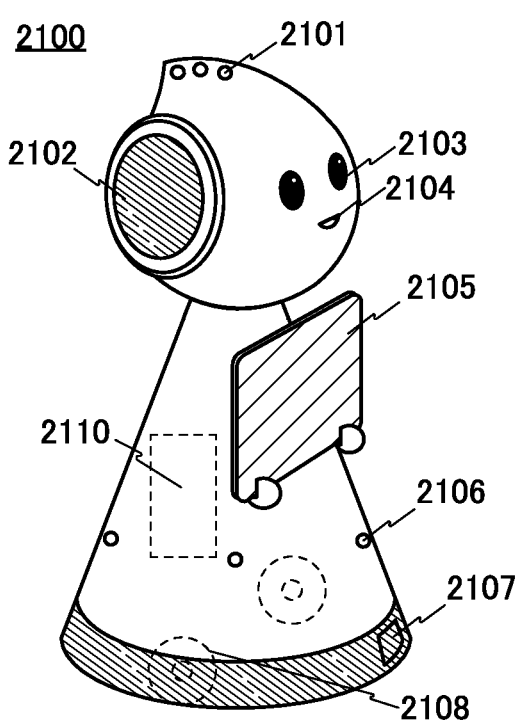

A robot 2100 illustrated in FIG. 12B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect the presence of an obstacle in the direction where the robot 2100 advances with the moving mechanism 2108. The robot 2100 can move safely by recognizing the surroundings with the upper camera 2103, the lower camera 2106, and the obstacle sensor 2107.

The light-emitting apparatus of one embodiment of the present invention can be used for the display 2105.

Figure 12C:
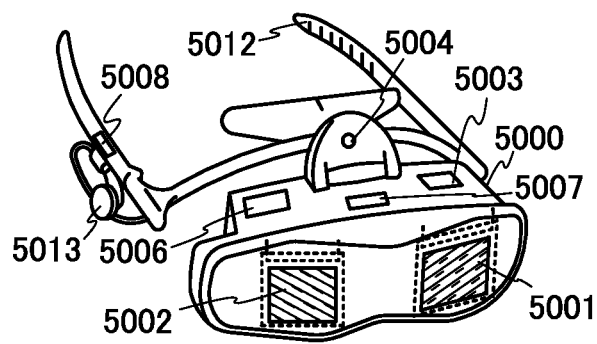

FIG. 12C shows an example of a goggle-type display. The goggle-type display includes, for example, a housing 5000, a display portion 5001, a speaker 5003, an LED lamp 5004, a connection terminal 5006, a sensor 5007 (a sensor having a function of measuring force, displacement, position, speed, acceleration, angular velocity, rotational frequency, distance, light, liquid, magnetism, temperature, a chemical substance, sound, time, hardness, an electric field, current, voltage, power, radiation, a flow rate, humidity, gradient, oscillation, an odor, or infrared rays), a microphone 5008, a second display portion 5002, a support 5012, and an earphone 5013.

The light-emitting apparatus of one embodiment of the present invention can be used for the display portion 5001 and the second display portion 5002.

Figure 13A:
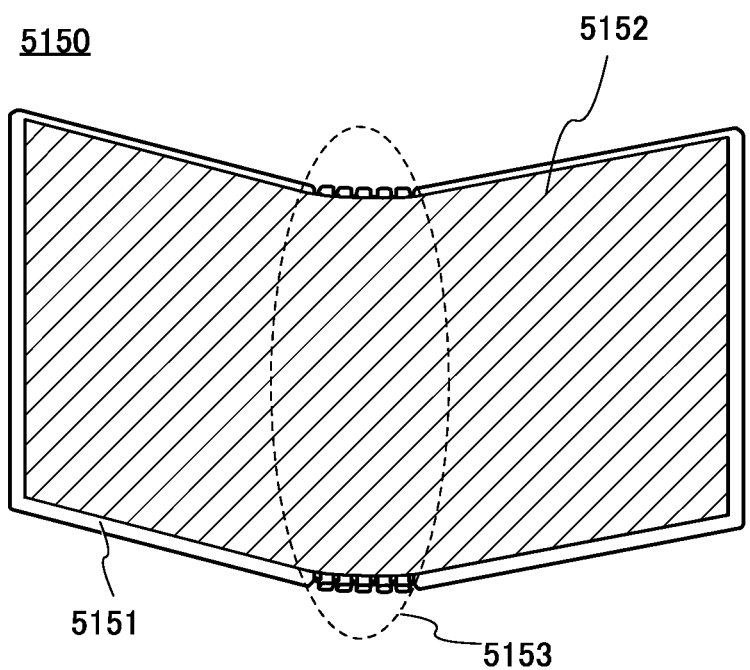
FIG. 13A and FIG. 13B are perspective views illustrating a display device of one embodiment of the present invention.
Figure 13B:
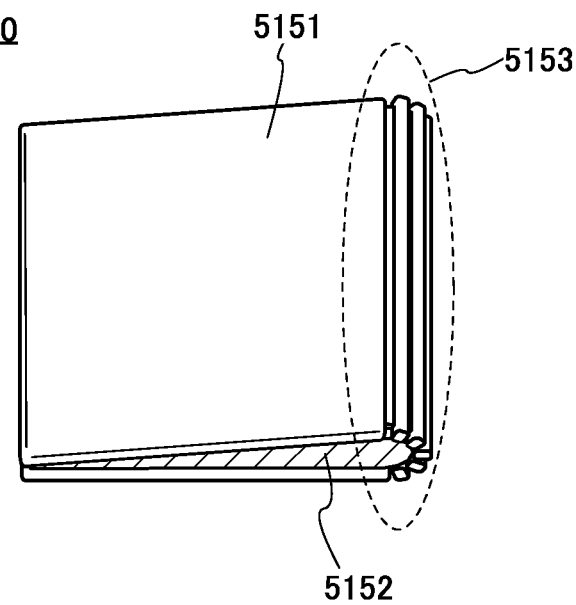

FIG. 13A and FIG. 13B illustrate a foldable portable information terminal 5150. The foldable portable information terminal 5150 includes a housing 5151, a display region 5152, and a bend portion 5153. FIG. 13A illustrates the portable information terminal 5150 that is opened. FIG. 13B illustrates the portable information terminal 5150 that is folded. Despite its large display region 5152, the portable information terminal 5150 is compact in size and has excellent portability when folded.

The display region 5152 can be folded in half with the bend portion 5153. The bend portion 5153 is formed of a stretchable member and a plurality of supporting members, and in the case where the display region is folded, the stretchable member stretches and the bend portion 5153 has a radius of curvature of 2 mm or more, preferably 5 mm or more.

Note that the display region 5152 may be a touch panel (an input/output device) including a touch sensor (an input device). The light-emitting apparatus of one embodiment of the present invention can be used for the display region 5152.

This embodiment can be combined with the other embodiments as appropriate.

Embodiment 6

In this embodiment, examples in which the light-emitting device of one embodiment of the present invention is used for various lighting devices will be described with reference to FIG. 14. With the use of the light-emitting device of one embodiment of the present invention, a highly reliable lighting device with high emission efficiency can be manufactured.

Fabricating the light-emitting device of one embodiment of the present invention over a substrate having flexibility enables an electronic device or a lighting device that has a light-emitting region with a curved surface to be obtained.

Furthermore, a light-emitting apparatus in which the light-emitting device of one embodiment of the present invention is used can also be used for lighting for motor vehicles; for example, such lighting can be provided on a windshield, a ceiling, and the like.

Figure 14:
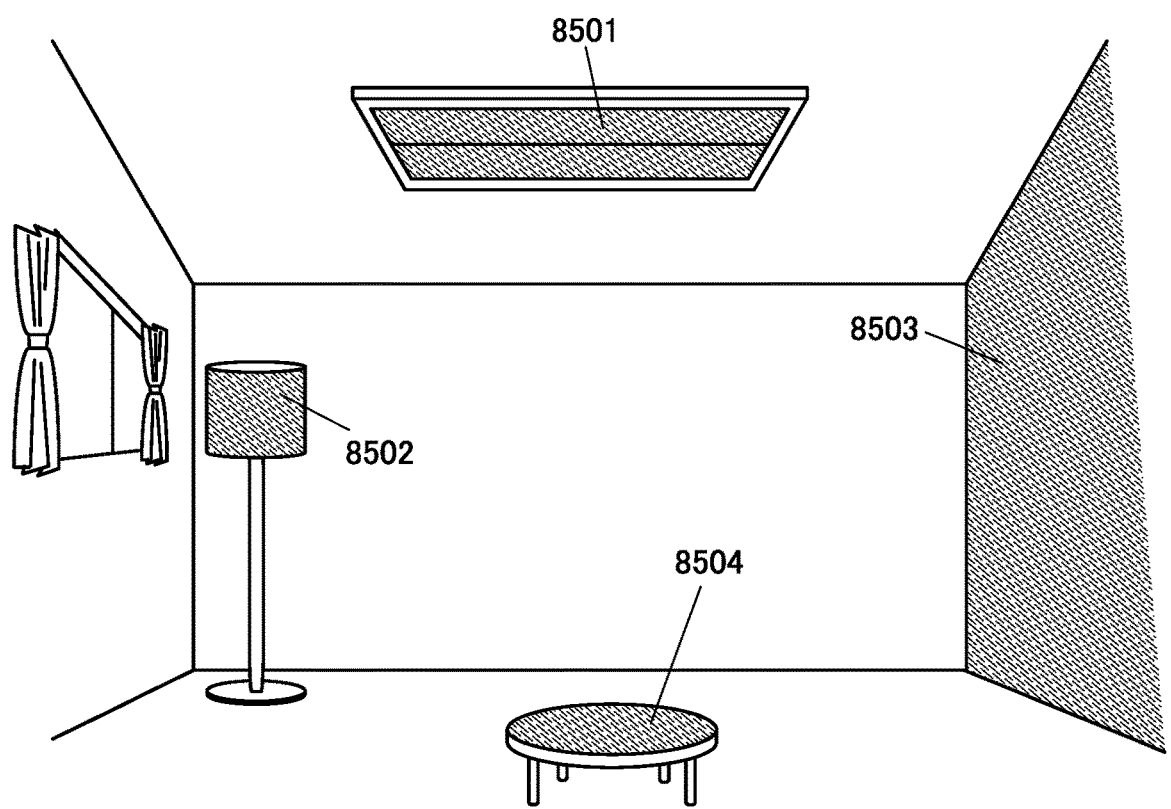
FIG. 14 is a diagram illustrating lighting devices of embodiments of the present invention.

FIG. 14 shows an example in which the light-emitting device is used for an indoor lighting device 8501. Since the light-emitting device can have a larger area, a lighting device having a large area can also be formed. In addition, a lighting device 8502 in which a light-emitting region has a curved surface can also be formed with the use of a housing with a curved surface. A light-emitting device described in this embodiment is in the form of a thin film, which allows the housing to be designed more freely. Thus, the lighting device can be elaborately designed in a variety of ways. Furthermore, a wall of the room may be provided with a large-sized lighting device 8503. The lighting devices 8501, 8502, and 8503 may be provided with a touch sensor with which power-on or off is performed.

Moreover, when the light-emitting device is used on the surface side of a table, a lighting device 8504 which has a function as a table can be obtained. When the light-emitting device is used as part of other furniture, a lighting device having a function of the furniture can be obtained.

As described above, lighting devices and electronic devices can be obtained by application of the light-emitting device of one embodiment of the present invention. Note that the light-emitting device can be used for lighting devices and electronic devices in a variety of fields without being limited to the lighting devices and the electronic devices described in this embodiment.

The structure described in this embodiment can be used in appropriate combination with any of the structures described in the other embodiments.

Example 1

Synthesis Example 1

In this example, a synthesis method of 5,12-bis(2,4,6-tricyclohexylphenyl)-5,12-dihydroquino[2,3-b]acridine-7,14-dione (abbreviation: ch3P2Qd), which is the organic compound represented by Structural Formula (100) of Embodiment 1, will be described. The structural formula of ch3P2Qd is shown below.

[Chemical Formula 34]

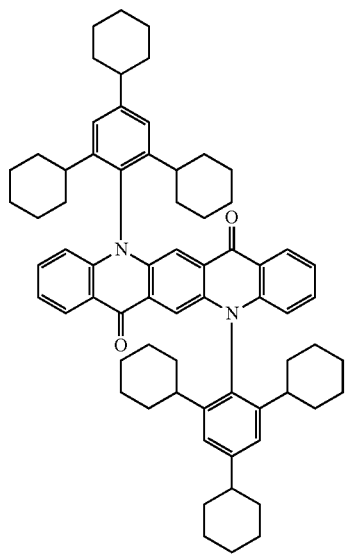

ch3P2Qd

Step 1: Synthesis of dimethyl 2,5-dihydro-3,6-bis(phenylamino)terephthalate 20 g (88 mmol) of 1,4-cyclohexanedione-2,5-dicarboxylic dimethyl and 26 g (280 mmol) of aniline were put into a 500 mL three-neck flask, and this mixture was heated at 80° C. for 5 hours. The precipitated solid was collected by suction filtration and the obtained solid was washed with hexane and methanol, so that 33 g of a mixture of a target substance and a compound that is the oxidized target substance was obtained. This mixture was used in Step 2 as it is. The synthesis scheme of Step 1 is shown below.

[Chemical Formulae 35]

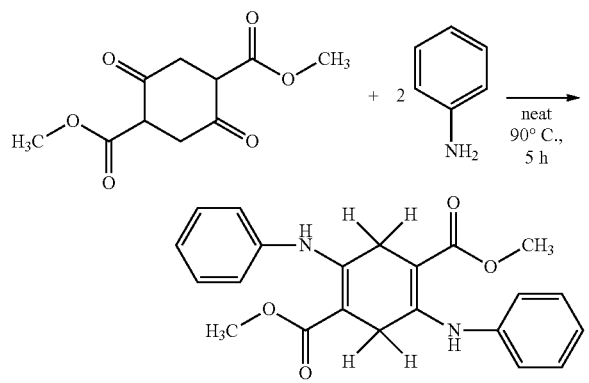

Step 2: Synthesis of dimethyl 2,5-bis(phenylamino)terephthalate 33 g of the mixture of dimethyl 2,5-dihydro-3,6-bis(phenylamino)terephthalate and the oxide thereof, which was obtained in Step 1, 10 g of iodine, and 220 mL of toluene were put into a 500 mL three-neck flask equipped with a reflux pipe, and this mixture was refluxed at 120° C. for 16 hours. After stirring, water was added to the obtained mixture, and an aqueous layer was subjected to extraction with toluene. The obtained organic layer was washed with water, an aqueous solution of sodium thiosulfate, and saturated saline, and the organic layer was dried with magnesium sulfate. The obtained mixture was gravity filtered to remove magnesium sulfate, and the obtained filtrate was concentrated to give 20 g of a red solid. The obtained solid was recrystallized from ethanol and acetone to give 13 g of a target red solid in a yield of 40%. The synthesis scheme of Step 2 is shown below.

[Chemical Formulae 36]

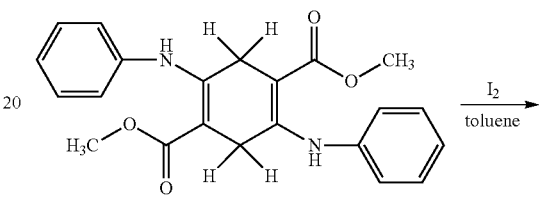

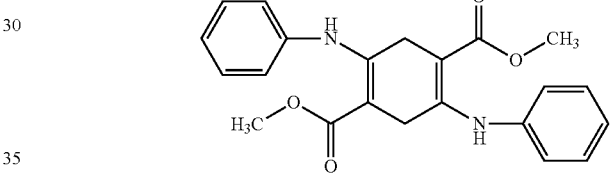

Step 3: Synthesis of dimethyl 2,5-bis[(2,4,6-tricyclohexylphenyl)phenylamino]terephthalate 1.7 g (4.5 mmol) of dimethyl 2,5-bis(phenylamino)terephthalate, which was obtained in Step 2, 4.0 g (10 mmol) of 1-bromo-2,4,6-tricyclohexylbenzene, 0.57 g (9.0 mmol) of copper, 0.86 g (4.5 mmol) of copper iodide, 1.4 g (10 mmol) of potassium carbonate, and 5 mL of diphenyl ether were put into a 200 mL three-neck flask equipped with a reflux pipe, the mixture was degassed at reduced pressure, and the air in the system was replaced with nitrogen. The mixture was stirred at 235° C. for 11 hours. Toluene and water were added to the obtained mixture, the mixture was subjected to suction filtration, and an insoluble matter was removed. The obtained filtrate was separated into an organic layer and an aqueous layer, the organic layer was washed with water and saturated saline, and the organic layer was dried with magnesium sulfate. The obtained mixture was gravity filtered to remove magnesium sulfate, and the obtained filtrate was concentrated to give a blackish-brown viscous solid. The obtained solid was purified by silica gel chromatography (developing solvent: hexane:toluene=1:1) to give 0.58 g of a yellowish-orange solid in a yield of 13%. The LC/MS analysis results revealed that m/z of the obtained yellowish-orange solid was 1021.68, and thus the solid was found to be a target substance. The synthesis scheme of Step 3 is shown below.

[Chemical Formulae 37]

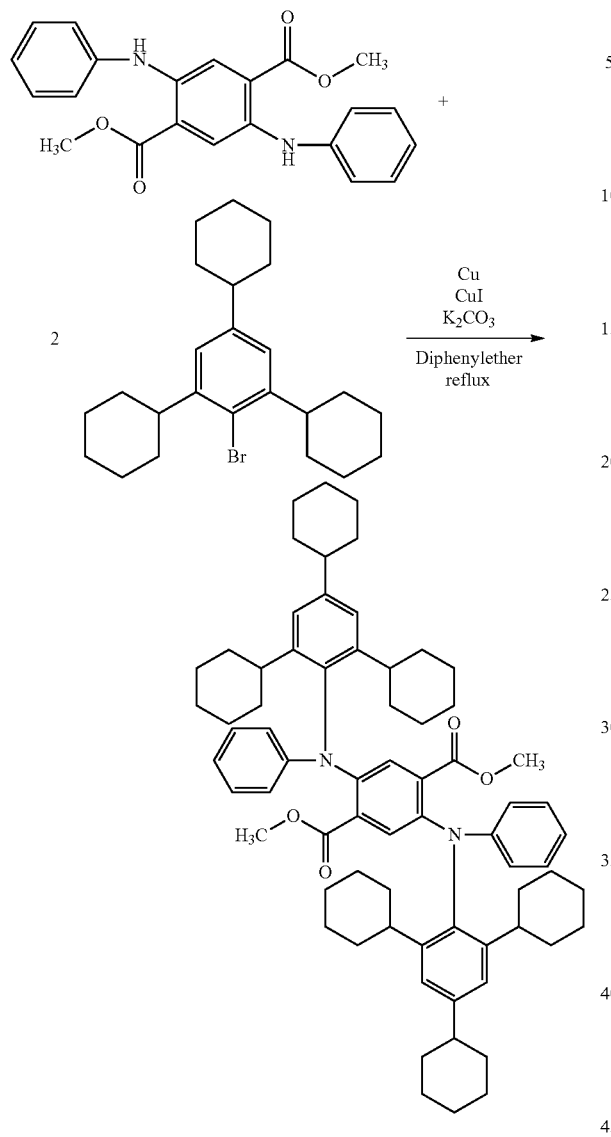

Step 4: Synthesis of 5,12-bis(2,4,6-tricyclohexylphenyl)-5,12-dihydroquino[2,3-b]acridine-7,14-dione (abbreviation: ch3P2Qd)

0.58 g of dimethyl 2,5-bis[N,N'-(2,4,6-tricyclohexylphenyl)phenylamino]terephthalate, which was obtained in Step 3, and 5 mL of methanesulfonate were put into a 100 mL three-neck flask, and stirring was performed at 140° C. for 1.5 hours. After cooling, the reaction product was put into iced water to stop the reaction. Toluene was added to the obtained mixture and an aqueous layer was subjected to extraction. The obtained organic layer was washed with water, and subsequently neutralized with a saturated aqueous solution of sodium hydrogen carbonate. The organic layer was washed with saturated saline, and dried with magnesium sulfate. The obtained mixture was gravity filtered to remove magnesium sulfate, and the obtained filtrate was concentrated to give 0.49 g of a yellowish-orange solid. The obtained solid was washed twice with acetone and a small amount of toluene and the obtained yellowish-orange solid was dried, so that 0.32 g of a yellowish-orange solid was obtained in a yield of 59%. The synthesis scheme of Step 4 is shown below.

[Chemical Formulae 38]

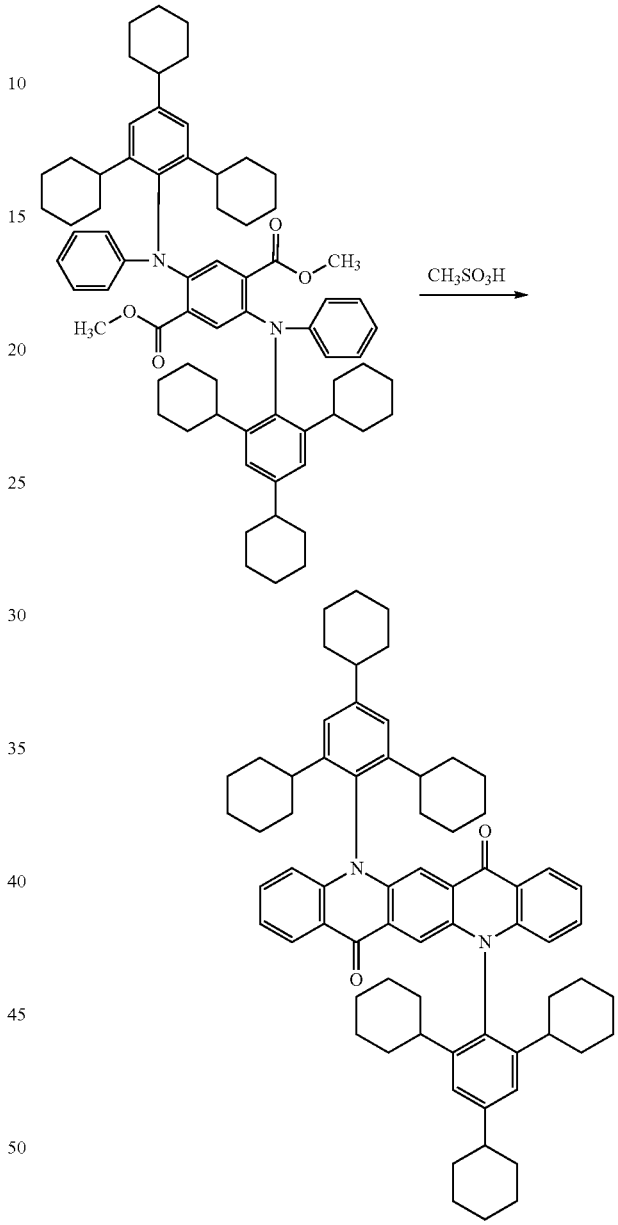

0.22 g of the yellowish-orange solid, which was obtained in Step 4, was sublimated and purified by a train sublimation method. In the sublimation purification, the solid was heated at 320° C. for 8 hours under a pressure of 3.4 Pa with a flow of argon at 5 mL/min. After the purification by sublimation, 0.15 g of a target yellowish-orange solid was obtained at a collection rate of 68%.

Figure 15A:
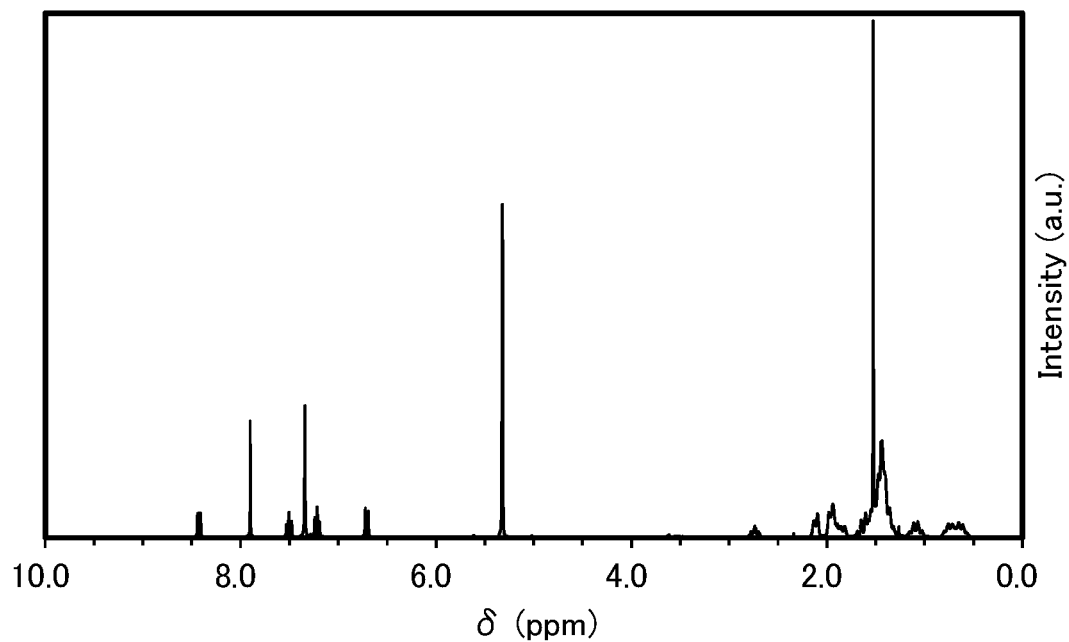
FIG. 15A and FIG. 15B are 1H-NMR charts of ch3P2Qd.
Figure 15B:
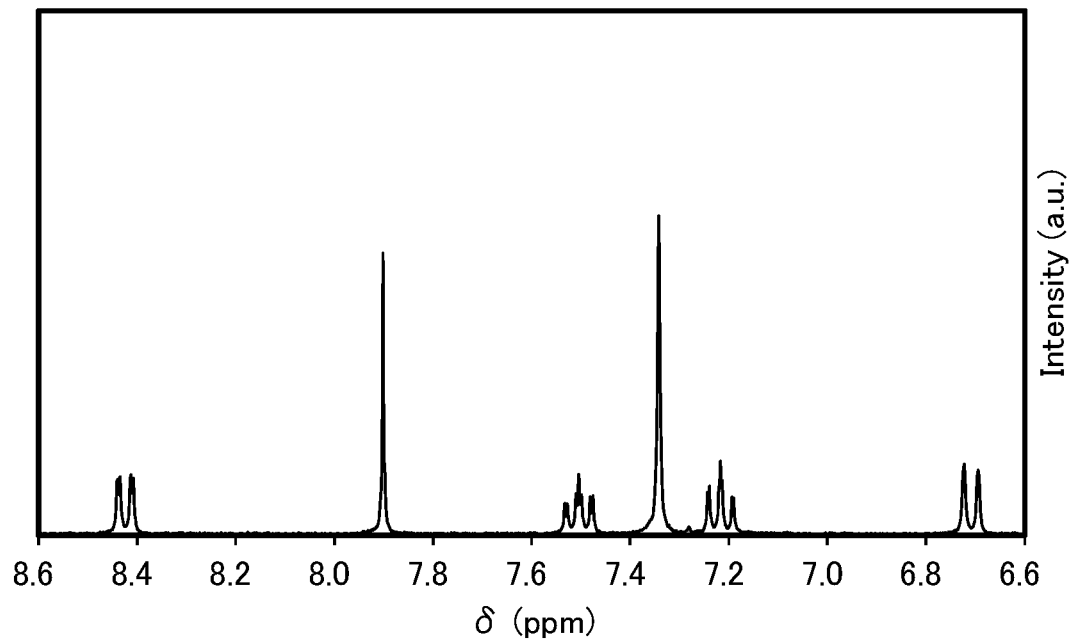

FIG. 15A and FIG. 15B show $^1$H NMR charts of the obtained solid, whose numerical data are given below. The data reveal that the target compound was obtained.

$^1$H NMR (dichloromethane-d$_2$, 300 MHz): δ=8.42 (dd, J=8.1 Hz, 1.5 Hz, 2H), 7.90 (s, 2H), 7.50 (t, J=8.1 Hz, 2H), 7.34 (s, 4H), 7.22 (t, J=7.5 Hz, 2H), 6.71 (d, J=8.4 Hz, 2H), 2.78-2.70 (m, 2H), 2.13-1.26 (m, 52H), 1.11-1.03 (m, 4H), 0.76-0.61 (m, 8H)

Next, an ultraviolet-visible absorption spectrum (hereinafter, simply referred to as an "absorption spectrum"), an emission spectrum, and an emission quantum yield of ch3P2Qd in a dichloromethane solution were measured. The absorption spectrum was measured using an ultraviolet-visible spectrophotometer (V-550, manufactured by JASCO Corporation). Note that the absorption spectrum of ch3P2Qd in the solution was calculated by subtraction of the measured absorption spectrum of only dichloromethane in a quartz cell. The emission spectrum was measured using a fluorescence spectrophotometer (FP-8600, manufactured by JASCO Corporation). For the measurement of the emission quantum yield, an absolute PL quantum yield measurement system (Quantaurus-QY, manufactured by Hamamatsu Photonics K.K.) was used.

Figure 16:
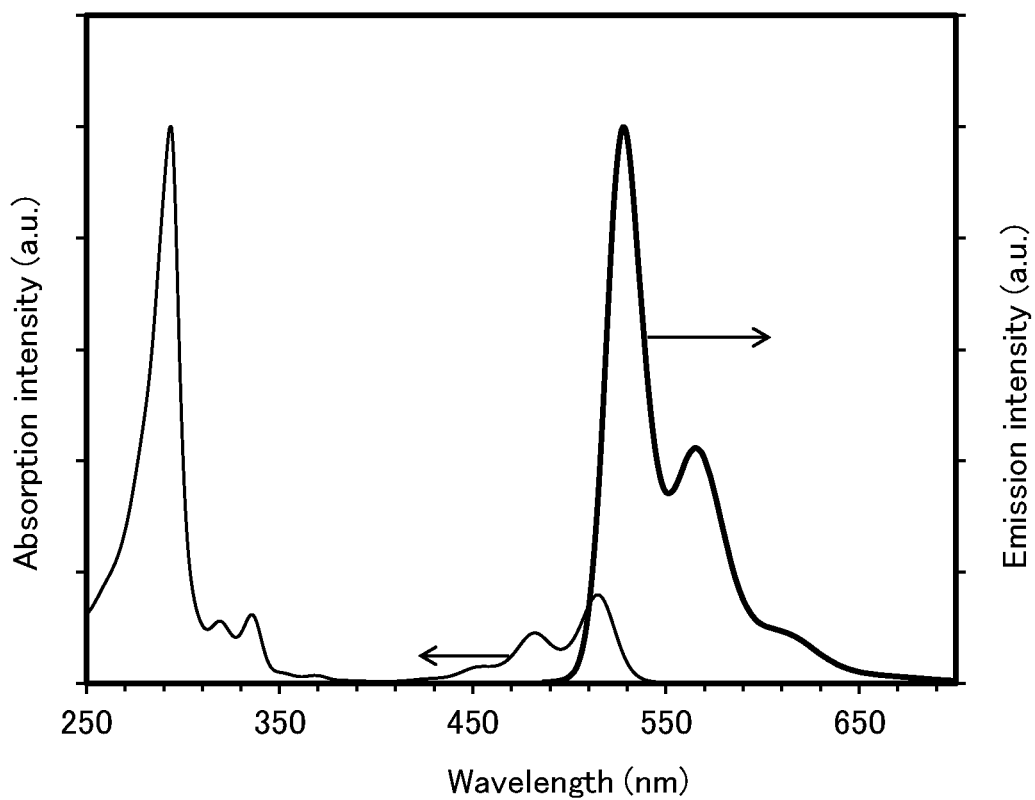
FIG. 16 shows an absorption spectrum and an emission spectrum of ch3P2Qd in a solution state.

FIG. 16 shows the obtained measurement results of the absorption spectrum and the emission spectrum of the dichloromethane solution. The horizontal axis represents a wavelength and the vertical axes represent absorption intensity and emission intensity. The horizontal axis represents a wavelength and the vertical axes represent absorption intensity and emission intensity. The results in FIG. 16 show that ch3P2Qd in the dichloromethane solution exhibited absorption peaks at around 515 nm, 482 nm, and 456 nm, and emission wavelength peaks at around 617 nm, 565 nm, and 528 nm (an excitation wavelength: 480 nm). Furthermore, the measured quantum yield in the dichloromethane solution was as high as 94%, which indicates that ch3P2Qd is suitable as a light-emitting material.

The HOMO level and the LUMO level of ch3P2Qd were calculated on the basis of a cyclic voltammetry (CV) measurement. An electrochemical analyzer (model number: ALS model 600A or 600C, manufactured by BAS Inc.) was used as a measurement apparatus. To prepare a solution for the CV measurement, dehydrated dimethylformamide (DMF) (manufactured by Sigma-Aldrich Inc., 99.8%, catalog No. 22705-6) was used as a solvent, tetra-n-butylammonium perchlorate (n-Bu4NClO4) (manufactured by Tokyo Chemical Industry Co., Ltd., catalog No. T0836) as a supporting electrolyte was dissolved at a concentration of 100 mmol/L, and the object to be measured was dissolved at a concentration of 2 mmol/L.

A platinum electrode (PTE platinum electrode, manufactured by BAS Inc.) was used as a working electrode, another platinum electrode (Pt counter electrode for VC-3 (5 cm), manufactured by BAS Inc.) was used as an auxiliary electrode, and an Ag/Ag+ electrode (RE7 reference electrode for non-aqueous solvent, manufactured by BAS Inc.) was used as a reference electrode. Note that the measurement was performed at room temperature (20 to 25° C.).

The scan speed in the CV measurement was fixed to 0.1 V/sec, and an oxidation potential Ea [V] and a reduction potential Ec[V] with respect to the reference electrode were measured. Ea is an intermediate potential of an oxidation-reduction wave, and Ec is an intermediate potential of a reduction-oxidation wave. Here, since the potential energy of the reference electrode used in this example with respect to the vacuum level is known to be −4.94 [eV], the HOMO level and the LUMO level can be calculated by the following formulae: HOMO level[eV]=−4.94−Ea and LUMO level [eV]=−4.94−Ec.

Furthermore, CV measurement was repeated 100 times, and the oxidation-reduction wave in the hundredth cycle was compared with the oxidation-reduction wave in the first cycle to examine the electrical stability of the compound.

As a result, the HOMO level was found to be −5.78 eV in the measurement of the oxidation potential Ea [V] of ch3P2Qd. In contrast, the LUMO level was found to be −3.24 eV in the measurement of the reduction potential Ec[V]. In addition, when the oxidation-reduction wave was repeatedly measured and the waveform of the first cycle was compared with that of the hundredth cycle, 84% of the peak intensity was maintained in the Ec measurement.

Then, thermogravimetry-differential thermal analysis of ch3P2Qd was performed. The measurement was performed using a high vacuum differential type differential thermal balance (TG-DTA2410SA, manufactured by Bruker AXS K.K.). The measurement was performed under atmospheric pressure at a temperature rising rate of 10° C./min under a pressure of 10 Pa under a nitrogen stream (flow rate: 2.0 mL/min). The thermogravimetry-differential thermal analysis showed that the temperature at which the weight measured by thermogravimetry becomes −5% of the weight at the start of the measurement is 261° C.

The above-described temperature of 5,12-diphenyl-5,12-dihydroquino[2,3-b]acridine-7,14-dione (DPQd), which was obtained by removing all cyclohexyl groups from the structure of ch3P2Qd, was 294° C.; the measurement was performed under the conditions similar to the above. The results revealed that introduction of a cyclohexyl group lowers sublimation temperature and facilitates sublimation.

Example 2

In this example, fabrication examples of the light-emitting devices of one embodiment of the present invention and comparative light-emitting devices and the characteristics of the light-emitting devices will be described. The structures of the light-emitting devices fabricated in this example are the same as that in FIG. 1A. The structures and abbreviations of the compounds used are shown below.

[Chemical Formulae 39]

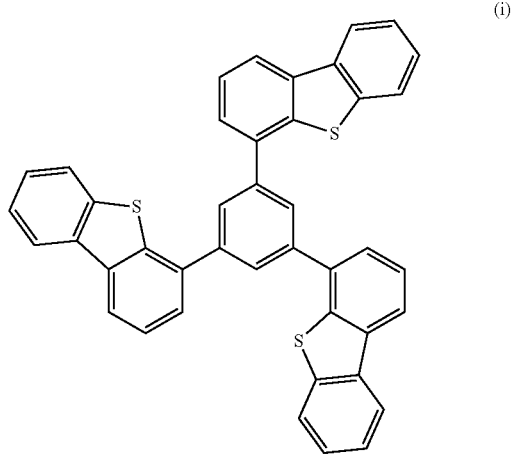

(i)

DBT3P-II

-continued
(ii)
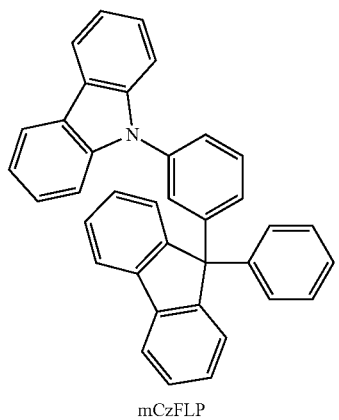
mCzFLP
(iii)
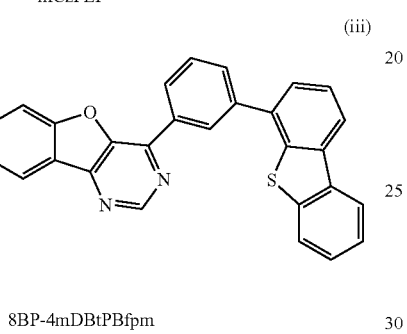
8BP-4mDBtPBfpm
(iv)
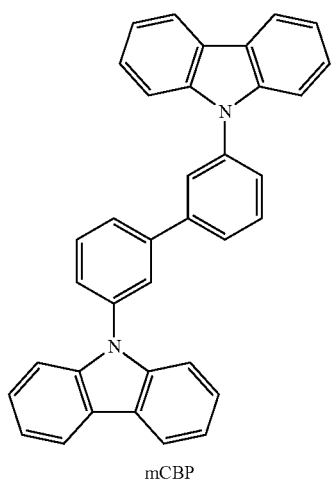
mCBP
(v)
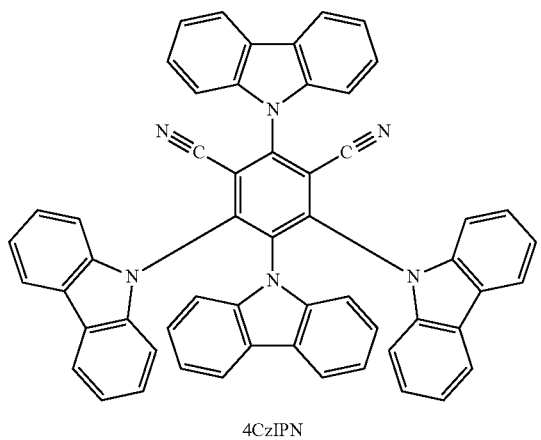
4CzIPN
(vi)
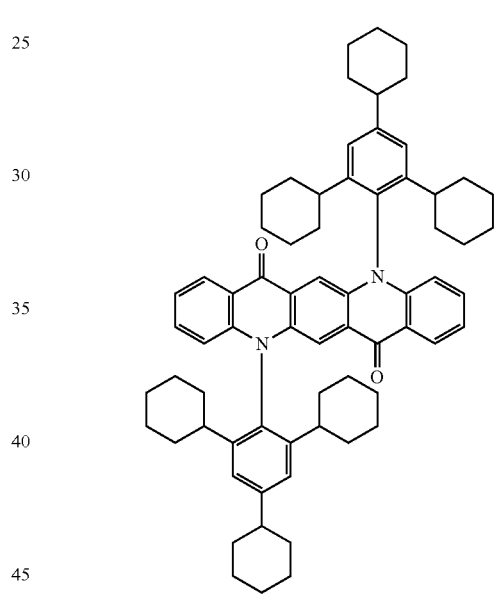
ch3P2Qd
(vii)
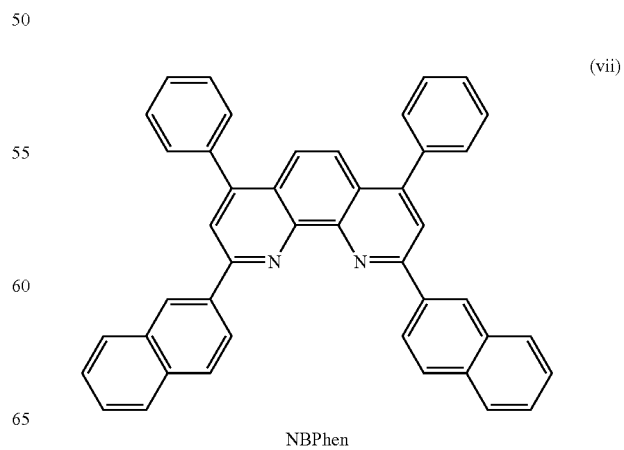
NBPhen -continued (viii)

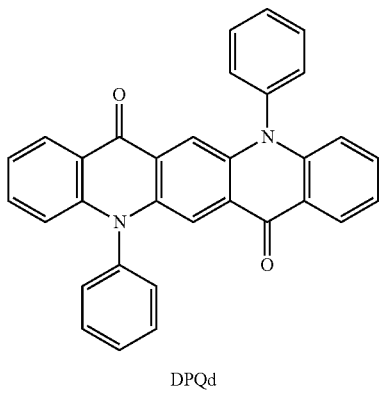

DPQd

<Fabrication Method of Light-Emitting Device 1>

As the electrode 101, an ITSO film was formed to a thickness of 70 nm over a glass substrate. Note that the electrode area of the electrode 101 was set to 4 mm$^2$ (2 mm×2 mm).

Next, as the hole-injection layer 111, 4,4',4''-(benzene-1,3,5-triyl)tri(dibenzothiophene) (abbreviation: DBT3P-II) represented by Structural Formula (i) above and molybdenum oxide (MoO$_3$) were deposited over the electrode 101 by co-evaporation at a weight ratio (DBT3P-II:MoO$_3$) of 1:0.5 to a thickness of 40 nm.

Next, as the hole-transport layer 112, 9-[3-(9-phenyl-9H-fluoren-9-yl)phenyl]9H-carbazole (abbreviation: mCzFLP) represented by Structural Formula (ii) above was deposited over the hole-injection layer 111 by evaporation to a thickness of 20 nm.

Next, as the light-emitting layer 130, 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm) represented by Structural Formula (iii) above, 3,3'-9H-carbazole-9-yl-biphenyl (abbreviation: mCBP) represented by Structural Formula (iv) above, 2,4,5,6-tetra(9H-carbazole-9-yl)isophthalonitrile (abbreviation: 4CzIPN) represented by Structural Formula (v) above, and 5,12-bis(2,4,6-tricyclohexylphenyl)-5,12-dihydroquino[2,3-b]acridine-7,14-dione (abbreviation: ch3P2Qd) represented by Structural Formula (vi) above were deposited over the hole-transport layer 112 by co-evaporation at a weight ratio (8BP-4mDBtPBfpm:mCBP:4CzIPN:ch3P2Qd) of 0.6:0.4:1:0.055 to a thickness of 31 nm.

Non-Patent Document 1 discloses that in the light-emitting device, 4CzIPN is a TADF material. Furthermore, ch3P2Qd is a fluorescent material having protecting groups.

Then, 8BP-4mDBtPBfpm was deposited over the light-emitting layer 130 by evaporation to a thickness of 20 nm, and then NBPhen was deposited thereover by evaporation to a thickness of 15 nm, whereby the electron-transport layer 118 was formed. After that, as the electron-injection layer 119, LiF was deposited to a thickness of 1 nm over the electron-transport layer 118 by evaporation.

Next, as the electrode 102, aluminum (Al) was formed to a thickness of 200 nm over the electron-injection layer 119, whereby a light-emitting device 1 was fabricated.

Then, in a glove box containing a nitrogen atmosphere, the light-emitting device 1 was sealed in the following manner: sealant was applied to the periphery of organic materials formed on a glass substrate, the glass substrate was bonded to a glass substrate for sealing, irradiation with ultraviolet light having a wavelength of 365 nm at 6 J/cm$^2$ was performed, heat treatment at 80° C. for one hour was performed, and the glass substrate for sealing was fixed to the glass substrate on which the organic materials were formed.

<Fabrication Method of Comparative Light-Emitting Device>

A comparative light-emitting device 1 was fabricated in a manner similar to that for the light-emitting device 1 except that ch3P2Qd in the light-emitting layer of the light-emitting device 1 was replaced by N,N'-diphenylquinacridone (abbreviation: DPQd) represented by Structural Formula (viii) above and the weight ratio of 8BP-4mDBtPBfpm to mCBP, 4CzIPN, and DPQd was 0.6:0.4:1:0.052. In other words, the comparative light-emitting device 1 is a light-emitting device using a fluorescent material having no protecting group. A comparative light-emitting device 2 was fabricated by forming the light-emitting layer of the light-emitting device 1 by co-evaporation to a thickness of 30 nm at the weight ratio of 8BP-4mDBtPBfpm to mCBP and 4CzIPN was 0.6:0.4:1. That is, the comparative light-emitting device 2 is a light-emitting device not using the organic compound described in Embodiment 1.

The element structures of the light-emitting device 1 and the comparative light-emitting device 1 are listed below.

TABLE 1

| light-emitting device 1 | | |
|---|---|---|
| | film thickness (nm) | material and mixture ratio |
| cathode | 200 | Al |
| electron-injection layer | 1 | LiF |
| electron-transport layer | 15 | N BPhen |
| | 20 | 8BP-4mDBtPBfpm |
| light-emitting layer | 30 | 8BP-4mDBtPBfpm:mCBP:4CzIPN:ch3P2Qd (0.6:0.4:1:0.055) |
| hole-transport layer | 20 | mCzFLP |
| hole-injection layer | 40 | DBT3P-II:MoOx (1:0.5) |
| anode | 70 | ITSO |

TABLE 2

| comparative light-emitting device 1 | | |
|---|---|---|
| | film thickness (nm) | material and mixture ratio |
| cathode | 200 | Al |
| electron-injection layer | 1 | LiF |
| electron-transport layer | 15 | N BPhen |
| | 20 | 8BP-4mDBtPBfpm |
| light-emitting layer | 30 | 8BP-4mDBtPBfpm:mCBP:4CzIPN:DPQd (0.6:0.4:1:0.052) |
| hole-transport layer | 20 | mCzFLP |
| hole-injection layer | 40 | DBT3P-II:MoOx (1:0.5) |
| anode | 70 | ITSO |

TABLE 3

| | comparative light-emitting device 2 | |
|---|---|---|
| | film thickness (nm) | material and mixture ratio |
| cathode | 200 | Al |
| electron-injection layer | 1 | LiF |
| electron-transport layer | 15 | N BPhen |
| | 20 | 8BP-4mDBtPBfpm |
| light-emitting layer | 30 | 8BP-4mDBtPBfpm:mCBP:4CzIPN (0.6:0.4:1) |
| hole-transport layer | 20 | mCzFLP |
| hole-injection layer | 40 | DBT3P-II:MoOx (1:0.5) |
| anode | 70 | ITSO |

<Characteristics of Light-Emitting Device 1, Comparative Light-Emitting Device 1, and Comparative Light-Emitting Device 2>

Next, characteristics of the fabricated light-emitting device 1, comparative light-emitting device 1, and comparative light-emitting device 2 were measured. Luminance, CIE chromaticity, and electroluminescence (EL) spectra were measured using a spectroradiometer (SR-UL1R, manufactured by TOPCON TECHNOHOUSE CORPORATION).

Figure 17:
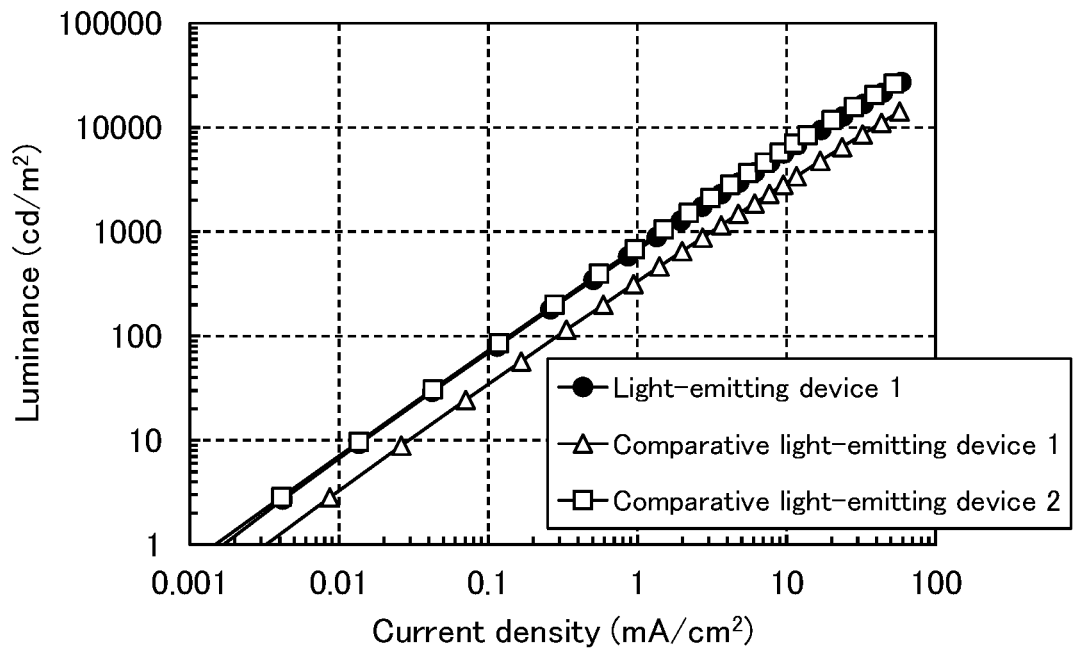
FIG. 17 shows luminance-current density characteristics of a light-emitting device 1 and a comparative light-emitting device 1.
Figure 18:
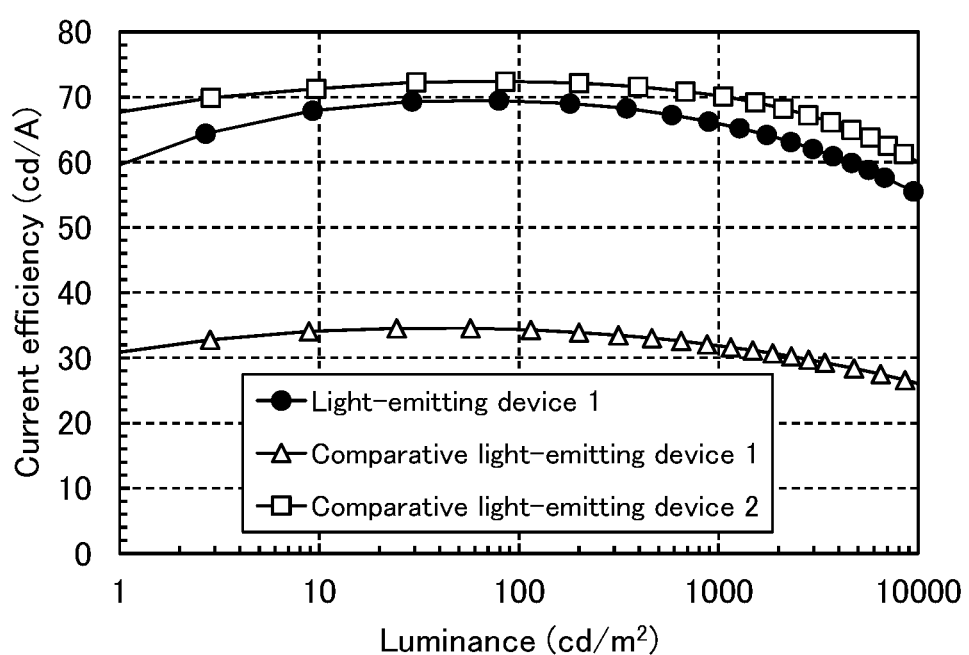
FIG. 18 shows current efficiency-luminance characteristics of the light-emitting device 1, the comparative light-emitting device 1, and a comparative light-emitting device 2.
Figure 19:
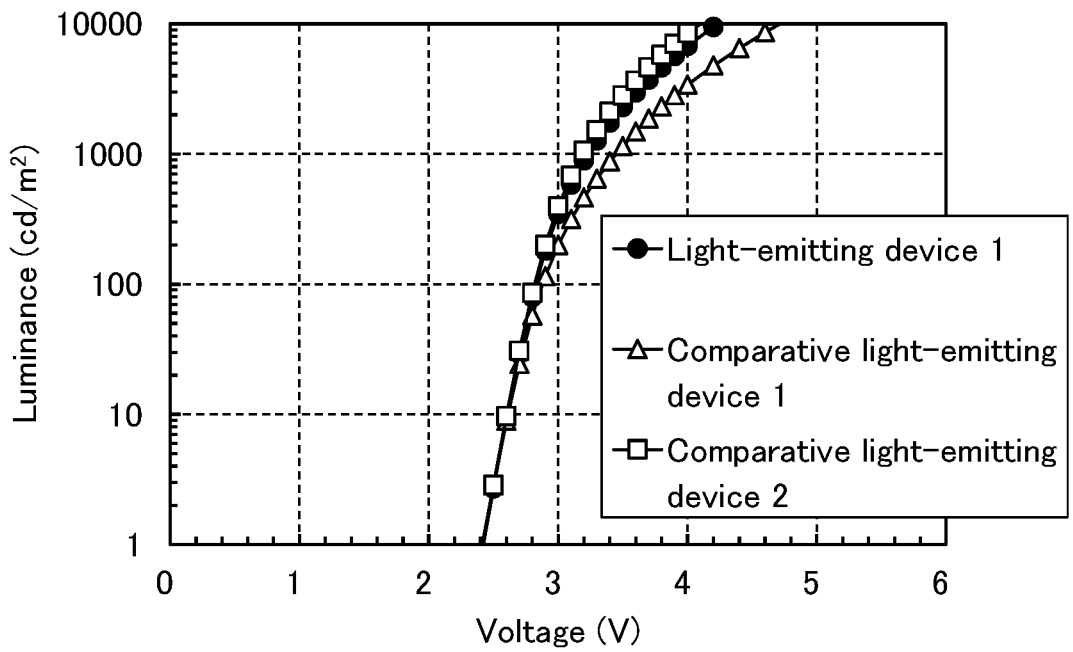
FIG. 19 shows luminance-voltage characteristics of the light-emitting device 1, the comparative light-emitting device 1, and the comparative light-emitting device 2.
Figure 20:
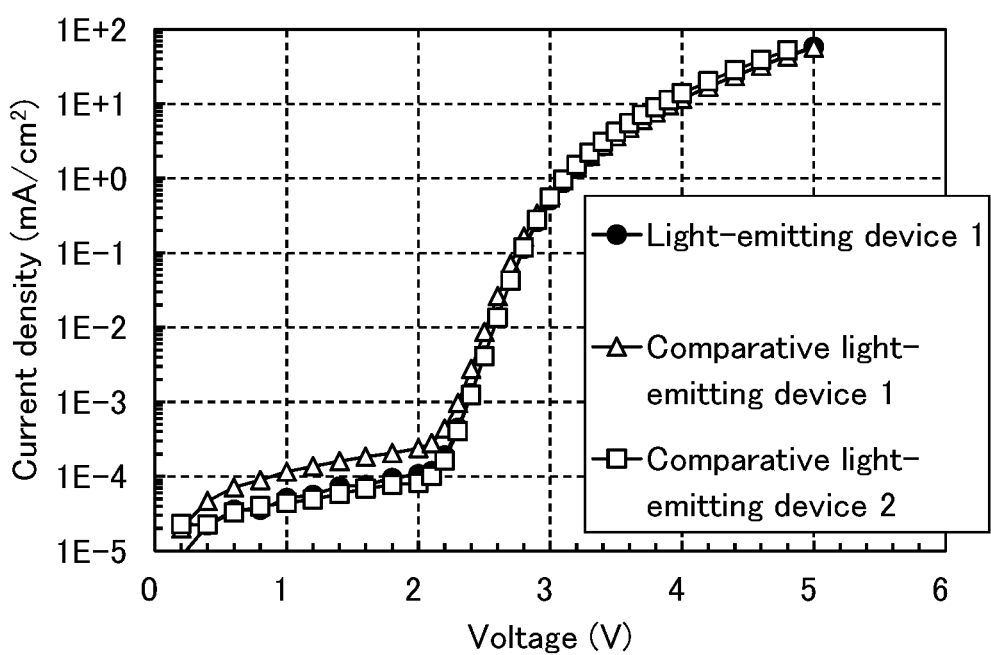
FIG. 20 shows current-voltage characteristics of the light-emitting device 1, the comparative light-emitting device 1, and the comparative light-emitting device 2.
Figure 21:
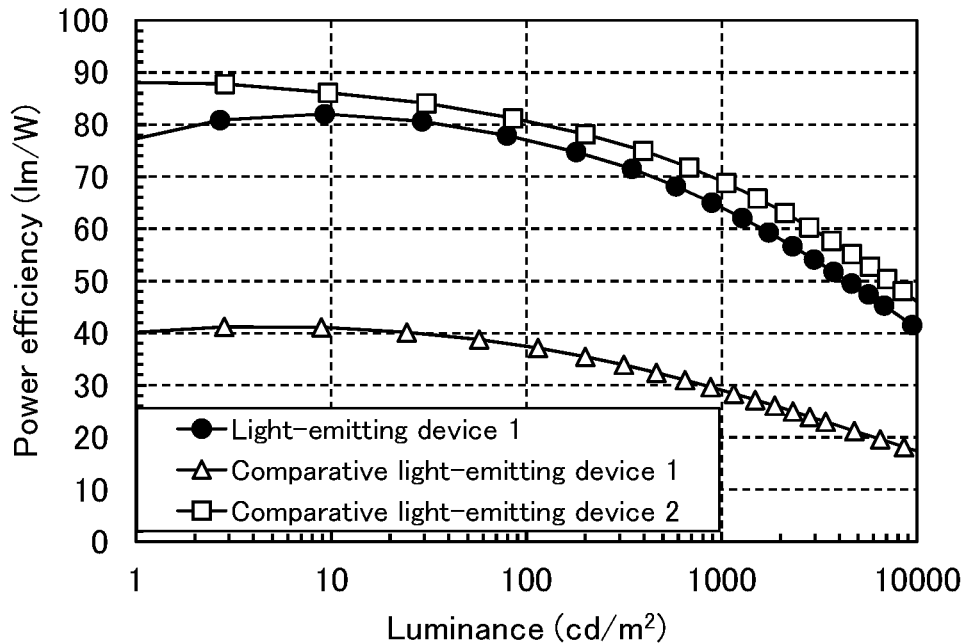
FIG. 21 shows power efficiency-luminance characteristics of the light-emitting device 1, the comparative light-emitting device 1, and the comparative light-emitting device 2.
Figure 22:
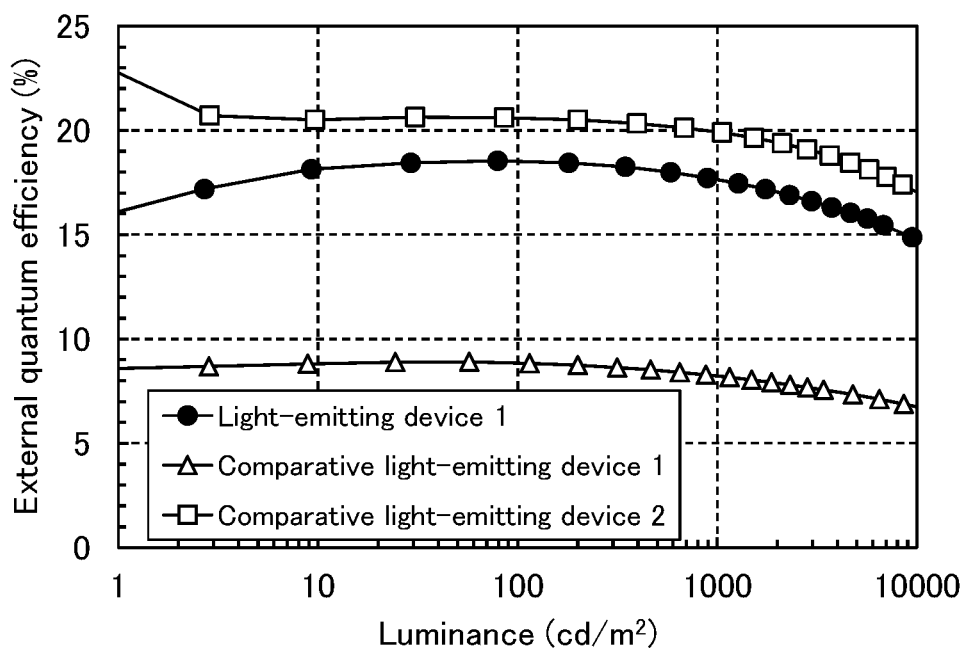
FIG. 22 shows external quantum efficiency-luminance characteristics of the light-emitting device 1, the comparative light-emitting device 1, and the comparative light-emitting device 2.
Figure 23:
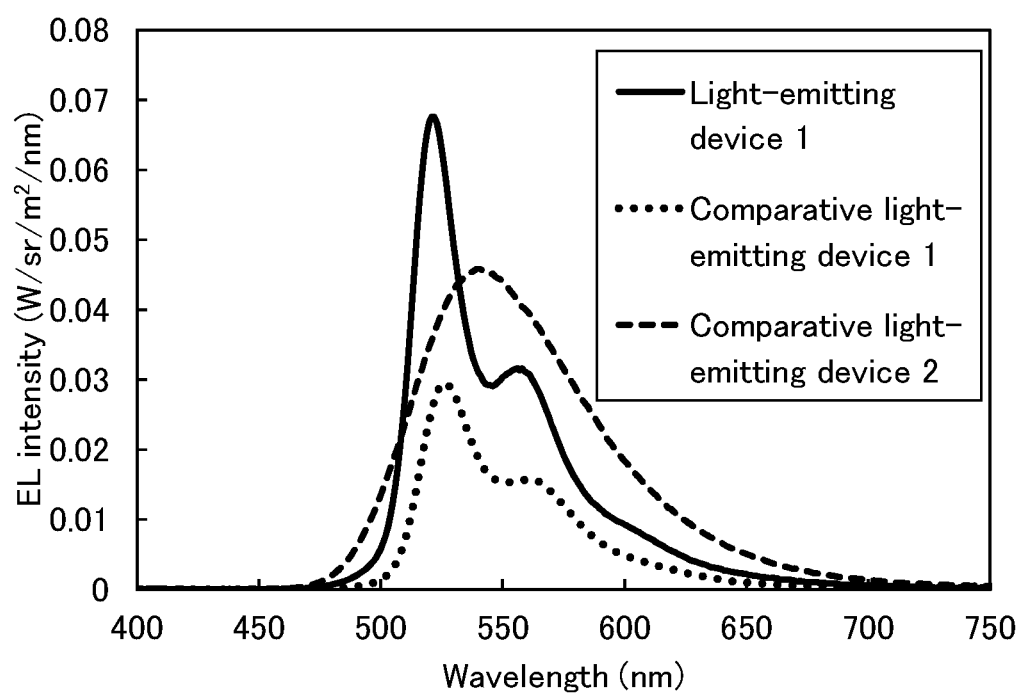
FIG. 23 shows emission spectra of the light-emitting device 1, the comparative light-emitting device 1, and the comparative light-emitting device 2.

FIG. 17 shows the luminance-current density characteristics of the light-emitting device 1, the comparative light-emitting device 1, and the comparative light-emitting device 2; FIG. 18, the current efficiency-luminance characteristics; FIG. 19, the luminance-voltage characteristics; FIG. 20, the current density-voltage characteristics; FIG. 21, the power efficiency-luminance characteristics; and FIG. 22, the external quantum efficiency-luminance characteristics. FIG. 23 shows the electroluminescence spectra of the light-emitting devices to which current flows at a current density of 2.5 mA/cm². Note that the measurement was carried out at room temperature (an atmosphere maintained at 23° C.).

Table 4 below lists the device characteristics at around 1000 cd/m² of the light-emitting device 1, the comparative light-emitting device 1, and the comparative light-emitting device 2.

TABLE 4

| | voltage (V) | current density (mA/cm²) | CIE chromaticity (x, y) | current efficiency (lm/W) | power efficiency (lm/W) | external quantum efficiency (%) |
|---|---|---|---|---|---|---|
| light-emitting device 1 | 3.20 | 1.35 | (0.314, 0.644) | 66.2 | 65.0 | 17.7 |
| comparative light-emitting device 1 | 3.40 | 2.73 | (0.337, 0.635) | 32.1 | 29.7 | 8.3 |
| comparative light-emitting device 2 | 3.20 | 1.51 | (0.376, 0.589) | 70.1 | 68.8 | 19.9 |

The light-emitting device 1 is a light-emitting element in which 4CzIPN serves as an energy donor, energy is transferred to ch3P2Qd, which is the organic compound (fluorescent material) described in Embodiment 1, and light emission is obtained from ch3P2Qd. The comparative light-emitting device 1 is a light-emitting element in which 4CzIPN serves as an energy donor, energy is transferred to DPQd, which is an organic compound (fluorescent material) having no protecting group, and light emission is obtained from DPQd. The comparative light-emitting device 2 is a light-emitting element in which light emission is obtained from 4CzIPN.

As shown in FIG. 23, the EL spectrum of the light-emitting device 1 had an extremely sharp spectrum shape which had a peak wavelength at 521 nm and in which a full width at half maximum is 26 nm. This is light emission based on ch3P2Qd, which is a fluorescent material. The EL spectrum of the comparative light-emitting device 1 had a sharp spectrum shape which had a peak wavelength at 526 nm and in which a full width at half maximum is 53 nm. This is light emission based on DPQd, which is a fluorescent material. The EL spectrum of the comparative light-emitting device 2 had a spectrum shape which had a peak wavelength at 540 nm and in which a full width at half maximum is 81 nm. This is light emission based on 4CzIPN, which is a TADF material. The shape of the emission spectrum of the comparative light-emitting device 2 is obviously different from those of the light-emitting device 1 and the comparative light-emitting device 1, which indicates that light emissions from the different light-emitting materials are observed.

As shown in FIG. 20, the driving voltages of the light-emitting device 1, the comparative light-emitting device 1, and the comparative light-emitting device 2 are substantially the same.

The maximum external quantum efficiency of the comparative light-emitting device 2 was as high as 20% or higher. This means that 4CzIPN exhibits favorable emission efficiency as a TADF material. The maximum external quantum efficiency of the light-emitting device 1 was as high as 18% or higher. In general, the generation probability of singlet excitons which are generated by recombination of carriers (holes and electrons) injected from the pair of electrodes is at most 25%; therefore, the maximum external quantum efficiency of a fluorescent light-emitting device in the case where the light extraction efficiency to the outside is 30% is 7.5%. The light-emitting device 1 exhibited external quantum efficiency exceeding 7.5%, which means that in addition to light emission derived from singlet excitons, light emission derived from energy transfer from triplet excitons is obtained from the fluorescent material.

Meanwhile, the external quantum efficiency of the comparative light-emitting device 1 was at most approximately 8%, which is lower than or equal to half of the efficiency of the light-emitting device 1. This indicates that in the comparative light-emitting device 1, triplet excitation energy cannot be efficiently converted into light emission. That is, by using ch3P2Qd, which is the compound of one embodiment of the present invention, non-radiative decay of triplet excitons was inhibited, and both the singlet excitation energy and the triplet excitation energy were efficiently converted into light emission of the fluorescent material.

Moreover, the light-emitting device 1 exhibits high emission efficiency and has an emission spectrum with a narrow half width; thus, as shown in FIG. 23, a comparison between peak intensities at 2.5 mA/cm$^2$ revealed that the peak intensity of the light-emitting device 1 was the highest. Furthermore, the light-emitting device 1 has an emission spectrum with a narrow half width and has high color purity, and thus is suitable for display application.

The peak wavelength of the EL spectrum of the light-emitting device 1 was shorter than the peak wavelength of the EL spectrum of the comparative light-emitting device 2. Therefore, as shown in Table 4, the light-emitting device 1 has a higher color purity than the comparative light-emitting device 2 and exhibits favorable green light emission with a better chromaticity y, and thus is suitable for display application. This is because the Stokes shift of ch3P2Qd is small as shown in FIG. 16. As described above, a condensed heteroaromatic ring such as quinacridone is preferably used as a luminophore because a fluorescent material with a small Stokes shift can be obtained.

Then, the cyclic voltammetry (CV) measurement results of the electrochemical characteristics (oxidation reaction characteristics and reduction reaction characteristics) of 8BP-4mDBtPBfpm and mCBP used for the light-emitting layers of the light-emitting devices are shown. The measurement method is similar to that in Example 1.

The HOMO level and the LUMO level of 8BP-4mDBtPBfpm were −6.21 eV and −3.01 eV, respectively, and the HOMO level and the LUMO level of mCBP were −5.93 eV and −2.22 eV, respectively; those were calculated from the CV measurement results.

As described above, the LUMO level of 8BP-4mDBtPBfpm is lower than the LUMO level of mCBP, and the HOMO level of mCBP is higher than the HOMO level of 8BP-4mDBtPBfpm. Therefore, in the case where the compounds are used for a light-emitting layer, electrons and holes are efficiently injected into 8BP-4mDBtPBfpm and mCBP, and an exciplex can be formed by 8BP-4mDBtPBfpm and mCBP.

Example 3

Synthesis Example 2

In this example, a synthesis method of 3,10-di-tert-butyl-5,12-bis(2,4,6-tricyclohexylphenyl)-5,12-dihydroquino[2,3-b]acridine-7,14-dione (abbreviation: 3,10tBu-ch3P2Qd), which is an organic compound of one embodiment of the present invention, will be described. The structural formula of 3,10tBu-ch3P2Qd is shown below.

[Chemical Formula 40]

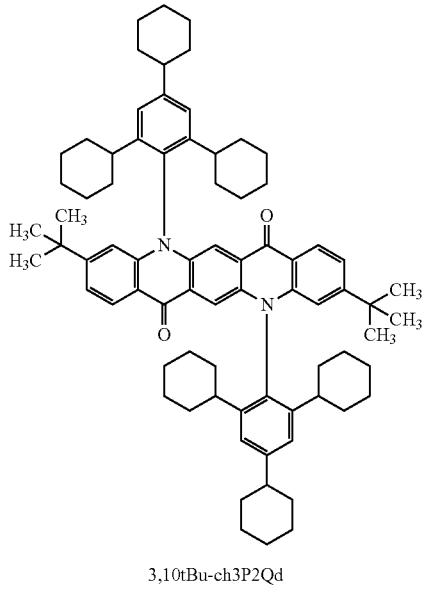

3,10tBu-ch3P2Qd

Step 1: Synthesis of dimethyl 2,5-dihydro-3,6-bis{(3-tert-butylphenyl)amino}terephthalate 5.0 g (22 mmol) of 1,4-cyclohexanedione-2,5-dicarboxylic dimethyl, 7.5 g (50 mmol) of 3-tert-butylaniline, 75 mL of an acetic acid, and 75 mL of ethanol were put into a 300 mL three-neck flask equipped with a reflux pipe, and this mixture was refluxed at 115° C. for 7 hours. After the mixture was cooled, the precipitated red solid was collected by suction filtration and the obtained solid was washed with hexane and methanol. In addition, water was added to the filtrate obtained by the suction filtration so that an aqueous layer was subjected to extraction with toluene. The organic layer was washed with a saturated aqueous solution of sodium hydrogen carbonate and saturated saline, and dried with magnesium sulfate. The obtained mixture was gravity filtered to remove magnesium sulfate, and the obtained solution was concentrated. The solids obtained by the suction filtration and the concentration were combined, whereby 5.6 g of a red solid was obtained. The LC/MS analysis results revealed that m/z of the obtained red solid was 491 and 489, and thus the solid was found to be a target substance and a target oxide. This mixture was used in Step 2 as it is. The synthesis scheme of Step 1 is shown below.

[Chemical Formulae 41]

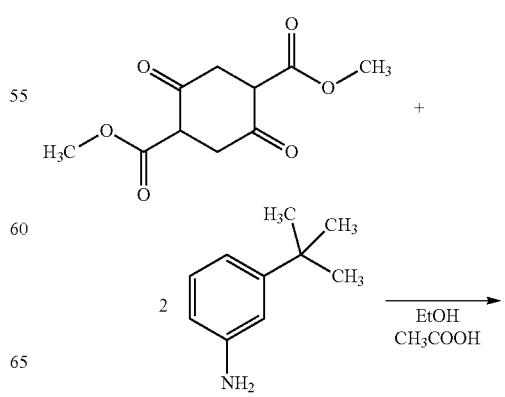

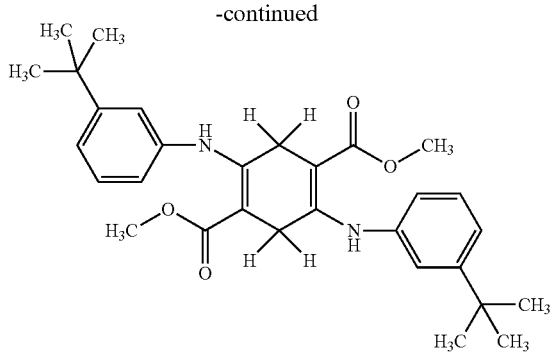

Step 2: Synthesis of dimethyl 2,5-bis{(3-tert-butylphenyl)amino}terephthalate 5.6 g of the mixture of dimethyl 2,5-dihydro-3,6-bis{(3-tert-butylphenyl)amino}terephthalate and the oxide thereof, which was obtained in Step 1, 4.5 g (35 mmol) of iodine, and 0.15 L of toluene were put into a 500 mL three-neck flask equipped with a reflux pipe, and this mixture was refluxed at 120° C. for 10 hours while being stirred. After the stirring, the precipitated solid was collected by suction filtration and the obtained solid was washed with hexane and methanol, so that 2.7 g of a red solid was obtained. Water was added to the filtrate obtained by the suction filtration so that an aqueous layer was subjected to extraction with toluene. The obtained organic layer was washed with water, and subsequently washed with an aqueous solution of sodium thiosulfate. The organic layer was washed with saturated saline, and dried with magnesium sulfate. The obtained mixture was gravity filtered to remove magnesium sulfate, and the obtained filtrate was concentrated to give a red solid. Methanol was added to the solid to form a slurry, the solid was collected by suction filtration, and the solid was washed with methanol and hexane. Through this operation, 2.0 g of a red solid was obtained. This solid and the solid obtained by the suction filtration were combined, whereby 4.7 g of a target compound was obtained in a yield of 44%. The LC/MS analysis results revealed that m/z of the obtained red solid was 489, and thus the solid was found to be a target substance. The synthesis scheme of Step 2 is shown below.

[Chemical Formulae 42]

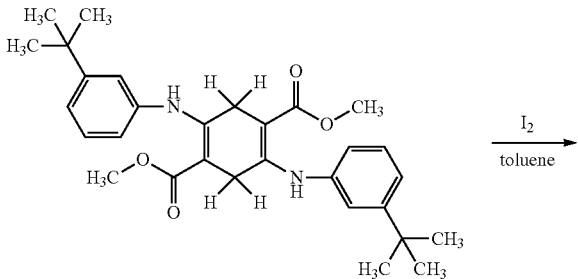

Step 3: Synthesis of dimethyl 2,5-bis[{3-(tert-butyl)phenyl}(2,4,6-tricyclohexylphenyl) amino]terephthalate 2.4 g (5.0 mmol) of 1,4-benzenedicarboxylic acid, which was obtained in Step 2, 2,5-bis{(3-tert-butylphenyl)amino}-,dimethylester, 4.4 g (11 mmol) of 1-bromo-2,4,6-tricyclohexylbenzene, 1.3 g (20 mmol) of copper, 0.95 g (5.0 mmol) of copper iodide, 2.8 g (20 mmol) of potassium carbonate, and 10 mL of diphenyl ether were put into a 200 mL three-neck flask equipped with a reflux pipe, the mixture was degassed at reduced pressure, and the air in the system was replaced with nitrogen. The mixture was stirred at 240° C. for 8 hours and further stirred at 260° C. for 2 hours. Toluene and water were added to the obtained mixture, the mixture was subjected to suction filtration, and an insoluble matter was removed. The obtained filtrate was separated into an organic layer and an aqueous layer, and the organic layer was washed twice with water. The organic layer was washed with saturated saline and dried with magnesium sulfate. The obtained mixture was gravity filtered to remove magnesium sulfate, and the obtained filtrate was concentrated to give a blackish-brown viscous solid. The obtained solid was purified by silica gel chromatography (developing solvent: hexane:toluene=2:1) to give 0.99 g of a target yellowish-orange solid in a yield of 17%. The LC/MS analysis results revealed that m/z of the obtained yellowish-orange solid was 1133, and thus the solid was found to be a target substance. The synthesis scheme of Step 3 is shown below.

[Chemical Formulae 43]

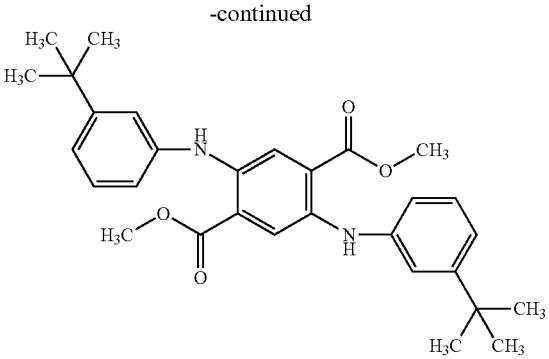

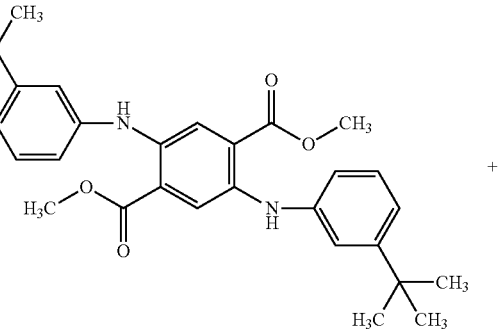

+

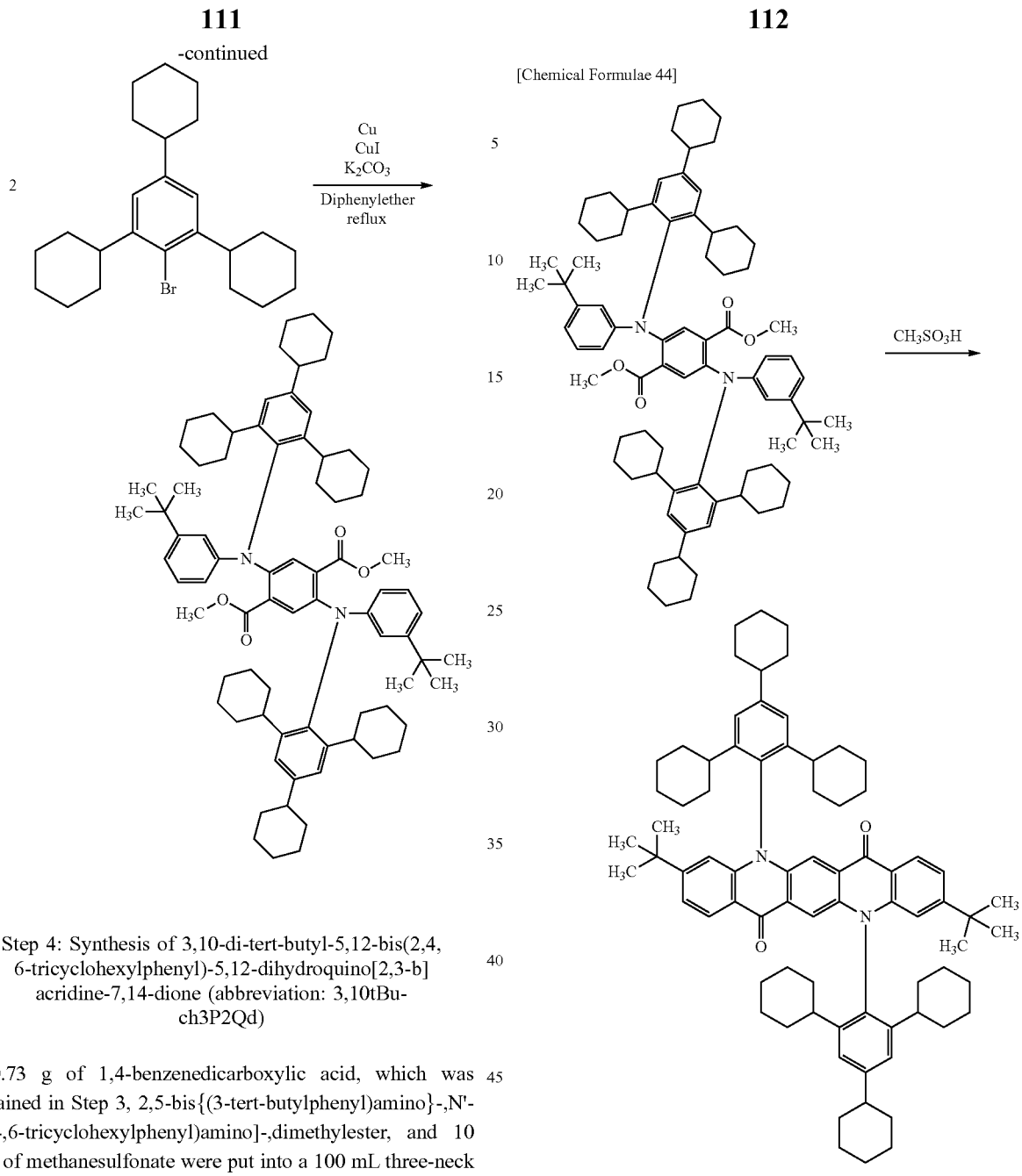

Step 4: Synthesis of 3,10-di-tert-butyl-5,12-bis(2,4,6-tricyclohexylphenyl)-5,12-dihydroquino[2,3-b]acridine-7,14-dione (abbreviation: 3,10tBu-ch3P2Qd)

0.73 g of 1,4-benzenedicarboxylic acid, which was obtained in Step 3, 2,5-bis{(3-tert-butylphenyl)amino}-,N'-(2,4,6-tricyclohexylphenyl)amino]-,dimethylester, and 10 mL of methanesulfonate were put into a 100 mL three-neck flask, and stirring was performed at 140° C. for 1 hour. After the mixture was cooled, the reaction product was put into iced water to stop the reaction. Toluene was added to the obtained mixture and an aqueous layer was subjected to extraction. The obtained organic layer was washed with water, and subsequently washed with a saturated aqueous solution of sodium hydrogen carbonate. The organic layer was washed with saturated saline, and dried with magnesium sulfate. The obtained mixture was gravity filtered to remove magnesium sulfate, and the obtained filtrate was concentrated to give 0.62 g of a yellowish-orange solid. The obtained solid was purified by silica gel chromatography (developing solvent: toluene) to give 0.39 g of a target yellowish-orange solid in a yield of 57%. The synthesis scheme of Step 4 is shown below.

0.30 g of the obtained orange solid was sublimated and purified by a train sublimation method. In the sublimation purification, the solid was heated at 345° C. for 16 hours under a pressure of 5.0 Pa with a flow of argon at 10 mL/min. After the purification by sublimation, 0.25 g of a target orange solid was obtained at a collection rate of 83%.

Figure 24A:
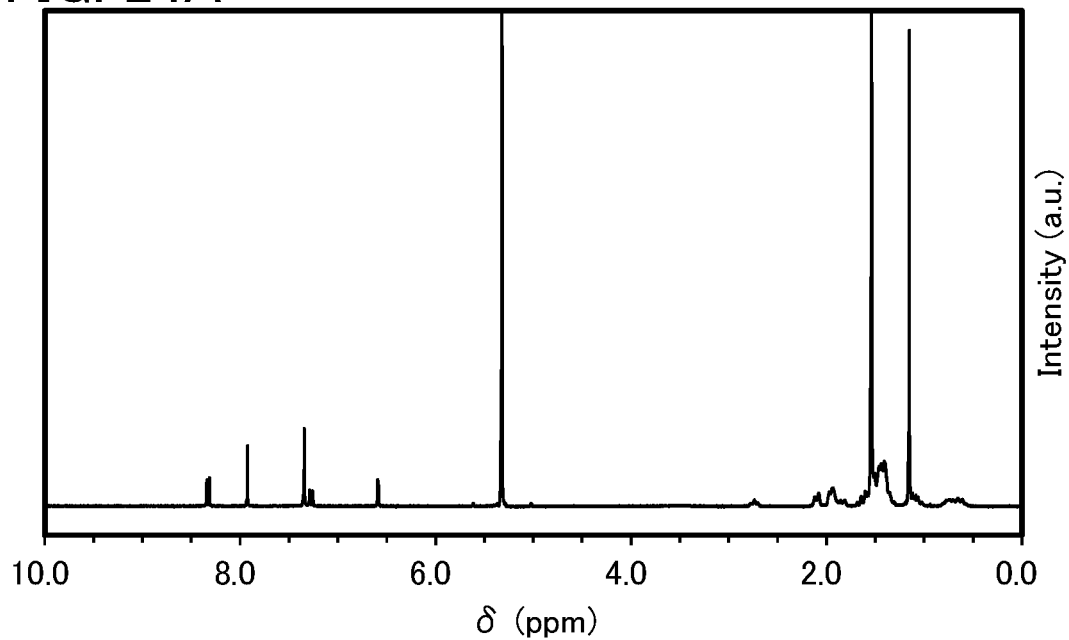
FIG. 24A and FIG. 24B are 1H-NMR charts of 3,10tBu-ch3P2Qd.
Figure 24B:
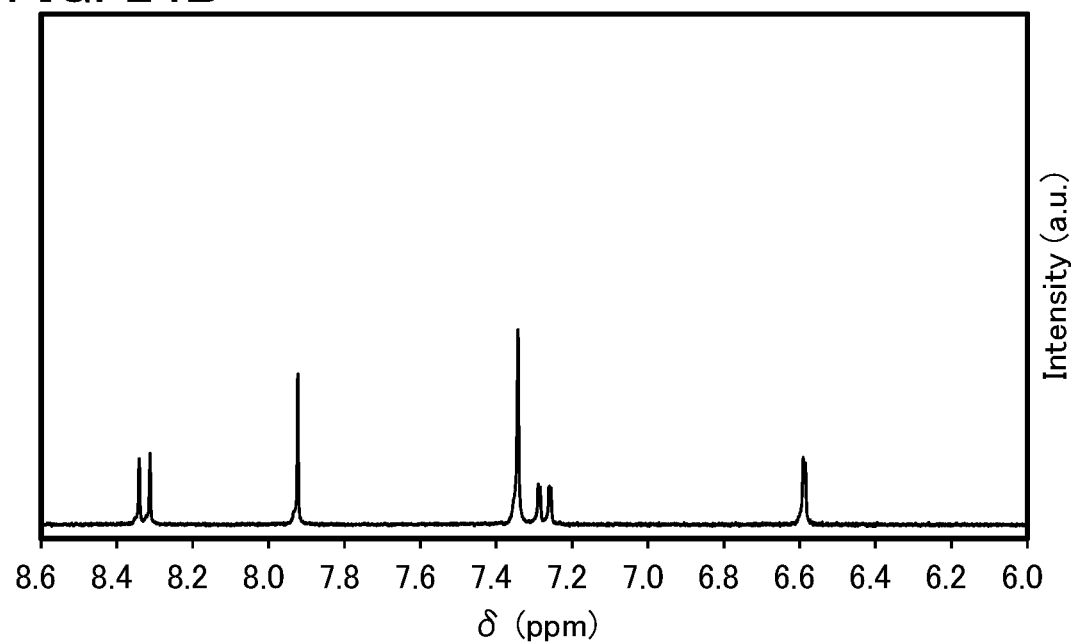

FIG. 24A and FIG. 24B show $^1$H NMR charts of the obtained solid, whose numerical data are given below. The data reveal that the target compound was obtained. $^1$H NMR (dichloromethane-d$_2$, 300 MHz): δ=8.46 (d, J=8.4 Hz, 2H), 7.98 (s, 2H), 7.35 (s, 4H), 7.31 (dd, J=4.2 Hz, 1.8 Hz, 2H), 6.61 (d, J=1.5 Hz, 2H), 2.81-2.65 (m, 2H), 2.16-2.05 (m, 4H), 2.00-1.77 (m, 10H), 1.71-1.28 (m, 38H), 1.16 (s, 18H), 1.13-0.98 (m, 4H), 0.85-0.52 (m, 8H)

Next, an ultraviolet-visible absorption spectrum (hereinafter, simply referred to as an "absorption spectrum") and an emission spectrum of 3,10tBu-ch3P2Qd in a dichloromethane solution were measured. The absorption spectrum was measured using an ultraviolet-visible spectrophotometer (V-550, manufactured by JASCO Corporation). Note that the absorption spectrum of 3,10tBu-ch3P2Qd in the solution was calculated by subtraction of the measured absorption spectrum of only dichloromethane in a quartz cell. The emission spectrum was measured using a fluorescence spectrophotometer (FP-8600, manufactured by JASCO Corporation). For the emission quantum yield, an absolute PL quantum yield measurement system (Quantaurus-QY, manufactured by Hamamatsu Photonics K.K.) was used.

Figure 25:
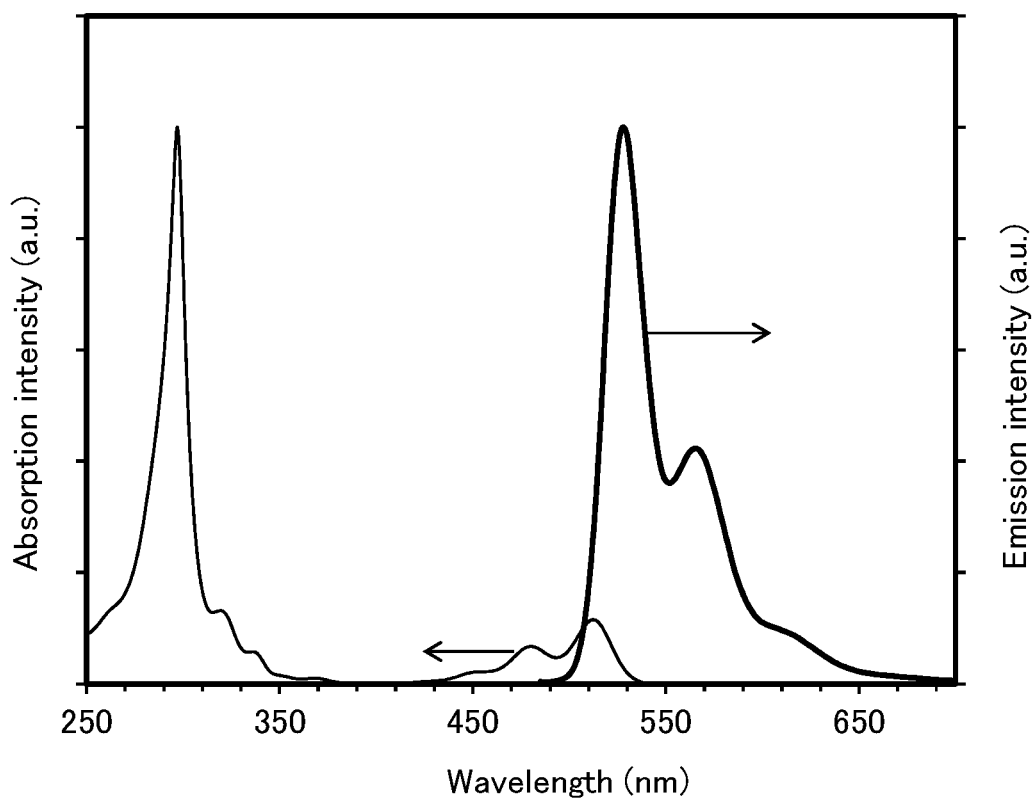
FIG. 25 shows an absorption spectrum and an emission spectrum of 3,10tBu-ch3P2Qd in a solution state.

FIG. 25 shows the obtained measurement results of the absorption spectrum and the emission spectrum of the dichloromethane solution. The horizontal axis represents a wavelength and the vertical axes represent absorption intensity and emission intensity. The horizontal axis represents a wavelength and the vertical axes represent absorption intensity and emission intensity. The results in FIG. 25 show that 3,10tBu-ch3P2Qd in the dichloromethane solution exhibited absorption peaks at around 512 nm, 480 nm, and 449 nm, and emission wavelength peaks at around 617 nm, 565 nm, and 528 nm (an excitation wavelength: 480 nm).

Furthermore, the measured quantum yield in the dichloromethane solution was as high as 91%, which indicates that 3,10tBu-ch3P2Qd is suitable as a light-emitting material.

The HOMO level and the LUMO level of 3,10tBu-ch3P2Qd were calculated on the basis of a cyclic voltammetry (CV) measurement. An electrochemical analyzer (model number: ALS model 600A or 600C, manufactured by BAS Inc.) was used as a measurement apparatus. To prepare a solution for the CV measurement, dehydrated dimethylformamide (DMF) (manufactured by Sigma-Aldrich Inc., 99.8%, catalog No. 22705-6) was used as a solvent, tetra-n-butylammonium perchlorate (n-Bu4NClO4) (manufactured by Tokyo Chemical Industry Co., Ltd., catalog No. T0836) as a supporting electrolyte was dissolved at a concentration of 100 mmol/L, and the object to be measured was dissolved at a concentration of 2 mmol/L.

The scan speed in the CV measurement was fixed to 0.1 V/sec, and an oxidation potential Ea [V] and a reduction potential Ec [V] with respect to the reference electrode were measured. Ea is an intermediate potential of an oxidation-reduction wave, and Ec is an intermediate potential of a reduction-oxidation wave. Here, since the potential energy of the reference electrode used in this example with respect to the vacuum level is known to be −4.94 [eV], the HOMO level and the LUMO level can be calculated by the following formulae: HOMO level [eV]=−4.94−Ea and LUMO level [eV]=−4.94−Ec.

Furthermore, CV measurement was repeated 100 times, and the oxidation-reduction wave in the hundredth cycle was compared with the oxidation-reduction wave in the first cycle to examine the electrical stability of the compound. As a result, the HOMO level was found to be −5.77 eV in the measurement of the oxidation potential Ea [V] of 3,10tBu-ch3P2Qd. In contrast, the LUMO level was found to be −3.18 eV in the measurement of the reduction potential Ec[V]. In addition, when the oxidation-reduction wave was repeatedly measured and the waveform of the first cycle was compared with that of the hundredth cycle, 75% of the peak intensity was maintained in the Ea measurement.

Example 4

In this example, fabrication examples of the light-emitting devices of one embodiment of the present invention and comparative light-emitting devices and the characteristics of the light-emitting devices will be described. The structures of the light-emitting devices fabricated in this example are the same as that in FIG. 1A. The structures and abbreviations of the compounds used are shown below.

[Chemical Formulae 45]

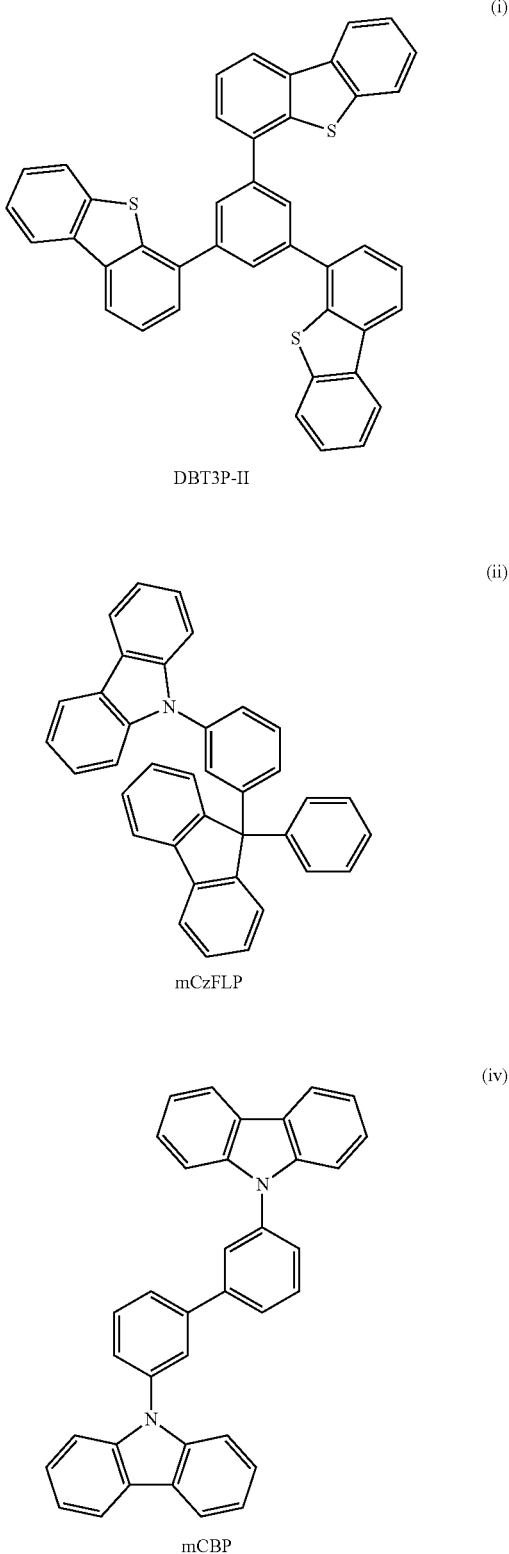

(i) DBT3P-II (ii) mCzFLP (iv) mCBP

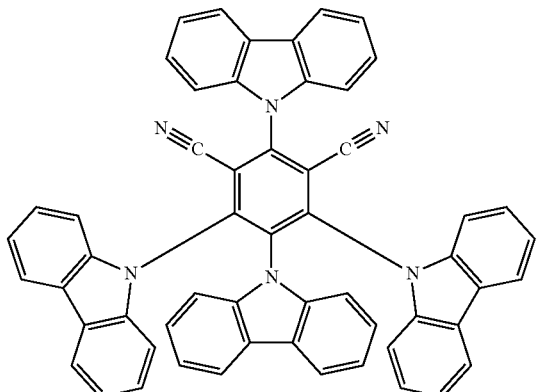

4CzIPN

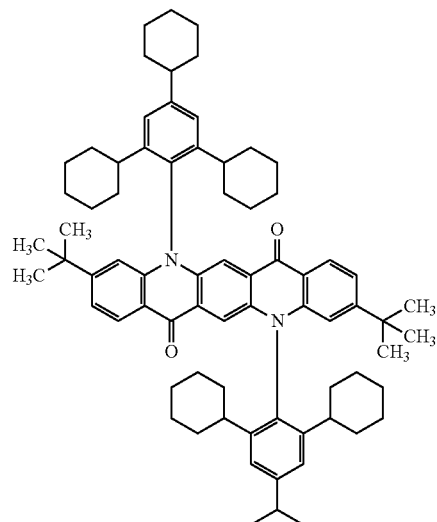

3,10tBu-ch3P2Qd

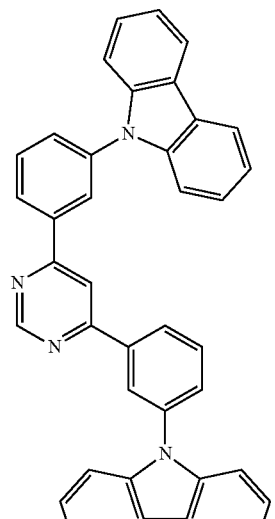

4,6mCzP2Pm

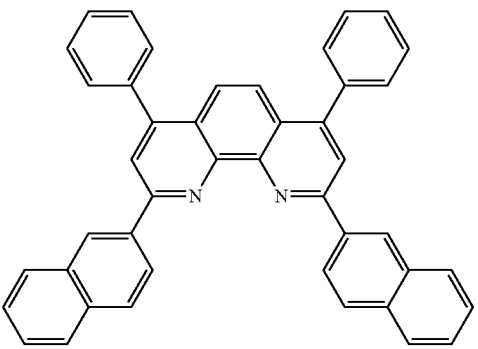

NBPhen

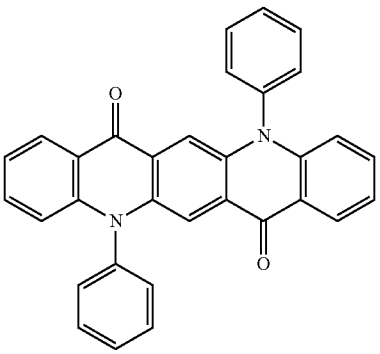

DPQd

<Fabrication Method of Light-Emitting Device 2>

As the electrode 101, an ITSO film was formed to a thickness of 70 nm over a glass substrate. Note that the electrode area of the electrode 101 was set to 4 mm² (2 mm×2 mm).

Next, as the hole-injection layer 111, 4,4',4"-(benzene-1, 3,5-triyl)tri(dibenzothiophene) (abbreviation: DBT3P-II) represented by Structural Formula (i) above and molybdenum oxide were deposited over the electrode 101 by co-evaporation at a weight ratio (DBT3P-II: molybdenum oxide) of 1:0.5 to a thickness of 40 nm.

Next, as the hole-transport layer 112, 9-[3-(9-phenyl-9H-fluoren-9-yl)phenyl]9H-carbazole (abbreviation: mCzFLP) represented by Structural Formula (ii) above was deposited over the hole-injection layer 111 by evaporation to a thickness of 20 nm.

Next, as the light-emitting layer 130, 3,3'-9H-carbazole-9-yl-biphenyl (abbreviation: mCBP) represented by Structural Formula (iv) above, 2,4,5,6-tetra(9H-carbazole-9-yl) isophthalonitrile (abbreviation: 4CzIPN) represented by Structural Formula (v) above, and 3,10-di-tert-butyl-5,12-bis(2,4,6-tricyclohexylphenyl)-5,12-dihydroquino [2,3-b] acridine-7,14-dione (abbreviation: 3,10tBu-ch3P2Qd) represented by Structural Formula (ix) above were deposited over the hole-transport layer 112 by co-evaporation at a weight ratio (mCBP:4CzIPN:3,10tBu-ch3P2Qd) of 1:1:0.05 to a thickness of 40 nm.

Non-Patent Document 1 discloses that in the light-emitting device, 4CzIPN is a TADF material. Furthermore, 3,10tBu-ch3P2Qd is a fluorescent material having protecting groups.

Then, 9,9'-(pyrimidine-4,6-diyldi-3,1-phenylene)bis(9H-calbazole) (abbreviation: 4,6CzP2Pm) represented by Structural Formula (x) above was deposited over the light-emitting layer 130 by evaporation to a thickness of 20 nm, and then NBPhen was deposited thereover by evaporation to a thickness of 15 nm, whereby the electron-transport layer 118 was formed. After that, as the electron-injection layer 119, LiF was deposited to a thickness of 1 nm over the electron-transport layer 118 by evaporation.

After that, as the electrode 102, aluminum (Al) was formed to a thickness of 200 nm over the electron-injection layer 119, whereby a light-emitting device 2 was fabricated.

Then, in a glove box containing a nitrogen atmosphere, the light-emitting device 2 was sealed in the following manner: sealant was applied to the periphery of organic materials formed on a glass substrate, the glass substrate was bonded to a glass substrate for sealing, irradiation with ultraviolet light having a wavelength of 365 nm at 6 J/cm$^2$ was performed, heat treatment at 80° C. for one hour was performed, and the glass substrate for sealing was fixed to the glass substrate on which the organic materials were formed.

<Fabrication Method of Comparative Light-Emitting Device>

A comparative light-emitting device 3 was fabricated in a manner similar to that for the light-emitting device 2 except that 3,10tBu-ch3P2Qd in the light-emitting layer of the light-emitting device 2 was replaced by N,N'-diphenylquinacridone (abbreviation: DPQd) represented by Structural Formula (viii) above, the weight ratio of mCBP to 4CzIPN and DPQd was 1:1:0.05, and the thickness of the light-emitting layer was 30 nm. In other words, the comparative light-emitting device 3 is a light-emitting device using a fluorescent material having no protecting group instead of the organic compound of one embodiment of the present invention. A comparative light-emitting device 4 was fabricated in a manner similar to that for the light-emitting device 2 except that the light-emitting layer of the light-emitting device 2 was formed to a thickness of 30 nm at the weight ratio of mCBP to 4CzIPN was 1:1. That is, the comparative light-emitting device 4 is a light-emitting device not using the organic compound of the present invention.

The element structures of the light-emitting device 2, the comparative light-emitting device 3, and the comparative light-emitting device 4 are listed below.

TABLE 5 light-emitting device 2

| | film thickness (nm) | material and mixture ratio |
|---|---|---|
| cathode | 200 | Al |
| electron-injection layer | 1 | LiF |
| electron-transport layer | 15 | N BPhen |
| | 20 | 4,6mCzP2Pm |
| light-emitting layer | 40 | mCBP:4CzIPN:3,10tBu-ch3P2Qd (1:1:0.05) |
| hole-transport layer | 20 | mCzFLP |
| hole-injection layer | 40 | DBT3P-II:MoOx (1:0.5) |
| anode | 70 | ITSO |

TABLE 6 comparative light-emitting device 3

| | film thickness (nm) | material and mixture ratio |
|---|---|---|
| cathode | 200 | Al |
| electron-injection layer | 1 | LiF |
| electron-transport layer | 15 | N BPhen |
| | 20 | 4,6mCzP2Pm |
| light-emitting layer | 30 | mCBP:4CzIPN:DPQd (1:1:0.05) |
| hole-transport layer | 20 | mCzFLP |
| hole-injection layer | 40 | DBT3P-II:MoOx (1:0.5) |
| anode | 70 | ITSO |

TABLE 7 comparative light-emitting device 4

| | film thickness (nm) | material and mixture ratio |
|---|---|---|
| cathode | 200 | Al |
| electron-injection layer | 1 | LiF |
| electron-transport layer | 15 | N BPhen |
| | 20 | 4,6mCzP2Pm |
| light-emitting layer | 30 | mCBP:4CzIPN (1:1) |
| hole-transport layer | 20 | mCzFLP |
| hole-injection layer | 40 | DBT3P-II:MoOx (1:0.5) |
| anode | 70 | ITSO |

<Characteristics of Light-Emitting Device 2, Comparative Light-Emitting Device 3, and Comparative Light-Emitting Device 4>

Next, characteristics of the fabricated light-emitting device 2, comparative light-emitting device 3, and comparative light-emitting device 4 were measured. Luminance, CIE chromaticity, and electroluminescence (EL) spectra were measured using a spectroradiometer (SR-UL1R, manufactured by TOPCON TECHNOHOUSE CORPORATION).

Figure 26:
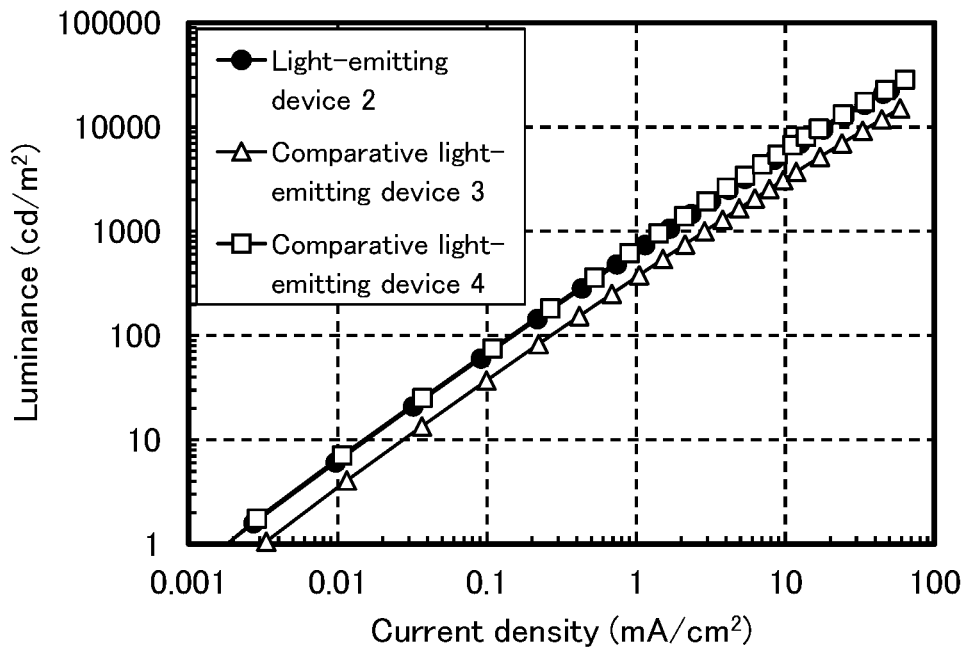
FIG. 26 shows luminance-current density characteristics of a light-emitting device 2, a comparative light-emitting device 3, and a comparative light-emitting device 4.
Figure 27:
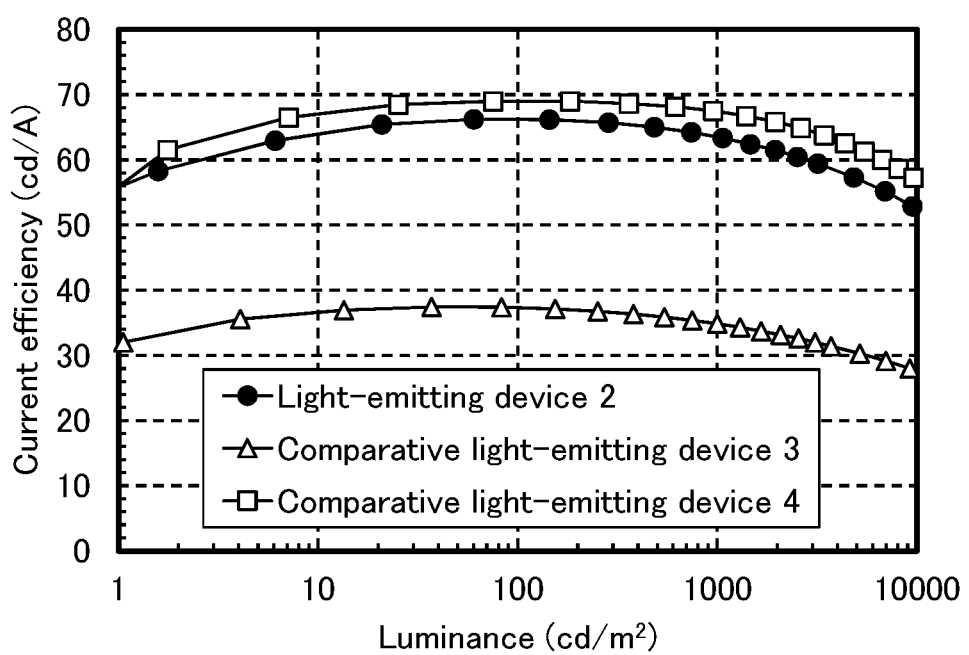
FIG. 27 shows current efficiency-luminance characteristics of the light-emitting device 2, the comparative light-emitting device 3, and the comparative light-emitting device 4.
Figure 28:
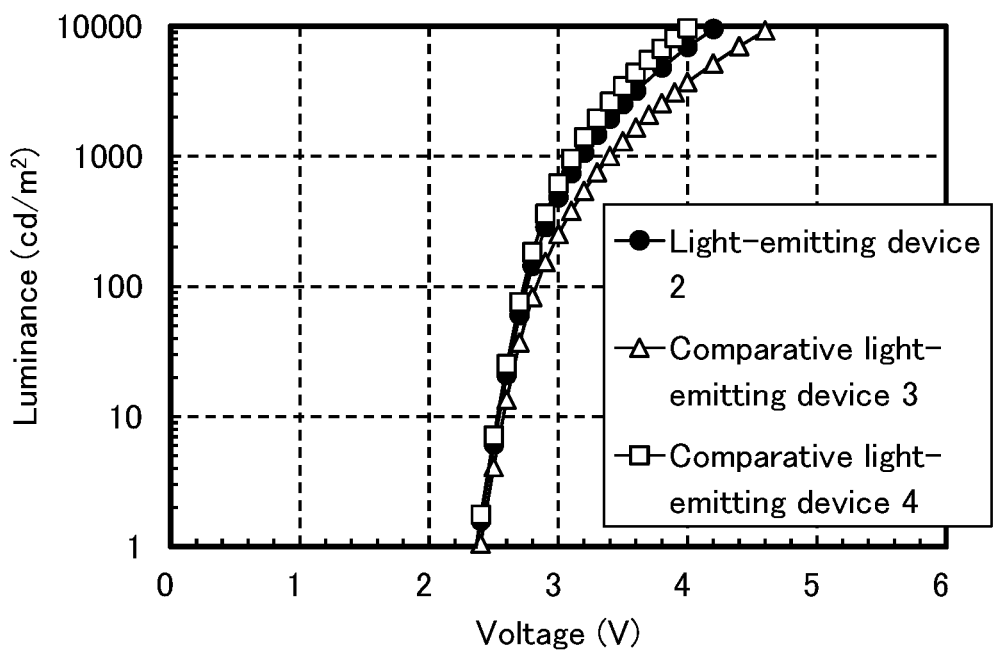
FIG. 28 shows luminance-voltage characteristics of the light-emitting device 2, the comparative light-emitting device 3, and the comparative light-emitting device 4.
Figure 29:
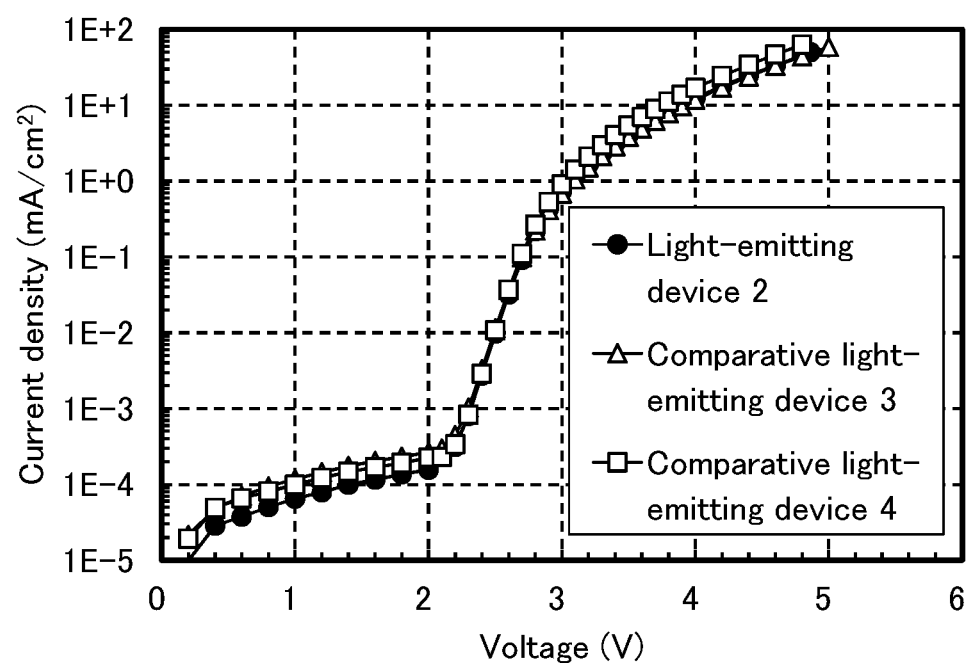
FIG. 29 shows current-voltage characteristics of the light-emitting device 2, the comparative light-emitting device 3, and the comparative light-emitting device 4.
Figure 30:
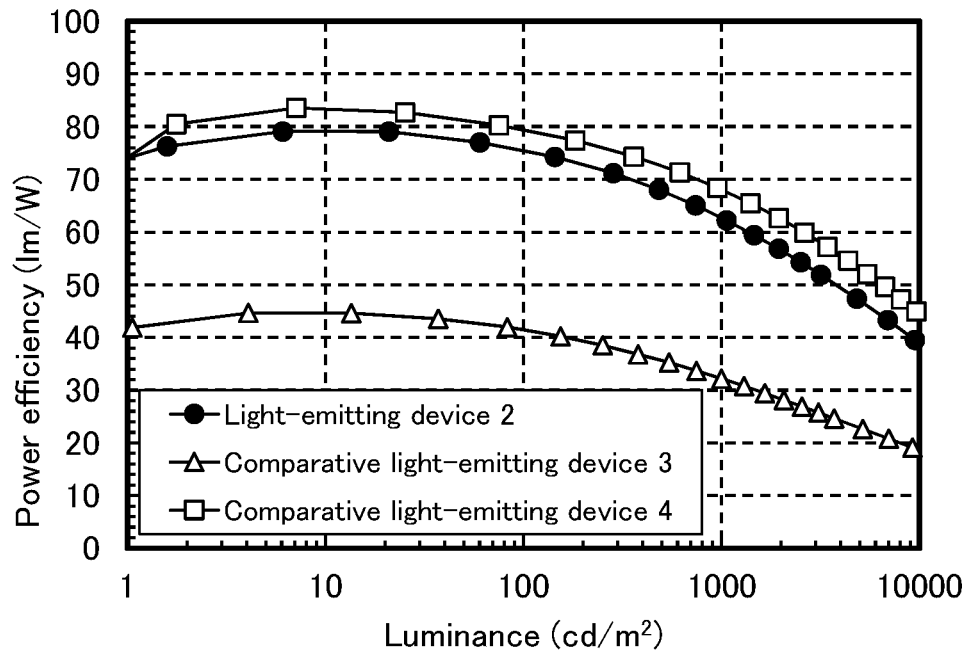
FIG. 30 shows power efficiency-luminance characteristics of the light-emitting device 2, the comparative light-emitting device 3, and the comparative light-emitting device 4.
Figure 31:
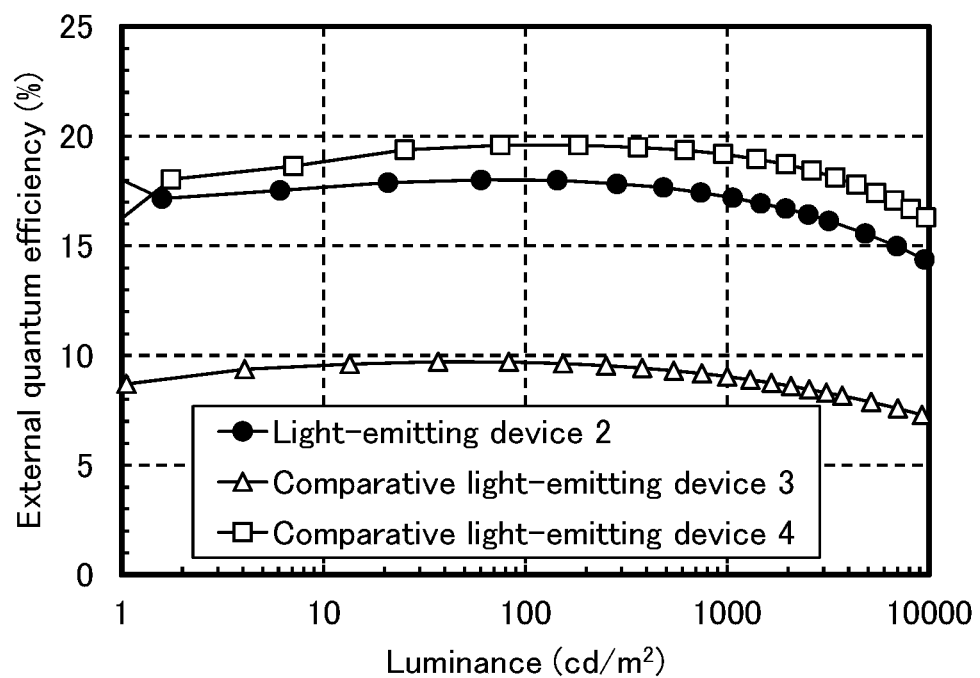
FIG. 31 shows the external quantum efficiency-luminance characteristics of the light-emitting device 2, the comparative light-emitting device 3, and the comparative light-emitting device 4.
Figure 32:
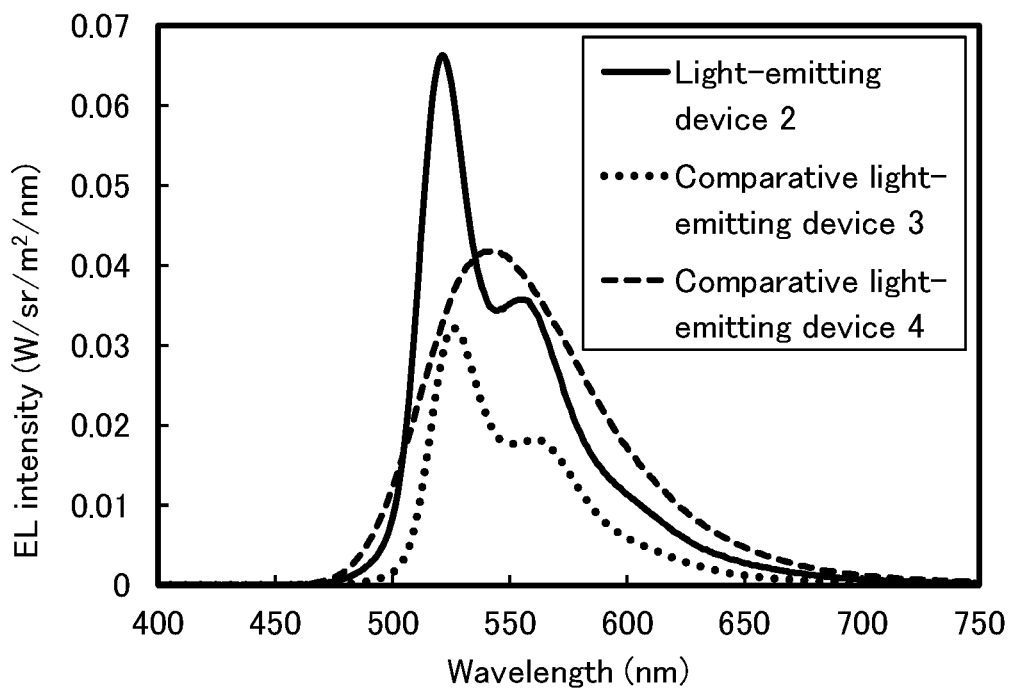
FIG. 32 shows emission spectra of the light-emitting device 2, the comparative light-emitting device 3, and the comparative light-emitting device 4.

FIG. 26 shows the luminance-current density characteristics of the light-emitting device 2, the comparative light-emitting device 3, and the comparative light-emitting device 4; FIG. 27, the current efficiency-luminance characteristics; FIG. 28, the luminance-voltage characteristics; FIG. 29, the current density-voltage characteristics; FIG. 30, the power efficiency-luminance characteristics; and FIG. 31, the external quantum efficiency-luminance characteristics. FIG. 32 shows the electroluminescence spectra of the light-emitting devices to which current flows at a current density of 2.5 mA/cm$^2$. Note that the measurement was carried out at room temperature (an atmosphere maintained at 23° C.).

Table 8 lists the device characteristics at around 1000 cd/m$^2$ of the light-emitting device 2, the comparative light-emitting device 3, and the comparative light-emitting device 4.

TABLE 8

|  | voltage (V) | current density (mA/cm²) | CIE chromaticity (x, y) | current efficiency (lm/W) | power efficiency (lm/W) | external quantum efficiency (%) |
|---|---|---|---|---|---|---|
| light-emitting device 2 | 3.20 | 1.68 | (0.323, 0.634) | 63.4 | 62.2 | 17.2 |
| comparative light-emitting device 3 | 3.40 | 2.87 | (0.343, 0.629) | 34.8 | 32.2 | 9.0 |
| comparative light-emitting device 4 | 3.10 | 1.42 | (0.377, 0.587) | 67.5 | 68.4 | 19.2 |

The light-emitting device 2 is a light-emitting element in which 4CzIPN, which is a TADF material, serves as an energy donor, energy is transferred to 3,10tBu-ch3P2Qd, which is the organic compound (fluorescent material) of one embodiment of the present invention, and light emission is obtained from 3,10tBu-ch3P2Qd. The comparative light-emitting device 3 is a light-emitting element in which 4CzIPN serves as an energy donor, energy is transferred to DPQd, which is an organic compound (fluorescent material) having no protecting group, and light emission is obtained from DPQd. The comparative light-emitting device 4 is a light-emitting device in which light emission is obtained from 4CzIPN.

As shown in FIG. 32, the EL spectrum of the light-emitting device 2 had an extremely sharp spectrum shape which had a peak wavelength at 521 nm and in which a full width at half maximum is 53 nm. This is light emission based on 3,10tBu-ch3P2Qd, which is a fluorescent material. The EL spectrum of the comparative light-emitting device 3 had a sharp spectrum shape which had a peak wavelength at 526 nm and in which a full width at half maximum is 56 nm. This is light emission based on DPQd, which is a fluorescent material. The EL spectrum of the comparative light-emitting device 4 had a spectrum shape which had a peak wavelength at 543 nm and in which a full width at half maximum is 82 nm. This is light emission based on 4CzIPN, which is a TADF material. The shape of the emission spectrum of the comparative light-emitting device 4 is obviously different from those of the light-emitting device 2 and the comparative light-emitting device 3, which indicates that light emissions from the different light-emitting materials are observed.

The maximum external quantum efficiency of the comparative light-emitting device 4 was as high as approximately 20%. This means that 4CzIPN exhibits favorable emission efficiency as a TADF material. The maximum external quantum efficiency of the light-emitting device 2 was as high as 18% or higher. In general, the generation probability of singlet excitons which are generated by recombination of carriers (holes and electrons) injected from the pair of electrodes is at most 25%; therefore, the maximum external quantum efficiency of a fluorescent light-emitting device in the case where the light extraction efficiency to the outside is 30% is 7.5%. The light-emitting device 2 exhibited external quantum efficiency exceeding 7.5%, which means that in addition to light emission derived from singlet excitons, light emission derived from energy transfer from triplet excitons is obtained from the fluorescent material. Meanwhile, the external quantum efficiency of the comparative light-emitting device 3 was at most on the order of 9%, which is approximately half of the efficiency of the light-emitting device 2. This indicates that in the comparative light-emitting device 3, triplet excitation energy cannot be efficiently converted into light emission. That is, by using 3,10tBu-ch3P2Qd, which is the compound of one embodiment of the present invention, non-radiative decay of triplet excitons was inhibited, and both the singlet excitation energy and the triplet excitation energy were efficiently converted into light emission of the fluorescent material.

Moreover, the light-emitting device 2 exhibits high emission efficiency and has an emission spectrum with a narrow full width at half; thus, as shown in FIG. 32, a comparison between peak intensities at 2.5 mA/cm² revealed that the peak intensity of the light-emitting device 2 was the highest. Furthermore, the light-emitting device 2 has an emission spectrum with a narrow half width and has high color purity, and thus is suitable for display application.

The peak wavelength of the EL spectrum of the light-emitting device 2 was shorter than the peak wavelength of the EL spectrum of the comparative light-emitting device 4. Therefore, as shown in Table 4, the light-emitting device 2 has a higher color purity than the comparative light-emitting device 4 and exhibits favorable green light emission with a better chromaticity y, and thus is suitable for display application. This is because the Stokes shift of 3,10tBu-ch3P2Qd is small as shown in FIG. 25. As described above, a condensed heteroaromatic ring such as quinacridone is preferably used as a luminophore because a fluorescent material with a small Stokes shift can be obtained.

Figure 33:
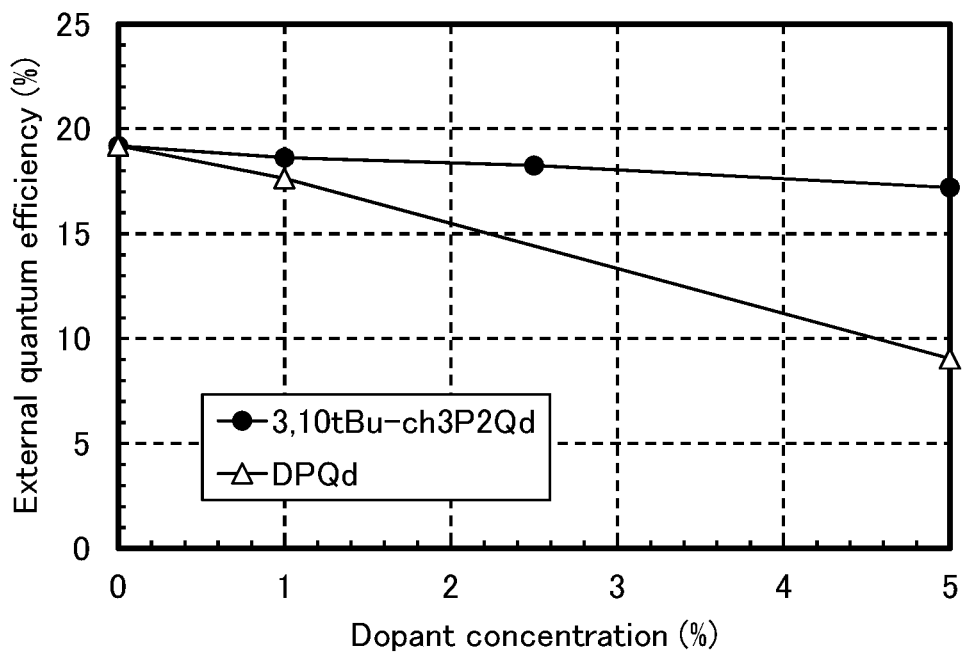
FIG. 33 is a graph showing an influence of dopant concentration on emission efficiency.

FIG. 33 is a graph showing an influence of dopant concentration on emission efficiency. Light-emitting devices that are different from the light-emitting device 2 and the comparative light-emitting device 3 only in dopant concentration were fabricated, and external quantum efficiencies at around 1000 cd/m² were plotted. The results revealed that the external quantum efficiency of the device using DPQd as a dopant significantly decreased as the dopant concentration increased; in contrast, a significant decrease in the efficiency of the device using 3,10tBu-ch3P2Qd as a dopant did not occur even when the concentration increased. This is presumably because concentration quenching was significantly suppressed owing to 3,10tBu-ch3P2Qd having protecting groups, which can keep appropriate distance between dopants. Accordingly, the margin of production for dopant concentration of the light-emitting device of one embodiment of the present invention is large, and the light-emitting device is easily manufactured.

Example 5

In this example, fabrication examples of the light-emitting devices of one embodiment of the present invention and comparative light-emitting devices and the characteristics of the light-emitting devices will be described. The structures of the light-emitting devices fabricated in this example are the same as that in FIG. 1A. The structures and abbreviations of the compounds used are shown below.
[Chemical Formulae 46]
(i)
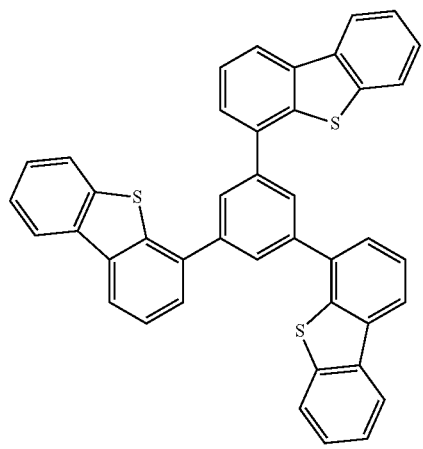
DBT3P-II
(xi)
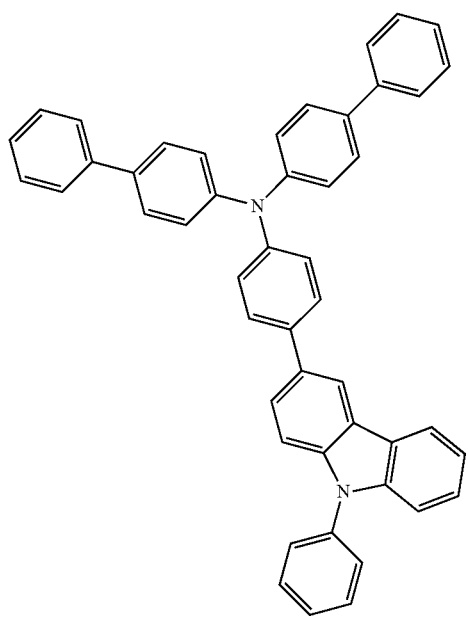
PCBBi1BP
(xii)
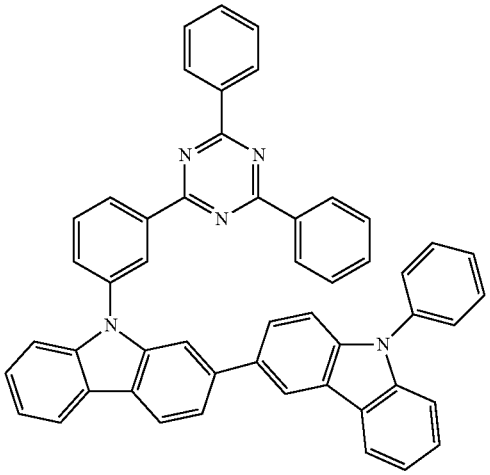
mPCCzPTzn-02
(xiii)
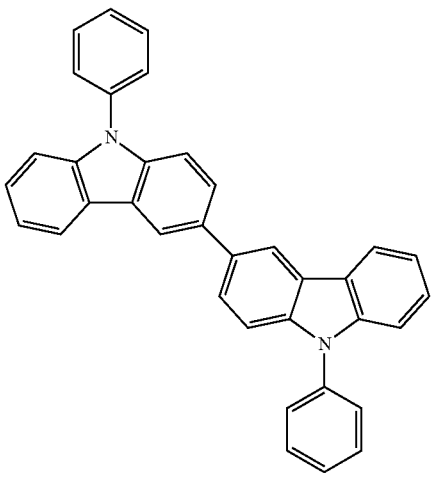
PCCP
(xiv)
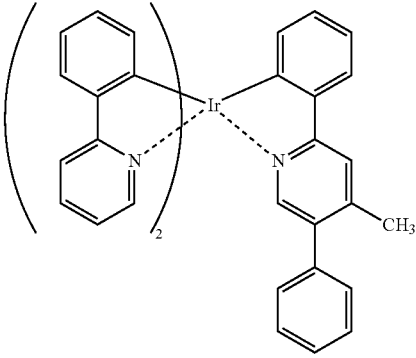
[Ir(ppy)₂(mdppy)]

-continued (vii)

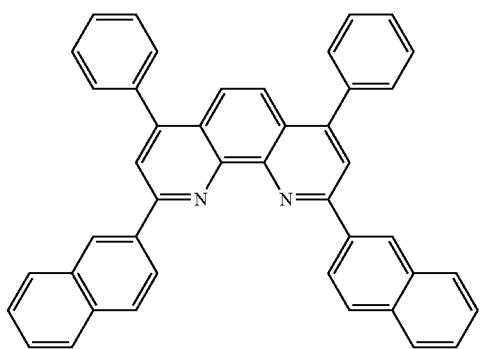

NBPhen (ix)

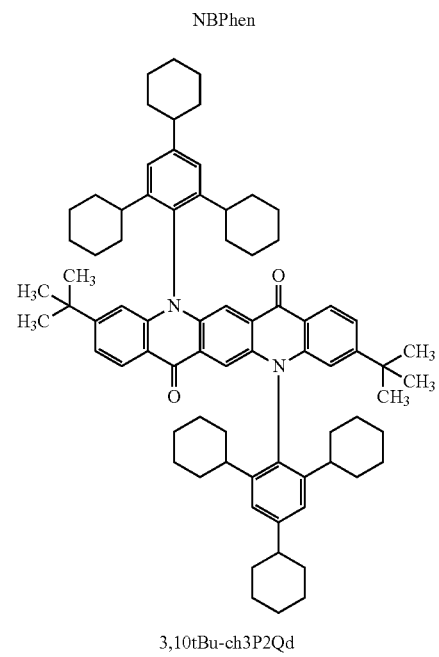

3,10tBu-ch3P2Qd (viii)

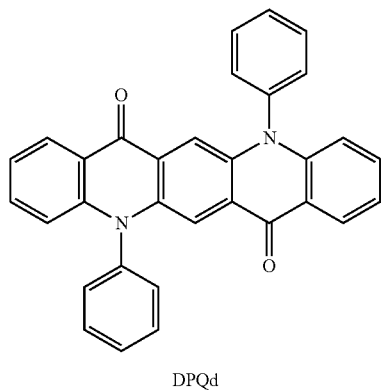

DPQd

<Fabrication Method of Light-Emitting Device 3>

As the electrode 101, an ITSO film was formed to a thickness of 70 nm over a glass substrate. Note that the electrode area of the electrode 101 was set to 4 mm² (2 mm×2 mm).

Next, as the hole-injection layer 111, 4,4',4"-(benzene-1,3,5-triyl)tri(dibenzothiophene) (abbreviation: DBT3P-II) represented by Structural Formula (i) above and molybdenum oxide were deposited over the electrode 101 by co-evaporation at a weight ratio (DBT3P-II:molybdenum oxide) of 1:0.5 to a thickness of 40 nm.

Next, as the hole-transport layer 112, 4,4'-diphenyl-4"-(9-phenyl-9H-carbazol-3-yl)triphenylamine (abbreviation: PCBBi1BP) represented by Structural Formula (xi) above was deposited over the hole-injection layer 111 by evaporation to a thickness of 20 nm.

Next, as the light-emitting layer 130, 9-[3-(4,6-diphenyl-1,3,5-triazin-2-yl)phenyl]-9'-phenyl-2,3'-bi-9H-carbazole (abbreviation: mPCCzPTzn-02) represented by Structural Formula (xii) above, 3,3'-bis(9-phenyl-9H-carbazole) (abbreviation: PCCP) represented by Structural Formula (xiii) above, [2-(4-methyl-5-phenyl-2-pyridinyl-κN)phenyl-κC]bis[2-(2-pyridinyl-κN)phenyl-κC]iridium (abbreviation: [Ir(ppy)₂(mdppy)]) represented by Structural Formula (xiv) above, and 3,10-di-tert-butyl-5,12-bis(2,4,6-tricyclohexylphenyl)-5,12-dihydroquino[2,3-b]acridine-7,14-dione (abbreviation: 3,10tBu-ch3P2Qd) represented by Structural Formula (ix) above were deposited over the hole-transport layer 112 by co-evaporation at a weight ratio (mPCCzPTzn-02:PCCP:[Ir(ppy)₂(mdppy)]:3,10tBu-ch3P2Qd) of 0.5:0.5:0.1:0.01 to a thickness of 40 nm.

It is known that in the light-emitting device, [Ir(ppy)₂(mdppy)] is a phosphorescent material. Furthermore, 3,10tBu-ch3P2Qd is a fluorescent material having protecting groups.

Then, mPCCzPTzn-02 was deposited over the light-emitting layer 130 by evaporation to a thickness of 20 nm, and then NBPhen was deposited thereover by evaporation to a thickness of 10 nm, whereby the electron-transport layer 118 was formed. After that, as the electron-injection layer 119, LiF was deposited to a thickness of 1 nm over the electron-transport layer 118 by evaporation.

After that, as the electrode 102, aluminum (Al) was formed to a thickness of 200 nm over the electron-injection layer 119, whereby a light-emitting device 3 was fabricated.

Then, in a glove box containing a nitrogen atmosphere, the light-emitting device 3 was sealed in the following manner: sealant was applied to the periphery of organic materials formed on a glass substrate, the glass substrate was bonded to a glass substrate for sealing, irradiation with ultraviolet light having a wavelength of 365 nm at 6 J/cm² was performed, heat treatment at 80° C. for one hour was performed, and the glass substrate for sealing was fixed to the glass substrate on which the organic materials were formed.

<Fabrication Method of Comparative Light-Emitting Device>

A comparative light-emitting device 5 was fabricated in a manner similar to that for the light-emitting device 3 except that 3,10tBu-ch3P2Qd in the light-emitting layer of the light-emitting device 3 was replaced by N,N'-diphenylquinacridone (abbreviation: DPQd) represented by Structural Formula (viii) above. In other words, the comparative light-emitting device 5 is a light-emitting device using a fluorescent material having no protecting group instead of the organic compound of the present invention.

The element structures of the light-emitting device 3 and the comparative light-emitting device 5 are listed in the following table.

TABLE 9 light-emitting device 3

| | film thickness (nm) | material and mixture ratio |
|---|---|---|
| cathode | 200 | Al |
| electron-injection layer | 1 | LiF |
| electron-transport layer | 10 | NBPhen |
| | 20 | mPCCzPTzn-02 |
| light-emitting layer | 40 | mPCCzPTzn-02:PCCP:[Ir(ppy)$_2$(mdppy)]:3,10tBu-ch3P2Qd (0.5:0.5:0.1:0.01) |
| hole-transport layer | 20 | PCBBiIBP |
| hole-injection layer | 40 | DBT3P-II:MoOx (1:0.5) |
| anode | 70 | ITSO |

TABLE 10 comparative light-emitting device 5

| | film thickness (nm) | material and mixture ratio |
|---|---|---|
| cathode | 200 | Al |
| electron-injection layer | 1 | LiF |
| electron-transport layer | 15 | NBPhen |
| | 20 | 4,6mCzP2Pm |
| light-emitting layer | 30 | mPCCzPTzn-02:PCCP:[Ir(ppy)2(mdppy)]:DPQd (0.5:0.5:0.1:0.01) |
| hole-transport layer | 20 | mCzFLP |
| hole-injection layer | 40 | DBT3P-II:MoOx (1:0.5) |
| anode | 70 | ITSO |

<Characteristics of Light-Emitting Device 3 and Comparative Light-Emitting Device 5>

Next, characteristics of the fabricated light-emitting device 3 and comparative light-emitting device 5 were measured. Luminance, CIE chromaticity, and electroluminescence (EL) spectra were measured using a spectroradiometer (SR-UL1R, manufactured by TOPCON TECHNOHOUSE CORPORATION).

Figure 34:
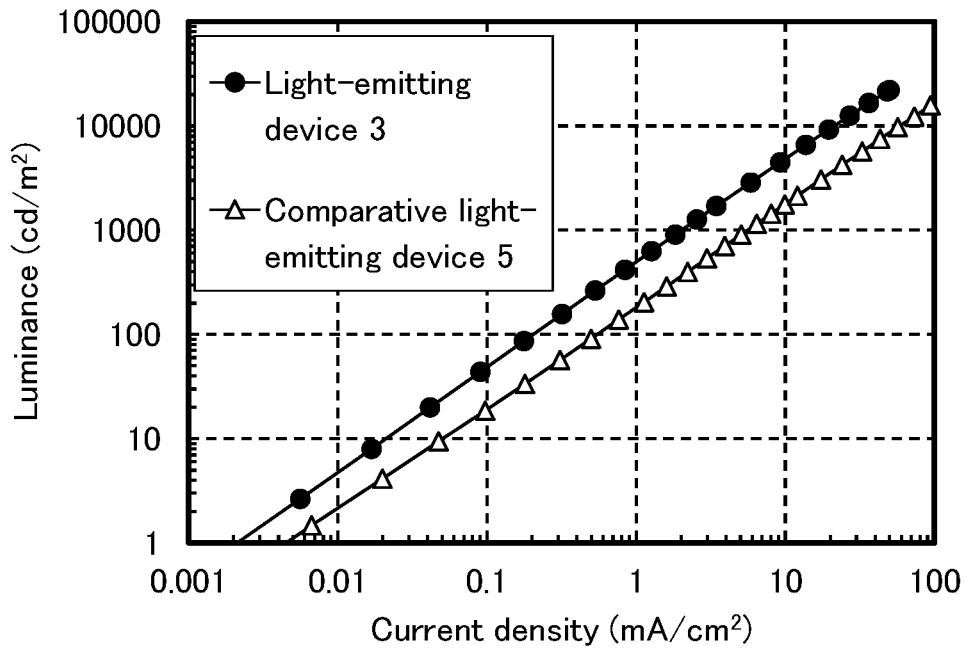
FIG. 34 shows luminance-current density characteristics of a light-emitting device 3 and a comparative light-emitting device 5.
Figure 35:
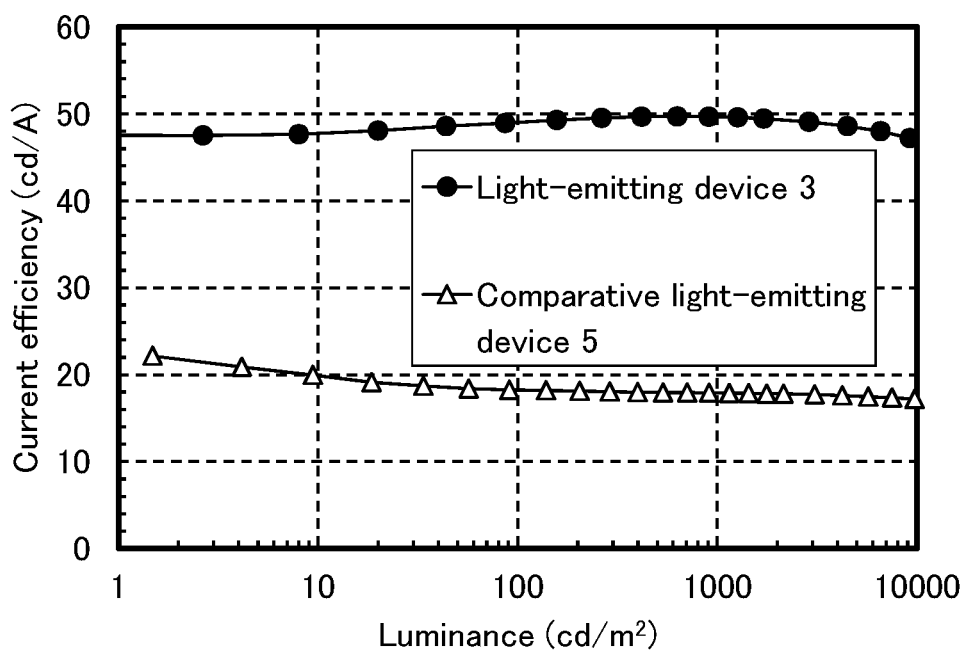
FIG. 35 shows current efficiency-luminance characteristics of the light-emitting device 3 and the comparative light-emitting device 5.
Figure 36:
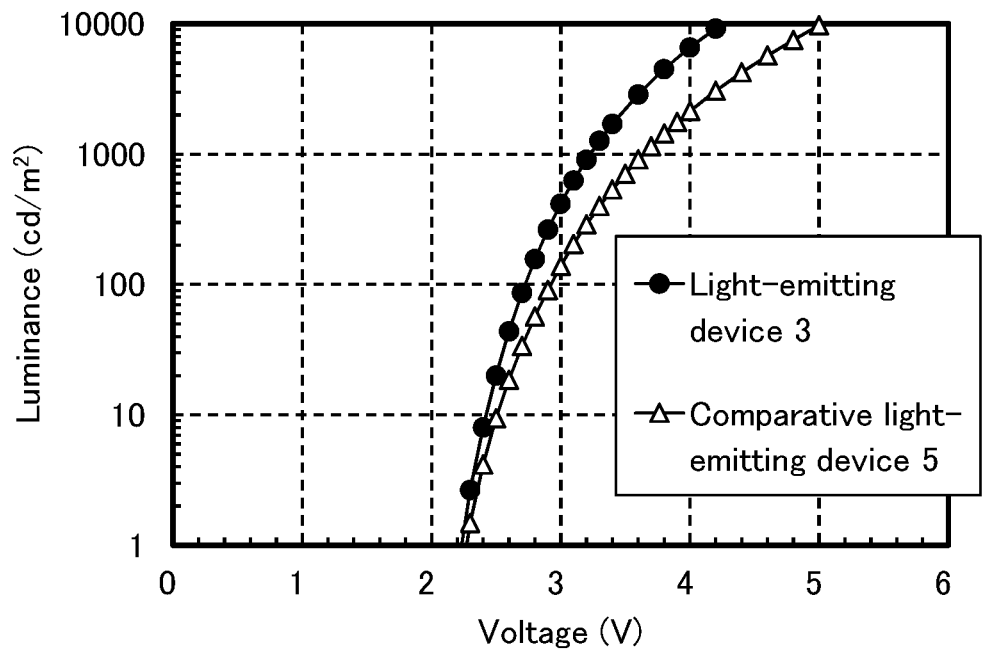
FIG. 36 shows luminance-voltage characteristics of the light-emitting device 3 and the comparative light-emitting device 5.
Figure 37:
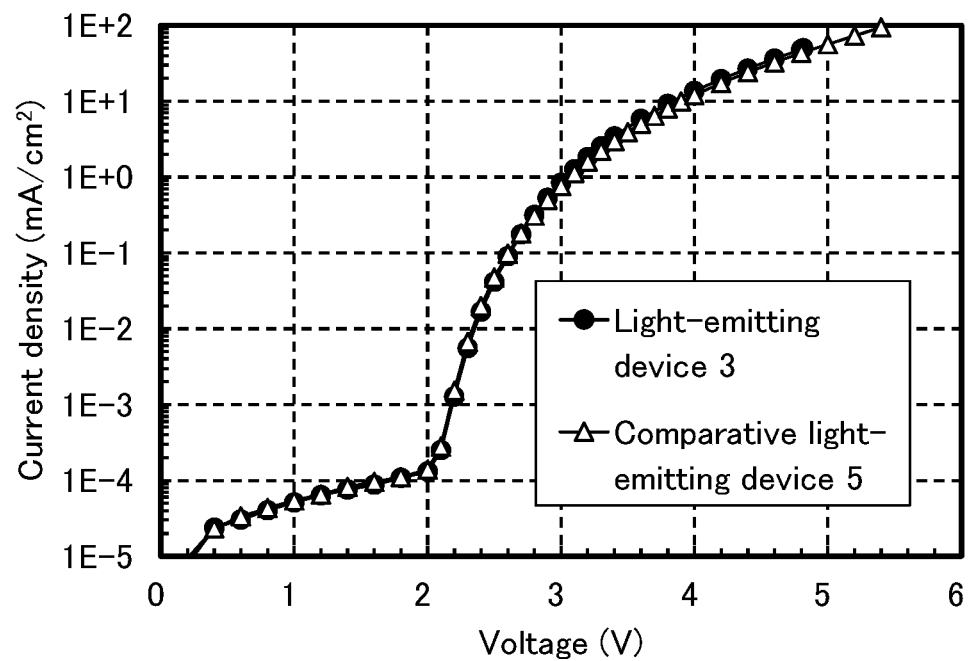
FIG. 37 shows current-voltage characteristics of the light-emitting device 3 and the comparative light-emitting device 5.
Figure 38:
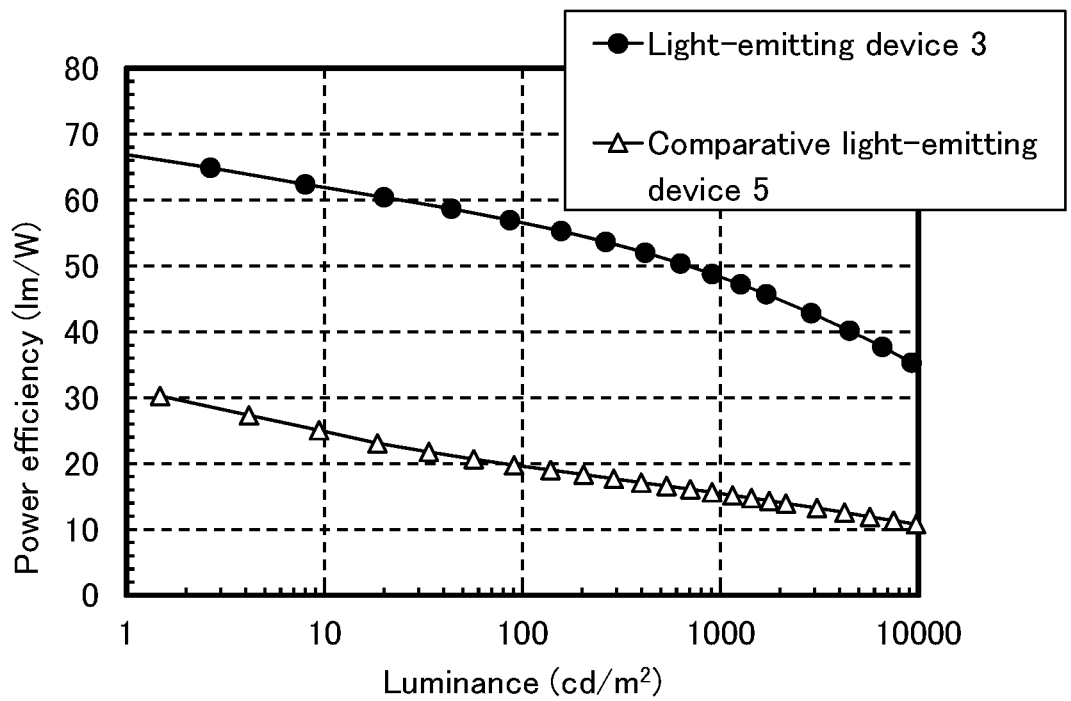
FIG. 38 shows power efficiency-luminance characteristics of the light-emitting device 3 and the comparative light-emitting device 5.
Figure 39:
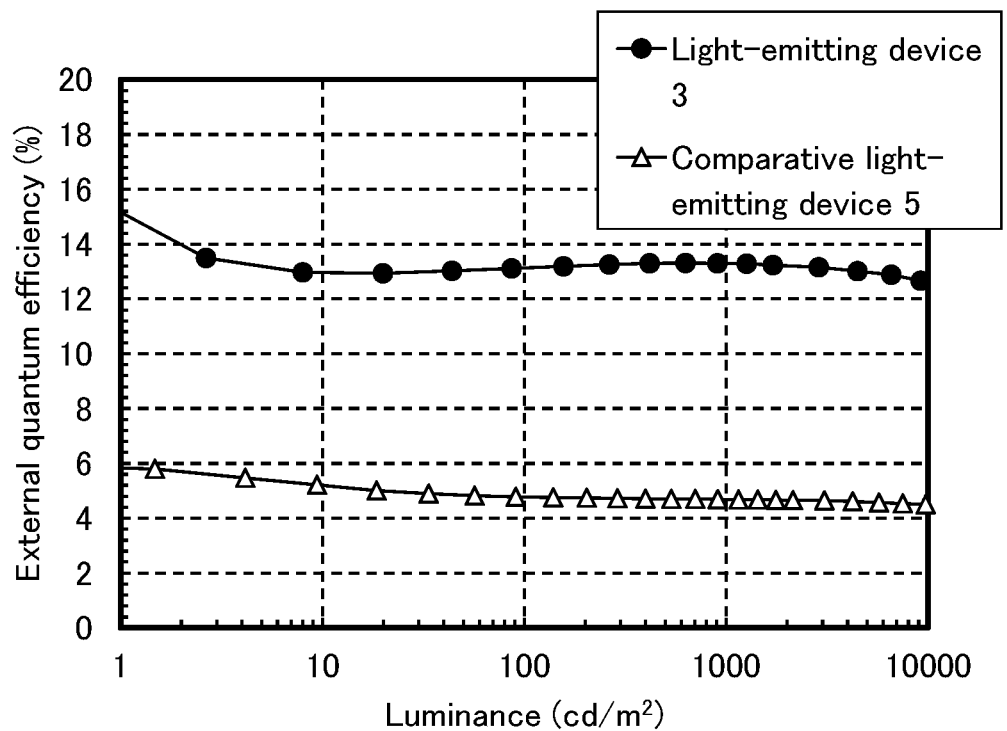
FIG. 39 shows external quantum efficiency-luminance characteristics of the light-emitting device 3 and the comparative light-emitting device 5.
Figure 40:
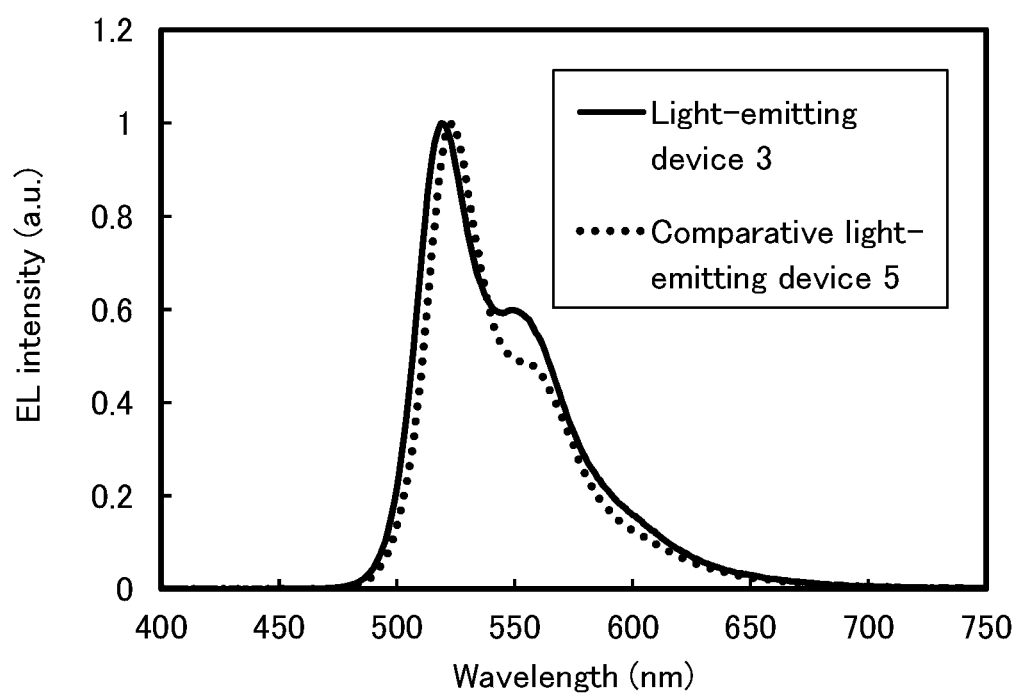
FIG. 40 shows emission spectra of the light-emitting device 3 and the comparative light-emitting device 5.

FIG. 34 shows the luminance-current density characteristics of the light-emitting device 3 and the comparative light-emitting device 5; FIG. 35, the current efficiency-luminance characteristics; FIG. 36, the luminance-voltage characteristics; FIG. 37, the current density-voltage characteristics; FIG. 38, the power efficiency-luminance characteristics; and FIG. 39, the external quantum efficiency-luminance characteristics. FIG. 40 shows the electroluminescence spectra of the light-emitting devices to which current flows at a current density of 2.5 mA/cm$^2$. Note that the measurement was carried out at room temperature (an atmosphere maintained at 23° C.).

Table 11 lists the device characteristics at around 1000 cd/m$^2$ of the light-emitting device 3 and the comparative light-emitting device 5.

TABLE 11

| | voltage (V) | current density (mA/cm$^2$) | CIE chromaticity (x, y) | current efficiency (lm/W) | power efficiency (lm/W) | external quantum efficiency (%) |
|---|---|---|---|---|---|---|
| light-emitting device 3 | 3.20 | 1.83 | (0.309, 0.643) | 49.7 | 48.8 | 13.3 |
| comparative light-emitting device 5 | 3.60 | 5.07 | (0.293, 0.677) | 17.9 | 15.6 | 4.7 |

The light-emitting device 3 is a light-emitting element in which [Ir(ppy)₂(mdppy)], which is a phosphorescent material, serves as an energy donor, energy is transferred to 3,10tBu-ch3P2Qd, which is the organic compound (fluorescent material) of one embodiment of the present invention, and light emission is obtained from 3,10tBu-ch3P2Qd. The comparative light-emitting device 5 is a light-emitting element in which [Ir(ppy)₂(mdppy)] serves as an energy donor, energy is transferred to DPQd, which is an organic compound (fluorescent material) having no protecting group, and light emission is obtained from DPQd.

As shown in FIG. 40, the EL spectrum of the light-emitting device 3 had an extremely sharp spectrum shape which had a peak wavelength at 519 nm and in which a full width at half maximum is 57 nm. This is light emission based on 3,10tBu-ch3P2Qd, which is a fluorescent material. The EL spectrum of the comparative light-emitting device 5 had a sharp spectrum shape which had a peak wavelength at 524 nm and in which a full width at half maximum is 37 nm. This is light emission based on DPQd, which is a fluorescent material.

The maximum external quantum efficiency of the light-emitting device 3 was as high as 13% or higher. In general, the generation probability of singlet excitons which are generated by recombination of carriers (holes and electrons) injected from the pair of electrodes is at most 25%; therefore, the maximum external quantum efficiency of a fluorescent light-emitting device in the case where the light extraction efficiency to the outside is 30% is 7.5%. The light-emitting device 3 exhibited external quantum efficiency exceeding 7.5%, which means that in addition to light emission derived from singlet excitons, light emission derived from energy transfer from triplet excitons is obtained from the fluorescent material. Meanwhile, the external quantum efficiency of the comparative light-emitting device 5 was at most on the order of 5%, which is lower than or equal to half of the efficiency of the light-emitting device 3. This indicates that in the comparative light-emitting device 5, triplet excitation energy cannot be efficiently converted into light emission. That is, by using 3,10tBu-ch3P2Qd, which is the compound of one embodiment of the present invention, non-radiative decay of triplet excitons was inhibited, and both the singlet excitation energy and the triplet excitation energy were efficiently converted into light emission of the fluorescent material.

Then, the cyclic voltammetry (CV) measurement results of the electrochemical characteristics (oxidation reaction characteristics and reduction reaction characteristics) of mPCCzPTzn-02 and PCCP used for the light-emitting layers of the light-emitting devices are shown. The measurement method is similar to that in Example 1.

The HOMO level and the LUMO level of mPCCzPTzn-02 were −5.69 eV and −3.00 eV, respectively, and the HOMO level and the LUMO level of PCCP were −5.63 eV and −1.96 eV, respectively; those were calculated from the CV measurement results.

As described above, the LUMO level of mPCCzPTzn-02 is lower than the LUMO level of PCCP, and the HOMO level of PCCP is higher than the HOMO level of mPCCzPTzn-02. Therefore, in the case where the compounds are used for a light-emitting layer, electrons and holes are efficiently injected into mPCCzPTzn-02 and PCCP, and an exciplex can be formed by mPCCzPTzn-02 and PCCP. The formation of the exciplex allows efficient energy transfer from the exciplex to [Ir(ppy)₂(mdppy)], which is an energy donor, and contributes to an improvement in emission efficiency.

REFERENCE NUMERALS

100: EL layer, 101: electrode, 102: electrode, 106: light-emitting unit, 108: light-emitting unit, 111: hole-injection layer, 112: hole-transport layer, 113: electron-transport layer, 114: electron-injection layer, 115: charge-generation layer, 116: hole-injection layer, 117: hole-transport layer, 118: electron-transport layer, 119: electron-injection layer, 120: light-emitting layer, 130: light-emitting layer, 131: compound, 132: compound, 133: compound, 134: compound, 135: compound, 150: light-emitting device, 170: light-emitting layer, 250: light-emitting device, 301: guest material, 302: guest material, 310: luminophore, 320: protecting group, 330: host material, 601: source side driver circuit, 602: pixel portion, 603: gate side driver circuit, 604: sealing substrate, 605: sealant, 607: space, 608: wiring, 609: FPC, 610: element substrate, 611: switching TFT, 612: current controlling TFT, 613: electrode, 614: insulator, 616: EL layer, 617: electrode, 618: light-emitting device, 623: n-channel TFT, 624: p-channel TFT, 625: desiccant, 900: portable information terminal, 901: housing, 902: housing, 903: display portion, 905: hinge portion, 910: portable information terminal, 911: housing, 912: display portion, 913: operation button, 914: external connection port, 915: speaker, 916: microphone, 917: camera, 920: camera, 921: housing, 922: display portion, 923: operation button, 924: shutter button, 926: lens, 1001: substrate, 1002: base insulating film, 1003: gate insulating film, 1006: gate electrode, 1007: gate electrode, 1008: gate electrode, 1020: interlayer insulating film, 1021: interlayer insulating film, 1022: electrode, 1024B: electrode, 1024G: electrode, 1024R: electrode, 1024W: electrode, 1025B: lower electrode, 1025G: lower electrode, 1025R: lower electrode, 1025W: lower electrode, 1026: partition wall, 1028: EL layer, 1029: electrode, 1031: sealing substrate, 1032: sealant, 1033: base material, 1034B: coloring layer, 1034G: coloring layer, 1034R: coloring layer, 1036: overcoat layer, 1037: interlayer insulating film, 1040: pixel portion, 1041: driver circuit portion, 1042: peripheral portion, 1044B: blue pixel, 1044G: green pixel, 1044R: red pixel, 1044W: white pixel, 2100: robot, 2101: illuminance sensor, 2102: microphone, 2103: upper camera, 2104: speaker, 2105: display, 2106: lower camera, 2107: obstacle sensor, 2108: moving mechanism, 2110: arithmetic device, 5000: housing, 5001: display portion, 5002: display portion, 5003: speaker, 5004: LED lamp, 5005: operation key, 5006: connection terminal, 5007: sensor, 5008: microphone, 5012: support, 5013: earphone, 5100: cleaning robot, 5101: display, 5102: camera, 5103: brush, 5104: operation button, 5120: dust, 5140: portable electronic device, 5150: portable information terminal, 5151: housing, 5152: display region, 5153: bend portion, 8501: lighting device, 8502: lighting device, 8503: lighting device, 8504: lighting device

The invention claimed is:

1. An organic compound represented by General Formula (G1-1),

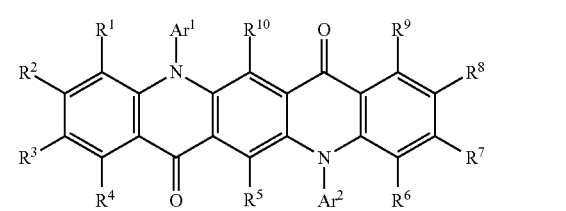

(G1-1)

wherein $R^1$ to $R^{10}$ each independently represent any one of hydrogen, an alkyl group having 3 to 10, inclusive, carbon atoms, and a substituted or unsubstituted cycloalkyl group having 3 to 10, inclusive, carbon atoms, wherein in the case where the cycloalkyl group has a substituent, the substituent is any of an alkyl group having 1 to 7, inclusive, carbon atoms, a cycloalkyl group having 5 to 7, inclusive, carbon atoms, and an aryl group having 6 to 12, inclusive, carbon atoms, wherein $Ar^1$ and $Ar^2$ each independently represent an aromatic hydrocarbon group having 6 to 13, inclusive, carbon atoms with a substituent, and wherein $Ar^1$ and $Ar^2$ each comprise, as the substituent, one or more of a cycloalkyl group having 3 to 12, inclusive, carbon atoms and a cycloalkyl group having a bridge structure and having 7 to 10, inclusive, carbon atoms.

2. The organic compound according to claim 1,
wherein $Ar^1$ and $Ar^2$ each represent a phenyl group with a substituent.

3. An organic compound represented by General Formula (G1-2),

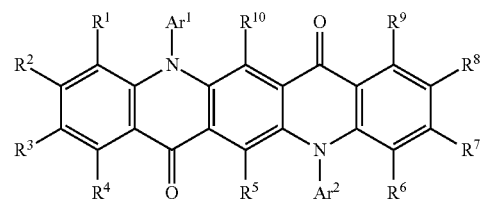

(G1-2)

wherein $R^1$ to $R^{10}$ each independently represent any one of hydrogen, an alkyl group having 3 to 10, inclusive, carbon atoms, and a substituted or unsubstituted cycloalkyl group having 3 to 10, inclusive, carbon atoms, wherein in the case where the cycloalkyl group has a substituent, the substituent is any of an alkyl group having 1 to 7, inclusive, carbon atoms, a cycloalkyl group having 5 to 7, inclusive, carbon atoms, and an aryl group having 6 to 12, inclusive, carbon atoms, wherein $Ar^1$ and $Ar^2$ each independently represent an aromatic hydrocarbon group having 6 to 13, inclusive, carbon atoms with three or more substituents, and wherein $Ar^1$ and $Ar^2$ each comprise, as the substituents, two or more selected from an alkyl group having 1 to 10, inclusive, carbon atoms, a cycloalkyl group having 3 to 12, inclusive, carbon atoms, and a cycloalkyl group having a bridge structure and having 7 to 10, inclusive, carbon atoms.

4. The organic compound according to claim 3,
wherein $Ar^1$ and $Ar^2$ each comprise three to five substituents.

5. The organic compound according to claim 3,
wherein $Ar^1$ and $Ar^2$ each represent a phenyl group with a substituent.

6. The organic compound according to claim 5,
wherein the substituents of $Ar^1$ and $Ar^2$ are bonded to both ortho positions and para positions of $Ar^1$ and $Ar^2$.

7. The organic compound according to claim 1,
wherein $Ar^1$ and $Ar^2$ each comprise three substituents.

8. The organic compound according to claim 1,
wherein the substituents of $Ar^1$ and $Ar^2$ are each a cyclohexyl group.

9. An organic compound represented by General Formula (G2),

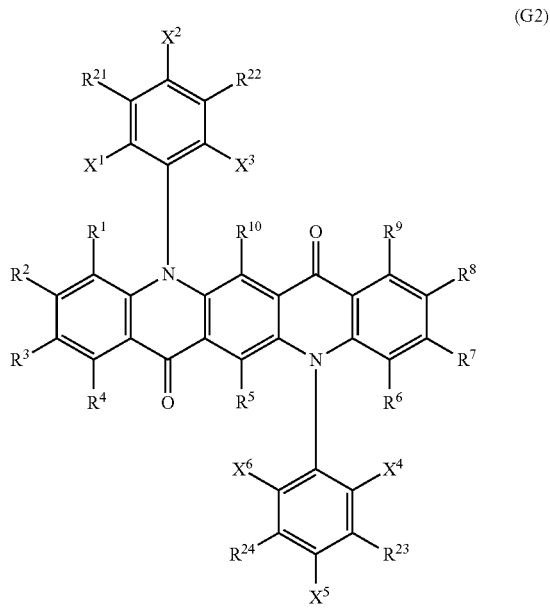

(G2)

wherein $R^1$ to $R^{10}$ and $R^{21}$ to $R^{24}$ each independently represent any one of hydrogen, an alkyl group having 3 to 10, inclusive, carbon atoms, and a substituted or unsubstituted cycloalkyl group having 3 to 10, inclusive, carbon atoms, wherein in the case where the cycloalkyl group has a substituent, the substituent is any of an alkyl group having 1 to 7, inclusive, carbon atoms, a cycloalkyl group having 5 to 7, inclusive, carbon atoms, and an aryl group having 6 to 12, inclusive, carbon atoms, and wherein $X^1$ to $X^6$ each independently represent any one of an alkyl group having 1 to 10, inclusive, carbon atoms, a cycloalkyl group having 3 to 12, inclusive, carbon atoms, and a cycloalkyl group having a bridge structure and having 7 to 10, inclusive, carbon atoms.

10. The organic compound according to claim 9,
wherein $R^{21}$ to $R^{24}$ each represent hydrogen.

11. The organic compound according to claim 9,
wherein $X^1$ to $X^6$ each represent a cycloalkyl group having 3 to 12, inclusive, carbon atoms.

12. The organic compound according to claim 9,
wherein $X^1$ to $X^6$ each represent a cyclohexyl group.

13. The organic compound according to claim 1,
wherein $R^1$ to $R^{10}$ each represent hydrogen.

14. A light-emitting device material comprising the organic compound according to claim 1.

15. A light-emitting material for a light-emitting device, comprising the organic compound according to claim 1, for receiving excitation energy from a material configured to convert triplet excitation energy into light emission, and converting the excitation energy into light emission from a singlet excited state in a light-emitting layer.

16. A light-emitting device comprising the organic compound according to claim 1.

17. A light-emitting device comprising, in a light-emitting layer, a material configured to convert triplet excitation energy into light emission and the organic compound according to claim 1 configured to convert singlet excitation energy into light emission.

18. An electronic device comprising the light-emitting device according to claim 16, and a sensor, an operation button, a speaker, or a microphone.

19. A light-emitting apparatus comprising the light-emitting device according to claim 16, and a transistor or a substrate.

20. A lighting device comprising the light-emitting device according to claim 16, and a housing.

* * * * *